US012082408B2

(12) United States Patent
Yang et al.

(10) Patent No.: US 12,082,408 B2
(45) Date of Patent: Sep. 3, 2024

(54) THREE-DIMENSIONAL MEMORY DEVICES HAVING FIRST SEMICONDUCTOR STRUCTURE BONDED WITH SECOND SEMICONDUCTOR STRUCTURE EACH INCLUDING PERIPHERAL CIRCUIT AND METHODS FOR FORMING THE SAME

(71) Applicant: YANGTZE MEMORY TECHNOLOGIES CO., LTD., Wuhan (CN)

(72) Inventors: Yuancheng Yang, Wuhan (CN); Wenxi Zhou, Wuhan (CN); Zhiliang Xia, Wuhan (CN); Wei Liu, Wuhan (CN)

(73) Assignee: YANGTZE MEMORY TECHNOLOGIES CO., ~LTD., Wuhan (CN)

( * ) Notice: Subject to any disclaimer, the term of this patent is extended or adjusted under 35 U.S.C. 154(b) by 393 days.

(21) Appl. No.: 17/481,803

(22) Filed: Sep. 22, 2021

(65) Prior Publication Data

US 2023/0005543 A1    Jan. 5, 2023

Related U.S. Application Data

(63) Continuation of application No. PCT/CN2021/103418, filed on Jun. 30, 2021.

(51) Int. Cl.
*H10B 41/41* (2023.01)
*G11C 16/04* (2006.01)
(Continued)

(52) U.S. Cl.
CPC ......... *H10B 41/41* (2023.02); *G11C 16/0483* (2013.01); *G11C 16/10* (2013.01);
(Continued)

(58) Field of Classification Search
CPC ..... G11C 16/0483; G11C 16/10; G11C 16/26; H10B 43/35; H10B 41/35; H10B 43/40;
(Continued)

(56) References Cited

U.S. PATENT DOCUMENTS 10,283,493 B1  5/2019  Nishida
2008/0153200 A1  6/2008  Sitaram
(Continued)

FOREIGN PATENT DOCUMENTS

CN  101147258 A  3/2008
CN  101179077 A  5/2008
(Continued)

OTHER PUBLICATIONS

Supplemental European Search Report issued in corresponding EP Application No. 21 94 7510, dated Jan. 15, 2024, 8 pages.
(Continued)

*Primary Examiner* — Michael Jung
(74) *Attorney, Agent, or Firm* — BAYES PLLC

(57) ABSTRACT

In certain aspects, a three-dimensional (3D) memory device includes a first semiconductor structure, a second semiconductor structure, and a bonding interface between the first and second semiconductor structures. The first semiconductor structure includes an array of NAND memory strings, a first peripheral circuit of the array of NAND memory strings including a first transistor, a polysilicon layer between the array of NAND memory strings and the first peripheral circuit, and a first semiconductor layer in contact with the first transistor. The polysilicon layer is in contact with sources of the array of NAND memory strings. The second semiconductor structure includes a second peripheral circuit of the array of NAND memory strings including a second transistor, and a second semiconductor layer in contact with the second transistor. The second peripheral circuit is
(Continued)

between the bonding interface and the second semiconductor layer. The first semiconductor layer is between the polysilicon layer and the second semiconductor layer.

20 Claims, 73 Drawing Sheets

(51) Int. Cl.
*G11C 16/10* (2006.01)
*G11C 16/26* (2006.01)
*H01L 23/528* (2006.01)
*H10B 41/27* (2023.01)
*H10B 41/35* (2023.01)
*H10B 41/40* (2023.01)
*H10B 43/27* (2023.01)
*H10B 43/35* (2023.01)
*H10B 43/40* (2023.01)

(52) U.S. Cl.
CPC .......... *G11C 16/26* (2013.01); *H01L 23/5283* (2013.01); *H10B 41/27* (2023.02); *H10B 41/35* (2023.02); *H10B 41/40* (2023.02); *H10B 43/27* (2023.02); *H10B 43/35* (2023.02); *H10B 43/40* (2023.02)

(58) Field of Classification Search
CPC ........ H10B 41/27; H10B 43/27; H10B 41/41; H01L 23/5283
See application file for complete search history.

(56) References Cited

U.S. PATENT DOCUMENTS

| | | |
|---|---|---|
| 2009/0168482 A1 | 7/2009 | Park et al. |
| 2010/0302848 A1 | 12/2010 | Mikhalev |
| 2011/0159682 A1 | 6/2011 | Yang |
| 2014/0175637 A1 | 6/2014 | Stuber et al. |
| 2018/0277517 A1 | 9/2018 | Kim et al. |
| 2018/0358371 A1 | 12/2018 | Hwang et al. |
| 2019/0221557 A1 | 7/2019 | Kim et al. |
| 2020/0105721 A1 | 4/2020 | Park |
| 2020/0203328 A1 | 6/2020 | Park et al. |
| 2020/0258817 A1* | 8/2020 | Okina .................. H10B 43/40 |
| 2020/0328176 A1 | 10/2020 | Liu |
| 2020/0328180 A1 | 10/2020 | Cheng et al. |
| 2020/0328186 A1 | 10/2020 | Liu |
| 2020/0350322 A1 | 11/2020 | Liu et al. |
| 2020/0363983 A1 | 11/2020 | Li et al. |
| 2021/0104534 A1 | 4/2021 | Huo et al. |
| 2021/0111089 A1 | 4/2021 | Liu |
| 2021/0111122 A1 | 4/2021 | Liu |
| 2021/0134753 A1 | 5/2021 | Lee |
| 2021/0134778 A1 | 5/2021 | Huang et al. |
| 2022/0270992 A1* | 8/2022 | Wada .................. H01L 24/80 |

FOREIGN PATENT DOCUMENTS

| | | |
|---|---|---|
| CN | 101286480 A | 10/2008 |
| CN | 102237314 A | 11/2011 |
| CN | 104282629 A | 1/2015 |
| CN | 106169307 A | 11/2016 |
| CN | 110192269 A | 8/2019 |
| CN | 110291631 A | 9/2019 |
| CN | 110546762 A | 12/2019 |
| CN | 110620117 A | 12/2019 |
| CN | 110731012 A | 1/2020 |
| CN | 110876281 A | 3/2020 |
| CN | 110945652 A | 3/2020 |
| CN | 110970439 A | 4/2020 |
| CN | 111211126 A | 5/2020 |
| CN | 112271191 A | 1/2021 |
| CN | 112614831 A | 4/2021 |
| CN | 112802855 A | 5/2021 |
| JP | 2018117102 A | 7/2018 |
| KR | 20080024764 A | 3/2008 |
| WO | 2020211271 A1 | 10/2020 |

OTHER PUBLICATIONS

International Search Report issued in corresponding International Application No. PCT/CN2021/103418, mailed Mar. 28, 2022, 5 pages.
International Search Report issued in corresponding International Application No. PCT/CN2021/103411, mailed Apr. 6, 2022, 4 pages.
International Search Report issued in corresponding International Application No. PCT/CN2021/103408, mailed Mar. 28, 2022, 4 pages.
International Search Report issued in corresponding International Application No. PCT/CN2021/103420, mailed Mar. 28, 2022, 4 pages.
International Search Report issued in corresponding International Application No. PCT/CN2021/103497, mailed Mar. 28, 2022, 4 pages.

* cited by examiner

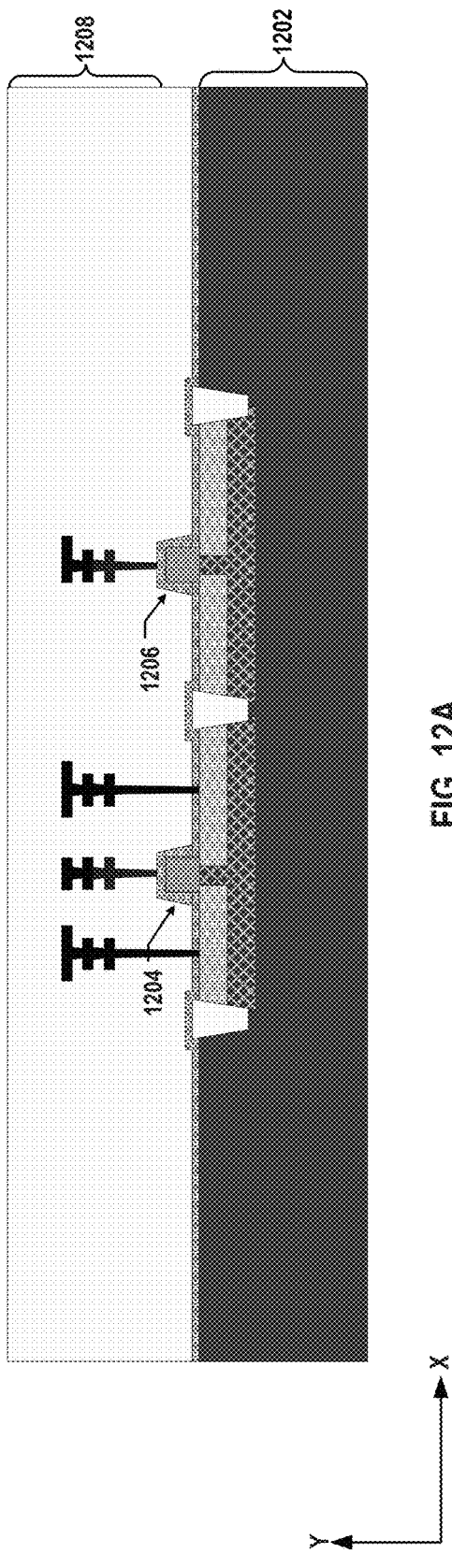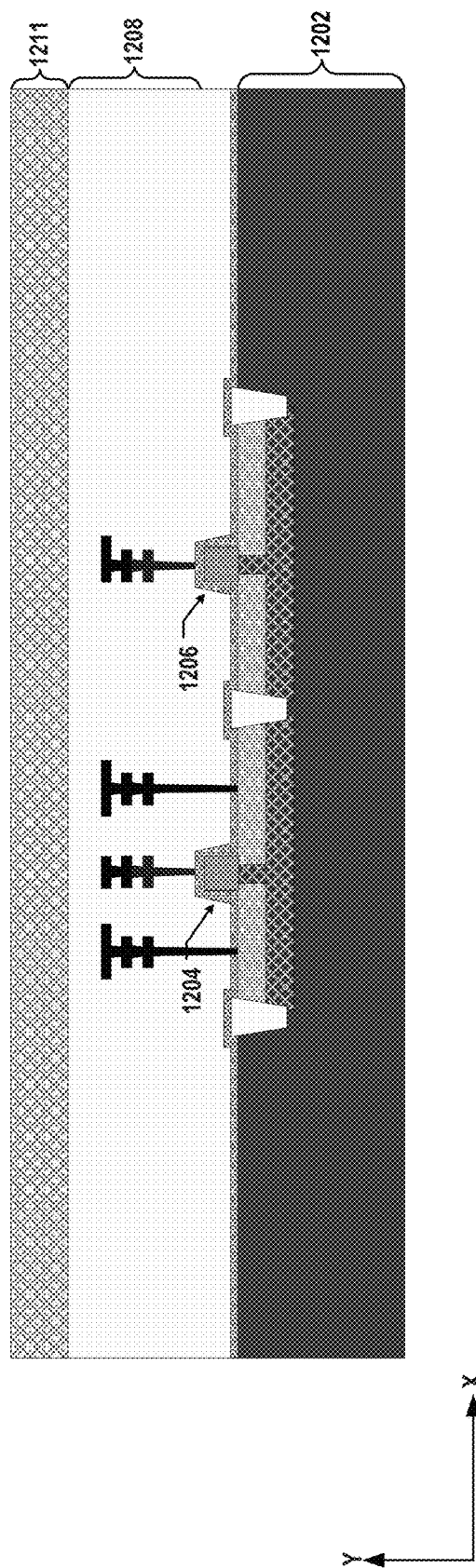
FIG. 12A
FIG. 12B

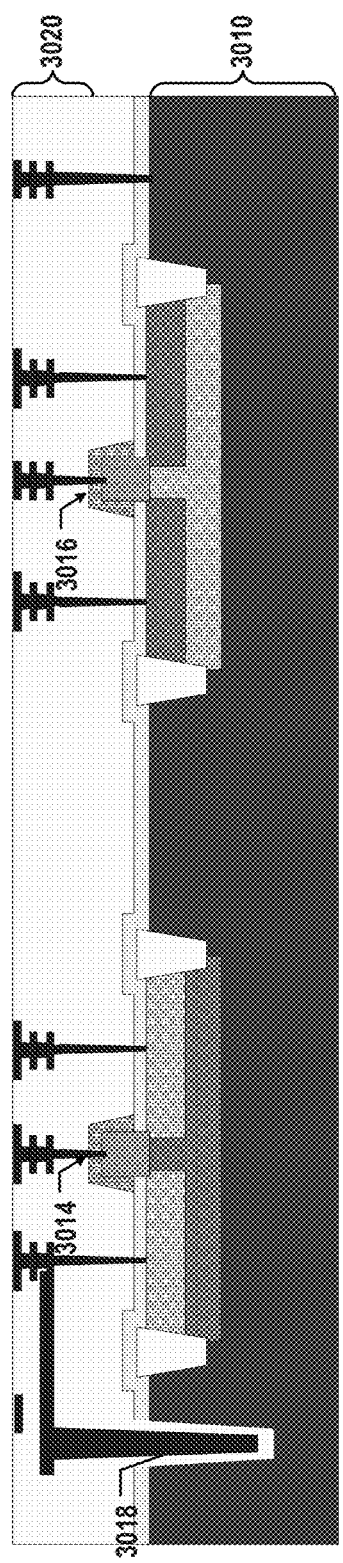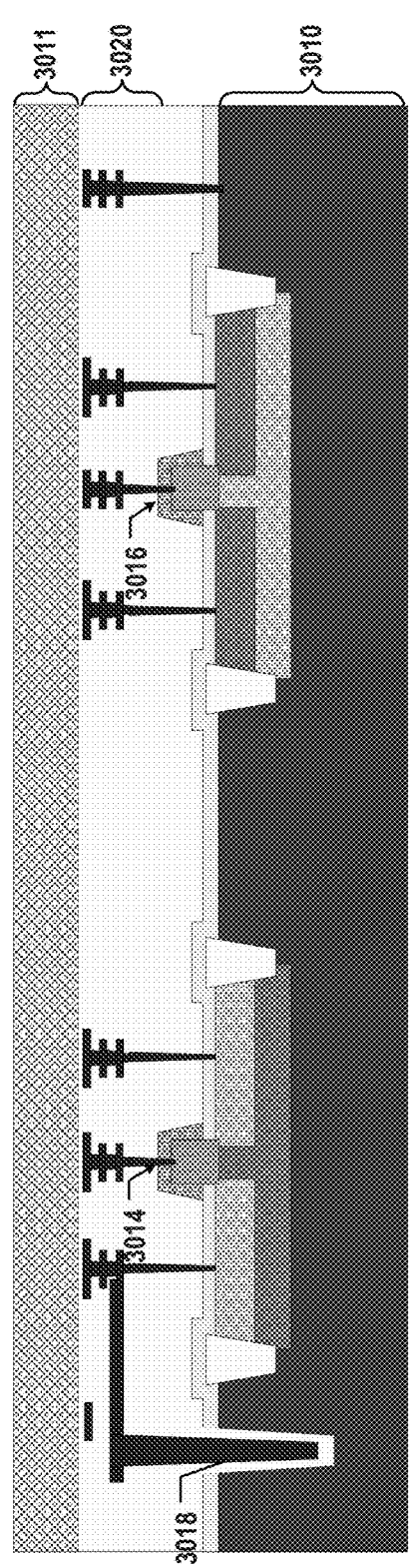
FIG. 30A
FIG. 30B

3600

THREE-DIMENSIONAL MEMORY DEVICES HAVING FIRST SEMICONDUCTOR STRUCTURE BONDED WITH SECOND SEMICONDUCTOR STRUCTURE EACH INCLUDING PERIPHERAL CIRCUIT AND METHODS FOR FORMING THE SAME

CROSS-REFERENCE TO RELATED APPLICATIONS

This application is a continuation of International Application No. PCT/CN2021/103418, filed on Jun. 30, 2021, entitled "THREE-DIMENSIONAL MEMORY DEVICES AND METHODS FOR FORMING THE SAME," which is hereby incorporated by reference in its entirety. This application is also related to U.S. application Ser. No. 17/481,838, filed on Sep. 22, 2021 entitled "THREE-DIMENSIONAL MEMORY DEVICES AND METHODS FOR FORMING THE SAME," U.S. application Ser. No. 17/481,875, filed on Sep. 22, 2021, entitled "THREE-DIMENSIONAL MEMORY DEVICES AND METHODS FOR FORMING THE SAME," U.S. application Ser. No. 17/481,902, filed on Sep. 22, 2021, entitled "THREE-DIMENSIONAL MEMORY DEVICES AND METHODS FOR FORMING THE SAME," and U.S. application Ser. No. 17/481,943, filed on Sep. 22, 2021, entitled "THREE-DIMENSIONAL MEMORY DEVICES AND METHODS FOR FORMING THE SAME," all of which are hereby incorporated by reference in their entireties.

BACKGROUND

The present disclosure relates to memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, a 3D memory device includes a first semiconductor structure, a second semiconductor structure, and a bonding interface between the first semiconductor structure and the second semiconductor structure. The first semiconductor structure includes an array of NAND memory strings, a first peripheral circuit of the array of NAND memory strings including a first transistor, a polysilicon layer between the array of NAND memory strings and the first peripheral circuit, and a first semiconductor layer in contact with the first transistor. The polysilicon layer is in contact with sources of the array of NAND memory strings. The second semiconductor structure includes a second peripheral circuit of the array of NAND memory strings including a second transistor, and a second semiconductor layer in contact with the second transistor. The second peripheral circuit is between the bonding interface and the second semiconductor layer. The first semiconductor layer is between the polysilicon layer and the second semiconductor layer.

In another aspect, a system includes a memory device configured to store data. The memory device includes a first semiconductor structure, a second semiconductor structure, and a bonding interface between the first semiconductor structure and the second semiconductor structure. The first semiconductor structure includes an array of NAND memory strings, a first peripheral circuit of the array of NAND memory strings including a first transistor, a polysilicon layer between the array of NAND memory strings and the first peripheral circuit, and a first semiconductor layer in contact with the first transistor. The polysilicon layer is in contact with sources of the array of NAND memory strings. The second semiconductor structure includes a second peripheral circuit of the array of NAND memory strings including a second transistor, and a second semiconductor layer in contact with the second transistor. The second peripheral circuit is between the bonding interface and the second semiconductor layer. The first semiconductor layer is between the polysilicon layer and the second semiconductor layer. The system also includes a memory controller coupled to the memory device and configured to control the array of memory cells through the first peripheral circuit and the second peripheral circuit.

In still another aspect, a method for forming a 3D memory device is disclosed. A first transistor is formed on a front side of a first substrate. A polysilicon layer is formed above the first transistor on the first substrate. An array of NAND memory strings is formed on the polysilicon layer. A second transistor is formed on a second substrate. The first substrate and the second substrate are bonded in a back-to-face manner.

In yet another aspect, a method for forming a 3D memory device is disclosed. A first transistor is formed on a first substrate. A semiconductor layer is formed on above the first transistor. The semiconductor layer includes single crystalline silicon. A second transistor is formed on the semiconductor layer. A polysilicon layer is formed above the second transistor. An array of NAND memory strings is formed on the polysilicon layer.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 12A-12G illustrate a fabrication process for forming the 3D memory device in FIG. 10, according to some aspects of the present disclosure.

FIGS. 30A-30G illustrate a fabrication process for forming the 3D memory device in FIGS. 28A and 28B, according to some aspects of the present disclosure.

Figure 1A:
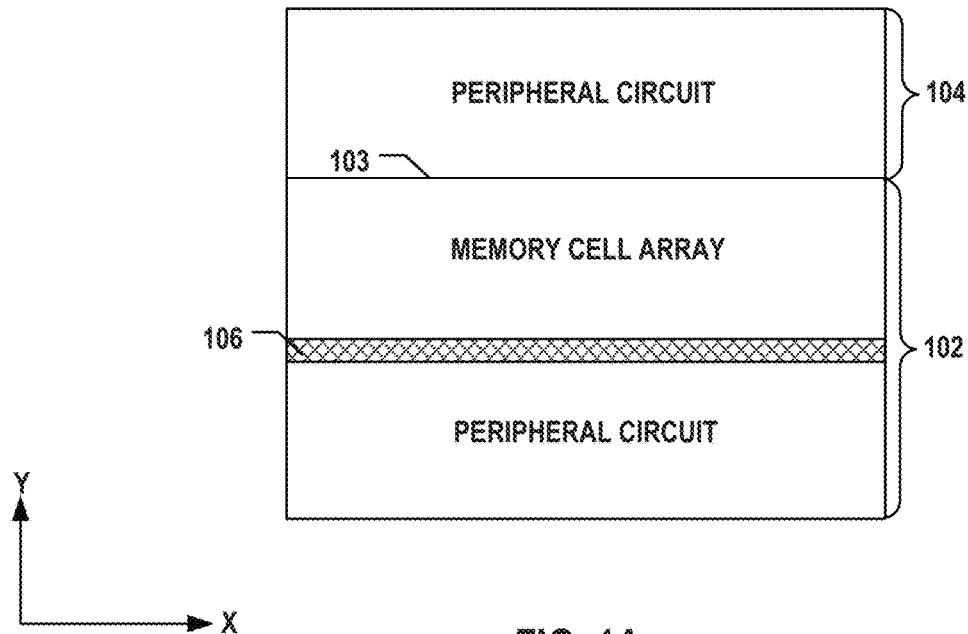
FIG. 1A illustrates a schematic view of a cross-section of a 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

With the development of 3D memory devices, such as 3D NAND Flash memory devices, the more stacked layers (e.g., more word lines and the resulting more memory cells) require more peripheral circuits (and the components, e.g., transistors, forming the peripheral circuits) for operating the 3D memory devices. For example, the number and/or size of page buffers needs to increase to match the increased number of memory cells. In another example, the number of string drivers in the word line driver is proportional to the number of word lines in the 3D NAND Flash memory. Thus, the continuous increase of the word lines also increases the area occupied by the word line driver, as well as the complexity of metal routings, sometimes even the number of metal layers. Moreover, in some 3D memory devices in which the peripheral circuits are fabricated under the memory cell array, sometimes known as "periphery under cell" (PUC) architecture or "complementary metal-oxide-semiconductor (CMOS) under the array" (CuA) architecture, the continuous increase of peripheral circuits' areas makes it the bottleneck for reducing the total chip size since the memory cell array can be scaled up vertically by increasing the number of levels instead of increasing the planar size.

Thus, it is desirable to reduce the planar areas occupied by the peripheral circuits of the 3D memory devices with the increased numbers of peripheral circuits and the transistors thereof. However, scaling down the transistor size of the peripheral circuits following the advanced CMOS technology node trend used for the logic devices would cause a significant cost increase and higher leakage current, which are undesirable for memory devices. Moreover, because the 3D NAND Flash memory devices require a relatively high voltage (e.g., above 5 V) in certain memory operations, such as program and erase, unlike logic devices, which can reduce its working voltage as the CMOS technology node advances, the voltage provided to the memory peripheral circuits cannot be reduced. As a result, scaling down the memory peripheral circuit sizes by following the trend for advancing the CMOS technology nodes, like the normal logic devices, becomes infeasible.

To address one or more of the aforementioned issues, the present disclosure introduces various solutions in which the peripheral circuits of a memory device are disposed in different planes (levels, tiers) in the vertical direction, i.e., stacked over one another, to reduce the planar chip size of the peripheral circuits, as well as the total chip size of the memory device. In some implementations, the memory cell array (e.g., NAND memory strings), the memory peripheral circuits provided with a relatively high voltage (e.g., above 3.3 V), and the memory peripheral circuits provided with a relatively low voltage (e.g., below 2 V) are disposed in different planes in the vertical direction, i.e., stacked over one another, to further reduce the chip size. The 3D memory device architectures and fabrication processes disclosed in the present disclosure can be easily scaled up vertically to stack more peripheral circuits in different planes to further reduce the chip size. Moreover, the 3D memory device architectures and fabrication processes disclosed herein can be compatible with the PUC/CuA architecture and process. In some implementations, the memory cell array (e.g., NAND memory strings) can be formed on a deposited polysilicon (a.k.a. polycrystalline silicon) layer (e.g., in contact with a polysilicon source plate), as opposed to a single crystalline silicon substrate, which is suitable for "floating gate" type of NAND memory strings or certain designs of channel structures in "charge trap" type of NAND memory strings, for example, that are suitable for gate-induced drain leakage (GIDL) erase operations.

The peripheral circuits can be separated into different planes in the vertical direction based on different performance requirements, for example, the voltages applied to the transistors thereof, which affect the dimensions of the transistors (e.g., gate dielectric thickness), dimensions of the substrates in which the transistors are formed (e.g., substrate thickness), and thermal budgets (e.g., the interconnect material). Thus, peripheral circuits with different dimension requirements (e.g., gate dielectric thickness and substrate thickness) and thermal budgets can be fabricated in different processes to reduce the design and process constraints from each other, thereby improving the device performance and fabrication complexity.

According to some aspects of the present disclosure, the memory cell array and various peripheral circuits with different performance and dimension requirements can be fabricated in parallel on different substrates and then stacked over one another using various joining technologies, such as hybrid bonding, transfer bonding, etc. As a result, the fabrication cycle of the memory device can be further reduced. Moreover, since the thermal budgets of the different devices become independent to each other, interconnect materials with desirable electric performance but low thermal budget, such as copper, can be used in interconnecting the memory cells and transistors of the peripheral circuits, thereby further improving the device performance. Bonding technologies can introduce additional benefits as well. In some implementations, hybrid bonding in a face-to-face manner achieves millions of parallel short interconnects between the bonded semiconductor structures to increase the throughput and input/output (I/O) speed of the memory devices. In some implementations, transfer bonding re-uses a single wafer to transfer thin semiconductor layers thereof onto different memory devices for forming transistors thereon, which can reduce the cost of the memory devices.

The 3D memory device architectures and fabrication processes disclosed in the present disclosure also have the flexibility to allow various device pad-out schemes to meet different needs and different designs of the memory cell array. In some implementations, the pad-out interconnect layer is formed from the side of the semiconductor structure that has the peripheral circuits to shorten the interconnect distance between the pad-out interconnect layer and the transistors of the peripheral circuits to reduce the parasitic capacitance from the interconnects and improve the electric performance. In some implementations, the pad-out interconnect layer is formed on a thinned substrate to enable inter-layer vias (LLVs, e.g., submicron-level) for pad-out interconnects with high I/O throughput and low fabrication complicity.

FIG. 1A illustrates a schematic view of a cross-section of a 3D memory device 100, according to some aspects of the present disclosure. 3D memory device 100 represents an example of a bonded chip. In some implementations, the components of 3D memory device 100 (e.g., memory cell array and peripheral circuits) are formed separately on different substrates in parallel and then jointed to form a bonded chip (a process referred to herein as a "parallel process"). In some implementations, a semiconductor layer (e.g., single crystalline silicon) is attached onto another semiconductor structure using transferring bonding, then some of the components of 3D memory device 100 (e.g., some peripheral circuits) are formed on the attached semiconductor layer (a process referred to herein as a "series process").

It is noted that x- and y-axes are added in FIG. 1A to further illustrate the spatial relationships of the components of a semiconductor device. A substrate of a semiconductor device, e.g., 3D memory device 100, includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device is determined relative to the substrate of the semiconductor device in the y-direction (the vertical direction or thickness direction) when the substrate is positioned in the lowest plane of the semiconductor device in they-direction. The same notion for describing the spatial relationships is applied throughout the present disclosure.

3D memory device 100 can include a first semiconductor structure 102 including an array of memory cells (also referred to herein as a "memory cell array"). In some implementations, the memory cell array includes an array of NAND Flash memory cells. For ease of description, a NAND Flash memory cell array may be used as an example for describing the memory cell array in the present disclosure. But it is understood that the memory cell array is not limited to NAND Flash memory cell array and may include any other suitable types of memory cell arrays, such as NOR Flash memory cell array, phase change memory (PCM) cell array, resistive memory cell array, magnetic memory cell array, spin transfer torque (STT) memory cell array, to name a few.

First semiconductor structure 102 can be a NAND Flash memory device in which memory cells are provided in the form of an array of 3D NAND memory strings and/or an array of two-dimensional (2D) NAND memory cells. NAND memory cells can be organized into pages or fingers, which are then organized into blocks in which each NAND memory cell is coupled to a separate line called a bit line (BL). All cells with the same vertical position in the NAND memory cell can be coupled through the control gates by a word line (WL). In some implementations, a memory plane contains a certain number of blocks that are coupled through the same bit line. First semiconductor structure 102 can include one or more memory planes, and the peripheral circuits that are needed to perform all the read/program (write)/erase operations can be included in a second semiconductor structure 104 and first semiconductor structure 102.

In some implementations, the array of NAND memory cells is an array of 2D NAND memory cells, each of which includes a floating-gate transistor. The array of 2D NAND memory cells includes a plurality of 2D NAND memory strings, each of which includes a plurality of memory cells connected in series (resembling a NAND gate) and two select transistors, according to some implementations. Each 2D NAND memory string is arranged in the same plane (i.e., referring to herein a flat, two-dimensional (2D) surface, different from the term "memory plane" in the present discourse) on the substrate, according to some implementations. In some implementations, the array of NAND memory cells is an array of 3D NAND memory strings, each of which extends vertically above the substrate (in 3D) through a stack structure, e.g., a memory stack. Depending on the 3D NAND technology (e.g., the number of layers/tiers in the memory stack), a 3D NAND memory string typically includes a certain number of NAND memory cells, each of which includes a floating-gate transistor or a charge-trap transistor.

Consistent with the scope of the present disclosure, first semiconductor structure 102 can also include a polysilicon layer 106 on which the memory cell array is formed. In some implementations, the memory cell array includes an array of NAND memory strings, and polysilicon layer 106 is in contact with the sources of the NAND memory strings. That is, polysilicon layer 106 can serve as a common source plate of multiple NAND memory strings. As described below in detail, polysilicon layer 106 can be formed in first semiconductor structure 102 using one or more thin film deposition processes including, but not limited to, chemical vapor deposition (CVD), physical vapor deposition (PVD), atomic layer deposition (ALD), or any combination thereof, which are compatible with PUC/CuA processes. It is understood that in some examples, polysilicon layer 106 may be a semiconductor layer in general that is not limited to polysilicon.

As shown in FIG. 1A, first semiconductor structure 102 can further include some of the peripheral circuits of the memory cell array, and the memory cell array and the peripheral circuits in first semiconductor structure 102 can be separated by polysilicon layer 106 in the vertical direction. That is, polysilicon layer 106 can be disposed vertically between the memory cell array and the peripheral circuits in first semiconductor structure 102. In some implementations, the peripheral circuits are disposed under polysilicon layer 106 and the memory cell array formed thereon. Depending on the thickness of polysilicon layer 106, interconnects (e.g., inter-layer vias (ILVs) in the submicron-level or through substrate vias (TSVs) in the micron- or tens micron-level) can be formed through polysilicon layer 106 to make direct, short-distance (e.g., submicron- to tens micron-levels) electrical connections between the memory cell array and the peripheral circuits in first semiconductor structure 102.

As shown in FIG. 1A, 3D memory device 100 can also include a second semiconductor structure 104 including some of the peripheral circuits of the memory cell array in first semiconductor structure 102. That is, the peripheral circuits of the memory cell array can be separated into at least two semiconductor structures (e.g., 102 and 104 in FIG. 1A). The peripheral circuits (a.k.a. control and sensing circuits) can include any suitable digital, analog, and/or mixed-signal circuits used for facilitating the operations of the memory cell array. For example, the peripheral circuits can include one or more of a page buffer, a decoder (e.g., a row decoder and a column decoder), a sense amplifier, a driver (e.g., a word line driver), an I/O circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in first and second semiconductor structures 102 and 104 can use CMOS technology, e.g., which can be implemented with logic processes in any suitable technology nodes.

As shown in FIG. 1A, first and second semiconductor structures 102 and 104 are stacked over one another in different planes, according to some implementations. As a result, the memory cell array in first semiconductor structure 102, the peripheral circuits in first semiconductor structure 102, and the peripheral circuits in second semiconductor structure 104 can be stacked over one another in different planes to reduce the planar size of 3D memory device 100, compared with memory devices in which all the peripheral circuits are disposed in the same plane.

As shown in FIG. 1A, 3D memory device 100 further includes a bonding interface 103 vertically between first semiconductor structure 102 and second semiconductor structure 104. Bonding interface 103 can be an interface between two semiconductor structures formed by any suitable bonding technologies as described below in detail, such as hybrid bonding, anodic bonding, fusion bonding, transfer bonding, adhesive bonding, eutectic bonding, to name a few.

Figure 1B:
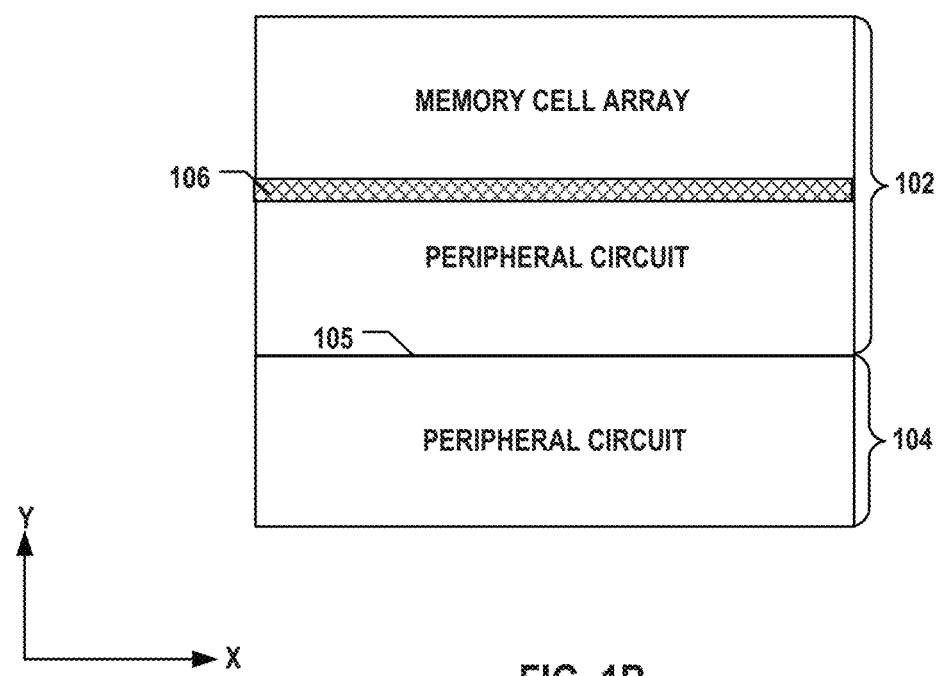
FIG. 1B illustrates a schematic view of a cross-section of another 3D memory device, according to some aspects of the present disclosure.

It is understood that the relative positions of stacked first and second semiconductor structures 102 and 104 are not limited and may vary in different examples. FIG. 1B illustrates a schematic view of a cross-section of another exemplary 3D memory device 101, according to some implementations. Different from 3D memory device 100 in FIG. 1A in which the memory cell array in first semiconductor structure is vertically between the peripheral circuits in first semiconductor structure 102 and the peripheral circuits in second semiconductor structure 104, in 3D memory device 101 in FIG. 1B, the peripheral circuits in first semiconductor structure 102 are vertically between the memory cell array in first semiconductor structure 102 and the peripheral circuits in second semiconductor structures. That is, second semiconductor structure 102 can be bonded to first semiconductor structure 102 on either side thereof, such as the side on which the memory cell array is formed in 3D memory device 100 in FIG. 1A, or the side on which the peripheral circuits are formed in 3D memory device 101 in FIG. 1B. As a result, in contrast to 3D memory device 100 in which bonding interface 103 is formed vertically between second semiconductor structure 104 and the memory cell array of first semiconductor structure 102, a bonding interface 105 is formed vertically between second semiconductor structure 104 and the peripheral circuits of first semiconductor structure 102. Similar to bonding interface 103, bonding interface 105 can be an interface between two semiconductor structures formed by any suitable bonding technologies as described below in detail, such as hybrid bonding, anodic bonding, fusion bonding, transfer bonding, adhesive bonding, eutectic bonding, to name a few.

As described below in detail, in some implementations, first and second semiconductor structures 102 and 104 can be fabricated separately (and in parallel in some implementations) by the parallel process, such that the thermal budget of fabricating one of first and second semiconductor structures 102 and 104 does not limit the processes of fabricating the other one. Moreover, a large number of interconnects (e.g., bonding contacts and/or ILVs/TSVs) can be formed across bonding interface 103 or 105 to make direct, short-distance (e.g., micron- or submicron-level) electrical connections between semiconductor structures 102 and 104, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer among the memory cell array and the different peripheral circuits in different semiconductor structures 102 and 104 can be performed through the interconnects (e.g., bonding contacts and/or ILVs/TSVs) across bonding interfaces 103 or 105 and through polysilicon layer 106. By vertically integrating first and second semiconductor structures 102 and 104, as well as vertically separating the memory cell array and the peripheral circuits into different planes in first semiconductor structure 102, the chip size can be reduced, and the memory cell density can be increased.

Figure 2:
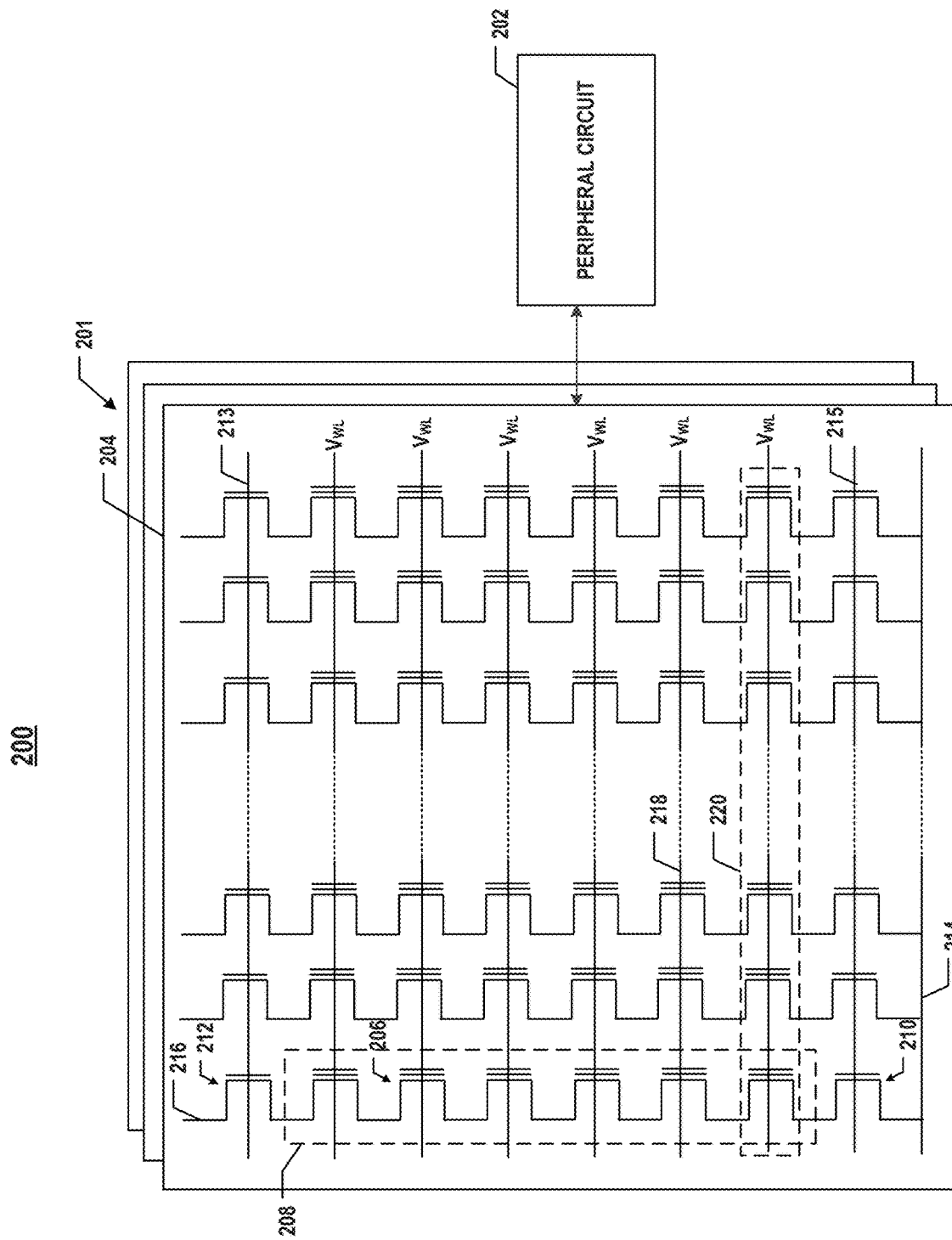
FIG. 2 illustrates a schematic circuit diagram of a memory device including peripheral circuits, according to some aspects of the present disclosure.

FIG. 2 illustrates a schematic circuit diagram of a memory device 200 including peripheral circuits, according to some aspects of the present disclosure. Memory device 200 can include a memory cell array 201 and peripheral circuits 202 coupled to memory cell array 201. 3D memory devices 100 and 101 may be examples of memory device 200 in which memory cell array 201 and at least two portions of peripheral circuits 202 may be included in different stacked semiconductor structures 102 and 104. Memory cell array 201 can be a NAND Flash memory cell array in which memory cells 206 are provided in the form of an array of NAND memory strings 208 each extending vertically above a substrate (not shown). In some implementations, each NAND memory string 208 includes a plurality of memory cells 206 coupled in series and stacked vertically. Each memory cell 206 can hold a continuous, analog value, such as an electrical voltage or charge, that depends on the number of electrons trapped within a region of memory cell 206. Each memory cell 206 can be either a floating gate type of memory cell including a floating-gate transistor or a charge trap type of memory cell including a charge-trap transistor.

In some implementations, each memory cell 206 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 206 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 2, each NAND memory string 208 can include a source select gate (SSG) transistor 210 at its source end and a drain select gate (DSG) transistor 212 at its drain end. SSG transistor 210 and DSG transistor 212 can be configured to activate selected NAND memory strings 208 (columns of the array) during read and program operations. In some implementations, SSG transistors 210 of NAND memory strings 208 in the same block 204 are coupled through a same source line (SL) 214, e.g., a common SL, for example, to the ground. DSG transistor 212 of each NAND memory string 208 is coupled to a respective bit line 216 from which data can be read or programmed via an output bus (not shown), according to some implementations. In some implementations, each NAND memory string 208 is configured to be selected or deselected by applying a select voltage (e.g., above the threshold voltage of DSG transistor 212) or a deselect voltage (e.g., 0 V) to respective DSG transistor 212 through one or more DSG lines 213 and/or by applying a select voltage (e.g., above the threshold voltage of SSG transistor 210) or a deselect voltage (e.g., 0 V) to respective SSG transistor 210 through one or more SSG lines 215.

As shown in FIG. 2, NAND memory strings 208 can be organized into multiple blocks 204, each of which can have a common source line 214. In some implementations, each block 204 is the basic data unit for erase operations, i.e., all memory cells 206 on the same block 204 are erased at the same time. Memory cells 206 of adjacent NAND memory strings 208 can be coupled through word lines 218 that select which row of memory cells 206 is affected by read and program operations. In some implementations, each word line 218 is coupled to a page 220 of memory cells 206, which is the basic data unit for program and read operations. The size of one page 220 in bits can correspond to the number of NAND memory strings 208 coupled by word line 218 in one block 204. Each word line 218 can include a plurality of control gates (gate electrodes) at each memory cell 206 in respective page 220 and a gate line coupling the control gates.

Figure 8:
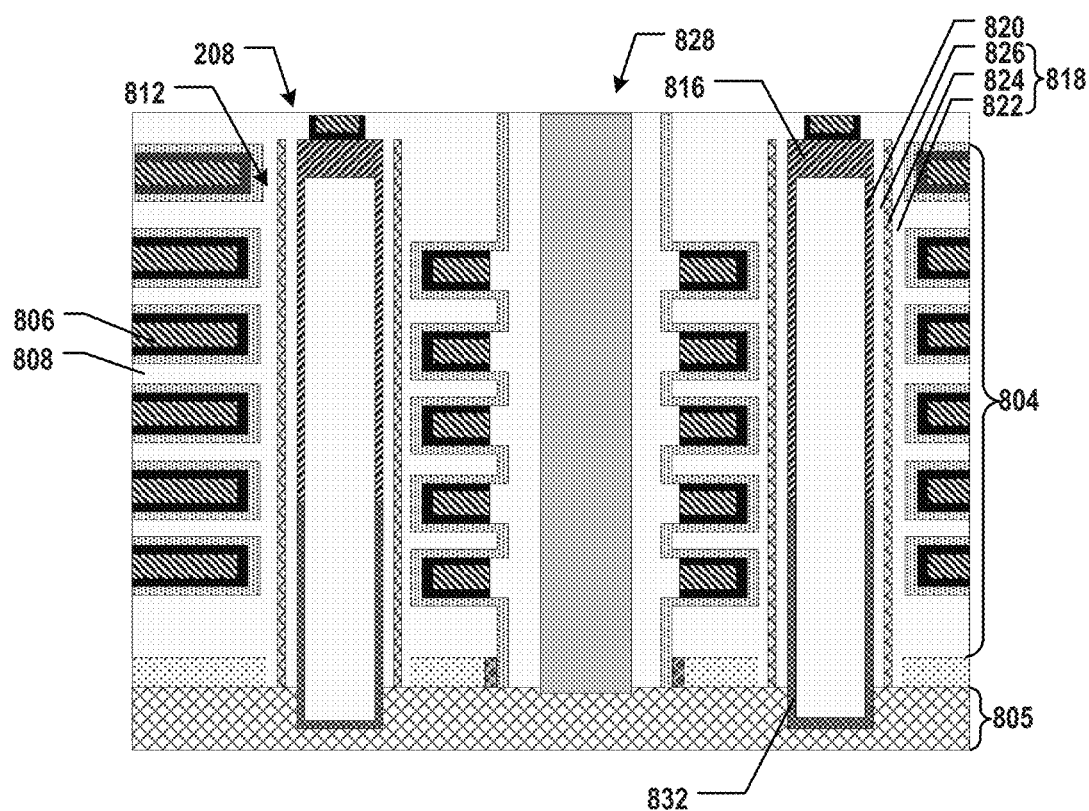
FIG. 8 illustrates a side view of a NAND memory string in 3D memory devices, according to some aspects of the present disclosure.

FIG. 8 illustrates a side view of NAND memory string 208 in 3D memory devices, according to some aspects of the present disclosure. As shown in FIG. 8, NAND memory string 208 can extend vertically through a memory stack 804 on a polysilicon layer 805. Polysilicon layer 805 may be an example of polysilicon layer 106 in FIGS. 1A and 1B. Memory stack 804 can include interleaved gate conductive layers 806 and dielectric layers 808. The number of the pairs of gate conductive layers 806 and dielectric layers 808 in memory stack 804 can determine the number of memory cells 206 in memory cell array 201. Gate conductive layer 806 can include conductive materials including, but not limited to, tungsten (W), cobalt (Co), copper (Cu), aluminum (Al), polysilicon, doped silicon, silicides, or any combination thereof. In some implementations, each gate conductive layer 806 includes a metal layer, such as a tungsten layer. In some implementations, each gate conductive layer 806 includes a doped polysilicon layer. Each gate conductive layer 806 can include control gates surrounding the memory cells, the gates of DSG transistors 212, or the gates of SSG transistors 210, and can extend laterally as DSG line 213 at the top of memory stack 804, SSG line 215 at the bottom of memory stack 804, or word line 218 between DSG line 213 and SSG line 215.

As shown in FIG. 8, NAND memory string 208 includes a channel structure 812 extending vertically through memory stack 804. In some implementations, channel structure 812 includes a channel hole filled with semiconductor material(s) (e.g., as a semiconductor channel 820) and dielectric material(s) (e.g., as a memory film 818). In some implementations, semiconductor channel 820 includes silicon, such as polysilicon. In some implementations, memory film 818 is a composite dielectric layer including a tunneling layer 826, a storage layer 824 (also known as a "charge trap/storage layer"), and a blocking layer 822. Channel structure 812 can have a cylinder shape (e.g., a pillar shape). Semiconductor channel 820, tunneling layer 826, storage layer 824, blocking layer 822 are arranged radially from the center toward the outer surface of the pillar in this order, according to some implementations. Tunneling layer 826 can include silicon oxide, silicon oxynitride, or any combination thereof. Storage layer 824 can include silicon nitride, silicon oxynitride, silicon, or any combination thereof. Blocking layer 822 can include silicon oxide, silicon oxynitride, high dielectric constant (high-k) dielectrics, or any combination thereof. In one example, memory film 818 may include a composite layer of silicon oxide/silicon oxynitride/ silicon oxide (ONO). Channel structure 812 can further include a channel plug 816 on the drain end of NAND memory string 208. Channel plug 816 can include polysilicon and be in contact with semiconductor channel 820.

In some implementations, polysilicon layer 805 is in contact with semiconductor channel 820 of channel structure 812 on the source end of NAND memory string 208. Parts of memory film 818 of channel structure 812 on the source end can be removed to expose semiconductor channel 820 to contact polysilicon layer 805. In some implementations, part of semiconductor channel 820 on the source end of NAND memory string 208 is doped to form a doped region 832 that is in contact with polysilicon layer 805. It is understood that in some examples, polysilicon layer 805 may be doped with the same dopant as doped region 832, and the dopants may diffuse to part of semiconductor channel 820 to form doped region 832. In some implementations, polysilicon layer 805 includes N-type doped polysilicon to enable GILD erase operations.

As shown in FIG. 8, a slit structure 828 does not include any conductors therein (e.g., a source contact) and thus, does not function as part of source line 214, according to some implementations. Instead, source contacts (not shown) may be formed on an opposite side of polysilicon layer 805 with respect to channel structure 812, such that the source contacts and parts of polysilicon layer 805 may function as parts of source line 214 coupled to the source of NAND memory string 208, for example, for applying an erase voltage to the source of NAND memory string 208 during erase operations.

Figure 3:
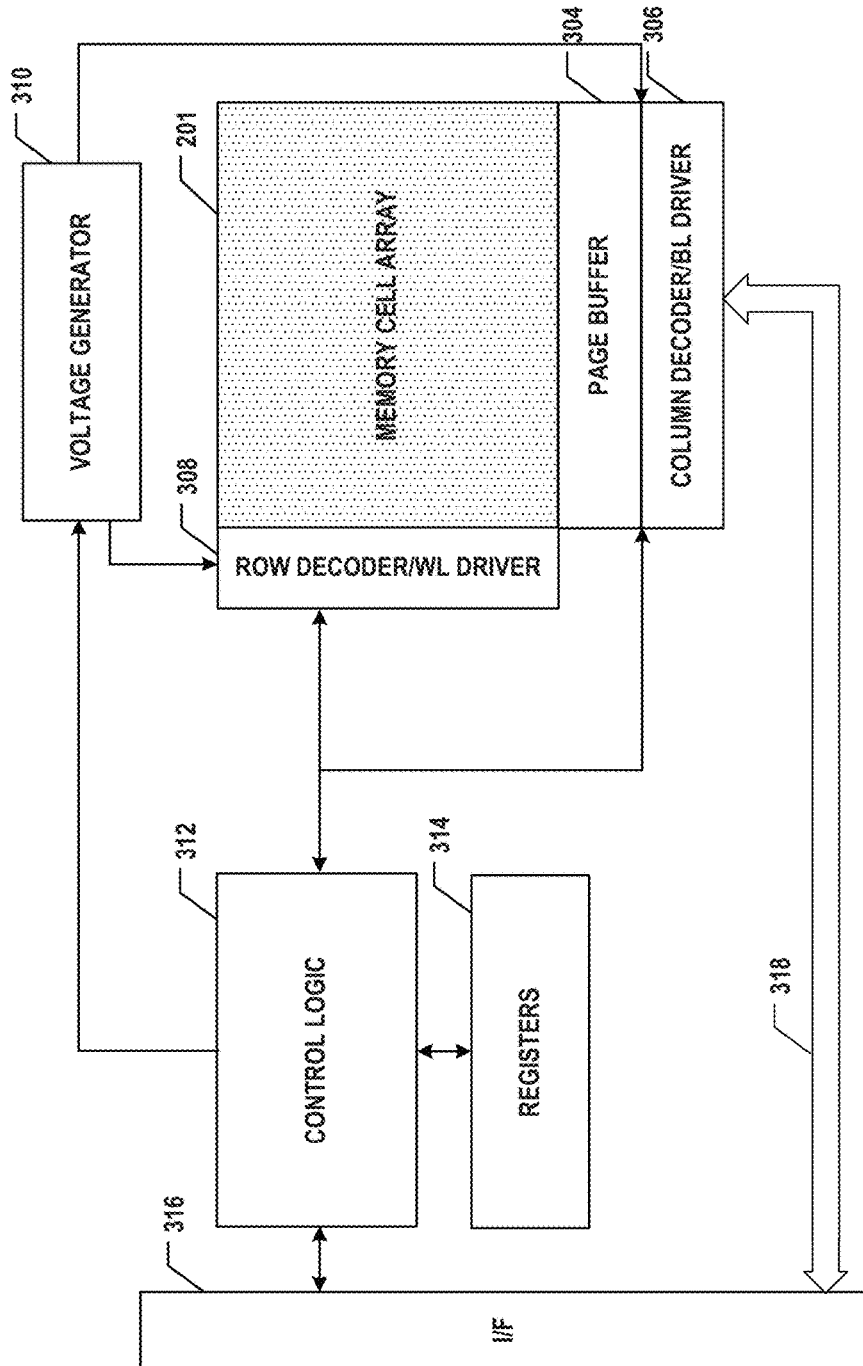
FIG. 3 illustrates a block diagram of a memory device including a memory cell array and peripheral circuits, according to some aspects of the present disclosure.

Referring back to FIG. 2, peripheral circuits 202 can be coupled to memory cell array 201 through bit lines 216, word lines 218, source lines 214, SSG lines 215, and DSG lines 213. As described above, peripheral circuits 202 can include any suitable circuits for facilitating the operations of memory cell array 201 by applying and sensing voltage signals and/or current signals through bit lines 216 to and from each target memory cell 206 through word lines 218, source lines 214, SSG lines 215, and DSG lines 213. Peripheral circuits 202 can include various types of peripheral circuits formed using CMOS technologies. For example, FIG. 3 illustrates some exemplary peripheral circuits 202 including a page buffer 304, a column decoder/bit line driver 306, a row decoder/word line driver 308, a voltage generator 310, control logic 312, registers 314, an interface (I/F) 316, and a data bus 318. It is understood that in some examples, additional peripheral circuits 202 may be included as well.

Page buffer 304 can be configured to buffer data read from or programmed to memory cell array 201 according to the control signals of control logic 312. In one example, page buffer 304 may store one page of program data (write data) to be programmed into one page 220 of memory cell array 201. In another example, page buffer 304 also performs program verify operations to ensure that the data has been properly programmed into memory cells 206 coupled to selected word lines 218.

Row decoder/word line driver 308 can be configured to be controlled by control logic 312 and select block 204 of memory cell array 201 and a word line 218 of selected block 204. Row decoder/word line driver 308 can be further configured to drive memory cell array 201. For example, row decoder/word line driver 308 may drive memory cells 206 coupled to the selected word line 218 using a word line voltage generated from voltage generator 310.

Column decoder/bit line driver 306 can be configured to be controlled by control logic 312 and select one or more 3D NAND memory strings 208 by applying bit line voltages generated from voltage generator 310. For example, column decoder/bit line driver 306 may apply column signals for selecting a set of N bits of data from page buffer 304 to be outputted in a read operation.

Control logic 312 can be coupled to each peripheral circuit 202 and configured to control operations of peripheral circuits 202. Registers 314 can be coupled to control logic 312 and include status registers, command registers, and address registers for storing status information, command operation codes (OP codes), and command addresses for controlling the operations of each peripheral circuit 202. Interface 316 can be coupled to control logic 312 and configured to interface memory cell array 201 with a memory controller (not shown). In some implementations, interface 316 acts as a control buffer to buffer and relay control commands received from the memory controller and/or a host (not shown) to control logic 312 and status information received from control logic 312 to the memory controller and/or the host. Interface 316 can also be coupled to page buffer 304 and column decoder/bit line driver 306 via data bus 318 and act as an I/O interface and a data buffer to buffer and relay the program data received from the memory controller and/or the host to page buffer 304 and the read data from page buffer 304 to the memory controller and/or the host. In some implementations, interface 316 and data bus 318 are parts of an I/O circuit of peripheral circuits 202.

Voltage generator 310 can be configured to be controlled by control logic 312 and generate the word line voltages (e.g., read voltage, program voltage, pass voltage, local voltage, and verification voltage) and the bit line voltages to be supplied to memory cell array 201. In some implementations, voltage generator 310 is part of a voltage source that provides voltages at various levels of different peripheral circuits 202, as described below in detail. Consistent with the scope of the present disclosure, in some implementations, the voltages provided by voltage generator 310, for example, to row decoder/word line driver 308, column decoder/bit line driver 306, and page buffer 304 are above certain levels that are sufficient to perform the memory operations. For example, the voltages provided to the page buffer circuits in page buffer 304 and/or the logic circuits in control logic 312 may be between 2 V and 3.3 V, such as 3.3 V, and the voltages provided to the driving circuits in row decoder/word line driver 308 and/or column decoder/bit line driver 306 may be between 5 V and 30 V.

Figure 4A:
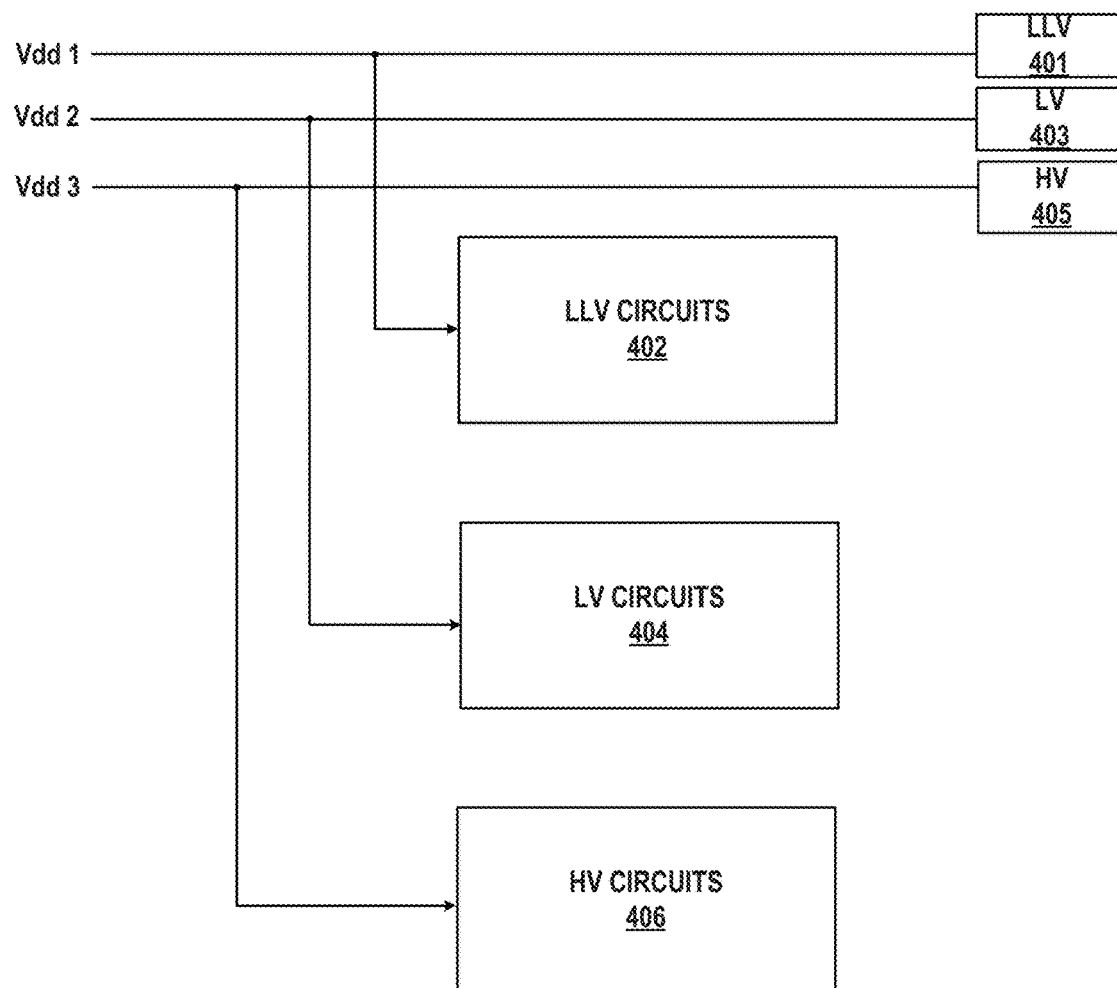
FIG. 4A illustrates a block diagram of peripheral circuits provided with various voltages, according to some aspects of the present disclosure.

Different from logic devices (e.g., microprocessors), memory devices, such as 3D NAND Flash memory, require a wide range of voltages to be supplied to different memory peripheral circuits. For example, FIG. 4A illustrates a block diagram of peripheral circuits provided with various voltages, according to some aspects of the present disclosure. In some implementations, a memory device (e.g., memory device 200) includes a low low voltage (LLV) source 401, a low voltage (LV) source 403, and a high voltage (HV) source 405, each of which is configured to provide a voltage at a respective level (Vdd1, Vdd2, or Vdd3). For example, Vdd3>Vdd2>Vdd1. Each voltage source 401, 403, or 405 can receive a voltage input at a suitable level from an external power source (e.g., a battery). Each voltage source 401, 403, or 405 can also include voltage converters and/or voltage regulators to convert the external voltage input to the respective level (Vdd1, Vdd2, or Vdd3) and maintain and output the voltage at the respective level (Vdd1, Vdd2, or Vdd3) through a corresponding power rail. In some implementations, voltage generator 310 of memory device 200 is part of voltage sources 401, 403, and 405.

In some implementations, LLV source 401 is configured to provide a voltage below 2 V, such as between 0.9 V and 2 V (e.g., 0.9 V, 0.95 V, 1 V, 1.05 V, 1.1 V, 1.15 V, 1.2 V, 1.25 V, 1.3 V, 1.35 V, 1.4 V, 1.45V, 1.5V, 1.55 V, 1.6 V, 1.65 V, 1.7 V, 1.75 V, 1.8 V, 1.85 V, 1.9 V, 1.95 V, any range bounded by the lower end by any of these values, or in any range defined by any two of these values). In one example, the voltage is 1.2 V. In some implementations, LV source 403 is configured to provide a voltage between 2 V and 3.3 V (e.g., 2 V, 2.1 V, 2.2 V, 2.3 V, 2.4 V, 2.5 V, 2.6 V, 2.7 V, 2.8 V, 2.9 V, 3 V, 3.1 V, 3.2 V, 3.3 V, any range bounded by the lower end by any of these values, or in any range defined by any two of these values). In one example, the voltage is 3.3 V. In some implementations, HV source 405 is configured to provide a voltage greater than 3.3 V, such as between 5 V and 30 V (e.g., 5 V, 6 V, 7 V, 8 V, 9 V, 10 V, 11 V, 12 V, 13V, 14V, 15V, 16V, 17V, 18V, 19 V, 20 V, 21 V, 22 V, 23 V, 24 V, 25 V, 26 V, 27 V, 28 V, 29 V, 30 V, any range bounded by the lower end by any of these values, or in any range defined by any two of these values). It is understood that the voltage ranges described above with respect to HV source 405, LV source 403, and LLV source 401 are for illustrative purposes and non-limiting, and any other suitable voltage ranges may be provided by HV source 405, LV source 403, and LLV source 401.

Based on their suitable voltage levels (Vdd1, Vdd 2, or Vdd3), the memory peripheral circuits (e.g., peripheral circuits 202) can be categorized into LLV circuits 402, LV circuits 404, and HV circuits 406, which can be coupled to LLV source 401, LV source 403, and HV source 405, respectively. In some implementations, HV circuits 406 include one or more driving circuits that are coupled to the memory cell array (e.g., memory cell array 201) through word lines, bit lines, SSG lines, DSG lines, source lines, etc., and configured to drive the memory cell array by applying a voltage at a suitable level to the word lines, bit lines, SSG lines, DSG lines, source lines, etc., when performing memory operations (e.g., read, program, or erase). In one example, HV circuit 406 may include word line driving circuits (e.g., in row decoder/word line driver 308) that are coupled to word lines and apply a program voltage (Vprog) or a pass voltage (Vpass) in the range of, for example, 5 V and 30 V, to the word lines during program operations. In another example, HV circuit 406 may include bit line driving circuits (e.g., in column decoder/bit line driver 306) that are coupled to bit lines and apply an erase voltage (Veras) in the range of, for example, 5 V and 30 V, to bit lines during erase operations. In some implementations, LV circuits 404 include page buffer circuits (e.g., in latches of page buffer 304) and are configured to buffer the data read from or programmed to the memory cell array. For example, the page buffer may be provided with a voltage of, for example, 3.3 V, by LV source 403. LV circuits 404 can also include logic circuits (e.g., in control logic 312). In some implementations, LLV circuits 402 include an I/O circuit (e.g., in interface 316 and/or data bus 318) configured to interface the memory cell array with a memory controller. For example, the I/O circuit may be provided with a voltage of, for example, 1.2 V, by LLV source 401.

Figure 4B:
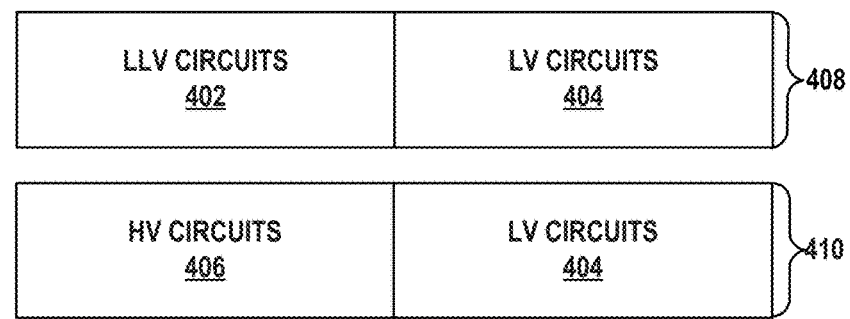
FIG. 4B illustrates a schematic diagram of peripheral circuits provided with various voltages arranged in separate semiconductor structures, according to some aspects of the present disclosure.

As described above, to reduce the total area occupied by the memory peripheral circuits, peripheral circuits 202 can be separately formed in different planes based on different performance requirements, such as the applied voltages. For example, FIG. 4B illustrates a schematic diagram of peripheral circuits provided with various voltages arranged in separate semiconductor structures, according to some aspects of the present disclosure. In some implementations, LLV circuits 402 and HV circuits 406 are separated, for example, in semiconductor structures 408 and 410, respectively, due to their significant difference in voltages and the resulting difference in device dimensions, such as different substrate thicknesses and different gate dielectric thicknesses. In one example, the thickness of the semiconductor layer (e.g., a substrate or a thinned substrate) in which HV circuits 406 are formed in semiconductor structure 410 may be larger than the thickness of the semiconductor layer (e.g., a substrate or a thinned substrate) in which LLV circuits 402 are formed in semiconductor structure 408. In another example, the thickness of the gate dielectric of transistors forming HV circuits 406 may be larger than the thickness of the gate dielectric of transistors forming LLV circuits 402. For example, the thickness difference may be at least 5-fold. It is understood that stacked LLV circuits 402 and HV circuits 406 in different planes may be formed in two semiconductor structure 408 or 410 separated by a bonding interface (e.g., in FIGS. 1A and 1B).

LV circuits 404 can be formed in either semiconductor structure 408 or 410, or in another semiconductor, i.e., in the same plane as LLV circuits 402 or HV circuits 406, or a different plane from LLV circuits 402 and HV circuits 406. As shown in FIG. 4B, in some implementations, some of LV circuits 404 are formed in semiconductor structure 408, i.e., in the same plane as LLV circuits 402, while some of LV circuits 404 are formed in semiconductor structure 410, i.e., in the same plane as HV circuits 406. That is, LV circuits 404 can be separated into different planes as well. The thickness of the gate dielectric of transistors forming LV circuits 404 in semiconductor structure 408 can be the same as the thickness of the gate dielectric of transistors forming LV circuits 404 in semiconductor structure 410, for example, when the same voltage is applied to LV circuits 404 in different semiconductor structures 408 and 410. In some implementations, the same voltage is applied to both LV circuits 404 in semiconductor structure 408 and the LV circuits 404 in semiconductor structure 410, such that the voltage applied to HV circuits 406 in semiconductor structure 410 is higher than the voltage applied to LV circuits 404 in semiconductor structure 408 or 410, which is in turn higher than the voltage applied to LLV circuits 402 in semiconductor structure 408. Moreover, since the voltage applied to LV circuits 404 is between the voltages applied to HV circuits 406 and LLV circuits 402, the thickness of the gate dielectric of transistors forming LV circuits 404 is between the thickness of the gate dielectric of transistors forming HV circuits 406 and the thickness of the gate dielectric of transistors forming LLV circuits 402, according to some implementations. For example, the gate dielectric thickness of transistors forming LV circuits 404 may be larger than the gate dielectric thickness of transistors forming LLV circuits 402, but smaller than the gate dielectric thickness of transistors forming HV circuits 406.

Figure 7:
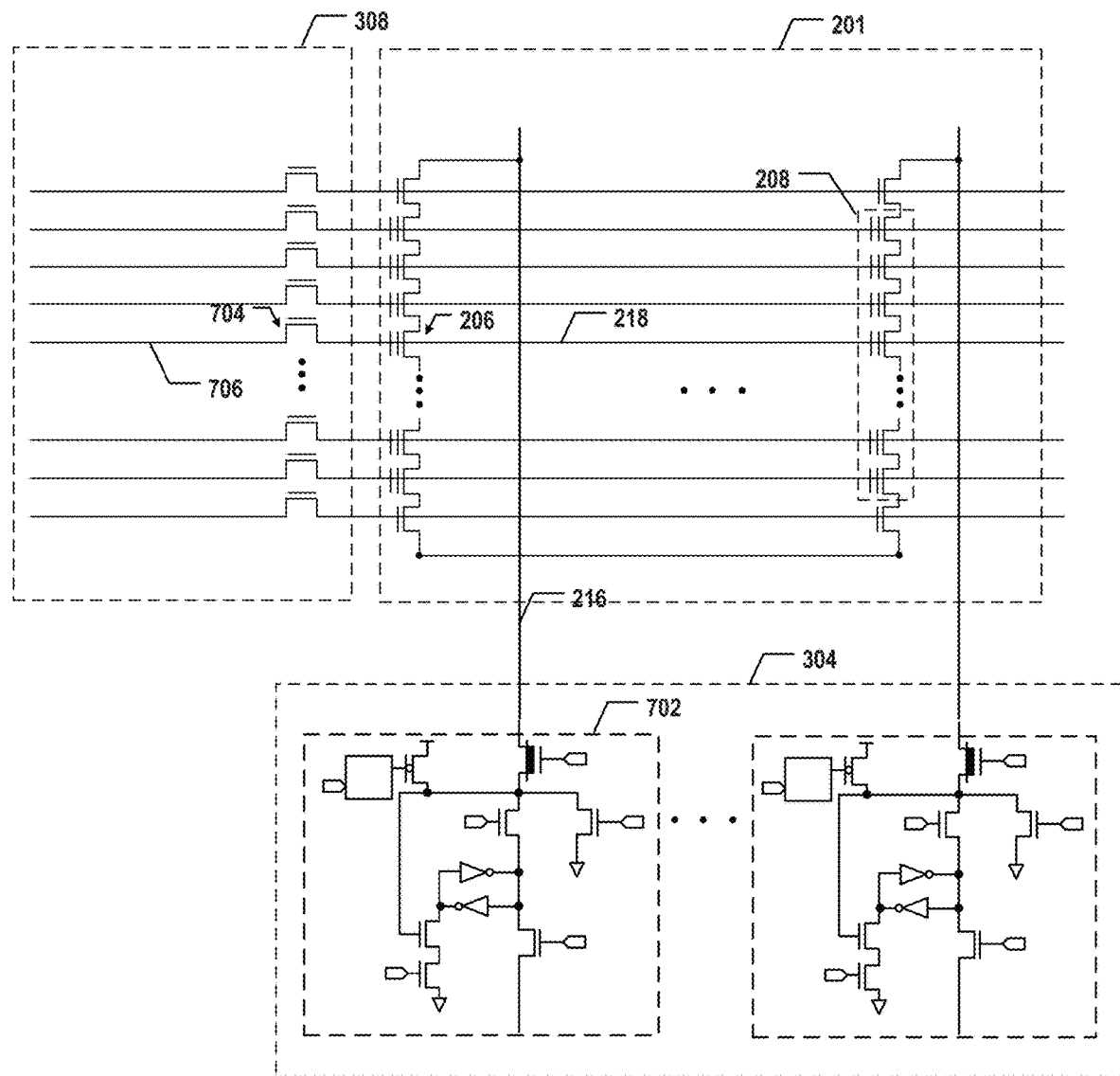
FIG. 7 illustrates a circuit diagram of a word line driver and a page buffer, according to some aspects of the present disclosure.

Based on the different performance requirements (e.g., associated with different applied voltages), peripheral circuits 202 can be separated into at least two stacked semiconductor structures 408 and 410 in different planes. In some implementations, the I/O circuits in interface 316 and/or data bus 318 (as LLV circuits 402) and logic circuits in control logic 312 (as part of LV circuits) are disposed in semiconductor structure 408, while the page buffer circuits in page buffer 304 and driving circuits in row decoder/word line driver 308 and column decoder/bit line driver 306 are disposed in semiconductor structure 410. For example, FIG. 7 illustrates a circuit diagram of word line driver 308 and page buffer 304, according to some aspects of the present disclosure.

In some implementations, page buffer 304 includes a plurality of page buffer circuits 702 each coupled to one NAND memory string 208 via a respective bit line 216. That is, memory device 200 can include bit lines 216 respectively coupled to NAND memory strings 208, and page buffer 304 can include page buffer circuits 702 respectively coupled to bit lines 216 and NAND memory strings 208. Each page buffer circuit 702 can include one or more latches, switches, supplies, nodes (e.g., data nodes and I/O nodes), current mirrors, verify logic, sense circuits, etc. In some implementations, each page buffer circuit 702 is configured to store sensing data corresponding to read data, which is received from a respective bit line 216, and output the stored sensing data to at the time of the read operation; each page buffer circuit 702 is also configured to store program data and output the stored program data to a respective bit line 216 at the time of the program operation.

In some implementations, word line driver 308 includes a plurality of string drivers 704 (a.k.a. driving circuits) respectively coupled to word lines 218. Word line driver 308 can also include a plurality of local word lines 706 (LWLs) respectively coupled to string drivers 704. Each string driver 704 can include a gate coupled to a decoder (not shown), a source/drain coupled to a respective local word line 706, and another source/drain coupled to a respective word line 218. In some memory operations, the decoder can select certain string drivers 704, for example, by applying a voltage signal greater than the threshold voltage of string drivers 704, and a voltage (e.g., program voltage, pass voltage, or erase voltage) to each local word line 706, such that the voltage is applied by each selected string driver 704 to a respective word line 218. In contrast, the decoder can also deselect certain string drivers 704, for example, by applying a voltage signal smaller than the threshold voltage of string drivers 704, such that each deselected string driver 704 floats a respective word line 218 during the memory operation.

In some implementations, page buffer circuits 702 include parts of LV circuits 404 disposed in semiconductor structures 408 and/or 410. In one example, since the number of page buffer circuits 702 increases as the number of bit numbers increases, which may occupy a large area for memory devices with large numbers of memory cells, page buffer circuits 702 may be to semiconductor structures 408 and 410. In some implementations, string drivers 704 include parts of HV circuits 406 disposed in semiconductor structure 410.

Figure 5A:
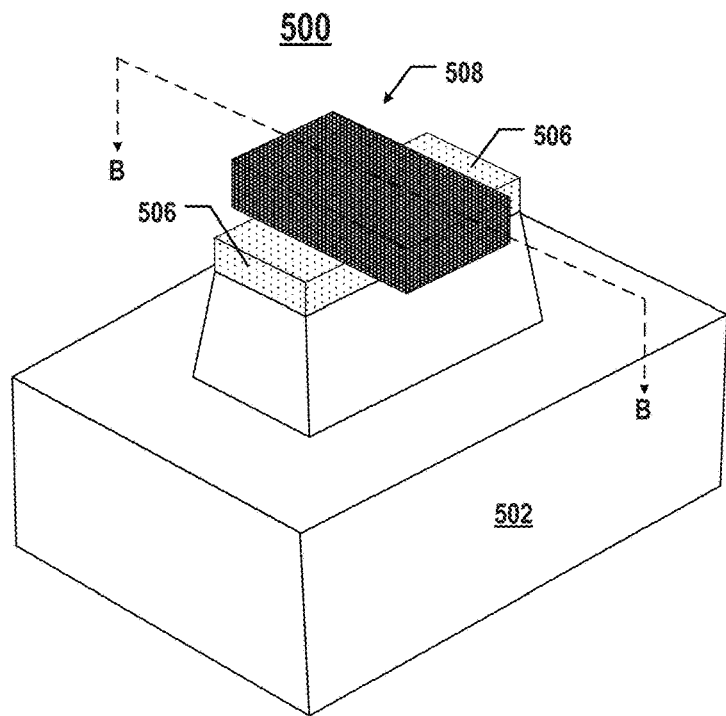
FIGS. 5A and 5B illustrate a perspective view and a side view, respectively, of a planar transistor, according to some aspects of the present disclosure.
Figure 5B:
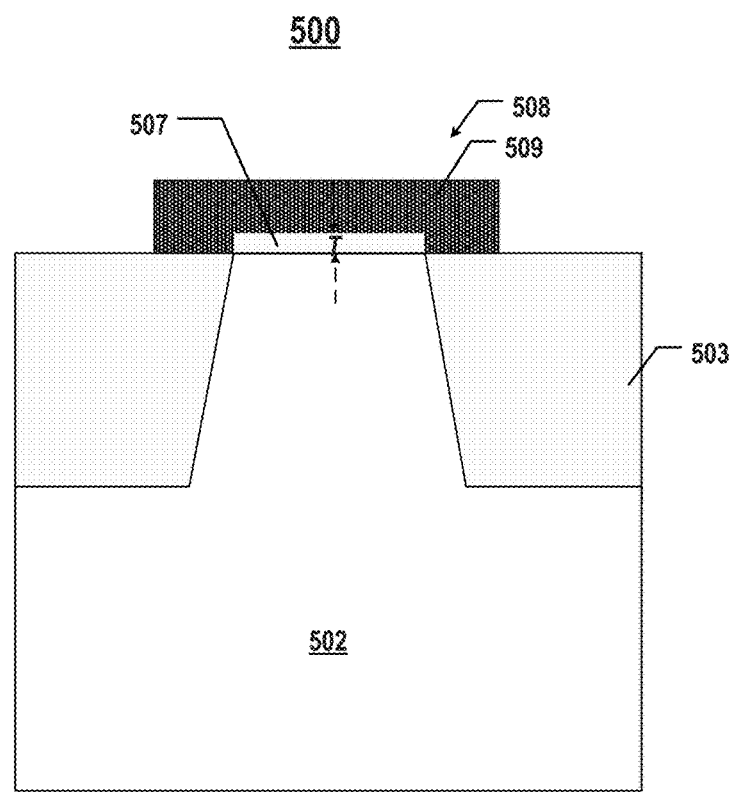
Figure 6A:
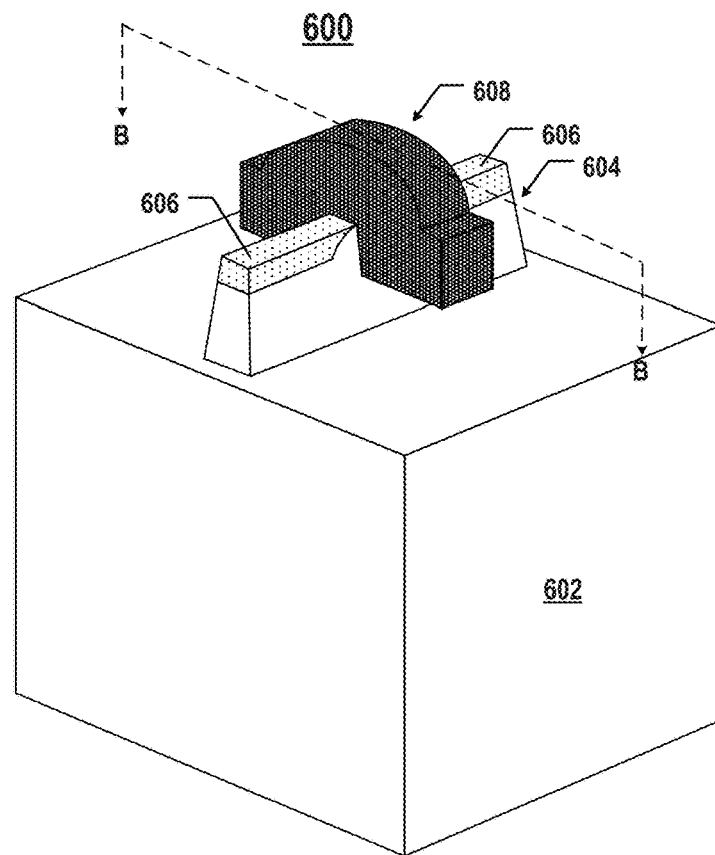
FIGS. 6A and 6B illustrate a perspective view and a side view, respectively, of a 3D transistor, according to some aspects of the present disclosure.
Figure 6B:
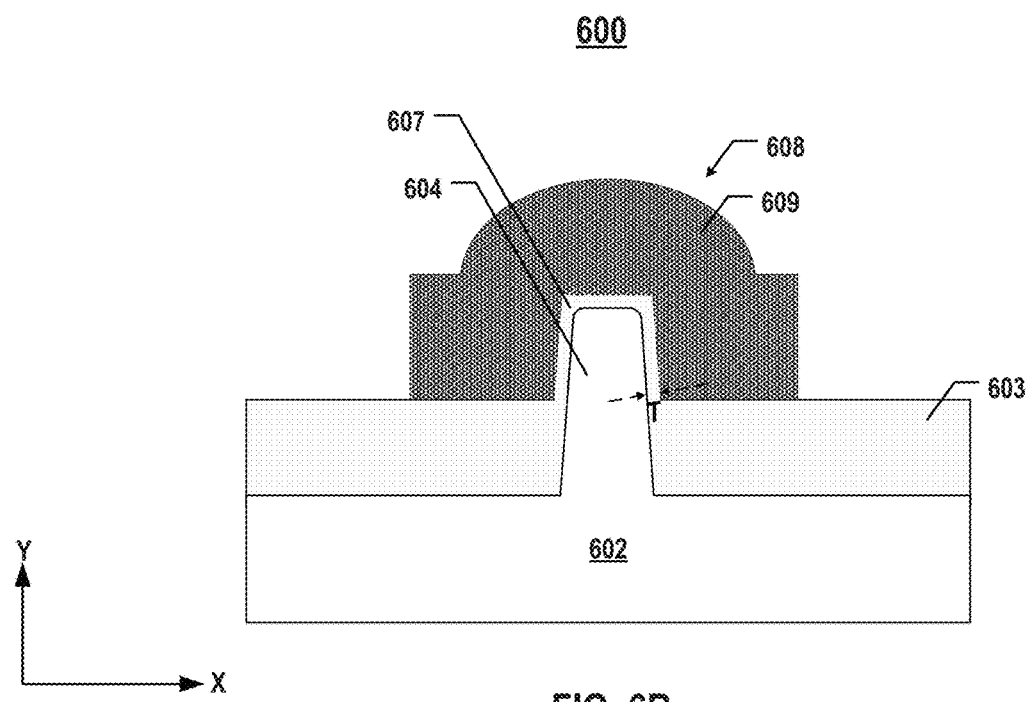

Consistent with the scope of the present disclosure, each peripheral circuit 202 can include a plurality of transistors as the basic building units thereof. The transistors can be metal-oxide-semiconductor field-effect-transistors (MOSFETs) in 2D (2D transistors, a.k.a. planar transistors) or 3D (3D transistors). For example, FIGS. 5A and 5B illustrate a perspective view and a side view, respectively, of a planar transistor 500, according to some aspects of the present disclosure, and FIGS. 6A and 6B illustrate a perspective view and a side view, respectively, of a 3D transistor 600, according to some aspects of the present disclosure. FIG. 5B illustrates the side view of the cross-section of planar transistor 500 in FIG. 5A in the BB plane, and FIG. 6B illustrates the side view of the cross-section of 3D transistor 600 in FIG. 6A in the BB plane.

As shown in FIGS. 5A and 5B, planar transistor 500 can be a MOSFET on a substrate 502, which can include silicon (e.g., single crystalline silicon, c-Si), silicon germanium (SiGe), gallium arsenide (GaAs), germanium (Ge), silicon on insulator (SOI), germanium on insulator (GOI), or any other suitable semiconductor materials. Trench isolations 503, such as shallow trench isolations (STI), can be formed in substrate 502 and between adjacent planar transistors 500 to reduce current leakage. Trench isolations 503 can include any suitable dielectric materials, such as silicon oxide, silicon nitride, silicon oxynitride, or high dielectric constant (high-k) dielectrics (e.g., aluminum oxide, hafnium oxide, zirconium oxide, etc.). In some implementations, high-k dielectric materials include any dielectrics having a dielectric constant, or k-value, higher than that of silicon nitride (k>7). In some implementations, trench isolation 503 includes silicon oxide.

As shown in FIGS. 5A and 5B, planar transistor 500 can also include a gate structure 508 on substrate 502. In some implementations, gate structure 508 is on the top surface of substrate 502. As shown in FIG. 5B, gate structure 508 can include a gate dielectric 507 on substrate 502, i.e., above and in contact with the top surface of substrate 502. Gate structure 508 can also include a gate electrode 509 on gate dielectric 507, i.e., above and in contact with gate dielectric 507. Gate dielectric 507 can include any suitable dielectric materials, such as silicon oxide, silicon nitride, silicon oxynitride, or high-k dielectrics. In some implementations, gate dielectric 507 includes silicon oxide, i.e., a gate oxide. Gate electrode 509 can include any suitable conductive materials, such as polysilicon, metals (e.g., W, Cu, Al, etc.), metal compounds (e.g., TiN, TaN, etc.), or silicides. In some implementations, gate electrode 509 includes doped polysilicon, i.e., a gate poly.

As shown in FIGS. 5A, planar transistor 500 can further include a pair of a source and a drain 506 in substrate 502. Source and drain 506 can be doped with any suitable P-type dopants, such as boron (B) or Gallium (Ga), or any suitable N-type dopants, such as phosphorus (P) or arsenic (Ar). Source and drain 506 can be separated by gate structure 508 in the plan view. In other words, gate structure 508 is formed between source and drain 506 in the plan view, according to some implementations. The channel of planar transistor 500 in substrate 502 can be formed laterally between source and drain 506 under gate structure 508 when a gate voltage applied to gate electrode 509 of gate structure 508 is above the threshold voltage of planar transistor 500. As shown in FIGS. 5A and 5B, gate structure 508 can be above and in contact with the top surface of the part of substrate 502 in which the channel can be formed (the active region). That is, gate structure 508 is in contact with only one side of the active region, i.e., in the plane of the top surface of substrate 502, according to some implementations. It is understood, although not shown in FIGS. 5A and 5B, planar transistor 500 may include additional components, such as wells and spacers.

As shown in FIGS. 6A and 6B, 3D transistor 600 can be a MOSFET on a substrate 602, which can include silicon (e.g., single crystalline silicon, c-Si), SiGe, GaAs, Ge, silicon on insulator SOI, or any other suitable materials. In some implementations, substrate 602 includes single crystalline silicon. Trench isolations 603, such as STI, can be formed in substrate 602 and between adjacent 3D transistors 600 to reduce current leakage. Trench isolations 603 can include any suitable dielectric materials, such as silicon oxide, silicon nitride, silicon oxynitride, or high-k dielectrics (e.g., aluminum oxide, hafnium oxide, zirconium oxide, etc.). In some implementations, trench isolation 603 includes silicon oxide.

As shown in FIGS. 6A and 6B, different from planar transistor 500, 3D transistor 600 can further include a 3D semiconductor body 604 above substrate 602. That is, in some implementations, 3D semiconductor body 604 at least partially extends above the top surface of substrate 602 to expose not only the top surface, but also the two side surfaces, of 3D semiconductor body 604. As shown in FIGS. 6A and 6B, for example, 3D semiconductor body 604 may be in a 3D structure, which is also known as a "fin," to expose three sides thereof. 3D semiconductor body 604 is formed from substrate 602 and thus, has the same semiconductor material as substrate 602, according to some implementations. In some implementations, 3D semiconductor body 604 includes single crystalline silicon. Since the channels can be formed in 3D semiconductor body 604, as opposed to substrate 602, 3D semiconductor body 604 may be viewed as the active region for 3D transistor 600.

As shown in FIGS. 6A and 6B, 3D transistor 600 can also include a gate structure 608 on substrate 602. Different from planar transistors 500 in which gate structure 508 is in contact with only one side of the active region, i.e., in the plane of the top surface of substrate 502, gate structure 608 of 3D transistor 600 can be in contact with a plurality of sides of the active region, i.e., in multiple planes of the top surface and side surfaces of the 3D semiconductor body 604. In other words, the active region of 3D transistor 600, i.e., 3D semiconductor body 604, can be at least partially surrounded by gate structure 608.

Gate structure 608 can include a gate dielectric 607 over 3D semiconductor body 604, e.g., in contact with the top surface and two side surfaces of 3D semiconductor body 604. Gate structure 608 can also include a gate electrode 609 over and in contact with gate dielectric 607. Gate dielectric 607 can include any suitable dielectric materials, such as silicon oxide, silicon nitride, silicon oxynitride, or high-k dielectrics. In some implementations, gate dielectric 607 includes silicon oxide, i.e., a gate oxide. Gate electrode 609 can include any suitable conductive materials, such as polysilicon, metals (e.g., W, Cu, Al, etc.), metal compounds (e.g., TiN, TaN, etc.), or silicides. In some implementations, gate electrode 609 includes doped polysilicon, i.e., a gate poly.

As shown in FIG. 6A, 3D transistor 600 can further include a pair of a source and a drain 606 in 3D semiconductor body 604. Source and drain 606 can be doped with any suitable P-type dopants, such as B or Ga, or any suitable N-type dopants, such as P or Ar. Source and drain 606 can be separated by gate structure 608 in the plan view. In other words, gate structure 608 is formed between source and drain 606 in the plan view, according to some implementations. As a result, multiple channels of 3D transistor 600 in 3D semiconductor body 604 can be formed laterally between source and drain 606 surrounded by gate structure 608 when a gate voltage applied to gate electrode 609 of gate structure 608 is above the threshold voltage of 3D transistor 600. Different from planar transistor 500 in which only a single channel can be formed on the top surface of substrate 502, multiple channels can be formed on the top surface and side surfaces of 3D semiconductor body 604 in 3D transistor 600. In some implementations, 3D transistor 600 includes a multi-gate transistor. It is understood, although not shown in FIGS. 6A, and 6B, 3D transistor 600 may include additional components, such as wells, spacers, and stressors (a.k.a. strain elements) at source and drain 606.

It is further understood that FIGS. 6A and 6B illustrate one example of 3D transistors that can be used in memory peripheral circuits, and any other suitable 3D multi-gate transistors may be used in memory peripheral circuits as well, including, for example, a gate all around (GAA) silicon on nothing (SON) transistor, a multiple independent gate FET (MIGET), a trigate FET, a Π-gate FET, and a Ω-FET, a quadruple gate FET, a cylindrical FET, or a multi-bridge/stacked nanowire FET.

Regardless of planar transistor 500 or 3D transistor 600, each transistor a memory peripheral circuit can include a gate dielectric (e.g., gate dielectrics 507 and 607) having a thickness T (gate dielectric thickness, e.g., shown in FIGS. 5B and 6B). The gate dielectric thickness T of a transistor can be designed to accommodate the voltage applied to the transistor. For example, referring back to FIGS. 4A and 4B, the gate dielectric thickness of transistors in HV circuits 406 (e.g., driving circuits such as string drivers 704) may be larger than the gate dielectric thickness of transistors in LV circuits 404 (e.g., page buffer circuits 702 or logic circuits in control logic 312), which may be in turn larger than the gate dielectric thickness of transistors in LLV circuits 402 (e.g., I/O circuits in interface 316 and data bus 318). In some implementations, the difference between the gate dielectric thickness of transistors in HV circuits 406 and the dielectric thickness of transistors in LLV circuits 402 is at least 5-fold, such as between 5-fold and 50-fold. For example, the gate dielectric thickness of transistors in HV circuits 406 may be at least 5 times larger than the gate dielectric thickness of transistors in LLV circuits 402.

In some implementations, the dielectric thickness of transistors in LLV circuits 402 is between 2 nm and 4 nm (e.g., 2 nm, 2.1 nm, 2.2 nm, 2.3 nm, 2.4 nm, 2.5 nm, 2.6 nm, 2.7 nm, 2.8 nm, 2.9 nm, 3 nm, 3.1 nm, 3.2 nm, 3.3 nm, 3.4 nm, 3.5 nm, 3.6 nm, 3.7 nm, 3.8 nm, 3.9 nm, 4 nm, any range bounded by the lower end by any of these values, or in any range defined by any two of these values). It is understood that the thickness may be commensurate with the LLV voltage range applied to LLV circuits 402, as described above in detail, such as below 2 V (e.g., 1.2 V). In some implementations, the dielectric thickness of transistors in LV circuits 404 is between 4 nm and 10 nm (e.g., 4 nm, 4.5 nm, 5 nm, 5.5 nm, 6 nm, 6.5 nm, 7 nm, 7.5 nm, 8 nm, 8.5 nm, 9 nm. 9.5 nm, 10 nm, any range bounded by the lower end by any of these values, or in any range defined by any two of these values). It is understood that the thickness may be commensurate with the LV voltage range applied to LV circuits 404, as described above in detail, such as between 2 V and 3.3 V (e.g., 3.3 V). In some implementations, the dielectric thickness of transistors in HV circuits 406 is between 20 nm and 100 nm (e.g., 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 45 nm, 50 nm, 55 nm, 60 nm, 65 nm, 70 nm, 75 nm, 80 nm, 85 nm, 90 nm, 95 nm, 100 nm, any range bounded by the lower end by any of these values, or in any range defined by any two of these values). It is understood that the thickness may be commensurate with the HV voltage range applied to HV circuits 406, as described above in detail, such as greater than 3.3 V (e.g., between 5 V and 30 V).

Figure 9A:
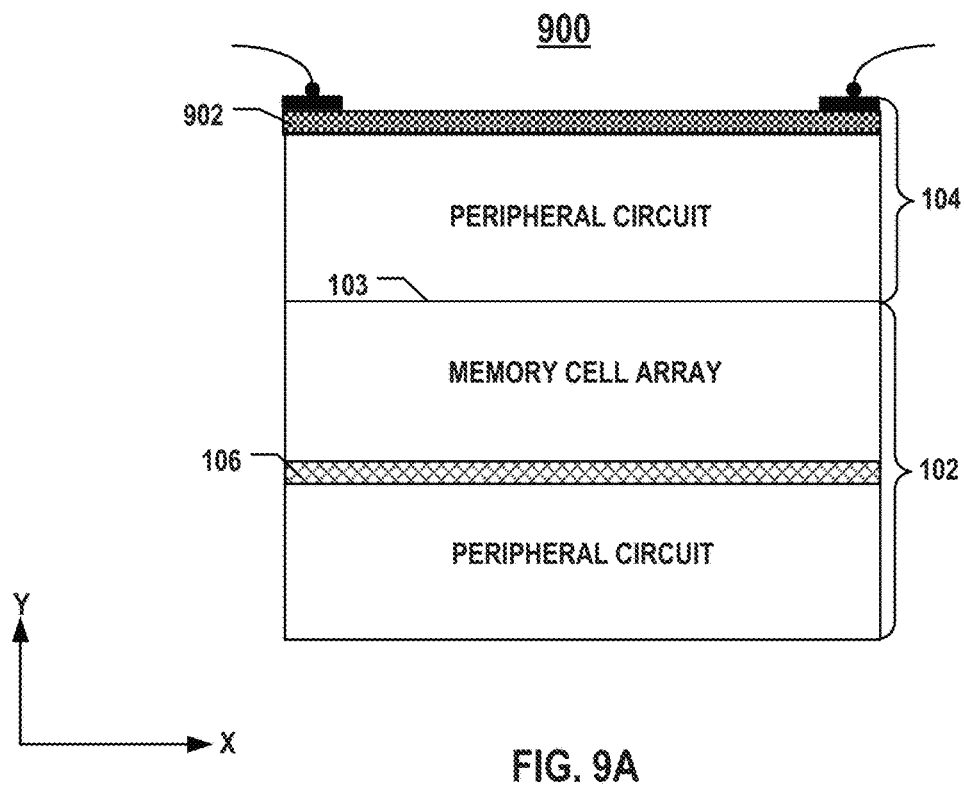
FIGS. 9A and 9B illustrate schematic views of cross-sections of 3D memory devices having two stacked semiconductor structures, according to various aspects of the present disclosure.
Figure 9B:
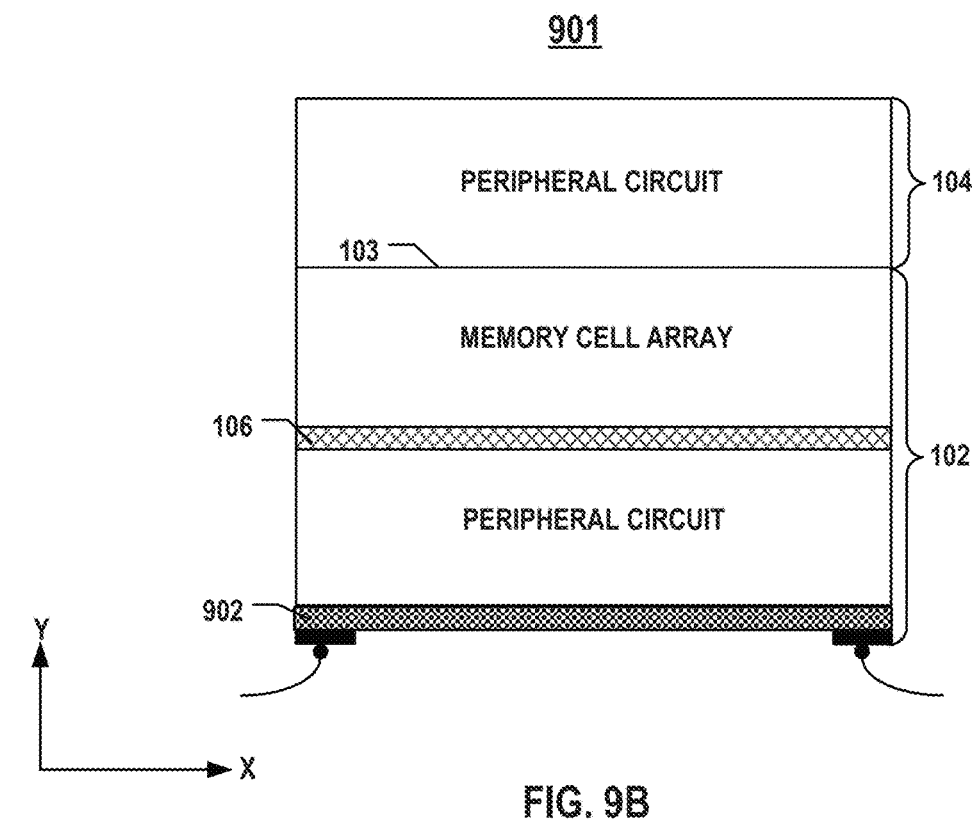

FIGS. 9A and 9B illustrate schematic views of cross-sections of 3D memory devices 900 and 901 having two stacked semiconductor structures, according to various aspects of the present disclosure. 3D memory devices 900 and 901 may be examples of 3D memory device 100 in FIG. 1A in which the memory array cell of first semiconductor structure 102 is disposed vertically between the peripheral circuits of first semiconductor structure 102 and the peripheral circuits of second semiconductor structure 104. That is, the two separate portions of the peripheral circuits can be disposed on the two sides of 3D memory device 900 or 901, respectively, in the vertical direction. As shown in FIGS. 9A and 9B, second semiconductor structure 104 including some of the peripheral circuits is bonded to first semiconductor structure 102 on the side having the memory cell array to form bonding interface 103 between second semiconductor structure 104 and the memory cell array of first semiconductor structure 102, according to some implementations.

Moreover, as shown in FIGS. 9A and 9B, 3D memory device 900 or 901 can further include a pad-out interconnect layer 902 for pad-out purposes, i.e., interconnecting with external devices using contact pads on which bonding wires can be soldered. In one example shown in FIG. 9A, second semiconductor structure 104 including some of the peripheral circuits on one side of 3D memory device 900 may include pad-out interconnect layer 902. In another example shown in FIG. 9B, first semiconductor structure 102 including the memory cell array and some of the peripheral circuits on another side of 3D memory device 901 may include pad-out interconnect layer 902, such that 3D memory device 901 may be pad-out from another peripheral circuit side. In either example, 3D memory device 900 or 901 may be pad-out from a peripheral circuit side to reduce the interconnect distance between contact pads and the peripheral circuits, thereby decreasing the parasitic capacitance from the interconnects and improving the electrical performance of 3D memory device 900 or 901.

Figure 10:
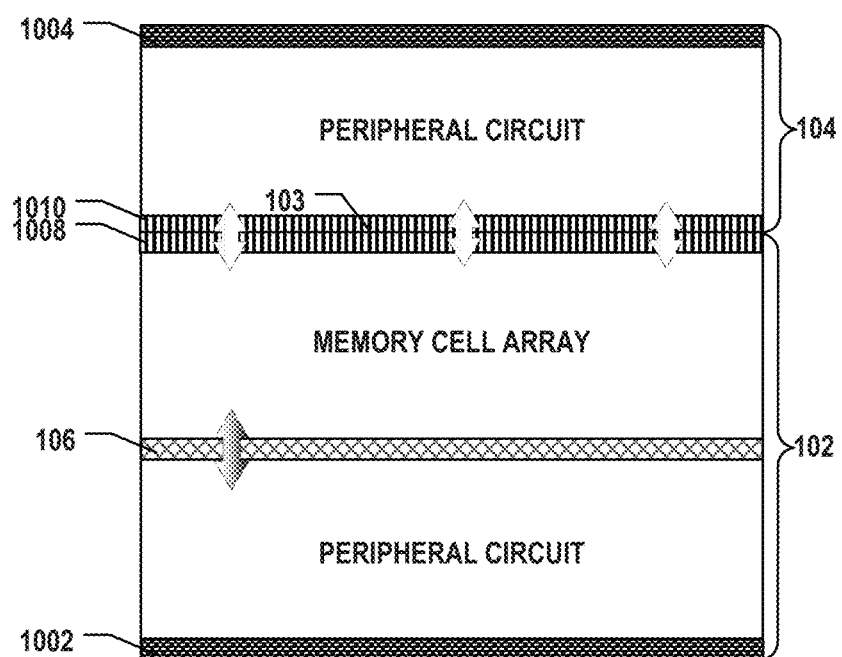
FIG. 10 illustrates a schematic view of a cross-section of the 3D memory devices in FIGS. 9A and 9B, according to various aspects of the present disclosure.
Figure 10:
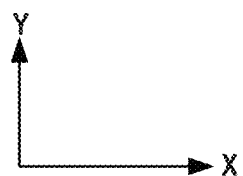

FIG. 10 illustrates a schematic view of a cross-section of the 3D memory devices in FIGS. 9A and 9B, according to some aspects of the present disclosure. 3D memory device 1000 may be an example of 3D memory devices 900 and 901 in FIGS. 9A and 9B. As shown in FIG. 10, 3D memory device 1000 can include stacked first and second semiconductor structures 102 and 104. In some implementations, first semiconductor structure 102 includes a semiconductor layer 1002, polysilicon layer 106, a bonding layer 1008, a memory cell array vertically between polysilicon layer 106 and bonding layer 1008, and some of the peripheral circuits vertically between semiconductor layer 1002 and polysilicon layer 106.

The memory cell array can include an array of NAND memory strings (e.g., NAND memory strings 208 disclosed herein), and the sources of the array of NAND memory strings can be in contact with polysilicon layer 106 (e.g., as shown in FIG. 8). Polysilicon layer 106 can be a deposited polysilicon layer (e.g., either N-type doped, P-type doped, or undoped), which is suitable for "floating gate" type of NAND memory strings or certain designs of channel structures (e.g., channel structure 812 in FIG. 8) in "charge trap" type of NAND memory strings, for example, that are suitable for suitable for GIDL erase operations. Bonding layer 1008 can include conductive bonding contacts (not shown) and dielectrics electrically isolating the bonding contacts, which can be used, for example, for hybrid bonding as described below in detail.

In some implementations, the peripheral circuits in first semiconductor structure 102 are in contact with semiconductor layer 1002, but not polysilicon layer 106. That is, the transistors (e.g., planar transistors 500 and 3D transistors 600) of the peripheral circuits can be in contact with semiconductor layer 1004. Semiconductor layer 1002 can include semiconductor materials, such as single crystalline silicon (e.g., a silicon substrate or a thinned silicon substrate). It is understood that in some examples, different from polysilicon layer 106 in first semiconductor structure 102, semiconductor layer 1002 on which the transistors are formed may include single crystalline silicon, but not polysilicon, due to the superior carrier mobility of single crystalline silicon that is desirable for transistors' performance. Through contacts (e.g., ILVs/TSVs) through polysilicon layer 106 can make direct, short-distance (e.g., submicron- or micron-level) electrical connections between the memory cell array and the peripheral circuits in first semiconductor structure 102.

In some implementations, second semiconductor structure 104 includes a semiconductor layer 1004, a bonding layer 1010, and some of the peripheral circuits of the memory cell array that are vertically between semiconductor layer 1004 and bonding layer 1010. The transistors (e.g., planar transistors 500 and 3D transistors 600) of the peripheral circuits can be in contact with semiconductor layer 1004. Similar to semiconductor layer 1002, semiconductor layer 1004 can include semiconductor materials, such as single crystalline silicon (e.g., a silicon substrate or a thinned silicon substrate). It is understood that in some examples, different from polysilicon layer 106 in first semiconductor structure 102, semiconductor layer 1004 on which the transistors are formed may include single crystalline silicon, but not polysilicon, due to the superior carrier mobility of single crystalline silicon that is desirable for transistors' performance.

Similar to bonding layer 1008 in first semiconductor structure 102, bonding layer 1010 can also include conductive bonding contacts (not shown) and dielectrics electrically isolating the bonding contacts. Bonding interface 103 is vertically between and in contact with bonding layers 1008 and 1010, respectively, according to some implementations. That is, bonding layers 1008 and 1010 can be disposed on opposite sides of bonding interface 103, and the bonding contacts of bonding layer 1008 can be in contact with the bonding contacts of bonding layer 1010 at bonding interface 103. As a result, different from through contacts (e.g., ILVs/TSVs), a large number (e.g., millions) of bonding contacts across bonding interface 103 can make direct, short-distance (e.g., micron-level) electrical connections between adjacent semiconductor structures 102 and 104.

As shown in FIG. 10, since first and second semiconductor structures 102 and 104 are bonded in a face-to-face manner (e.g., semiconductor layer 1002 being disposed on the bottom side of first semiconductor structure 102, while semiconductor layer 1004 being disposed on the top side of second semiconductor structure 104 in FIG. 10), the transistors of peripheral circuits in first and second semiconductor structures 102 and 104 are disposed facing toward each other, according to some implementations. Moreover, within first semiconductor structure 102, since polysilicon layer 106 is vertically between the memory cell array and the peripheral circuits, and the memory cell array and the peripheral circuits formed on polysilicon layer 106 and semiconductor layer 1002, respectively, the memory cell array and the peripheral circuits face toward the same direction (e.g., in the positive y-direction in FIG. 10). It is understood that pad-out interconnect layer 902 in FIGS. 9A and 9B is omitted from 3D memory device 1000 in FIG. 10 for ease of illustration and may be included in 3D memory device 1000 as described above with respect to FIGS. 9A and 9B.

As described above, first and second semiconductor structures 102 and 104 can have peripheral circuits having transistors with different applied voltages. For example, second semiconductor structure 104 may be one example of semiconductor structure 408 including LLV circuits 402 (and LV circuits 404 in some examples) in FIG. 4B, and first semiconductor structure 102 may be one example of semiconductor structure 410 including HV circuits 406 (and LV circuits 404 in some examples) in FIG. 4B, or vice versa. Thus, in some implementations, semiconductor layers 1002 and 1004 in first and second semiconductor structures 102 and 104 have different thicknesses to accommodate the transistors with different applied voltages. In one example, first semiconductor structure 102 may include HV circuits 406 and second semiconductor structure 104 may include LLV circuits 402, and the thickness of semiconductor layer 1002 in first semiconductor structure 102 may be larger than the thickness of semiconductor layer 1004 in second semiconductor structure 104. Moreover, in some implementations, the gate dielectrics of the transistors in first and second semiconductor structures 102 and 104 have different thicknesses as well to accommodate the different applied voltages. In one example, first semiconductor structure 102 may include HV circuits 406 and second semiconductor structure 104 may include LLV circuits 402, and the thickness of the gate dielectrics of the transistors in first semiconductor structure 102 may be larger (e.g., at least 5-fold) than the thickness of the gate dielectrics of the transistors in second semiconductor structure 104. The thicker gate dielectric can sustain a higher working voltage applied to the transistors in first semiconductor structure 102 than the transistors in second semiconductor structure 104 to avoid break down during high voltage operations.

Figure 11A:
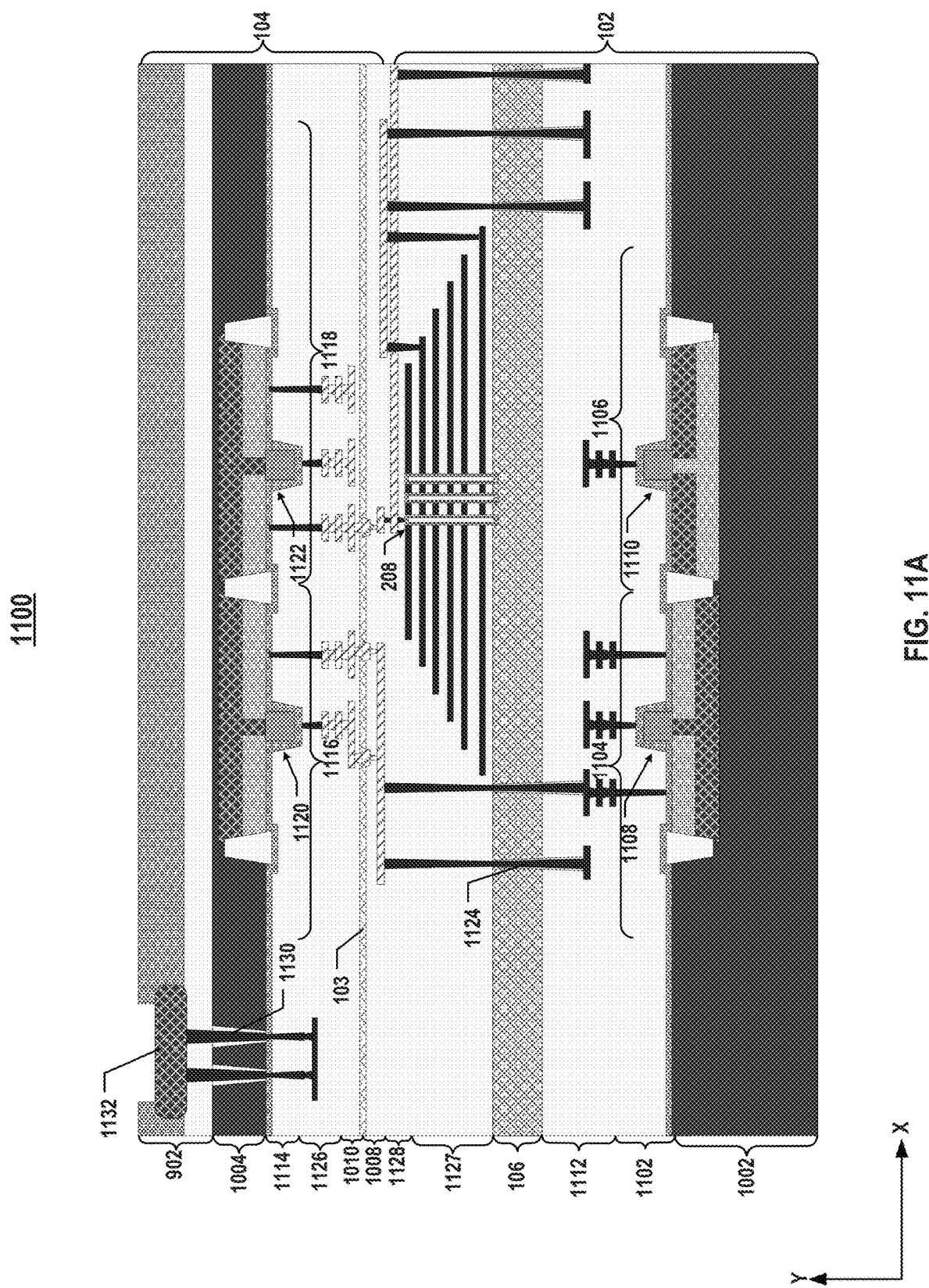
FIGS. 11A and 11B illustrate side views of various examples of the 3D memory device in FIG. 10, according to various aspects of the present disclosure.
Figure 11B:
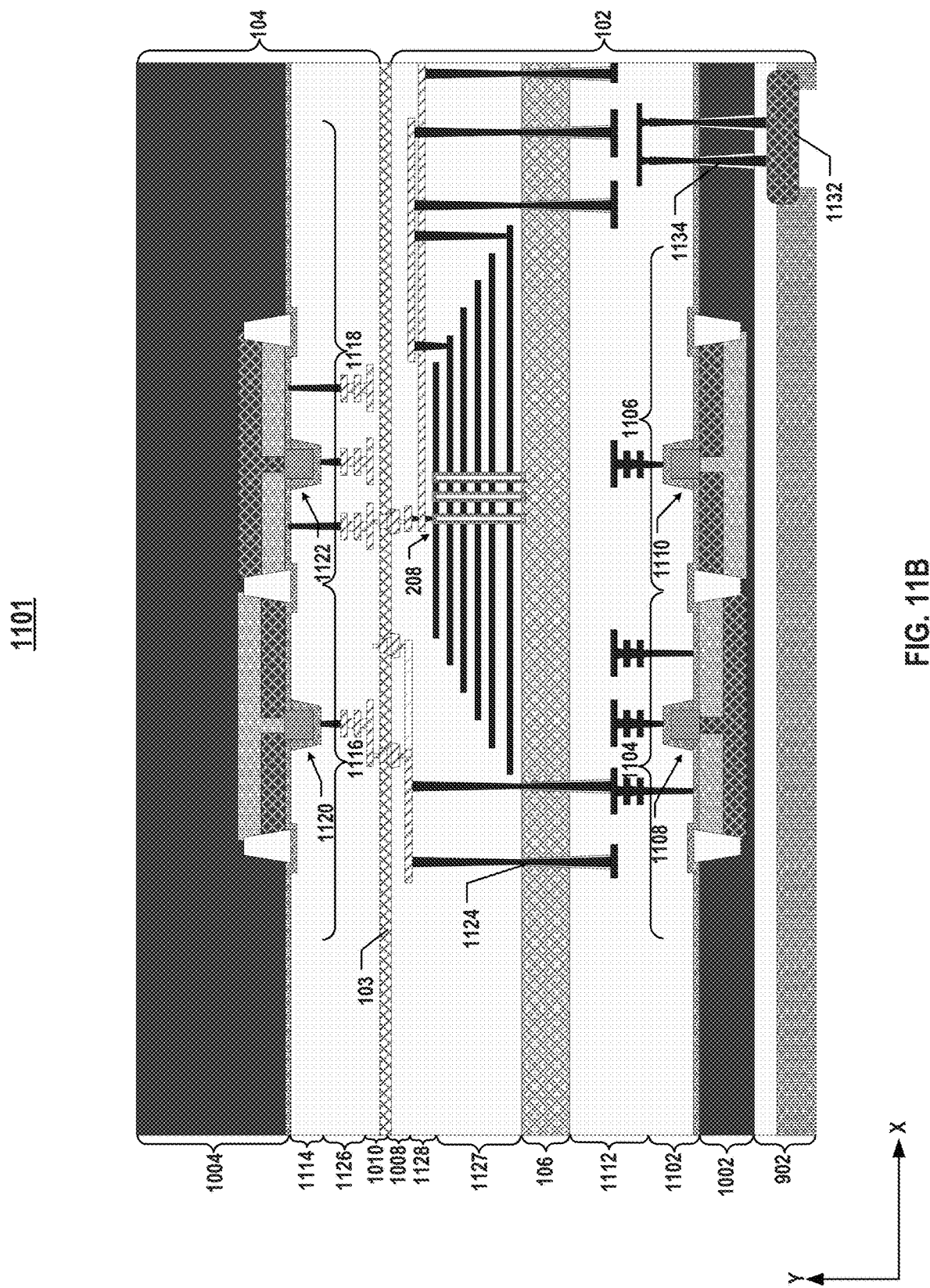

FIGS. 11A and 11B illustrate side views of various examples of 3D memory device 1000 in FIG. 10, according to various aspects of the present disclosure. As shown in FIG. 11A, as one example of 3D memory device 1000 in FIG. 10, 3D memory device 1100 is a bonded chip including first semiconductor structure 102 and second semiconductor structure 104, which are stacked over one another in different planes in the vertical direction (e.g., the y-direction in FIG. 11A), according to some implementations. First and second semiconductor structures 102 and 104 are bonded at bonding interface 103 therebetween, according to some implementations.

As shown in FIG. 11A, first semiconductor structure 102 can include semiconductor layer 1002 having semiconductor materials. In some implementations, semiconductor layer 1002 is a silicon substrate having single crystalline silicon. First semiconductor structure 102 can also include a device layer 1102 above and in contact with semiconductor layer 1002. In some implementations, device layer 1102 includes a first peripheral circuit 1104 and a second peripheral circuit 1106. First peripheral circuit 1104 can include HV circuits 406, such as driving circuits (e.g., string drivers 704 in row decoder/word line driver 308 and drivers in column decoder/bit line driver 306), and second peripheral circuit 1106 can include LV circuits 404, such as page buffer circuits (e.g., page buffer circuits 702 in page buffer 304) and logic circuits (e.g., in control logic 312). In some implementations, first peripheral circuit 1104 includes a plurality of transistors 1108 in contact with semiconductor layer 1002, and second peripheral circuit 1106 includes a plurality of transistors 1110 in contact with semiconductor layer 1002. Transistors 1108 and 1110 can include any transistors disclosed herein, such as planar transistors 500 and 3D transistors 600. As described above in detail with respect to transistors 500 and 600, in some implementations, each transistor 1108 or 1110 includes a gate dielectric, and the thickness of the gate dielectric of transistor 1108 (e.g., in HV circuit 406) is larger than the thickness of the gate dielectric of transistor 1110 (e.g., in LV circuit 404) due to the higher voltage applied to transistor 1108 than transistor 1110. Trench isolations (e.g., STIs) and doped regions (e.g., wells, sources, and drains of transistors 1108 and 1110) can be formed on or in semiconductor layer 1002 as well.

In some implementations, first semiconductor structure 102 further includes an interconnect layer 1112 above device layer 1102 to transfer electrical signals to and from peripheral circuits 1106 and 1104. As shown in FIG. 11A, interconnect layer 1112 can be vertically between polysilicon layer 106 and device layer 1102 (including transistors 1108 and 1110 of peripheral circuits 1104 and 1106). Interconnect layer 1112 can include a plurality of interconnects (also referred to herein as "contacts"), including lateral lines and vias. As used herein, the term "interconnects" can broadly include any suitable types of interconnects, such as middle-end-of-line (MEOL) interconnects and back-end-of-line (BEOL) interconnects. The interconnects in interconnect layer 1112 can be coupled to transistors 1108 and 1110 of peripheral circuits 1104 and 1106 in device layer 1102. Interconnect layer 1112 can further include one or more interlayer dielectric (ILD) layers (also known as "intermetal dielectric (IMD) layers") in which the lateral lines and vias can form. That is, interconnect layer 1112 can include lateral lines and vias in multiple ILD layers. In some implementations, the devices in device layer 1102 are coupled to one another through the interconnects in interconnect layer 1112. For example, peripheral circuit 1104 may be coupled to peripheral circuit 1106 through interconnect layer 1112. The interconnects in interconnect layer 1112 can include conductive materials including, but not limited to, W, Co, Cu, Al, silicides, or any combination thereof. The ILD layers in interconnect layer 1112 can include dielectric materials including, but not limited to, silicon oxide, silicon nitride, silicon oxynitride, low dielectric constant (low-k) dielectrics, or any combination thereof. In some implementations, the interconnects in interconnect layer 1112 include W, which has a relatively high thermal budget (compatible with high-temperature processes) and good quality (fewer detects, e.g., voids) among conductive metal materials.

As shown in FIG. 11A, first semiconductor structure can further include polysilicon layer 106 above and in contact with interconnect layer 1112. Polysilicon layer 106 is a doped polysilicon layer on interconnect layer 1112, as described below in detail with respect to the fabrication process, according to some implementations. It is understood that in some examples, trench isolations and doped regions (not shown) may be formed in polysilicon layer 106 as well.

As shown in FIG. 11A, first semiconductor structure 102 can also include a memory cell array, such as an array of NAND memory strings 208 above and in contact with polysilicon layer 106. The sources of the NAND memory strings 208 can be in contact with polysilicon layer 106. In some implementations, polysilicon layer 106 is vertically between NAND memory strings 208 and device layer 1102 including transistors 1108 and 1110. In some implementations, each NAND memory string 208 is a "charge trap" type of NAND memory string including any suitable channel structures disclosed herein, such as channel structure 812, described above in detail with respect to FIG. 8. In some implementations, NAND memory string 208 is a "floating gate" type of NAND memory string, and polysilicon layer 106 is the source plate of the floating gate type of NAND memory strings.

Each NAND memory string 208 extends vertically through a plurality of pairs each including a conductive layer and a dielectric layer, according to some implementations. The stacked and interleaved conductive layers and dielectric layers are also referred to herein as a stack structure, e.g., a memory stack 1127. Memory stack 1127 may be an example of memory stack 804 in FIG. 8, and the conductive layer and dielectric layer in memory stack 1127 may be examples of gate conductive layers 806 and dielectric layer 808, respectively, in memory stack 804. The interleaved conductive layers and dielectric layers in memory stack 1127 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 1127.

As shown in FIG. 11A, first semiconductor structure 102 can further include an interconnect layer 1128 above and in contact with NAND memory strings 208 to transfer electrical signals to and from NAND memory strings 208. In some implementations, memory stack 1127 and NAND memory strings 208 are vertically between interconnect layer 1128 and polysilicon layer 106. Interconnect layer 1128 can include a plurality of interconnects, such as MEOL interconnects and BEOL interconnects. In some implementations, the interconnects in interconnect layer 1128 also include local interconnects, such as bit line contacts and word line contacts. Interconnect layer 1128 can further include one or more ILD layers in which the lateral lines and vias can form. The interconnects in interconnect layer 1128 can include conductive materials including, but not limited to, W, Co, Cu, Al, silicides, or any combination thereof. The ILD layers in interconnect layer 1128 can include dielectric materials including, but not limited to, silicon oxide, silicon nitride, silicon oxynitride, low-k dielectrics, or any combination thereof.

As shown in FIG. 11A, first semiconductor structure 102 can further include one or more contacts 1124 extending vertically through polysilicon layer 106. In some implementations, contact 1124 couples the interconnects in interconnect layer 1128 to the interconnects in interconnect layer 1112 to make an electrical connection through polysilicon layer 106 between NAND memory strings 208 and transistors 1108 and 1110. Contact 1124 can include conductive materials including, but not limited to, W, Co, Cu, Al, silicides, or any combination thereof. In some implementations, contact 1124 includes W. In some implementations, contact 1124 includes a via surrounded by a dielectric spacer (e.g., having silicon oxide) to electrically separate the via from polysilicon layer 106. Depending on the thickness of polysilicon layer 106, contact 1124 can be an ILV having a depth (in the vertical direction) in the submicron-level (e.g., between 10 nm and 1 μm), or a TSV having a depth (in the vertical direction) in the micron- or tens micron-level (e.g., between 1 μm and 100 μm).

As shown in FIG. 11A, first semiconductor structure 102 can further include a bonding layer 1008 at bonding interface 103 and above and in contact with interconnect layer 1128. Bonding layer 1008 can include a plurality of bonding contacts and dielectrics electrically isolating the bonding contacts. The bonding contacts can include conductive materials including, but not limited to, W, Co, Cu, Al, silicides, or any combination thereof. In some implementations, the bonding contacts of bonding layer 1008 include Cu. The remaining area of bonding layer 1008 can be formed with dielectrics including, but not limited to, silicon oxide, silicon nitride, silicon oxynitride, low-k dielectrics, or any combination thereof. The bonding contacts and surrounding dielectrics in bonding layer 1008 can be used for hybrid bonding (also known as "metal/dielectric hybrid bonding"), which is a direct bonding technology (e.g., forming bonding between surfaces without using intermediate layers, such as solder or adhesives) and can obtain metal-metal (e.g., Cu-to-Cu) bonding and dielectric-dielectric (e.g., $SiO_2$-to-$SiO_2$) bonding simultaneously.

As shown in FIG. 11A, second semiconductor structure 104 can be bonded on top of first semiconductor structure 102 in a face-to-face manner at bonding interface 103. Second semiconductor structure 104 can also include a bonding layer 1010 at bonding interface 103, e.g., on the opposite side of bonding interface 103 with respect to bonding layer 1008 in first semiconductor structure 102. Bonding layer 1010 can include a plurality of bonding contacts and dielectrics electrically isolating the bonding contacts. The bonding contacts can include conductive materials, such as Cu. The remaining area of bonding layer 1010 can be formed with dielectric materials, such as silicon oxide. The bonding contacts and surrounding dielectrics in bonding layer 1010 can be used for hybrid bonding. In some implementations, bonding interface 103 is the place at which bonding layers 1008 and 1010 are met and bonded. In practice, bonding interface 103 can be a layer with a certain thickness that includes the top surface of bonding layer 1008 of first semiconductor structure 102 and the bottom surface of bonding layer 1010 of second semiconductor structure 104.

As shown in FIG. 11A, second semiconductor structure 104 can further include an interconnect layer 1126 above bonding layer 1010 to transfer electrical signals. Interconnect layer 1126 can include a plurality of interconnects, such as MEOL interconnects and BEOL interconnects. Interconnect layer 1126 can further include one or more ILD layers in which the lateral lines and vias can be formed. The interconnects in interconnect layer 1126 can include conductive materials including, but not limited to, W, Co, Cu, Al, silicides, or any combination thereof. The ILD layers in interconnect layer 1126 can include dielectric materials including, but not limited to, silicon oxide, silicon nitride, silicon oxynitride, low-k dielectrics, or any combination thereof. In some implementations, the interconnects in interconnect layer 1126 include Cu, which has a relatively low resistivity (better electrical performance) among conductive metal materials. As described below with respect to the fabrication process, although Cu has a relatively low thermal budget (incompatible with high-temperature processes), since the fabrication of interconnect layer 1126 can occur after the high-temperature processes in forming device layer 1114 in second semiconductor structure 104, as well as being separated from the high-temperature processes in forming first semiconductor structure 102, the interconnects of interconnect layer 1126 having Cu can become feasible.

As shown in FIG. 11A, second semiconductor structure 104 can include a device layer 1114 above and in contact with interconnect layer 1126. In some implementations, interconnect layer 1126 is vertically between bonding interface 103 and device layer 1114. In some implementations, device layer 1114 includes a third peripheral circuit 1116 and a fourth peripheral circuit 1118. Third peripheral circuit 1116 can include LLV circuits 402, such as I/O circuits (e.g., in interface 316 and data bus 318), and fourth peripheral circuit 1118 can include LV circuits 404, such as page buffer circuits (e.g., page buffer circuits 702 in page buffer 304) and logic circuits (e.g., in control logic 312). In some implementations, third peripheral circuit 1116 includes a plurality of transistors 1120, and fourth peripheral circuit 1118 includes a plurality of transistors 1122 as well. Transistors 1120 and 1122 can include any transistors disclosed herein, such as planar transistors 500 and 3D transistors 600. As described above in detail with respect to transistors 500 and 600, in some implementations, each transistor 1120 or 1122 includes a gate dielectric, and the thickness of the gate dielectric of transistor 1120 (e.g., in LLV circuit 402) is smaller than the thickness of the gate dielectric of transistor 1122 (e.g., in LV circuit 404) due to the lower voltage applied to transistor 1120 than transistor 1122.

Moreover, the different voltages applied to different transistors 1120, 1122, 1108, and 1110 in second and first semiconductor structures 104 and 102 can lead to differences of device dimensions between second and first semiconductor structures 104 and 102. In some implementations, the thickness of the gate dielectric of transistor 1108 (e.g., in HV circuit 406) is larger than the thickness of the gate dielectric of transistor 1120 (e.g., in LLV circuit 402) due to the higher voltage applied to transistor 1108 than transistor 1120. In some implementations, the thickness of the gate dielectric of transistor 1122 (e.g., in LV circuit 404) is the same as the thickness of the gate dielectric of transistor 1110 (e.g., in LV circuit 404) due to the same voltage applied to transistor 1122 and transistor 1110. In some implementations, the thickness of semiconductor layer 1002 in which transistor 1108 (e.g., in HV circuit 406) is formed is larger than the thickness of semiconductor layer 1004 in which transistor 1120 (e.g., in LLV circuit 402) is formed due to the higher voltage applied to transistor 1108 than transistor 1120.

As shown in FIG. 11A, second semiconductor structure 104 can further include semiconductor layer 1004 having semiconductor materials. In some implementations, semiconductor layer 1004 is a thinned silicon substrate having single crystalline silicon on which transistors 1120 and 1122 can be formed. Semiconductor layer 1004 can be disposed above and in contact with transistors 1120 and 1122 of peripheral circuits 1116 and 1118 in device layer 1114. In some implementations, transistors 1120 and 1122 are disposed vertically between bonding interface 103 and semiconductor layer 1004. Trench isolations (e.g., STIs) and doped regions (e.g., wells, sources, and drains of transistors 1120 and 1122) can be formed on or in semiconductor layer 1004 as well.

As shown in FIG. 11A, second semiconductor structure 104 can further include a pad-out interconnect layer 902 above and in contact with semiconductor layer 1004. In some implementations, semiconductor layer 1004 is disposed vertically between pad-out interconnect layer 902 and transistors 1120 and 1122. Pad-out interconnect layer 902 can include interconnects, e.g., contact pads 1132, in one or more ILD layers. Pad-out interconnect layer 902 and interconnect layer 1126 can be formed on opposite sides of semiconductor layer 1004. In some implementations, the interconnects in pad-out interconnect layer 902 can transfer electrical signals between 3D memory device 1100 and external devices, e.g., for pad-out purposes.

As shown in FIG. 11A, second semiconductor structure 104 can further include one or more contacts 1130 extending vertically through semiconductor layer 1004. In some implementations, contact 1130 couples the interconnects in interconnect layer 1126 to contact pads 1132 in pad-out interconnect layer 902 to make an electrical connection through semiconductor layer 1004. Contact 1130 can include conductive materials including, but not limited to, W, Co, Cu, Al, silicides, or any combination thereof. In some implementations, contact 1130 includes W. In some implementations, contact 1130 includes a via surrounded by a dielectric spacer (e.g., having silicon oxide) to electrically separate the via from semiconductor layer 1004. Depending on the thickness of semiconductor layer 1004, contact 1130 can be an ILV having a depth in the submicron-level (e.g., between 10 nm and 1 µm), or a TSV having a depth in the micron- or tens micron-level (e.g., between 1 µm and 100 µm).

As a result, peripheral circuits 1104, 1106, 1116, and 1118 in first and second semiconductor structures 102 and 104 can be coupled to NAND memory strings 208 in first semiconductor structure 102 through various interconnection structures, including interconnect layers 1112, 1126, and 1128, bonding layers 1008 and 1010, as well as contacts 1124. Moreover, peripheral circuits 1104, 1106, 1116, and 1118 and NAND memory strings 208 in 3D memory device 1100 can be further coupled to external devices through contacts 1130 and pad-out interconnect layer 902.

It is also understood that the pad-out of 3D memory devices is not limited to from second semiconductor structure 104 having peripheral circuit 1116 as shown in FIG. 11A (corresponding to FIG. 9A) and may be from first semiconductor structure 102 having peripheral circuit 1104 (corresponding to FIG. 9B). For example, as shown in FIG. 11B, a 3D memory device 1101 may include pad-out interconnect layer 902 in first semiconductor structure 102. Pad-out interconnect layer 902 can be in contact with semiconductor layer 1002 of first semiconductor structure 102 on which transistors 1108 of peripheral circuit 1104 are formed. In some implementations, first semiconductor structure 102 further includes one or more contacts 1134 extending vertically through semiconductor layer 1002. In some implementations, contact 1134 couples the interconnects in interconnect layer 1112 in first semiconductor structure 102 to contact pads 1132 in pad-out interconnect layer 902 to make an electrical connection through semiconductor layer 1002. Contact 1134 can include conductive materials including, but not limited to, W, Co, Cu, Al, silicides, or any combination thereof. In some implementations, contact 1134 includes W. In some implementations, contact 1134 includes a via surrounded by a dielectric spacer (e.g., having silicon oxide) to electrically separate the via from semiconductor layer 1002. Depending on the thickness of semiconductor layer 1002, contact 1134 can be an ILV having a thickness in the submicron-level (e.g., between 10 nm and 1 µm), or a TSV having a depth in the micron- or tens micron-level (e.g., between 1 µm and 100 µm). It is understood that the details of the same components (e.g., materials, fabrication process, functions, etc.) in both 3D memory devices 1100 and 1101 are not repeated for ease of description.

Figure 12C:
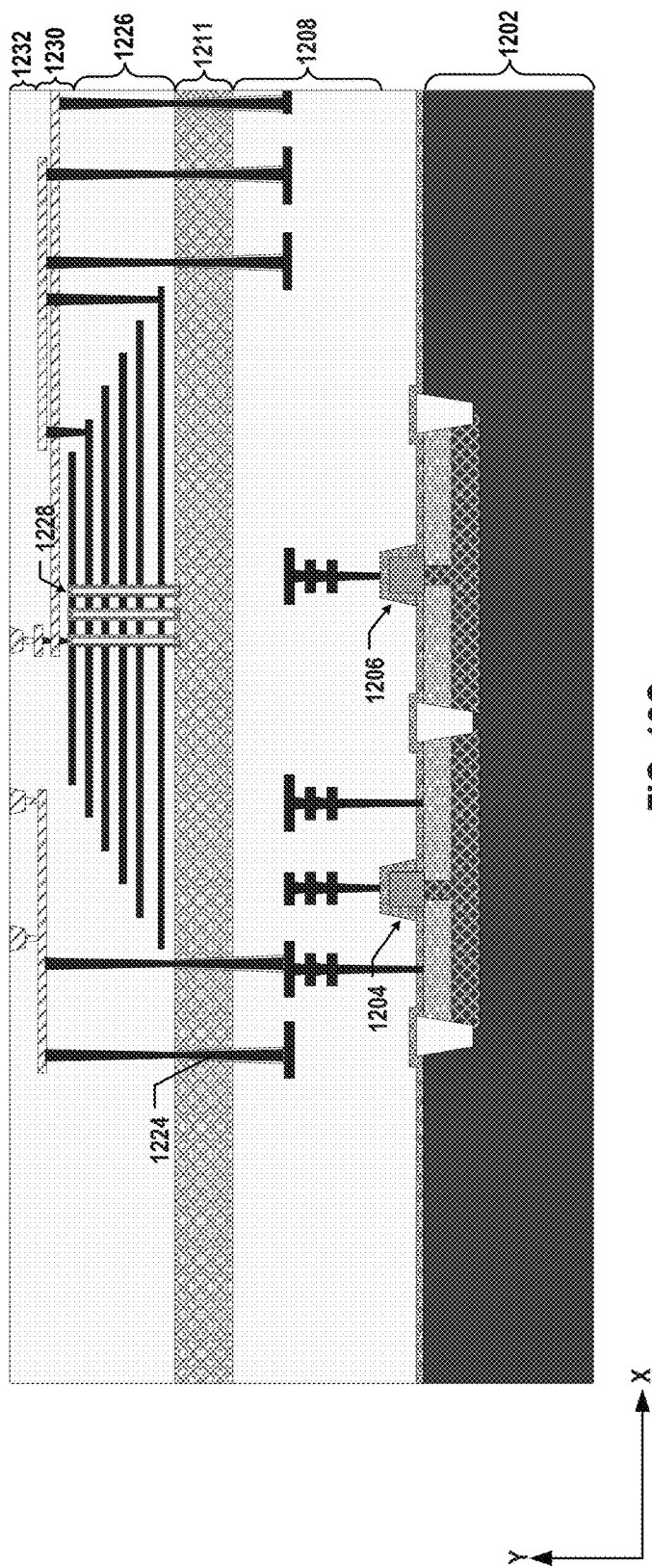
Figure 12D:
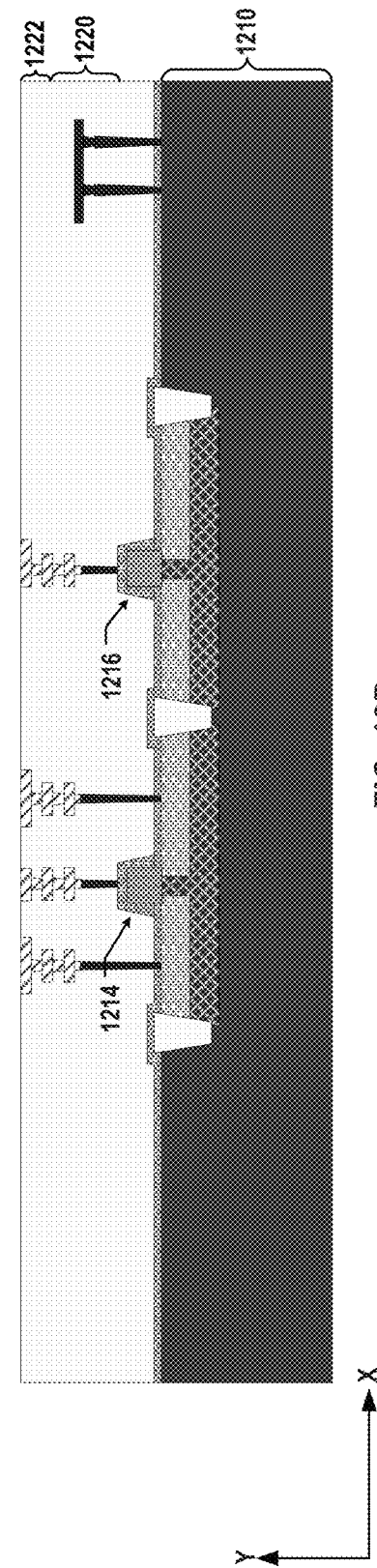
Figure 13A:
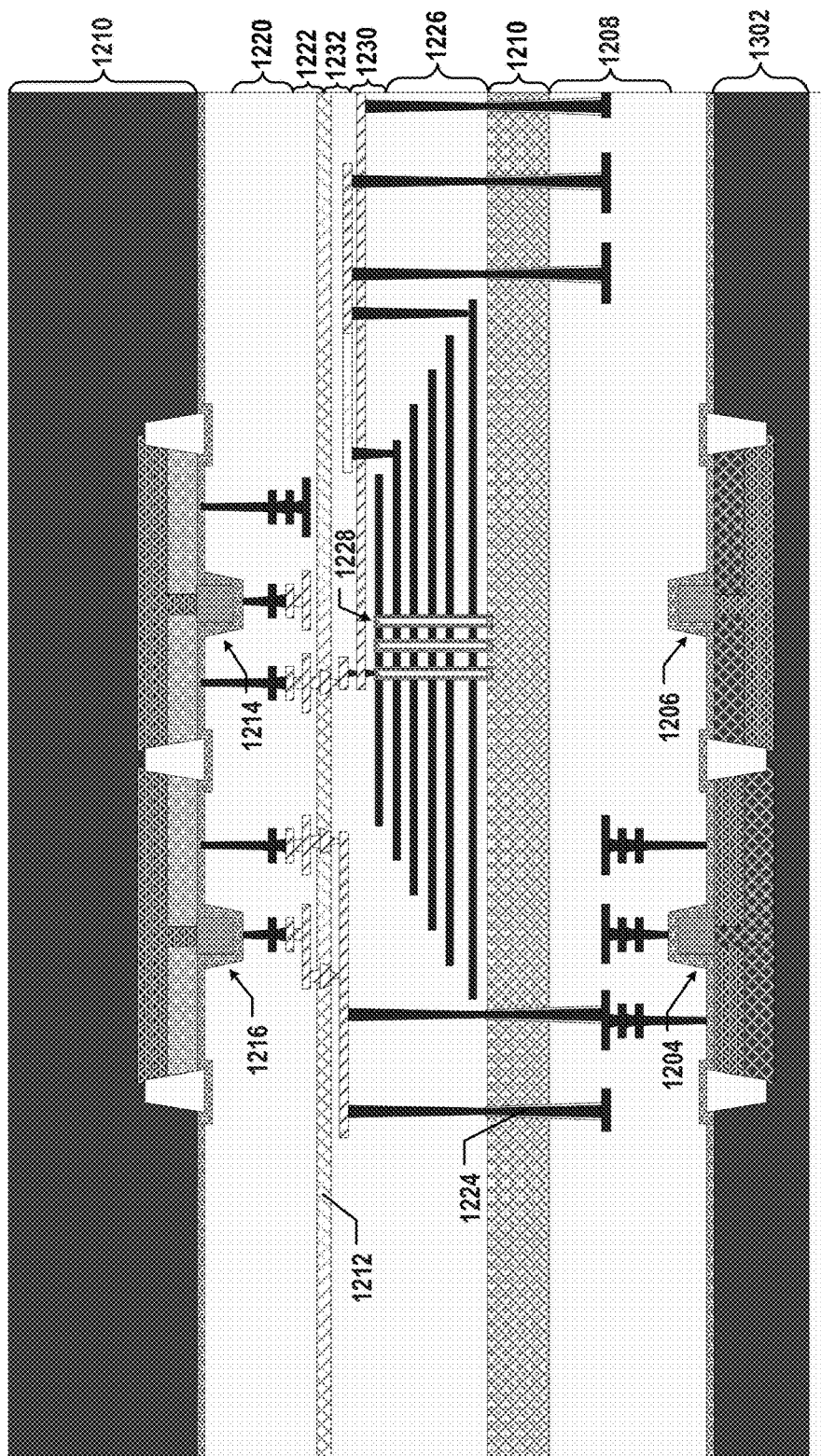
FIGS. 13A and 13B illustrate another fabrication process for forming the 3D memory devices in FIG. 10, according to some aspects of the present disclosure.
Figure 13B:
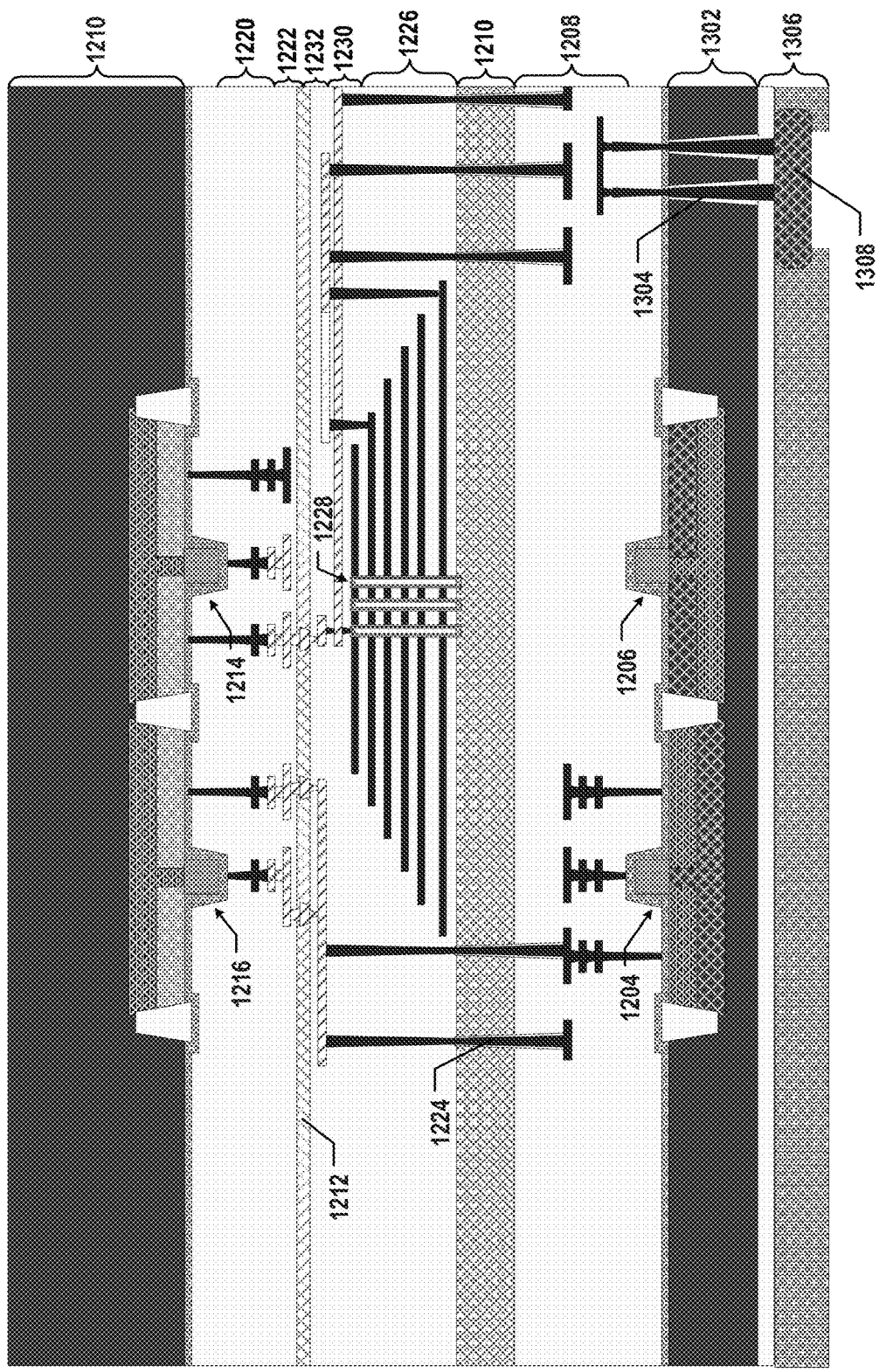
Figure 14:
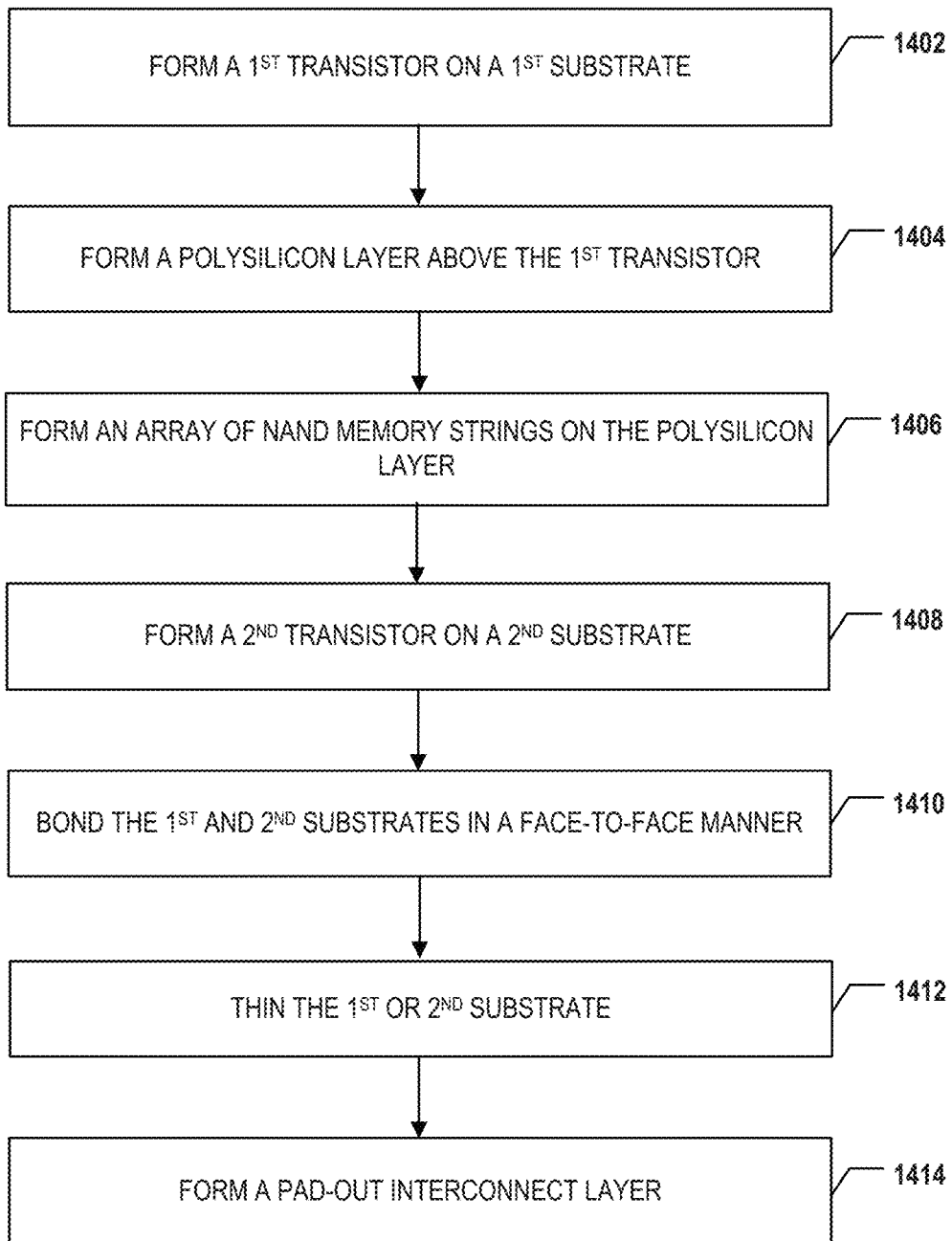
FIG. 14 illustrates a flowchart of a method for forming the 3D memory device in FIG. 10, according to some aspects of the present disclosure.

FIGS. 12A-12G illustrate a fabrication process for forming the 3D memory devices in FIG. 10, according to some aspects of the present disclosure. FIGS. 13A and 13B illustrate another fabrication process for forming the 3D memory devices in FIG. 10, according to some aspects of the present disclosure. FIG. 14 illustrates a flowchart of a method 1400 for forming the 3D memory devices in FIG. 10, according to some aspects of the present disclosure. Examples of the 3D memory devices depicted in FIGS. 12A-12G, 13A, 13B, and 14 include 3D memory devices 1100 and 1101 depicted in FIGS. 11A and 11B. FIGS. 12A-12G, 13A, 13B, and 14 will be described together. It is understood that the operations shown in method 1400 are not exhaustive and that other operations can be performed as well before, after, or between any of the illustrated operations. Further, some of the operations may be performed simultaneously, or in a different order than shown in FIG. 14.

Referring to FIG. 14, method 1400 starts at operation 1402, in which a first transistor is formed on a first substrate. The first substrate can be a silicon substrate having single crystalline silicon. As illustrated in FIG. 12A, a plurality of transistors 1204 and 1206 are formed on a silicon substrate 1202. Transistors 1204 and 1206 can be formed by a plurality of processes including, but not limited to, photolithography, dry/wet etch, thin film deposition, thermal growth, implantation, chemical mechanical polishing (CMP), and any other suitable processes. In some implementations, doped regions are formed in silicon substrate 1202 by ion implantation and/or thermal diffusion, which function, for example, as wells and source/drain regions of transistors 1204 and 1206. In some implementations, isolation regions (e.g., STIs) are also formed in silicon substrate 1202 by wet/dry etch and thin film deposition. In some implementations, the thickness of gate dielectric of transistor 1204 is different from the thickness of gate dielectric of transistor 1206, for example, by depositing a thicker silicon oxide film in the region of transistor 1204 than the region of transistor 1206, or by etching back part of the silicon oxide film deposited in the region of transistor 1206. It is understood that the details of fabricating transistors 1204 and 1206 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 1208 is formed above the transistor on the first substrate. The interconnect layer can include a plurality of interconnects in one or more ILD layers. As illustrated in FIG. 12A, an interconnect layer 1208 can be formed above transistors 1204 and 1206. Interconnect layer 1208 can include interconnects of MEOL and/or BEOL in a plurality of ILD layers to make electrical connections with transistors 1204 and 1206. In some implementations, interconnect layer 1208 includes multiple ILD layers and interconnects therein formed in multiple processes. For example, the interconnects in interconnect layer 1208 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 12A can be collectively referred to as interconnect layer 1208. In some implementations, the interconnects in interconnect layer 1208 include W, which has a relatively high thermal budget among conductive metal materials to sustain later high-temperature processes.

Method 1400 proceeds to operation 1404, as illustrated in FIG. 14, in which a polysilicon layer is formed above the first transistor. As illustrated in FIG. 12A, a polysilicon layer 1211 is formed above interconnect layer 1208 and transistors 1204 and 1206 on first silicon substrate 1202. Polysilicon layer 1211 can be formed by depositing polysilicon on interconnect layer 1208 using one or more thin film deposition processes including, but not limited to, CVD, PVD, ALD, or any combination thereof. In some implementations, polysilicon layer 1211 is doped with P-type or N-type dopant using in-situ doping process during the deposition process or ion implantation/diffusion process after the deposition process.

Method 1400 proceeds to operation 1406, as illustrated in FIG. 14, in which an array of NAND memory strings is formed on the polysilicon layer. In some implementations, to form the array of NAND memory strings, a memory stack is formed on the polysilicon layer. As illustrated in FIG. 12C, a stack structure, such as a memory stack 1226 including interleaved conductive layers and dielectric layers, is formed on polysilicon layer 1211. To form memory stack 1226, in some implementations, a dielectric stack (not shown) including interleaved sacrificial layers (not shown) and the dielectric layers is formed on polysilicon layer 1211. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 1226 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 1226 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 1226 and polysilicon layer 1211.

As illustrated in FIG. 12C, NAND memory strings 1228 are formed above polysilicon layer 1211, each of which extends vertically through memory stack 1226 to be in contact with polysilicon layer 1211. In some implementations, fabrication processes to form NAND memory string 1228 include forming a channel hole through memory stack 1226 (or the dielectric stack) and into polysilicon layer 1211 using dry etching/and or wet etching, such as deep reactive-ion etching (DRIE), followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 1228 may vary depending on the types of channel structures of NAND memory strings 1228 (e.g., channel structure 812 in FIG. 8) and thus, are not elaborated for ease of description.

In some implementations, an interconnect layer is formed above the array of NAND memory strings. The interconnect layer can include a first plurality of interconnects in one or more ILD layers. As illustrated in FIG. 12C, an interconnect layer 1230 is formed above memory stack 1226 and NAND memory strings 1228. Interconnect layer 1230 can include interconnects of MEOL and/or BEOL in a plurality of ILD layers to make electrical connections with NAND memory strings 1228. In some implementations, interconnect layer 1230 includes multiple ILD layers and interconnects therein formed in multiple processes. For example, the interconnects in interconnect layer 1230 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 12D can be collectively referred to as interconnect layer 1230.

In some implementations, a contact through the polysilicon layer is formed. As illustrated in FIG. 12C, one or more contacts 1224 each extending vertically through polysilicon layer 1211 is formed. Contacts 1224 can couple the interconnects in interconnect layers 1230 and 1208. Contacts 1224 can be formed by first patterning contact holes through polysilicon layer 1211 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor.

In some implementations, a first bonding layer is formed above interconnect layer. The first bonding layer can include a plurality of first bonding contacts. As illustrated in FIG. 12C, a bonding layer 1232 is formed above interconnect layer 1230. Bonding layer 1232 can include a plurality of bonding contacts surrounded by dielectrics. In some implementations, a dielectric layer is deposited on the top surface of interconnect layer 1230 by one or more thin film deposition processes including, but not limited to, CVD, PVD, ALD, or any combination thereof. The bonding contacts can then be formed through the dielectric layer and in contact with the interconnects in interconnect layer 1230 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 1400 proceeds to operation 1408, as illustrated in FIG. 14, in which a second transistor is formed on a second substrate. The second substrate can be a silicon substrate having single crystalline silicon. As illustrated in FIG. 12D, a plurality of transistors 1214 and 1216 are formed on a silicon substrate 1210 having single crystalline silicon. Transistors 1214 and 1216 can be formed by a plurality of processes including, but not limited to, photolithography, dry/wet etch, thin film deposition, thermal growth, implantation, CMP, and any other suitable processes. In some implementations, doped regions are formed in silicon substrate 1210 by ion implantation and/or thermal diffusion, which function, for example, as wells and source/drain regions of transistors 1214 and 1216. In some implementations, isolation regions (e.g., STIs) are also formed in silicon substrate 1210 by wet/dry etch and thin film deposition. In some implementations, the thickness of gate dielectric of transistor 1214 is different from the thickness of gate dielectric of transistor 1216, for example, by depositing a thicker silicon oxide film in the region of transistor 1214 than the region of transistor 1216, or by etching back part of the silicon oxide film deposited in the region of transistor 1216. It is understood that the details of fabricating transistors 1214 and 1216 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 1220 is formed above the transistor on the second substrate. The interconnect layer can include a plurality of interconnects in one or more ILD layers. As illustrated in FIG. 12D, an interconnect layer 1220 can be formed above transistors 1214 and 1216. Interconnect layer 1220 can include interconnects of MEOL and/or BEOL in a plurality of ILD layers to make electrical connections with transistors 1214 and 1216. In some implementations, interconnect layer 1220 includes multiple ILD layers and interconnects therein formed in multiple processes. For example, the interconnects in interconnect layer 1220 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 12C can be collectively referred to as interconnect layer 1220. Different from interconnect layer 1208, in some implementations, the interconnects in interconnect layer 1220 include Cu, which has a relatively low resistivity among conductive metal materials. It is understood that although Cu has a relatively low thermal budget (incompatible with high-temperature processes), using Cu as the conductive materials of the interconnects in interconnect layer 1220 may become feasible since there are no more high-temperature processes after the fabrication of interconnect layer 1220.

In some implementations, a second bonding layer is formed above the interconnect layer. The second bonding layer can include a plurality of second bonding contacts. As illustrated in FIG. 12D, a bonding layer 1222 is formed above interconnect layer 1220. Bonding layer 1222 can include a plurality of bonding contacts surrounded by dielectrics. In some implementations, a dielectric layer is deposited on the top surface of interconnect layer 1220 by one or more thin film deposition processes including, but not limited to, CVD, PVD, ALD, or any combination thereof. The bonding contacts can then be formed through the dielectric layer and in contact with the interconnects in interconnect layer 1220 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 1400 proceeds to operation 1410, as illustrated in FIG. 14, in which the first substrate and the second substrate are bonded in a face-to-face manner. The first bonding contact in the first bonding layer can be in contact with the second bonding contact in the second bonding layer at a bonding interface after bonding the first and second substrates. The bonding can include hybrid bonding.

Figure 12E:
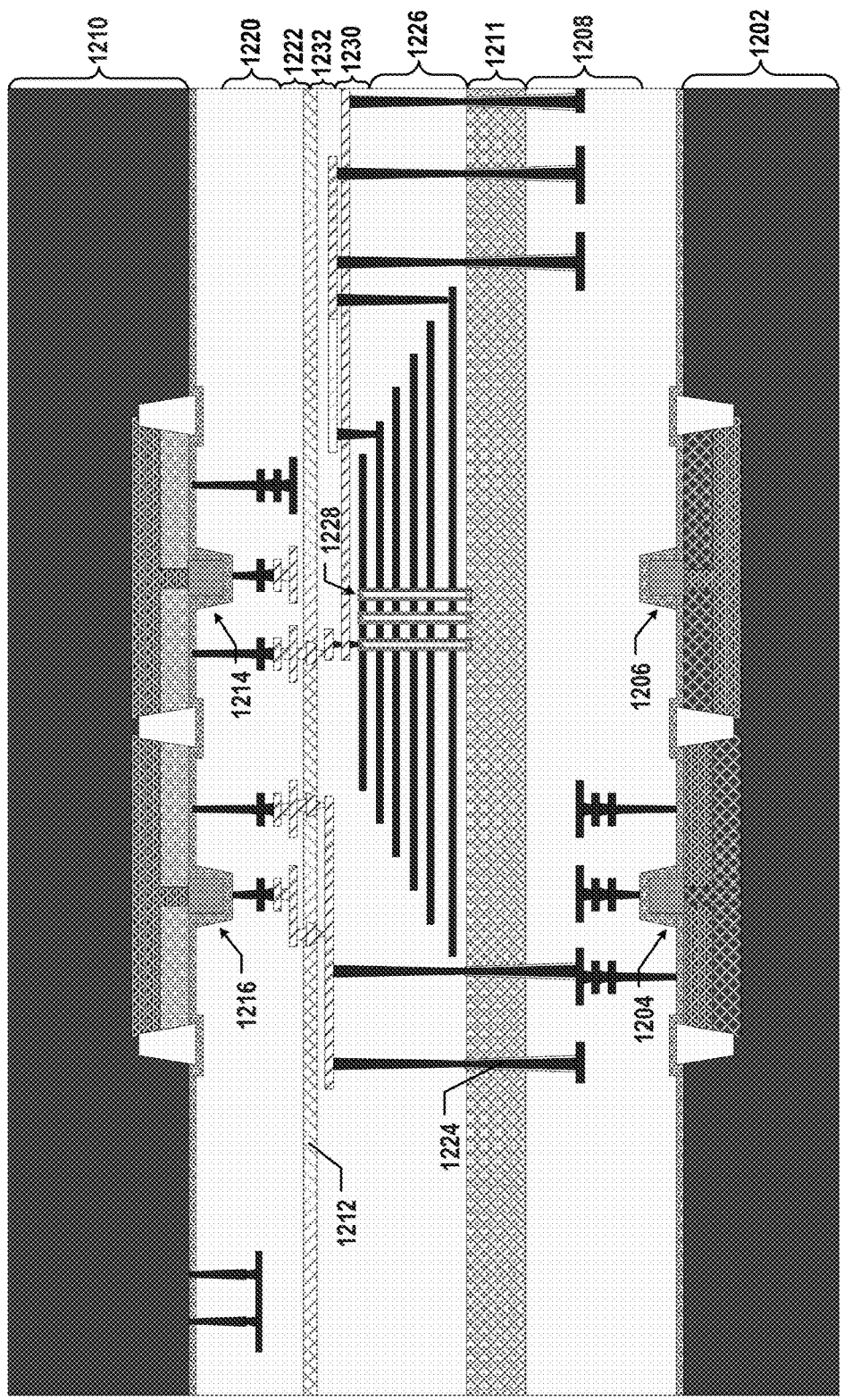

As illustrated in FIG. 12E, silicon substrate 1210 and components formed thereon (e.g., transistors 1214 and 1216) are flipped upside down. Bonding layer 1222 facing down is bonded with bonding layer 1232 facing up, i.e., in a face-to-face manner, thereby forming a bonding interface 1212. That is, silicon substrate 1210 and components formed thereon can be bonded with silicon substrate 1202 and components formed thereon in a face-to-face manner, such that the bonding contacts in bonding layer 1232 are in contact with the bonding contacts in bonding layer 1222 at bonding interface 1212. In some implementations, a treatment process, e.g., plasma treatment, wet treatment and/or thermal treatment, is applied to bonding surfaces prior to bonding. Although not shown in FIG. 12E, it is understood that in some examples, silicon substrate 1202 and components formed thereon (e.g., transistors 1204 1206, memory stack 1226 and NAND memory strings 1228) can be flipped upside down, and bonding layer 1232 facing down can be bonded with bonding layer 1222 facing up, i.e., in a face-to-face manner, thereby forming bonding interface 1212 as well.

As a result of the bonding, e.g., hybrid bonding, the bonding contacts on opposite sides of bonding interface 1212 can be inter-mixed. After the bonding, the bonding contacts in bonding layer 1232 and the bonding contacts in bonding layer 1222 are aligned and in contact with one another, such that memory stack 1226 and NAND memory strings 1228 formed therethrough as well as transistors 1204 and 1206 can be coupled to transistors 1214 and 1216 through the bonded bonding contacts across bonding interface 1212, according to some implementations.

Figure 12F:
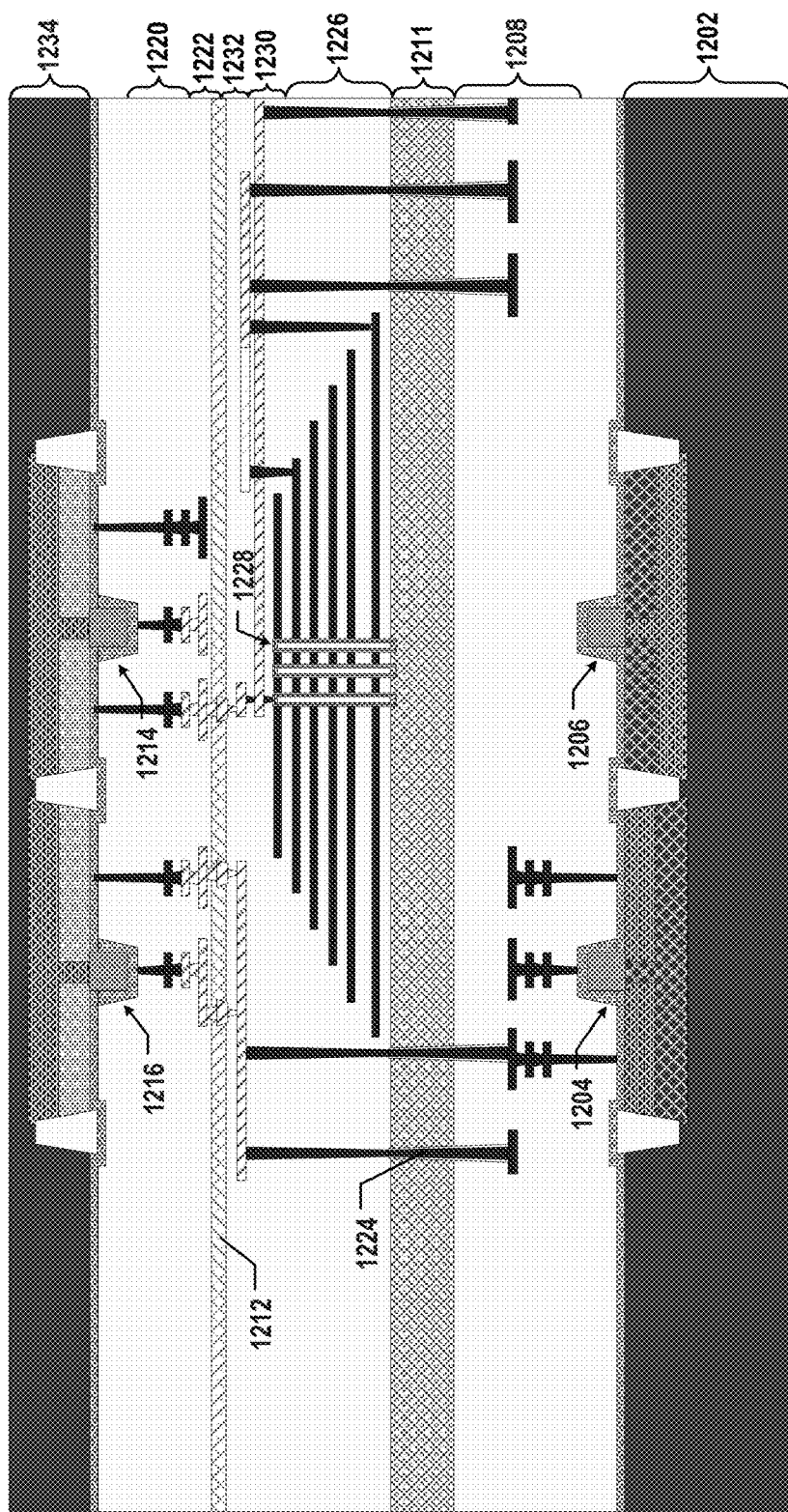

Method 1400 proceeds to operation 1412, as illustrated in FIG. 14, in which the first substrate or the second substrate is thinned. In some implementations, as illustrated in FIG. 12F, silicon substrate 1210 (shown in FIG. 12E) is thinned to become a semiconductor layer 1234 having single crystalline silicon. Silicon substrate 1210 can be thinned by processes including, but not limited to, wafer grinding, dry etch, wet etch, CMP, any other suitable processes, or any combination thereof. In some implementations, as illustrated in FIG. 13A, silicon substrate 1202 (shown in FIG. 12E) is thinned to become a semiconductor layer 1302 having single crystalline silicon. Similarly, silicon substrate 1202 can be thinned by processes including, but not limited to, wafer grinding, dry etch, wet etch, CMP, any other suitable processes, or any combination thereof.

Method 1400 proceeds to operation 1414, as illustrated in FIG. 14, in which a pad-out interconnect layer is formed. The pad-out interconnect layer can be formed on the thinned second substrate or on the thinned first substrate.

Figure 12G:
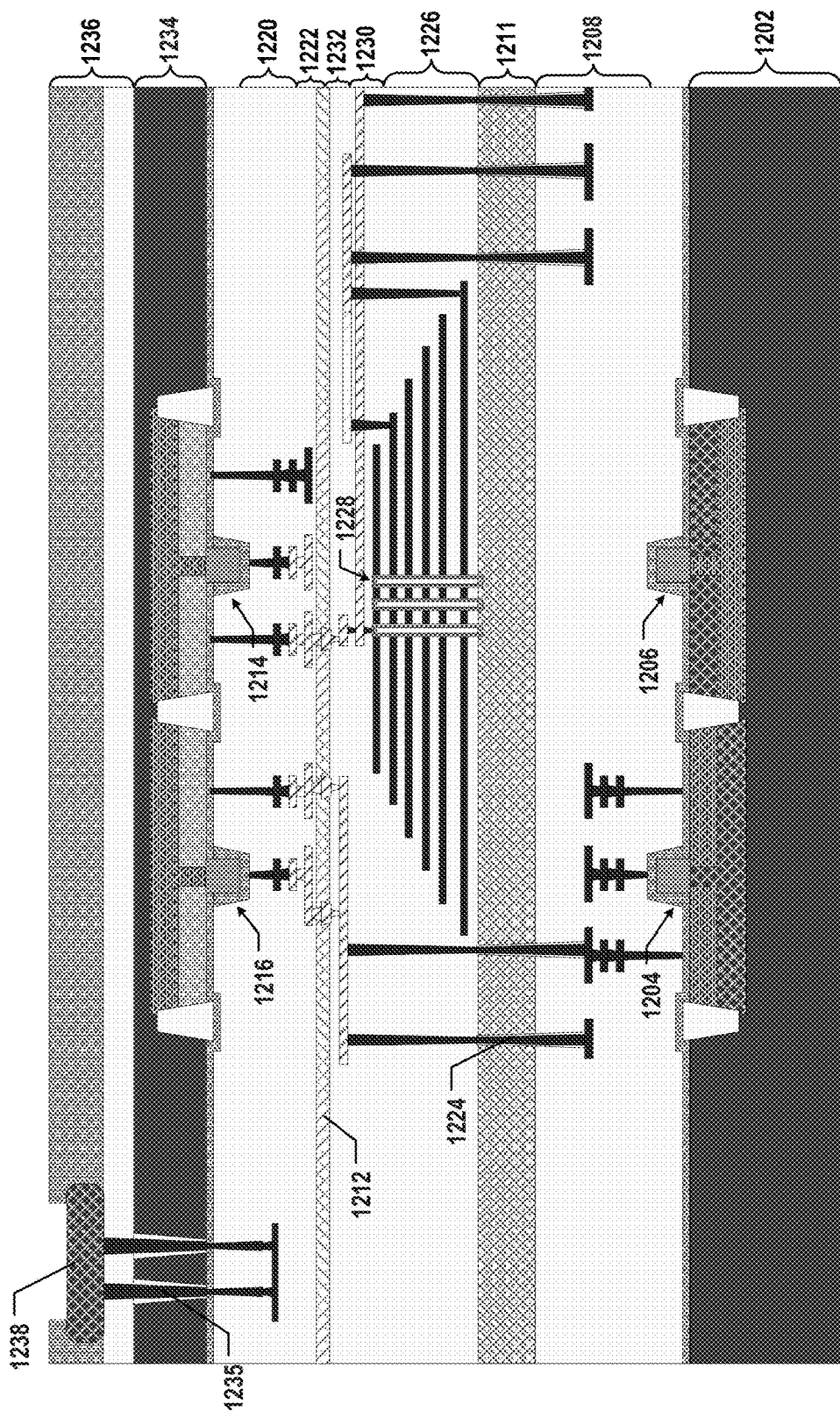

In some implementations, as illustrated in FIG. 12G, a pad-out interconnect layer 1236 is formed on semiconductor layer 1234 (the thinned silicon substrate 1210). Pad-out interconnect layer 1236 can include interconnects, such as contact pads 1238, formed in one or more ILD layers. Contact pads 1238 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations, after the bonding and thinning, contacts 1235 are formed, extending vertically through semiconductor layer 1234, for example, by wet/dry etching followed by depositing dielectric materials as spacers and conductive materials as conductors. Contacts 1235 can couple contact pads 1238 in pad-out interconnect layer 1236 to the interconnects in interconnect layer 1220. It is understood that in some examples, contacts 1235 may be formed in silicon substrate 1210 before thinning (the formation of semiconductor layer 1234, e.g., shown in FIG. 12D) and be exposed from the backside of silicon substrate 1210 (where the thinning occurs) after the thinning.

In some implementations, as illustrated in FIG. 13B, a pad-out interconnect layer 1306 is formed on semiconductor layer 1302 (the thinned silicon substrate 1202). Pad-out interconnect layer 1306 can include interconnects, such as contact pads 1308, formed in one or more ILD layers. Contact pads 1308 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations, after the bonding and thinning, contacts 1304 are formed, extending vertically through semiconductor layer 1302, for example, by wet/dry etching followed by depositing dielectric materials as spacers and conductive materials as conductors. Contacts 1304 can couple contact pads 1308 in pad-out interconnect layer 1306 to the interconnects in interconnect layer 1208. It is understood that in some examples, contacts 1304 may be formed in silicon substrate 1202 before thinning (the formation of semiconductor layer 1234) and be exposed from the backside of silicon substrate 1202 (where the thinning occurs) after the thinning.

Figure 15A:
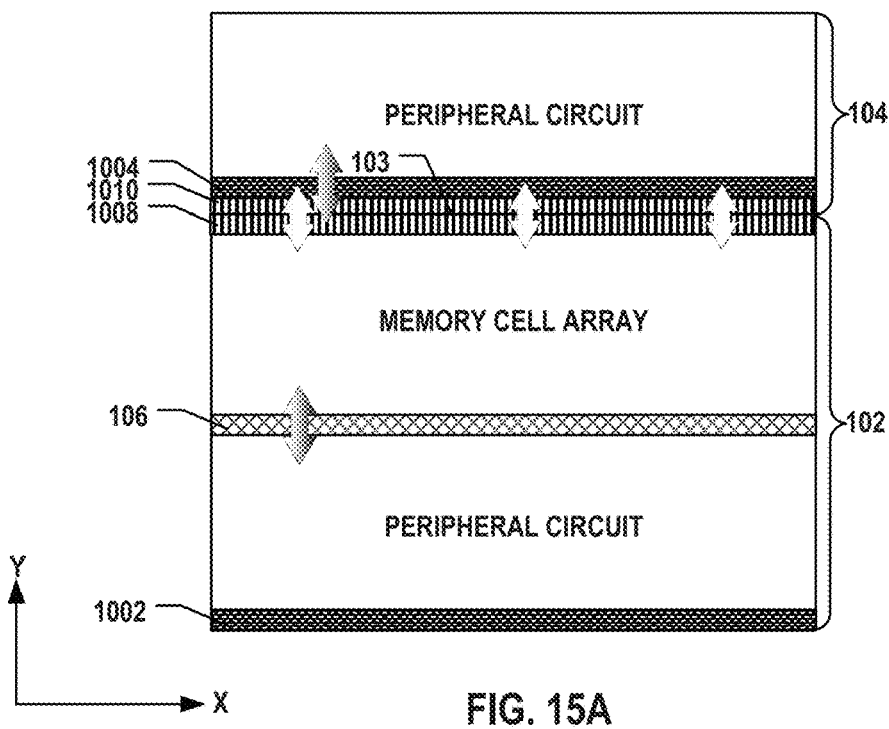
FIGS. 15A and 15B illustrate schematic views of cross-sections of the 3D memory devices in FIGS. 9A and 9B, according to various aspects of the present disclosure.
Figure 15B:
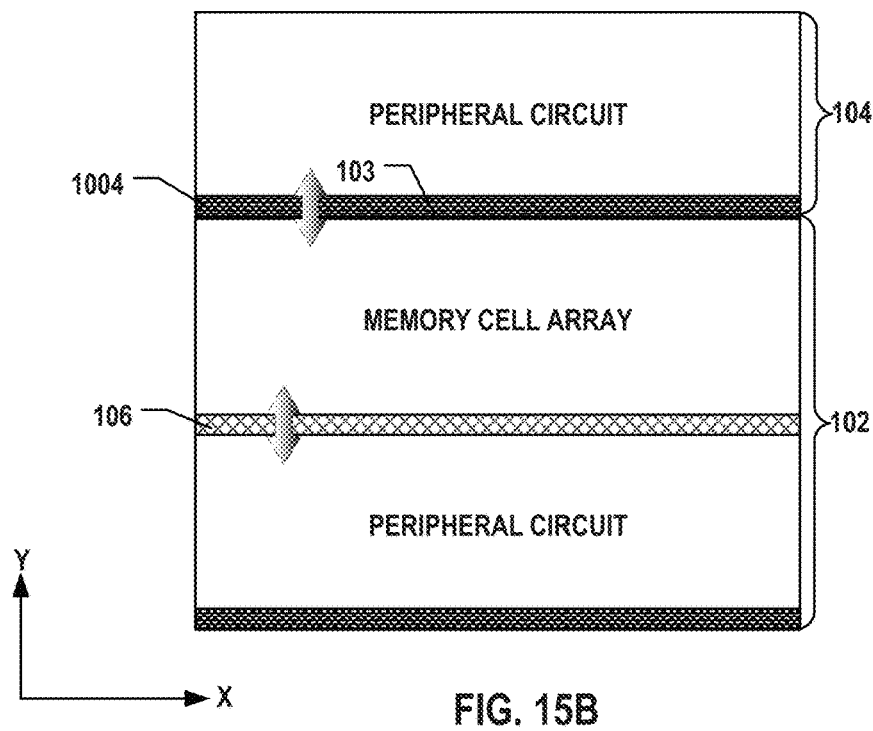

FIGS. 15A and 15B illustrate schematic views of cross-sections of the 3D memory devices in FIGS. 9A and 9B, according to various aspects of the present disclosure. 3D memory devices 1500 and 1501 may be examples of 3D memory devices 900 and 901 in FIGS. 9A and 9B. As shown in FIG. 15A, 3D memory device 1500 can include stacked first and second semiconductor structures 102 and 104. In some implementations, first semiconductor structure 102 includes semiconductor layer 1002, polysilicon layer 106, bonding layer 1008, a memory cell array vertically between polysilicon layer 106 and bonding layer 1008, and some of the peripheral circuits vertically between semiconductor layer 1002 and polysilicon layer 106.

The memory cell array can include an array of NAND memory strings (e.g., NAND memory strings 208 disclosed herein), and the sources of the array of NAND memory strings can be in contact with polysilicon layer 106 (e.g., as shown in FIG. 8). Polysilicon layer 106 can be a deposited polysilicon layer (e.g., either N-type doped, P-type doped, or undoped), which is suitable for "floating gate" type of NAND memory strings or certain designs of channel structures (e.g., channel structure 812 in FIG. 8) in "charge trap" type of NAND memory strings, for example, that are suitable for suitable for GIDL erase operations. Bonding layer 1008 can include conductive bonding contacts (not shown) and dielectrics electrically isolating the bonding contacts, which can be used, for example, for hybrid bonding as described below in detail.

In some implementations, the peripheral circuits in first semiconductor structure 102 are in contact with semiconductor layer 1002, but not polysilicon layer 106. That is, the transistors (e.g., planar transistors 500 and 3D transistors 600) of the peripheral circuits can be in contact with semiconductor layer 1002. Semiconductor layer 1002 can include semiconductor materials, such as single crystalline silicon (e.g., a silicon substrate or a thinned silicon substrate). It is understood that in some examples, different from polysilicon layer 106 in first semiconductor structure 102, semiconductor layer 1002 on which the transistors are formed may include single crystalline silicon, but not polysilicon, due to the superior carrier mobility of single crystalline silicon that is desirable for transistors' performance. Through contacts (e.g., ILVs/TSVs) through polysilicon layer 106 can make direct, short-distance (e.g., submicron- or micron-level) electrical connections between the memory cell array and the peripheral circuits in first semiconductor structure 102.

In some implementations, second semiconductor structure 104 includes a semiconductor layer 1004, a bonding layer 1010, and some of the peripheral circuits of the memory cell array. Semiconductor layer 1004 can be vertically between the peripheral circuits and bonding layer 1010. The transistors (e.g., planar transistors 500 and 3D transistors 600) of the peripheral circuits can be in contact with semiconductor layer 1004. Similar to semiconductor layer 1002, semiconductor layer 1004 can include semiconductor materials, such as single crystalline silicon (e.g., a silicon substrate or a thinned silicon substrate). It is understood that in some examples, different from polysilicon layer 106 in first semiconductor structure 102, semiconductor layer 1004 on which the transistors are formed may include single crystalline silicon, but not polysilicon, due to the superior carrier mobility of single crystalline silicon that is desirable for transistors' performance. The peripheral circuits and bonding layer 1010 can be formed on opposite sides of semiconductor layer 1004, such that semiconductor layer 1004 is disposed vertically between the peripheral circuits and bonding layer 1010. In some implementations, the transistors of the peripheral circuits are formed on the front side of semiconductor layer 1004, and the bonding contacts of bonding layer 1010 are formed on the backside of semiconductor layer 1004.

Similar to bonding layer 1008 in first semiconductor structure 102, bonding layer 1010 can also include conductive bonding contacts (not shown) and dielectrics electrically isolating the bonding contacts. Bonding interface 103 is vertically between and in contact with bonding layers 1008 and 1010, respectively, according to some implementations. That is, bonding layers 1008 and 1010 can be disposed on opposite sides of bonding interface 103, and the bonding contacts of bonding layer 1008 can be in contact with the bonding contacts of bonding layer 1010 at bonding interface 103. As a result, a large number (e.g., millions) of bonding contacts across bonding interface 103, in conjunction with through contacts (e.g., ILVs/TSVs) through semiconductor layer 1004, can make direct, short-distance (e.g., micron-level) electrical connections between adjacent semiconductor structures 102 and 104.

It is understood that in some examples, first and second semiconductor structures 102 and 104 may not include bonding layers 1008 and 1010, respectively, disposed on opposite sides of bonding interface 103 as shown in FIG. 15A. In FIG. 15B, semiconductor layer 1004 in second semiconductor structure 104 of 3D memory device 1501 can be a layer of single crystalline silicon transferred from a silicon substrate or an SOI substrate and attached to the top surface of first semiconductor structure 102 by transfer bonding, and bonding interface 103 between first and second semiconductor structures 102 and 104 can result from transfer bonding, as opposed to hybrid bonding. Through contacts (e.g., ILVs/TSVs) through semiconductor layer 1004 vertically between first and second semiconductor structures 102 and 104 can make direct, short-distance (e.g., submicron-level) electrical connections between adjacent semiconductor structures 102 and 104.

As shown in FIGS. 15A and 15B, since first and second semiconductor structures 102 and 104 are bonded in a face-to-back manner (e.g., semiconductor layers 1002 and 1004 being disposed on the bottom sides of first and second semiconductor structures 102 and 104, respectively, in FIGS. 15A and 15B), the transistors of peripheral circuits in first and second semiconductor structures 102 and 104 are disposed facing toward the same direction (e.g., the positive y-direction in FIGS. 15A and 15B), according to some implementations. Moreover, within first semiconductor structure 102, since polysilicon layer 106 is vertically between the memory cell array and the peripheral circuits, and the memory cell array and the peripheral circuits formed on polysilicon layer 106 and semiconductor layer 1002, respectively, the memory cell array and the peripheral circuits face toward the same direction (e.g., in the positive y-direction in FIGS. 15A and 15B). It is understood that pad-out interconnect layer 902 in FIGS. 9A and 9B is omitted from 3D memory devices 1500 and 1501 in FIGS. 15A and 15B for ease of illustration and may be included in 3D memory devices 1500 and 1501 as described above with respect to FIGS. 9A and 9B.

As described above, first and second semiconductor structures 102 and 104 can have peripheral circuits having transistors with different applied voltages. For example, second semiconductor structure 104 may be one example of semiconductor structure 408 including LLV circuits 402 (and LV circuits 404 in some examples) in FIG. 4B, and first semiconductor structure 102 may be one example of semiconductor structure 410 including HV circuits 406 (and LV circuits 404 in some examples) in FIG. 4B, or vice versa. Thus, in some implementations, semiconductor layers 1002 and 1004 in first and second semiconductor structures 102 and 104 have different thicknesses to accommodate the transistors with different applied voltages. In one example, first semiconductor structure 102 may include HV circuits 406 and second semiconductor structure 104 may include LLV circuits 402, and the thickness of semiconductor layer 1002 in first semiconductor structure 102 may be larger than the thickness of semiconductor layer 1004 in second semiconductor structure 104. Moreover, in some implementations, the gate dielectrics of the transistors in first and second semiconductor structures 102 and 104 have different thicknesses as well to accommodate the different applied voltages. In one example, first semiconductor structure 102 may include HV circuits 406 and second semiconductor structure 104 may include LLV circuits 402, and the thickness of the gate dielectrics of the transistors in first semiconductor structure 102 may be larger (e.g., at least 5-fold) than the thickness of the gate dielectrics of the transistors in second semiconductor structure 104.

Figure 16A:
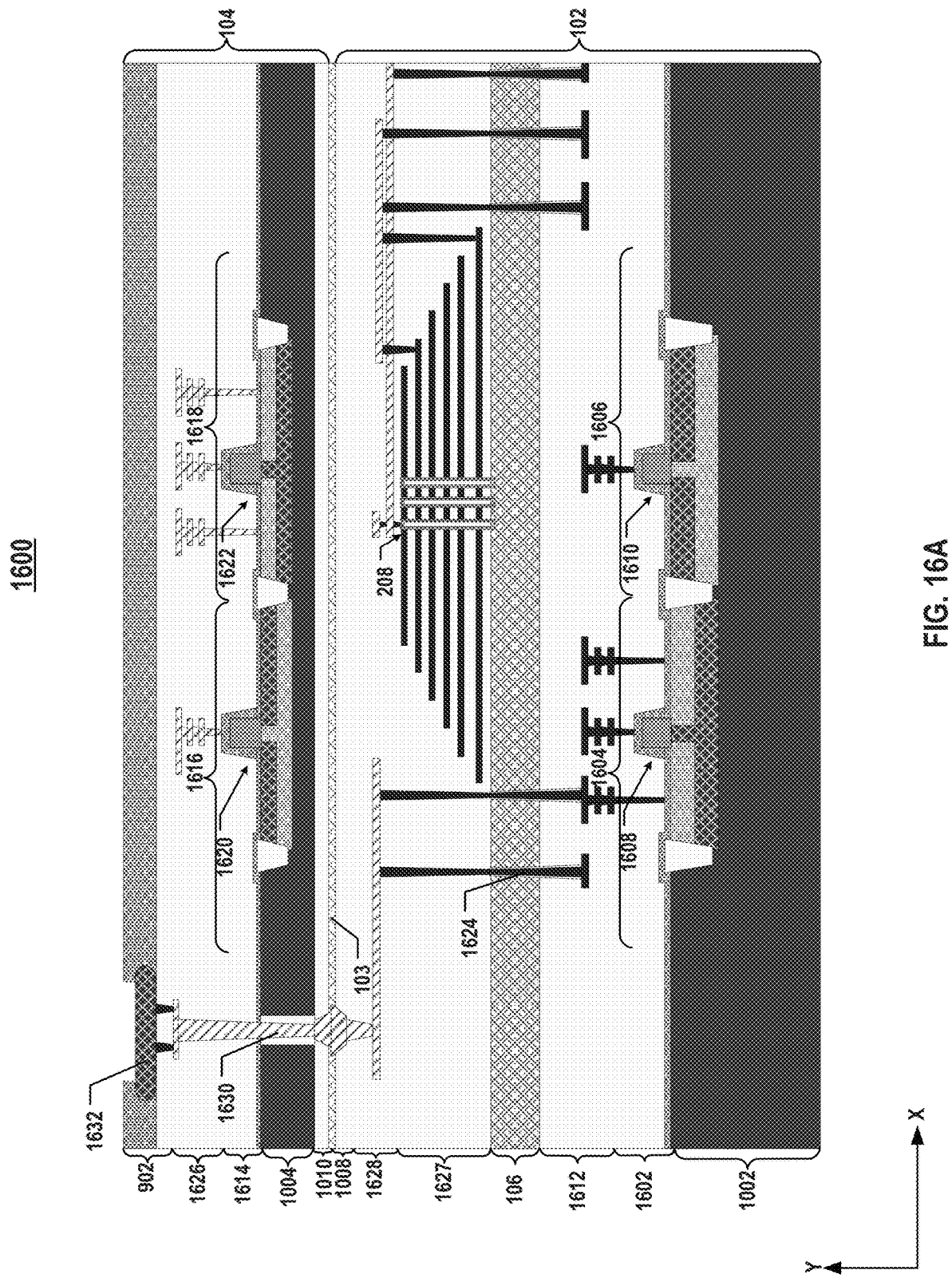
FIGS. 16A and 16B illustrate side views of various examples of the 3D memory devices in FIGS. 15A and 15B, according to various aspects of the present disclosure.
Figure 16B:
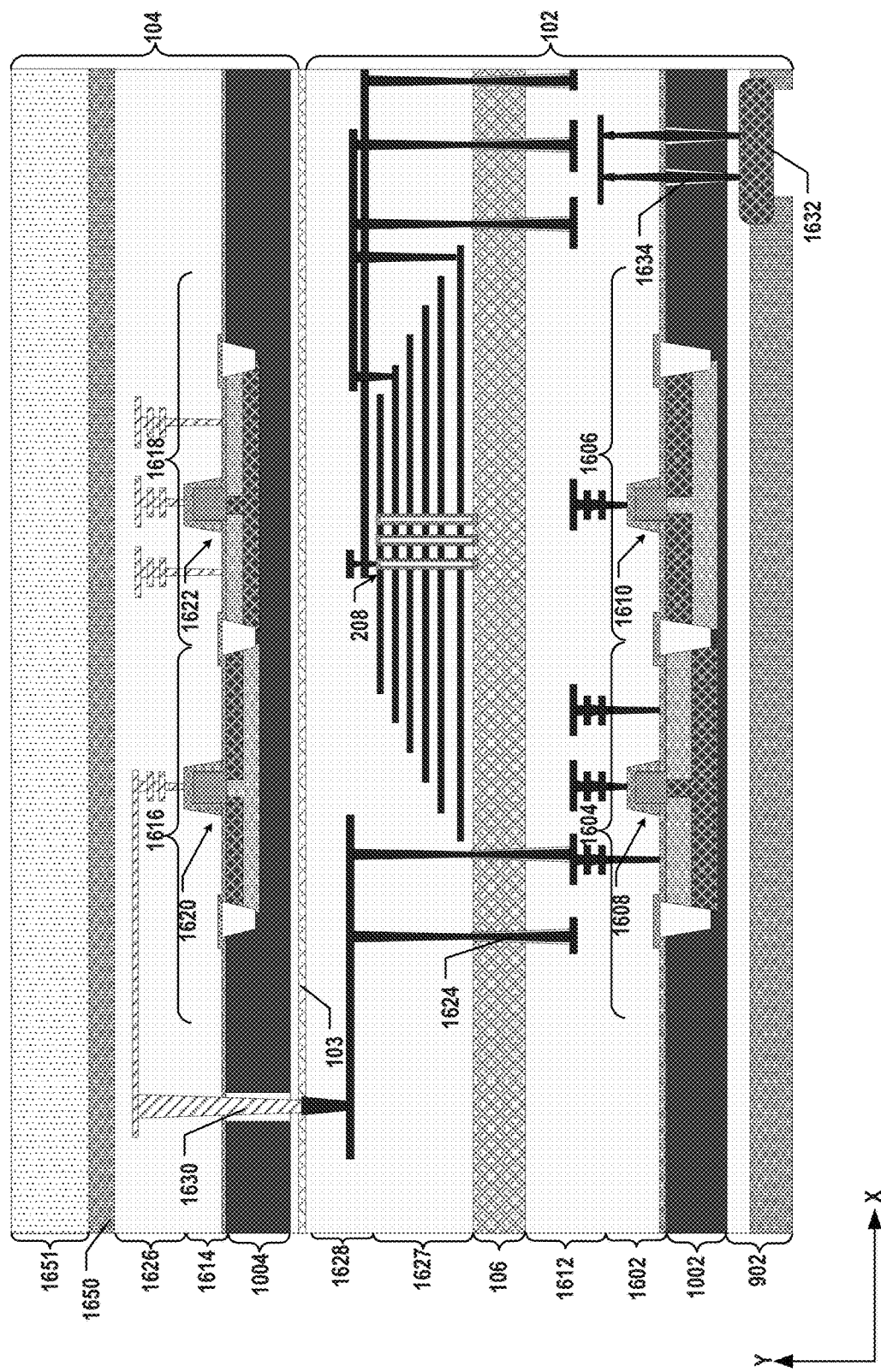

FIGS. 16A and 16B illustrate side views of various examples of 3D memory devices 1500 and 1501 in FIGS. 15A and 15B, according to various aspects of the present disclosure. As shown in FIG. 16A, as one example of 3D memory devices 1500 and 1501 in FIGS. 15A and 15B, 3D memory device 1600 is a bonded chip including first semiconductor structure 102 and second semiconductor structure 104, which are stacked over one another in different planes in the vertical direction (e.g., the y-direction in FIG. 16A), according to some implementations. First and second semiconductor structures 102 and 104 are bonded at bonding interface 103 therebetween, according to some implementations.

As shown in FIG. 16A, first semiconductor structure 102 can include semiconductor layer 1002 having semiconductor materials. In some implementations, semiconductor layer 1002 is a silicon substrate having single crystalline silicon. First semiconductor structure 102 can also include a device layer 1602 above and in contact with semiconductor layer 1002. In some implementations, device layer 1602 includes a first peripheral circuit 1604 and a second peripheral circuit 1606. First peripheral circuit 1604 can include HV circuits 406, such as driving circuits (e.g., string drivers 704 in row decoder/word line driver 308 and drivers in column decoder/bit line driver 306), and second peripheral circuit 1606 can include LV circuits 404, such as page buffer circuits (e.g., page buffer circuits 702 in page buffer 304) and logic circuits (e.g., in control logic 312). In some implementations, first peripheral circuit 1604 includes a plurality of transistors 1608 in contact with semiconductor layer 1002, and second peripheral circuit 1606 includes a plurality of transistors 1610 in contact with semiconductor layer 1002. Transistors 1608 and 1610 can include any transistors disclosed herein, such as planar transistors 500 and 3D transistors 600. As described above in detail with respect to transistors 500 and 600, in some implementations, each transistor 1608 or 1610 includes a gate dielectric, and the thickness of the gate dielectric of transistor 1608 (e.g., in HV circuit 406) is larger than the thickness of the gate dielectric of transistor 1610 (e.g., in LV circuit 404) due to the higher voltage applied to transistor 1608 than transistor 1610. Trench isolations (e.g., STIs) and doped regions (e.g., wells, sources, and drains of transistors 1608 and 1610) can be formed on or in semiconductor layer 1002 as well.

In some implementations, first semiconductor structure 102 further includes an interconnect layer 1612 above device layer 1602 to transfer electrical signals to and from peripheral circuits 1606 and 1604. As shown in FIG. 16A, interconnect layer 1612 can be vertically between polysilicon layer 106 and device layer 1602 (including transistors 1608 and 1610 of peripheral circuits 1604 and 1606). Interconnect layer 1612 can include a plurality of interconnects, such as MEOL interconnects and BEOL interconnects. The interconnects in interconnect layer 1612 can be coupled to transistors 1608 and 1610 of peripheral circuits 1604 and 1606 in device layer 1602. Interconnect layer 1612 can further include one or more ILD layers in which the lateral lines and vias can form. That is, interconnect layer 1612 can include lateral lines and vias in multiple ILD layers. In some implementations, the devices in device layer 1602 are coupled to one another through the interconnects in interconnect layer 1612. For example, peripheral circuit 1604 may be coupled to peripheral circuit 1606 through interconnect layer 1612. The interconnects in interconnect layer 1612 can include conductive materials including, but not limited to, W, Co, Cu, Al, silicides, or any combination thereof. The ILD layers in interconnect layer 1612 can include dielectric materials including, but not limited to, silicon oxide, silicon nitride, silicon oxynitride, low-k dielectrics, or any combination thereof. In some implementations, the interconnects in interconnect layer 1612 include W, which has a relatively high thermal budget (compatible with high-temperature processes) and good quality (fewer detects, e.g., voids) among conductive metal materials.

As shown in FIG. 16A, first semiconductor structure can further include polysilicon layer 106 above and in contact with interconnect layer 1612. Polysilicon layer 106 is a doped polysilicon layer on interconnect layer 1612, as described below in detail with respect to the fabrication process, according to some implementations. It is understood that in some examples, trench isolations and doped regions (not shown) may be formed in polysilicon layer 106 as well.

As shown in FIG. 16A, first semiconductor structure 102 can also include a memory cell array, such as an array of NAND memory strings 208 above and in contact with polysilicon layer 106. The sources of the NAND memory strings 208 can be in contact with polysilicon layer 106. In some implementations, polysilicon layer 106 is vertically between NAND memory strings 208 and device layer 1602 including transistors 1608 and 1610. In some implementations, each NAND memory string 208 is a "charge trap" type of NAND memory string including any suitable channel structures disclosed herein, such as channel structure 812, described above in detail with respect to FIG. 8. In some implementations, NAND memory string 208 is a "floating gate" type of NAND memory string, and polysilicon layer 106 is the source plate of the floating gate type of NAND memory strings.

Each NAND memory string 208 extends vertically through a plurality of pairs each including a conductive layer and a dielectric layer, according to some implementations. The stacked and interleaved conductive layers and dielectric layers are also referred to herein as a stack structure, e.g., a memory stack 1627. Memory stack 1627 may be an example of memory stack 804 in FIG. 8, and the conductive layer and dielectric layer in memory stack 1627 may be examples of gate conductive layers 806 and dielectric layer 808, respectively, in memory stack 804. The interleaved conductive layers and dielectric layers in memory stack 1627 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 1627.

As shown in FIG. 16A, first semiconductor structure 102 can further include an interconnect layer 1628 above and in contact with NAND memory strings 208 to transfer electrical signals to and from NAND memory strings 208. In some implementations, memory stack 1627 and NAND memory strings 208 are vertically between interconnect layer 1628 and polysilicon layer 106. Interconnect layer 1628 can include a plurality of interconnects, such as MEOL interconnects and BEOL interconnects. In some implementations, the interconnects in interconnect layer 1628 also include local interconnects, such as bit line contacts and word line contacts. Interconnect layer 1628 can further include one or more ILD layers in which the lateral lines and vias can form. The interconnects in interconnect layer 1628 can include conductive materials including, but not limited to, W, Co, Cu, Al, silicides, or any combination thereof. The ILD layers in interconnect layer 1628 can include dielectric materials including, but not limited to, silicon oxide, silicon nitride, silicon oxynitride, low-k dielectrics, or any combination thereof.

As shown in FIG. 16A, first semiconductor structure 102 can further include one or more contacts 1624 extending vertically through polysilicon layer 106. In some implementations, contact 1624 couples the interconnects in interconnect layer 1628 to the interconnects in interconnect layer 1612 to make an electrical connection through polysilicon layer 106 between NAND memory strings 208 and transistors 1608 and 1610. Contact 1624 can include conductive materials including, but not limited to, W, Co, Cu, Al, silicides, or any combination thereof. In some implementations, contact 1624 includes W. In some implementations, contact 1624 includes a via surrounded by a dielectric spacer (e.g., having silicon oxide) to electrically separate the via from polysilicon layer 106. Depending on the thickness of polysilicon layer 106, contact 1624 can be an ILV having a depth in the submicron-level (e.g., between 10 nm and 1 μm), or a TSV having a depth in the micron- or tens micron-level (e.g., between 1 μm and 100 μm).

As shown in FIG. 16A, first semiconductor structure 102 can further include a bonding layer 1008 at bonding interface 103 and above and in contact with interconnect layer 1628. Bonding layer 1008 can include a plurality of bonding contacts and dielectrics electrically isolating the bonding contacts. The bonding contacts can include conductive materials including, but not limited to, W, Co, Cu, Al, silicides, or any combination thereof. In some implementations, the bonding contacts of bonding layer 1008 include Cu. The remaining area of bonding layer 1008 can be formed with dielectrics including, but not limited to, silicon oxide, silicon nitride, silicon oxynitride, low-k dielectrics, or any combination thereof. The bonding contacts and surrounding dielectrics in bonding layer 1008 can be used for hybrid bonding (also known as "metal/dielectric hybrid bonding"), which is a direct bonding technology (e.g., forming bonding between surfaces without using intermediate layers, such as solder or adhesives) and can obtain metal-metal (e.g., Cu-to-Cu) bonding and dielectric-dielectric (e.g., $SiO_2$-to-$SiO_2$) bonding simultaneously.

As shown in FIG. 16A, second semiconductor structure 104 can be bonded on top of first semiconductor structure 102 in a back-to-face manner at bonding interface 103. Second semiconductor structure 104 can also include a bonding layer 1010 at bonding interface 103, e.g., on the opposite side of bonding interface 103 with respect to bonding layer 1008 in first semiconductor structure 102. Bonding layer 1010 can include a plurality of bonding contacts and dielectrics electrically isolating the bonding contacts. The bonding contacts can include conductive materials, such as Cu. The remaining area of bonding layer 1010 can be formed with dielectric materials, such as silicon oxide. The bonding contacts and surrounding dielectrics in bonding layer 1010 can be used for hybrid bonding. In some implementations, bonding interface 103 is the place at which bonding layers 1008 and 1010 are met and bonded. In practice, bonding interface 103 can be a layer with a certain thickness that includes the top surface of bonding layer 1008 of first semiconductor structure 102 and the bottom surface of bonding layer 1010 of second semiconductor structure 104.

As shown in FIG. 16A, second semiconductor structure 104 can further include semiconductor layer 1004 having semiconductor materials. Bonding layer 1010 can be formed on the backside of semiconductor layer 1004 and disposed vertically between semiconductor layer 1004 and bonding interface 103. In some implementations, semiconductor layer 1004 is a thinned silicon substrate having single crystalline silicon. Second semiconductor structure 104 can also include a device layer 1614 above and in contact with semiconductor layer 1004. In some implementations, device layer 1614 includes a third peripheral circuit 1616 and a fourth peripheral circuit 1618 above and in contact with semiconductor layer 1004. In some implementations, semiconductor layer 1004 is disposed vertically between bonding interface 103 and device layer 1614 having peripheral circuits 1616 and 1618. Third peripheral circuit 1616 can include LLV circuits 402, such as I/O circuits (e.g., in interface 316 and data bus 318), and fourth peripheral circuit 1618 can include LV circuits 404, such as page buffer circuits (e.g., page buffer circuits 702 in page buffer 304) and logic circuits (e.g., in control logic 312). In some implementations, third peripheral circuit 1616 includes a plurality of transistors 1620, and fourth peripheral circuit 1618 includes a plurality of transistors 1622 as well. Transistors 1620 and 1622 can include any transistors disclosed herein, such as planar transistors 500 and 3D transistors 600. As described above in detail with respect to transistors 500 and 600, in some implementations, each transistor 1620 or 1622 includes a gate dielectric, and the thickness of the gate dielectric of transistor 1620 (e.g., in LLV circuit 402) is smaller than the thickness of the gate dielectric of transistor 1622 (e.g., in LV circuit 404) due to the lower voltage applied to transistor 1620 than transistor 1622.

Moreover, the different voltages applied to different transistors 1620, 1622, 1608, and 1610 in second and first semiconductor structures 104 and 102 can lead to differences of device dimensions between second and first semiconductor structures 104 and 102. In some implementations, the thickness of the gate dielectric of transistor 1608 (e.g., in HV circuit 406) is larger than the thickness of the gate dielectric of transistor 1620 (e.g., in LLV circuit 402) due to the higher voltage applied to transistor 1608 than transistor 1620. In some implementations, the thickness of the gate dielectric of transistor 1622 (e.g., in LV circuit 404) is the same as the thickness of the gate dielectric of transistor 1610 (e.g., in LV circuit 404) due to the same voltage applied to transistor 1622 and transistor 1610. In some implementations, the thickness of semiconductor layer 1002 in which transistor 1608 (e.g., in HV circuit 406) is formed is larger than the thickness of semiconductor layer 1004 in which transistor 1620 (e.g., in LLV circuit 402) is formed due to the higher voltage applied to transistor 1608 than transistor 1620.

As shown in FIG. 16A, second semiconductor structure 104 can further include an interconnect layer 1626 above and in contact with device layer 1614 to transfer electrical signals to and from transistors 1620 and 1622 of peripheral circuits 1616 and 1618. Interconnect layer 1626 can include a plurality of interconnects, such as MEOL interconnects and BEOL interconnects. Interconnect layer 1626 can further include one or more ILD layers in which the lateral lines and vias can form. The interconnects in interconnect layer 1626 can include conductive materials including, but not limited to, W, Co, Cu, Al, silicides, or any combination thereof. The ILD layers in interconnect layer 1626 can include dielectric materials including, but not limited to, silicon oxide, silicon nitride, silicon oxynitride, low-k dielectrics, or any combination thereof. In some implementations, the interconnects in interconnect layer 1626 include Cu, which has a relatively low resistivity (better electrical performance) among conductive metal materials. As described below with respect to the fabrication process, although Cu has a relatively low thermal budget (incompatible with high-temperature processes), since the fabrication of interconnect layer 1626 can occur after the high-temperature processes in forming device layer 1614 in second semiconductor structure 104, as well as being separated from the high-temperature processes in forming first semiconductor structure 102, the interconnects of interconnect layer 1626 having Cu can become feasible.

As shown in FIG. 16A, second semiconductor structure 104 can also include one or more contacts 1630 extending vertically through semiconductor layer 1004. In some implementations, contact 1630, in conjunction with bonding contacts across bonding interface 103, couples the interconnects in interconnect layer 1626 to the interconnects in interconnect layer 1628 to make an electrical connection through semiconductor layer 1004 between NAND memory strings 208 and transistors 1620 and 1622. Contact 1630 can include conductive materials including, but not limited to, W, Co, Cu, Al, silicides, or any combination thereof. In some implementations, contact 1630 includes Cu. In some implementations, contact 1630 includes a via surrounded by a dielectric spacer (e.g., having silicon oxide) to electrically separate the via from semiconductor layer 1004. Depending on the thickness of semiconductor layer 1004, contact 1630 can be an ILV having a depth in the submicron-level (e.g., between 10 nm and 1 µm), or a TSV having a depth in the micron- or tens micron-level (e.g., between 1 µm and 100 µm).

As shown in FIG. 16A, second semiconductor structure 104 can further include a pad-out interconnect layer 902 above interconnect layer 1626 and transistors 1620 and 1622. In some implementations, transistors 1620 and 1622 are disposed vertically between pad-out interconnect layer 902 and semiconductor layer 1004. Pad-out interconnect layer 902 can include interconnects, e.g., contact pads 1632, in one or more ILD layers. Pad-out interconnect layer 902 and interconnect layer 1626 can be formed on the same side of semiconductor layer 1004. In some implementations, the interconnects in pad-out interconnect layer 902 can transfer electrical signals between 3D memory device 1600 and external devices, e.g., for pad-out purposes.

As a result, peripheral circuits 1604, 1606, 1616, and 1618 in first and second semiconductor structures 102 and 104 can be coupled to NAND memory strings 208 in first semiconductor structure 102 through various interconnection structures, including interconnect layers 1612, 1626, and 1628, bonding layers 1008 and 1010, as well as contacts 1624 and 1630. Moreover, peripheral circuits 1604, 1606, 1616, and 1618 and NAND memory strings 208 in 3D memory device 1600 can be further coupled to external devices through contacts 1630 and pad-out interconnect layer 902.

It is understood that the pad-out of 3D memory devices is not limited to from second semiconductor structure 104 having peripheral circuit 1616 as shown in FIG. 16A (corresponding to FIG. 9A) and may be from first semiconductor structure 102 having peripheral circuit 1604 (corresponding to FIG. 9B). For example, as shown in FIG. 16B, a 3D memory device 1601 may include pad-out interconnect layer 902 in first semiconductor structure 102. Pad-out interconnect layer 902 can be in contact with semiconductor layer 1002 of first semiconductor structure 102 on which transistors 1608 of peripheral circuit 1604 are formed. In some implementations, first semiconductor structure 102 further includes one or more contacts 1634 extending vertically through semiconductor layer 1002. In some implementations, contact 1634 couples the interconnects in interconnect layer 1612 in first semiconductor structure 102 to contact pads 1632 in pad-out interconnect layer 902 to make an electrical connection through semiconductor layer 1002. Contact 1634 can include conductive materials including, but not limited to, W, Co, Cu, Al, silicides, or any combination thereof. In some implementations, contact 1634 includes W. In some implementations, contact 1634 includes a via surrounded by a dielectric spacer (e.g., having silicon oxide) to electrically separate the via from semiconductor layer 1002. Depending on the thickness of semiconductor layer 1002, contact 1634 can be an ILV having a depth in the submicron-level (e.g., between 10 nm and 1 µm), or a TSV having a depth in the micron- or tens micron-level (e.g., between 1 µm and 100 µm).

As shown in FIG. 16B, second semiconductor structure 104 can further include a passivation layer 1650, replacing pad-out interconnect layer 902 in FIG. 16A, to protect and encapsulate 3D memory device 1601 from the side of second semiconductor structure 104 without pad-out interconnect layer 902. Passivation layer 1650 can include dielectric materials, such as silicon nitride and/or silicon oxide. In some implementations, second semiconductor structure 104 in 3D memory device 1601 further includes a handle/carrier substrate 1651 in contact with passivation layer 1650 as the base substrate of 3D memory device 1601 to provide support. It is understood that in some examples, passivation layer 1650 may be omitted or combined with handle substrate 1651 as a single layer for support and protection.

It is also understood that in some examples, first and second semiconductor structures 102 and 104 of 3D memory device 1601 may not include bonding layers 1008 and 1010, respectively, as shown in FIG. 16B. Bonding interface 103 can result from a transfer bonding process, and semiconductor layer 1004 can be a layer of single crystalline silicon transferred from a silicon substrate or an SOI substrate and attached to the top surface of first semiconductor structure 102 by transfer bonding, as described below in detail with respect to the fabrication process. In some implementations, dielectric layer(s) (e.g., silicon oxide layer) are formed vertically between bonding interface 103 and semiconductor layer 1004 and/or between bonding interface 105 and interconnect layer 1628 to facilitate the transfer bonding of semiconductor layer 1004 onto interconnect layer 1628. Thus, it is understood that bonding interface 103 may include the surfaces of the dielectric layer(s) in some examples. It is further understood that the details of the same components (e.g., materials, fabrication process, functions, etc.) in both 3D memory devices 1600 and 1601 are not repeated for ease of description.

Figure 19:
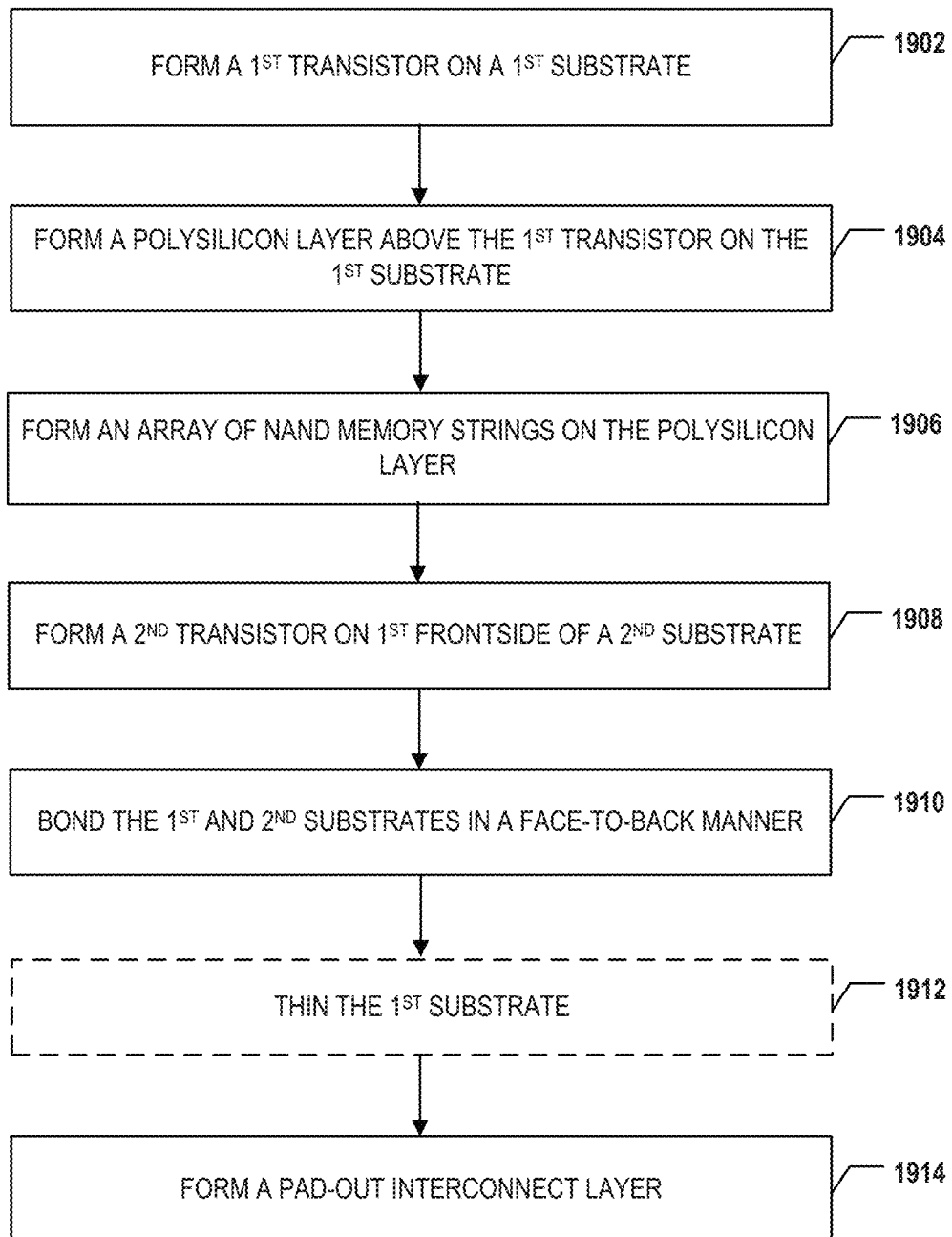
FIG. 19 illustrates a flowchart of a method for forming the 3D memory devices in FIGS. 15A and 15B, according to some aspects of the present disclosure.

FIGS. 17A-17H illustrate a fabrication process for forming the 3D memory devices in FIGS. 15A and 15B, according to some aspects of the present disclosure. FIG. 19 illustrates a flowchart of a method 1900 for forming the 3D memory devices in FIGS. 15A and 15B, according to some aspects of the present disclosure. Examples of the 3D memory devices depicted in FIGS. 17A-17H and 19 include 3D memory device 1600 depicted in FIG. 16A. FIGS. 17A-17H and 19 will be described together. It is understood that the operations shown in method 1900 are not exhaustive and that other operations can be performed as well before, after, or between any of the illustrated operations. Further, some of the operations may be performed simultaneously, or in a different order than shown in FIG. 19.

Figure 17A:
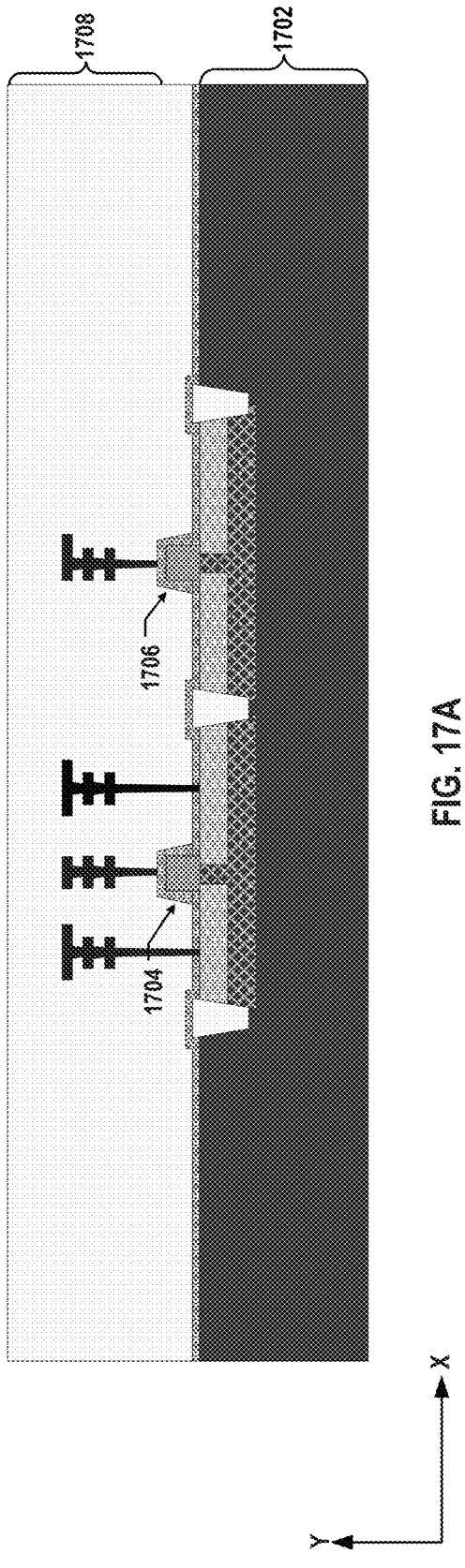
FIGS. 17A-17H illustrate a fabrication process for forming the 3D memory devices in FIGS. 15A and 15B, according to some aspects of the present disclosure.

Referring to FIG. 19, method 1900 starts at operation 1902, in which a first transistor is formed on a first substrate. The first substrate can be a silicon substrate having single crystalline silicon. As illustrated in FIG. 17A, a plurality of transistors 1704 and 1706 are formed on a silicon substrate 1702. Transistors 1704 and 1706 can be formed by a plurality of processes including, but not limited to, photolithography, dry/wet etch, thin film deposition, thermal growth, implantation, CMP, and any other suitable processes. In some implementations, doped regions are formed in silicon substrate 1702 by ion implantation and/or thermal diffusion, which function, for example, as wells and source/drain regions of transistors 1704 and 1706. In some implementations, isolation regions (e.g., STIs) are also formed in silicon substrate 1702 by wet/dry etch and thin film deposition. In some implementations, the thickness of gate dielectric of transistor 1704 is different from the thickness of gate dielectric of transistor 1706, for example, by depositing a thicker silicon oxide film in the region of transistor 1704 than the region of transistor 1706, or by etching back part of the silicon oxide film deposited in the region of transistor 1706. It is understood that the details of fabricating transistors 1704 and 1706 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 1708 is formed above the transistor on the first substrate. The interconnect layer can include a plurality of interconnects in one or more ILD layers. As illustrated in FIG. 17A, an interconnect layer 1708 can be formed above transistors 1704 and 1706. Interconnect layer 1708 can include interconnects of MEOL and/or BEOL in a plurality of ILD layers to make electrical connections with transistors 1704 and 1706. In some implementations, interconnect layer 1708 includes multiple ILD layers and interconnects therein formed in multiple processes. For example, the interconnects in interconnect layer 1708 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 17A can be collectively referred to as interconnect layer 1708. In some implementations, the interconnects in interconnect layer 1708 include W, which has a relatively high thermal budget among conductive metal materials to sustain later high-temperature processes.

Figure 17B:
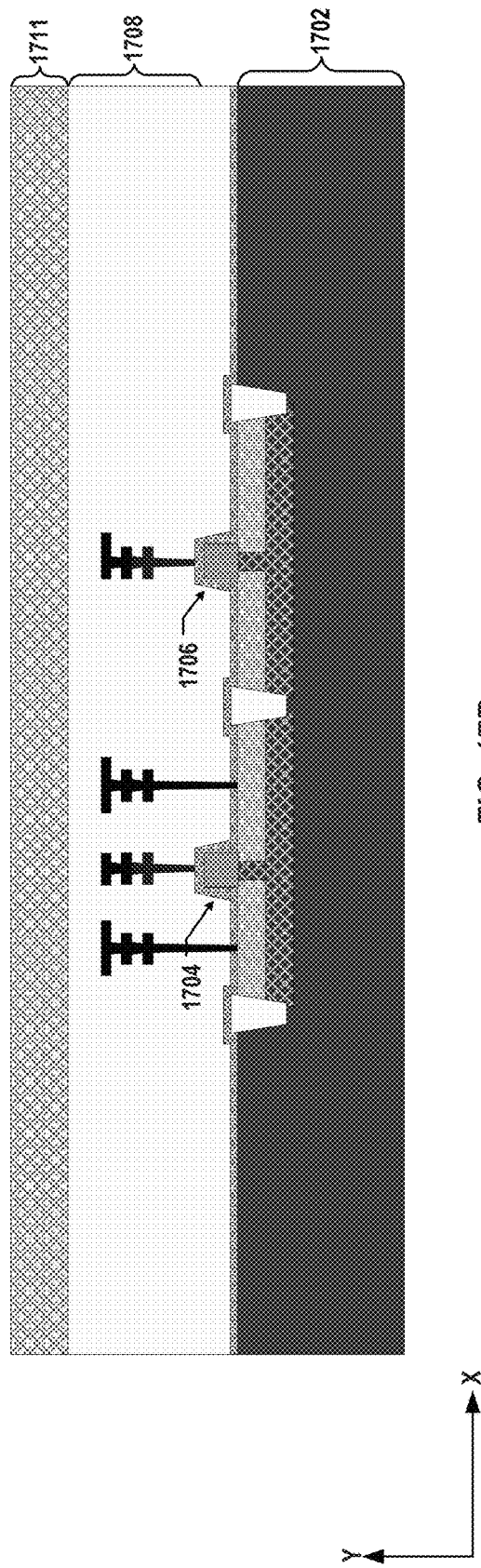

Method 1900 proceeds to operation 1904, as illustrated in FIG. 19, in which a polysilicon layer is formed above the first transistor. As illustrated in FIG. 17B, a polysilicon layer 1711 is formed above interconnect layer 1708 and transistors 1704 and 1706 on first silicon substrate 1702. Polysilicon layer 1711 can be formed by depositing polysilicon on interconnect layer 1708 using one or more thin film deposition processes including, but not limited to, CVD, PVD, ALD, or any combination thereof. In some implementations, polysilicon layer 1711 is doped with P-type or N-type dopant using an in-situ doping process during the deposition process or ion implantation/diffusion process after the deposition process.

Figure 17C:
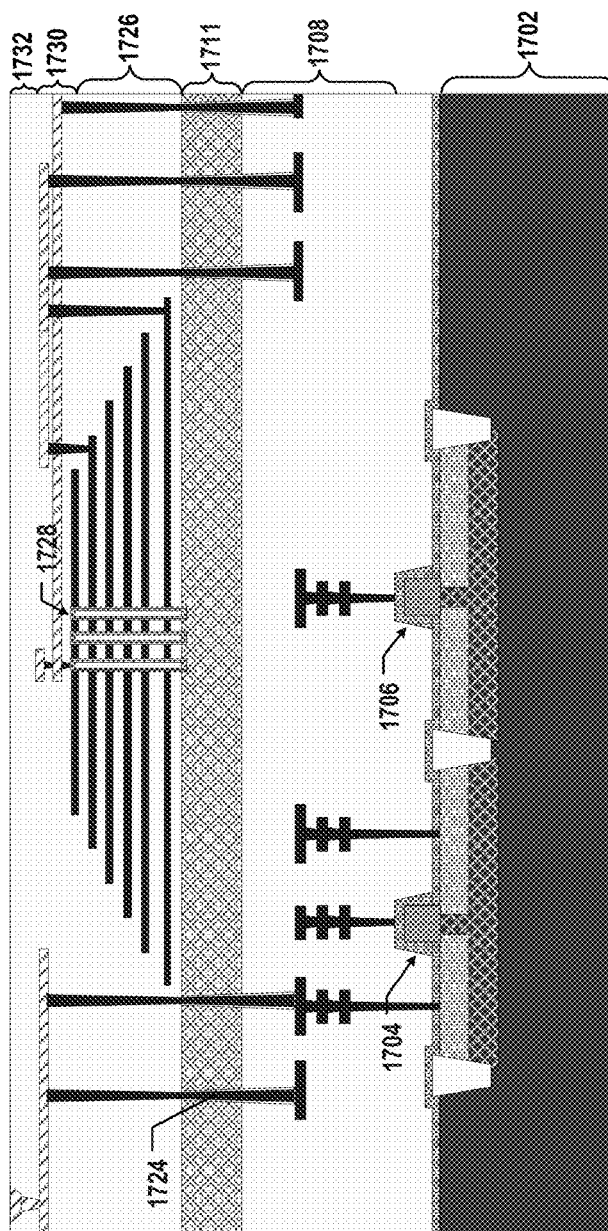

Method 1900 proceeds to operation 1906, as illustrated in FIG. 19, in which an array of NAND memory strings is formed on the polysilicon layer. In some implementations, to form the array of NAND memory strings, a memory stack is formed on the polysilicon layer. As illustrated in FIG. 17C, a stack structure, such as a memory stack 1726 including interleaved conductive layers and dielectric layers, is formed on polysilicon layer 1711. To form memory stack 1726, in some implementations, a dielectric stack (not shown) including interleaved sacrificial layers (not shown)

and the dielectric layers is formed on polysilicon layer 1711. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 1726 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 1726 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 1726 and polysilicon layer 1711.

As illustrated in FIG. 17C, NAND memory strings 1728 are formed above polysilicon layer 1711, each of which extends vertically through memory stack 1726 to be in contact with polysilicon layer 1711. In some implementations, fabrication processes to form NAND memory string 1728 include forming a channel hole through memory stack 1726 (or the dielectric stack) and into polysilicon layer 1711 using dry etching/and or wet etching, such as DRIE, followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 1728 may vary depending on the types of channel structures of NAND memory strings 1728 (e.g., channel structure 812 in FIG. 8) and thus, are not elaborated for ease of description.

In some implementations, an interconnect layer is formed above the array of NAND memory strings. The interconnect layer can include a first plurality of interconnects in one or more ILD layers. As illustrated in FIG. 17C, an interconnect layer 1730 is formed above memory stack 1726 and NAND memory strings 1728. Interconnect layer 1730 can include interconnects of MEOL and/or BEOL in a plurality of ILD layers to make electrical connections with NAND memory strings 1728. In some implementations, interconnect layer 1730 includes multiple ILD layers and interconnects therein formed in multiple processes. For example, the interconnects in interconnect layer 1730 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 17C can be collectively referred to as interconnect layer 1730.

In some implementations, a contact through the polysilicon layer is formed. As illustrated in FIG. 17C, one or more contacts 1724 each extending vertically through polysilicon layer 1711 is formed. Contacts 1724 can couple the interconnects in interconnect layers 1730 and 1708. Contacts 1724 can be formed by first patterning contact holes through polysilicon layer 1711 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor.

In some implementations, a first bonding layer is formed above interconnect layer. The first bonding layer can include a plurality of first bonding contacts. As illustrated in FIG. 12C, a bonding layer 1732 is formed above interconnect layer 1730. Bonding layer 1732 can include a plurality of bonding contacts surrounded by dielectrics. In some implementations, a dielectric layer is deposited on the top surface of interconnect layer 1730 by one or more thin film deposition processes including, but not limited to, CVD, PVD, ALD, or any combination thereof. The bonding contacts can then be formed through the dielectric layer and in contact with the interconnects in interconnect layer 1730 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Figure 17D:
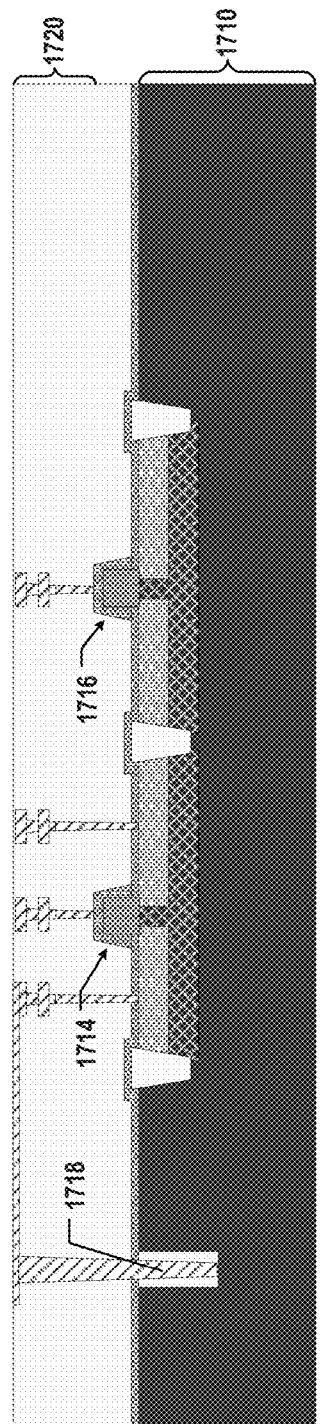

Method 1900 proceeds to operation 1908, as illustrated in FIG. 19, in which a second transistor is formed on a front side of a second substrate. The second substrate can be a silicon substrate having single crystalline silicon. As illustrated in FIG. 17D, a plurality of transistors 1714 and 1716 are formed on the front side of a silicon substrate 1710 having single crystalline silicon. Transistors 1714 and 1716 can be formed by a plurality of processes including, but not limited to, photolithography, dry/wet etch, thin film deposition, thermal growth, implantation, CMP, and any other suitable processes. In some implementations, doped regions are formed in silicon substrate 1710 by ion implantation and/or thermal diffusion, which function, for example, as wells and source/drain regions of transistors 1714 and 1716. In some implementations, isolation regions (e.g., STIs) are also formed in silicon substrate 1710 by wet/dry etch and thin film deposition. In some implementations, the thickness of gate dielectric of transistor 1714 is different from the thickness of gate dielectric of transistor 1716, for example, by depositing a thicker silicon oxide film in the region of transistor 1714 than the region of transistor 1716, or by etching back part of the silicon oxide film deposited in the region of transistor 1716. It is understood that the details of fabricating transistors 1714 and 1716 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer is formed above the transistor on the second substrate. The interconnect layer can include a plurality of interconnects in one or more ILD layers. As illustrated in FIG. 17D, an interconnect layer 1720 can be formed above transistors 1714 and 1716. Interconnect layer 1720 can include interconnects of MEOL and/or BEOL in a plurality of ILD layers to make electrical connections with transistors 1714 and 1716. In some implementations, interconnect layer 1720 includes multiple ILD layers and interconnects therein formed in multiple processes. For example, the interconnects in interconnect layer 1720 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 17D can be collectively referred to as interconnect layer 1720. Different from interconnect layer 1708, in some implementations, the interconnects in interconnect layer 1720 include Cu, which has a relatively low resistivity among conductive metal materials. It is understood that although Cu has a relatively low thermal budget (incompatible with high-temperature processes), using Cu as the conductive materials of the interconnects in interconnect layer 1720 may become feasible since there are no more high-temperature processes after the fabrication of interconnect layer 1720.

In some implementations, a contact through the thinned second substrate is formed. As shown in FIG. 17D, a contact 1718 extending vertically into silicon substrate 1710 from the front side of silicon substrate 1710 is formed. Contacts 1718 can be coupled to the interconnects in interconnect layer 1720. Contacts 1718 can be formed by first patterning contact holes into silicon substrate 1710 using patterning process (e.g., photolithography and dry/wet etch of dielectric materials in the dielectric layer). The contact holes can be filled with a conductor (e.g., Cu). In some implementations, filling the contact holes includes depositing a spacer (e.g., a silicon oxide layer) before depositing the conductor.

Figure 17E:
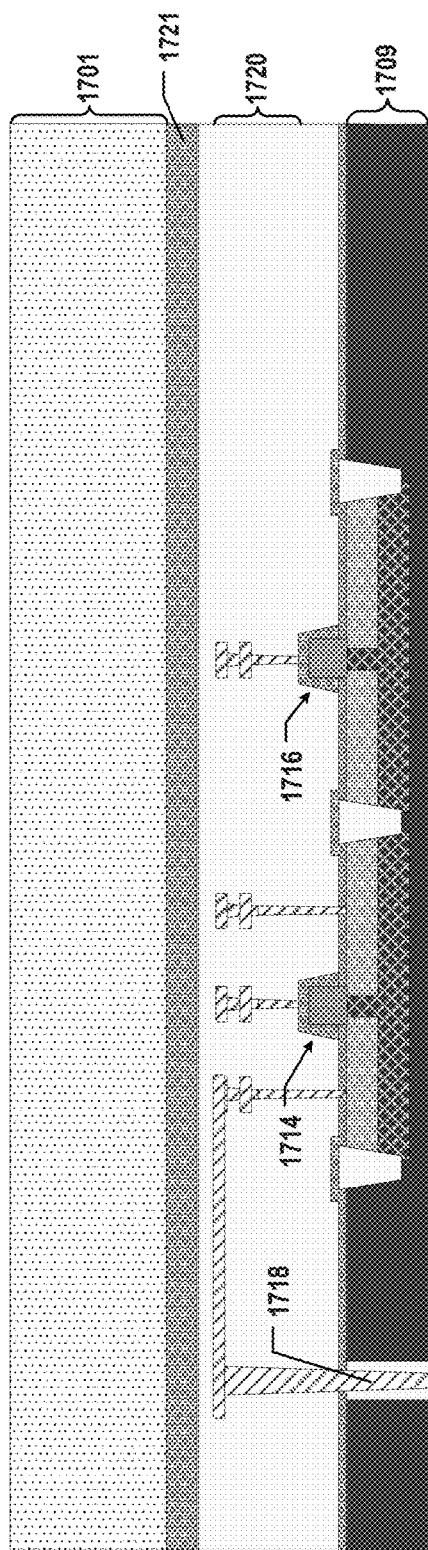

In some implementations, the second substrate is thinned. As illustrated in FIG. 17E, silicon substrate 1710 (shown in FIG. 17D) is thinned to become a semiconductor layer 1709 having single crystalline silicon. Silicon substrate 1710 can be thinned by processes including, but not limited to, wafer grinding, dry etch, wet etch, CMP, any other suitable processes, or any combination thereof. The thickness of semiconductor layer 1709 can be controlled to expose contact 1718 from the backside of thinned silicon substrate 1710, for example, by controlling the duration of the CMP process. It is understood that in some examples, contacts 1718 may be formed through semiconductor layer 1709 from the backside thereof after the thinning, as opposed to in silicon substrate 1710 before the thinning. In some implementations, before the thinning, a passivation layer 1721 is formed on interconnect layer 1720 by depositing a dielectric material, such as silicon nitride, on interconnect layer 1720 using one or more thin film deposition processes including, but not limited to, CVD, PVD, ALD, or any combination thereof. A handle substrate 1701 can then be attached to passivation layer 1721, for example, using adhesive bonding, prior to the thinning to allow the subsequent backside processes on silicon substrate 1710, such as thinning, contact formation, and bonding.

Figure 17F:
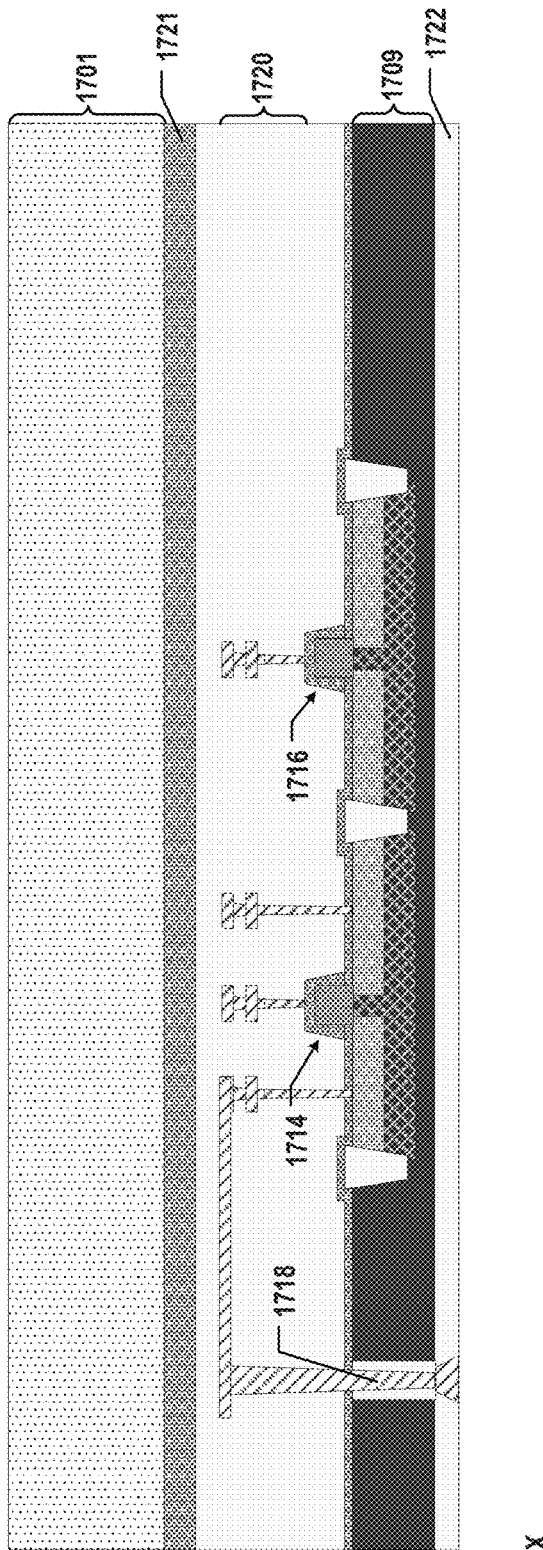

In some implementations, a second bonding layer is formed on the backside of the thinned second substrate. The second bonding layer can include a plurality of second bonding contacts. As illustrated in FIG. 17F, a bonding layer 1722 is formed on the backside of semiconductor layer 1709 (i.e., thinned silicon substrate 1710). Bonding layer 1722 can include a plurality of bonding contacts surrounded by dielectrics. In some implementations, a dielectric layer is deposited on the backside of semiconductor layer 1709 (opposite to the front side on which transistors 1714 and 1716 are formed) by one or more thin film deposition processes including, but not limited to, CVD, PVD, ALD, or any combination thereof. The bonding contacts can then be formed through the dielectric layer and in contact with contacts 1718 on the backside of thinned silicon substrate 1710 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 1900 proceeds to operation 1910, as illustrated in FIG. 19, in which the first substrate and the second substrate are bonded in a face-to-back manner. The first bonding contact in the first bonding layer can be in contact with the second bonding contact in the second bonding layer at a bonding interface after bonding the first and second substrates. The bonding can include hybrid bonding.

Figure 17G:
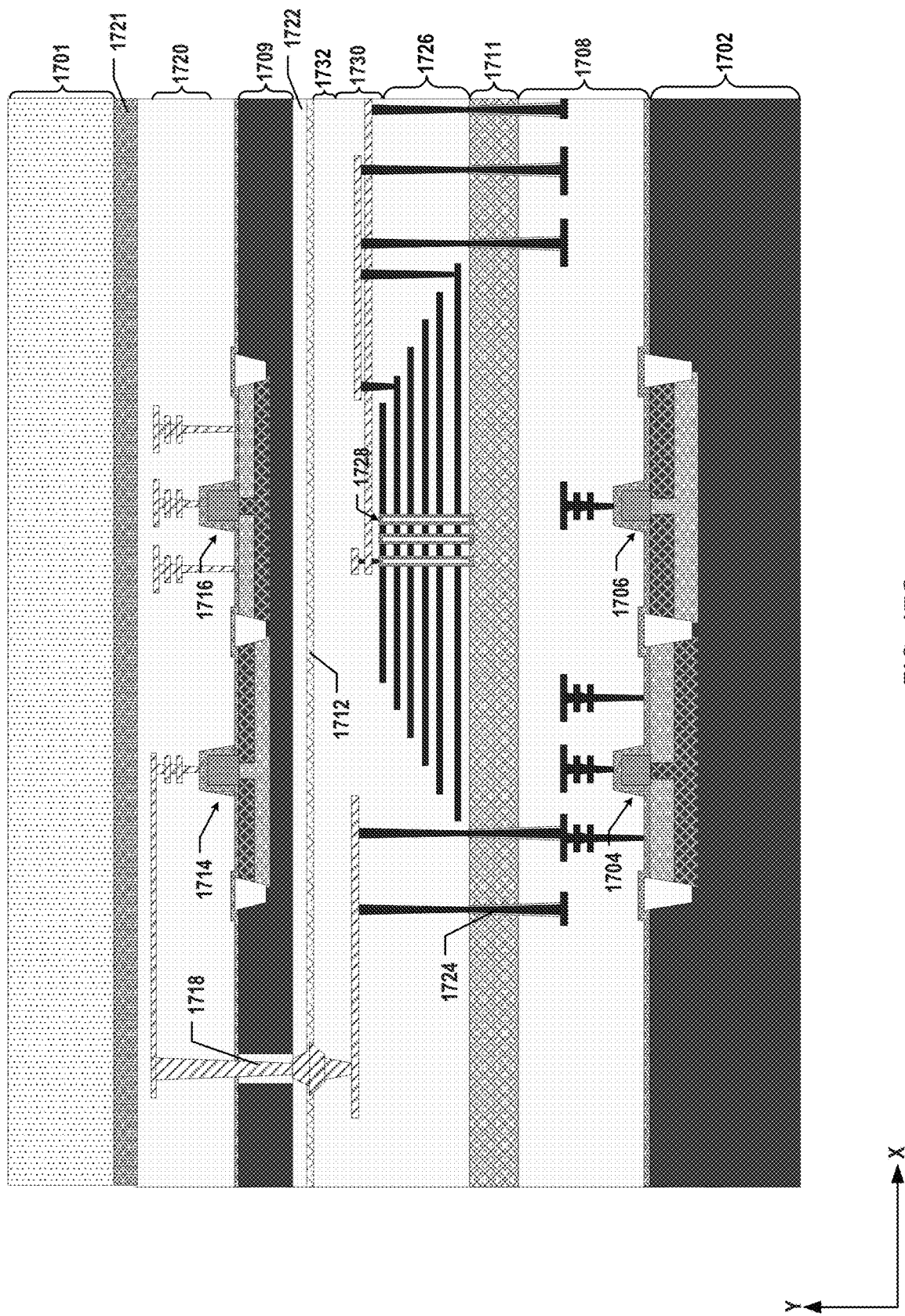

As illustrated in FIG. 17G, silicon substrate 1702 and components formed thereon (e.g., transistors 1704 and 1706 and NAND memory strings 1728) and thinned silicon substrate 1710 (i.e., semiconductor layer 1709) and components formed thereon (e.g., transistors 1714 and 1716) are bonded in a manner that bonding layer 1732 facing up on the front side of silicon substrate 1702 is bonded with bonding layer 1722 facing down on the backside of thinned silicon substrate 1710 (i.e., a face-to-face manner), thereby forming a bonding interface 1712. That is, silicon substrate 1702 and components formed thereon can be bonded with thinned silicon substrate 1710 and components formed thereon in a face-to-back manner, such that the bonding contacts in bonding layer 1732 are in contact with the bonding contacts in bonding layer 1722 at bonding interface 1712. In some implementations, a treatment process, e.g., plasma treatment, wet treatment and/or thermal treatment, is applied to bonding surfaces prior to bonding. As a result of the bonding, e.g., hybrid bonding, the bonding contacts on opposite sides of bonding interface 1712 can be inter-mixed. After the bonding, the bonding contacts in bonding layer 1732 and the bonding contacts in bonding layer 1722 are aligned and in contact with one another, such that memory stack 1726 and NAND memory strings 1728 formed therethrough as well as transistors 1704 and 1706 can be coupled to transistors 1714 and 1716 through the bonded bonding contacts across bonding interface 1712, according to some implementations.

Figure 17H:
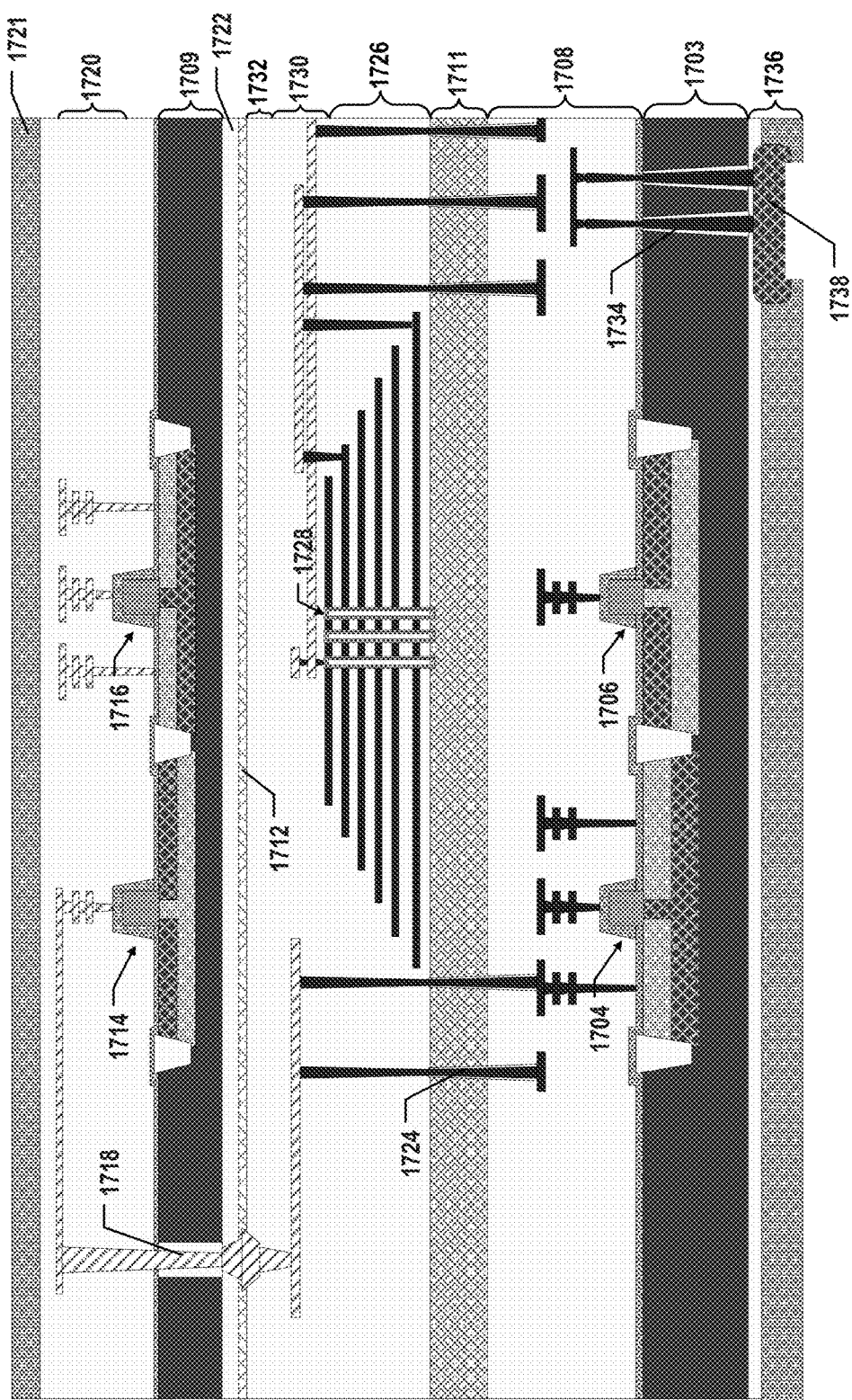

Method 1900 proceeds to optional operation 1912, as illustrated in FIG. 19, in which the first substrate is thinned. As illustrated in FIG. 17H, silicon substrate 1702 (shown in FIG. 17G) is thinned to become a semiconductor layer 1703 having single crystalline silicon. Silicon substrate 1702 can be thinned by processes including, but not limited to, wafer grinding, dry etch, wet etch, CMP, any other suitable processes, or any combination thereof.

Method 1900 proceeds to operation 1914, as illustrated in FIG. 19, in which a pad-out interconnect layer is formed. The pad-out interconnect layer can be formed on the thinned first substrate. As illustrated in FIG. 17H, a pad-out interconnect layer 1736 is formed on semiconductor layer 1703 (the thinned silicon substrate 1702). Pad-out interconnect layer 1736 can include interconnects, such as contact pads 1938, formed in one or more ILD layers. Contact pads 1738 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations, after the bonding and thinning, contacts 1734 are formed, extending vertically through semiconductor layer 1703, for example, by wet/dry etching followed by depositing dielectric materials as spacers and conductive materials as conductors. Contacts 1734 can couple contact pads 1738 in pad-out interconnect layer 1736 to the interconnects in interconnect layer 1708. It is understood that in some examples, contacts 1734 may be formed in silicon substrate 1702 before thinning (the formation of semiconductor layer 1703, e.g., shown in FIG. 17G) and be exposed from the backside of silicon substrate 1702 (where the thinning occurs) after the thinning.

In some implementations, after operation 1910, optional operation 1912 is skipped, and method 1900 proceeds to operation 1914, as illustrated in FIG. 19, in which a pad-out interconnect layer is formed. The pad-out interconnect layer can be formed above the second transistor. Although not shown in FIG. 17G, it is understood that in some examples, a pad-out interconnect layer having contact pads may be formed above interconnect layer 1720 and transistors 1716 and 1714 after removing handle substrate 1701 and passivation layer 1721.

Figure 20:
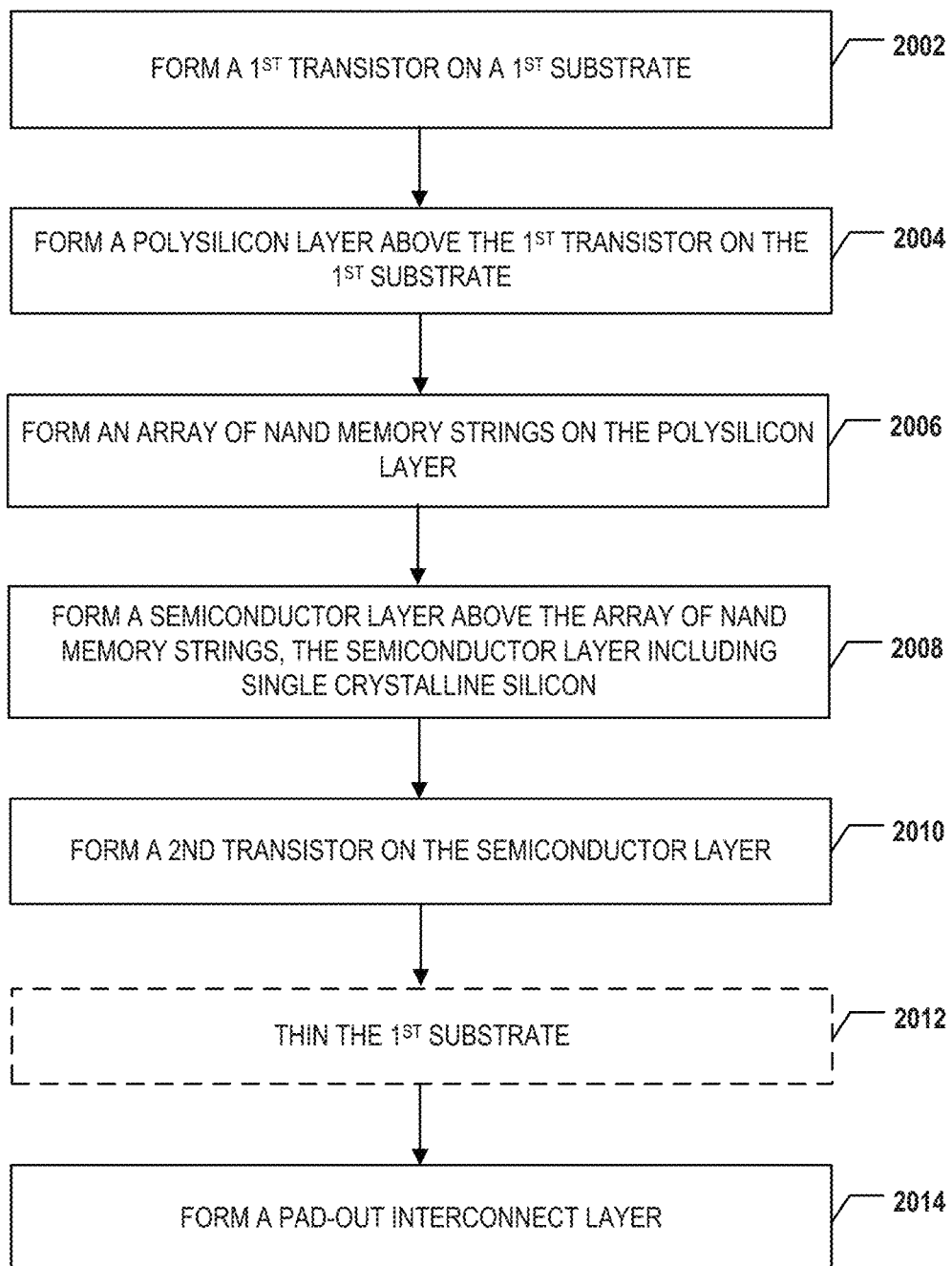
FIG. 20 illustrates a flowchart of a method for forming the 3D memory devices in FIGS. 15A and 15B, according to some aspects of the present disclosure.

FIGS. 18A-18F illustrate another fabrication process for forming the 3D memory devices in FIGS. 15A and 15B, according to some aspects of the present disclosure. FIG. 20 illustrates a flowchart of another method 2000 for forming the 3D memory devices in FIGS. 15A and 15B, according to some aspects of the present disclosure. Examples of the 3D memory devices depicted in FIGS. 18A-18F and 20 include 3D memory device 1601 depicted in FIG. 16B. FIGS. 18A-18F and 20 will be described together. It is understood that the operations shown in method 2000 are not exhaustive and that other operations can be performed as well before, after, or between any of the illustrated operations. Further, some of the operations may be performed simultaneously, or in a different order than shown in FIG. 20.

Figure 18A:
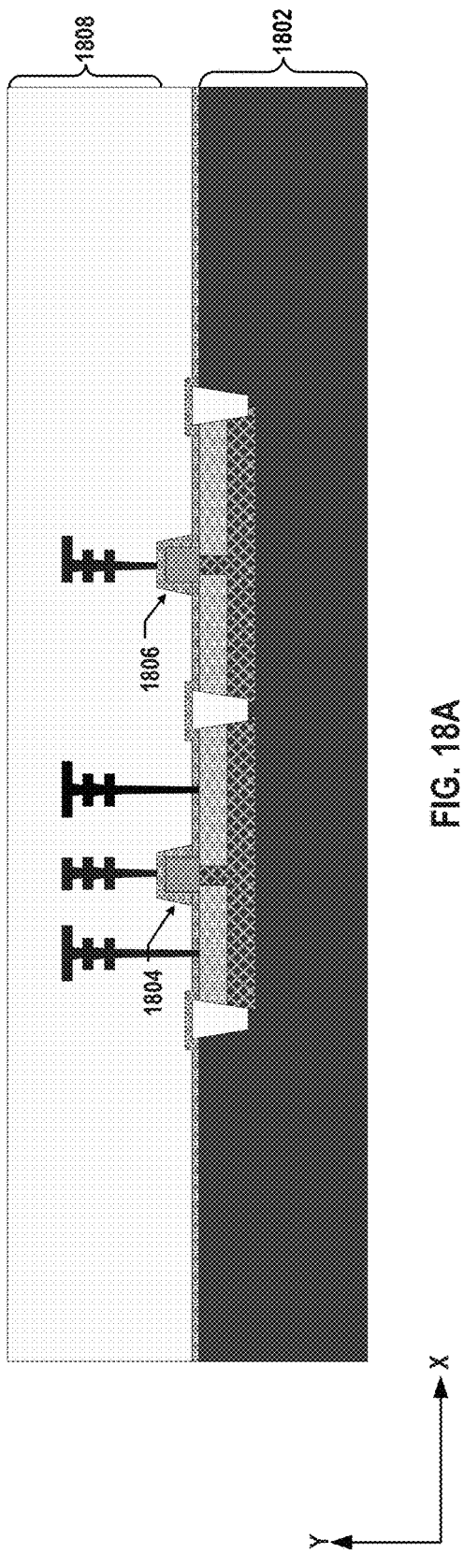
FIGS. 18A-18F illustrate another fabrication process for forming the 3D memory devices in FIGS. 15A and 15B, according to some aspects of the present disclosure.

Referring to FIG. 20, method 2000 starts at operation 2002, in which a first transistor is formed on a first substrate. The first substrate can be a silicon substrate having single crystalline silicon. As illustrated in FIG. 18A, a plurality of transistors 1804 and 1806 are formed on a silicon substrate 1802. Transistors 1804 and 1806 can be formed by a plurality of processes including, but not limited to, photolithography, dry/wet etch, thin film deposition, thermal growth, implantation, CMP, and any other suitable processes. In some implementations, doped regions are formed in silicon substrate 1802 by ion implantation and/or thermal diffusion, which function, for example, as wells and source/drain regions of transistors 1804 and 1806. In some implementations, isolation regions (e.g., STIs) are also formed in silicon substrate 1802 by wet/dry etch and thin film deposition. In some implementations, the thickness of gate dielectric of transistor 1804 is different from the thickness of gate dielectric of transistor 1806, for example, by depositing a thicker silicon oxide film in the region of transistor 1804 than the region of transistor 1806, or by etching back part of the silicon oxide film deposited in the region of transistor 1806. It is understood that the details of fabricating transistors 1804 and 1806 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 1808 is formed above the transistor on the first substrate. The interconnect layer can include a plurality of interconnects in one or more ILD layers. As illustrated in FIG. 18A, an interconnect layer 1808 can be formed above transistors 1804 and 1806. Interconnect layer 1808 can include interconnects of MEOL and/or BEOL in a plurality of ILD layers to make electrical connections with transistors 1804 and 1806. In some implementations, interconnect layer 1808 includes multiple ILD layers and interconnects therein formed in multiple processes. For example, the interconnects in interconnect layer 1808 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 18A can be collectively referred to as interconnect layer 1808. In some implementations, the interconnects in interconnect layer 1808 include W, which has a relatively high thermal budget among conductive metal materials to sustain later high-temperature processes.

Figure 18B:
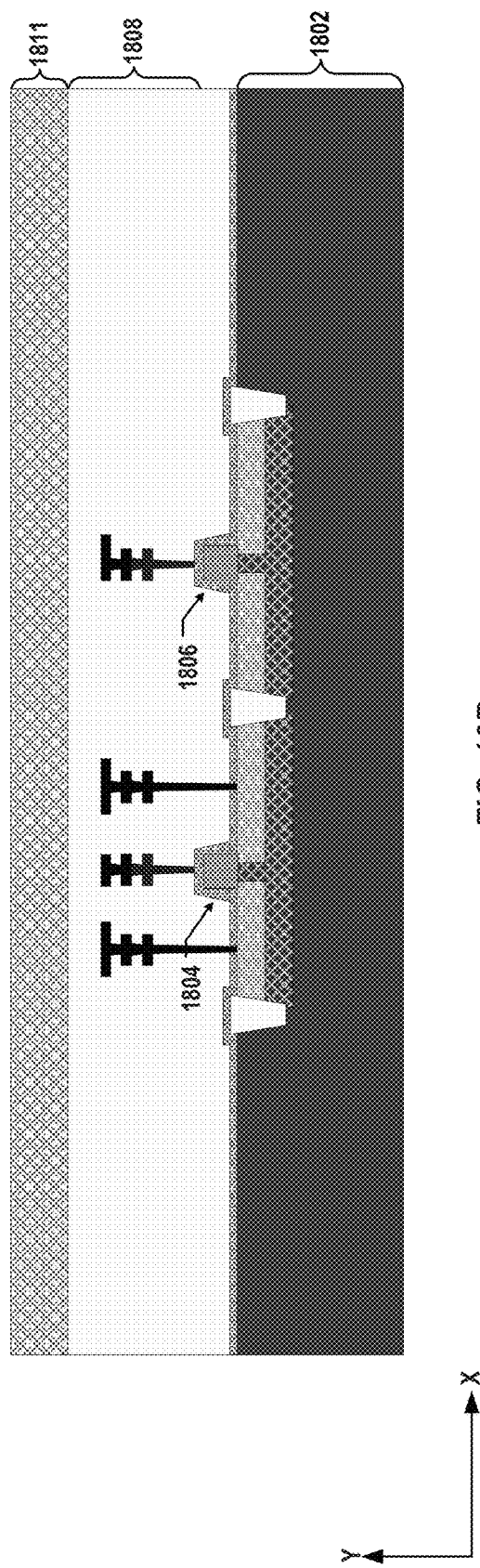

Method 2000 proceeds to operation 2004, as illustrated in FIG. 20, in which a polysilicon layer is formed above the first transistor. As illustrated in FIG. 18B, a polysilicon layer 1811 is formed above interconnect layer 1808 and transistors 1804 and 1806 on first silicon substrate 1802. Polysilicon layer 1811 can be formed by depositing polysilicon on interconnect layer 1808 using one or more thin film deposition processes including, but not limited to, CVD, PVD, ALD, or any combination thereof. In some implementations, polysilicon layer 1811 is doped with P-type or N-type dopant using an in-situ doping process during the deposition process or ion implantation/diffusion process after the deposition process.

Figure 18C:
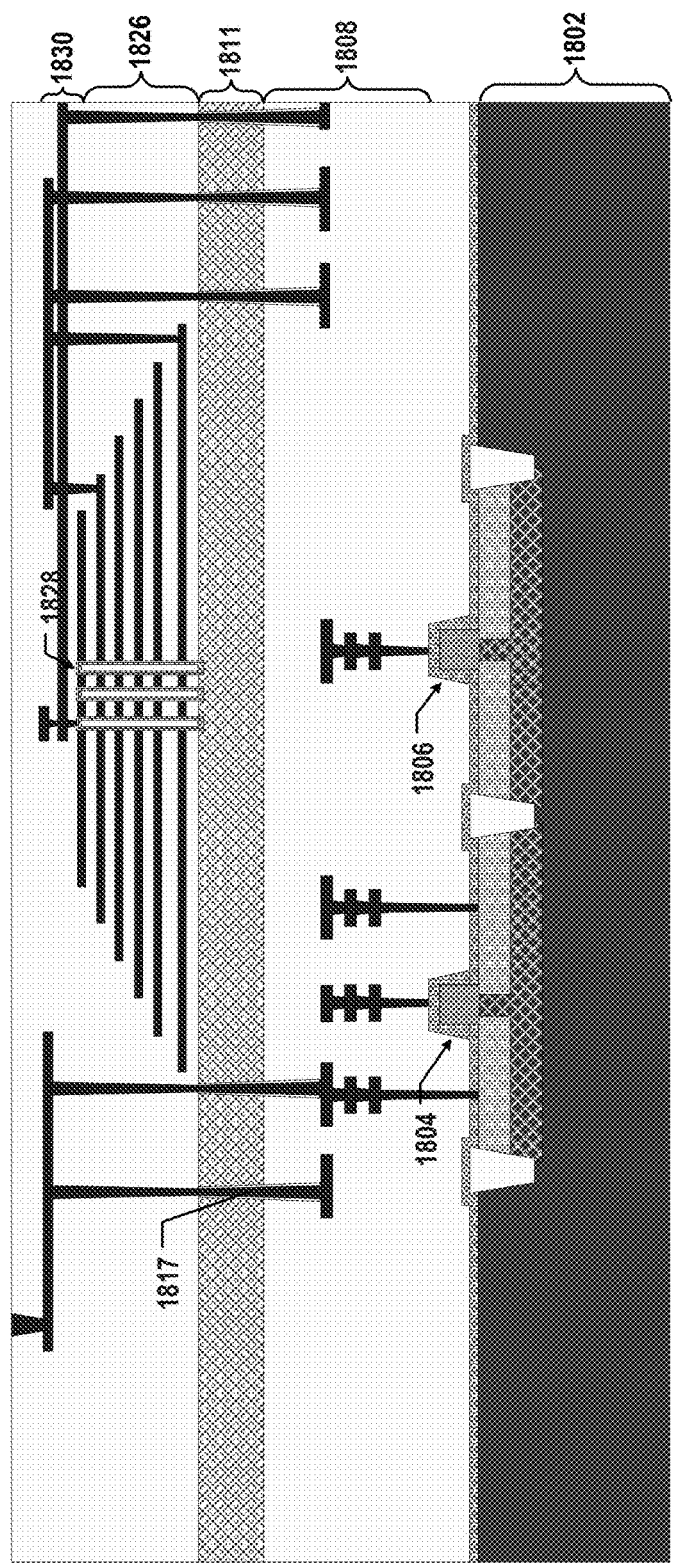

Method 2000 proceeds to operation 2006, as illustrated in FIG. 20, in which an array of NAND memory strings is formed on the polysilicon layer. In some implementations, to form the array of NAND memory strings, a memory stack is formed on the polysilicon layer. As illustrated in FIG. 18C, a stack structure, such as a memory stack 1826 including interleaved conductive layers and dielectric layers, is formed on polysilicon layer 1811. To form memory stack 1826, in some implementations, a dielectric stack (not shown) including interleaved sacrificial layers (not shown) and the dielectric layers is formed on polysilicon layer 1811. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 1826 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 1826 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 1826 and polysilicon layer 1811.

As illustrated in FIG. 18C, NAND memory strings 1828 are formed above polysilicon layer 1811, each of which extends vertically through memory stack 1826 to be in contact with polysilicon layer 1811. In some implementations, fabrication processes to form NAND memory string 1828 include forming a channel hole through memory stack 1826 (or the dielectric stack) and into polysilicon layer 1811 using dry etching/and or wet etching, such as DRIE, followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 1828 may vary depending on the types of channel structures of NAND memory strings 1828 (e.g., channel structure 812 in FIG. 8) and thus, are not elaborated for ease of description.

In some implementations, an interconnect layer is formed above the array of NAND memory strings. The interconnect layer can include a first plurality of interconnects in one or more ILD layers. As illustrated in FIG. 18C, an interconnect layer 1830 is formed above memory stack 1826 and NAND memory strings 1828. Interconnect layer 1830 can include interconnects of MEOL and/or BEOL in a plurality of ILD layers to make electrical connections with NAND memory strings 1828. In some implementations, interconnect layer 1830 includes multiple ILD layers and interconnects therein formed in multiple processes. For example, the interconnects in interconnect layer 1830 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 18C can be collectively referred to as interconnect layer 1830.

In some implementations, a contact through the polysilicon layer is formed. As illustrated in FIG. 18C, one or more contacts 1817 each extending vertically through polysilicon layer 1811 is formed. Contacts 1817 can couple the interconnects in interconnect layers 1830 and 1808. Contacts 1817 can be formed by first patterning contact holes through polysilicon layer 1811 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor.

Method 2000 proceeds to operation 2008, as illustrated in FIG. 20, in which a semiconductor layer is formed above the array of NAND memory strings. The semiconductor layer can include single crystalline silicon. In some implementations, to form the semiconductor layer, another substrate and the first substrate are bonded in a face-to-face manner, and the other substrate is thinned to leave the semiconductor layer. The bonding can include transfer bonding. The other substrate can be a silicon substrate having single crystalline silicon.

Figure 18D:
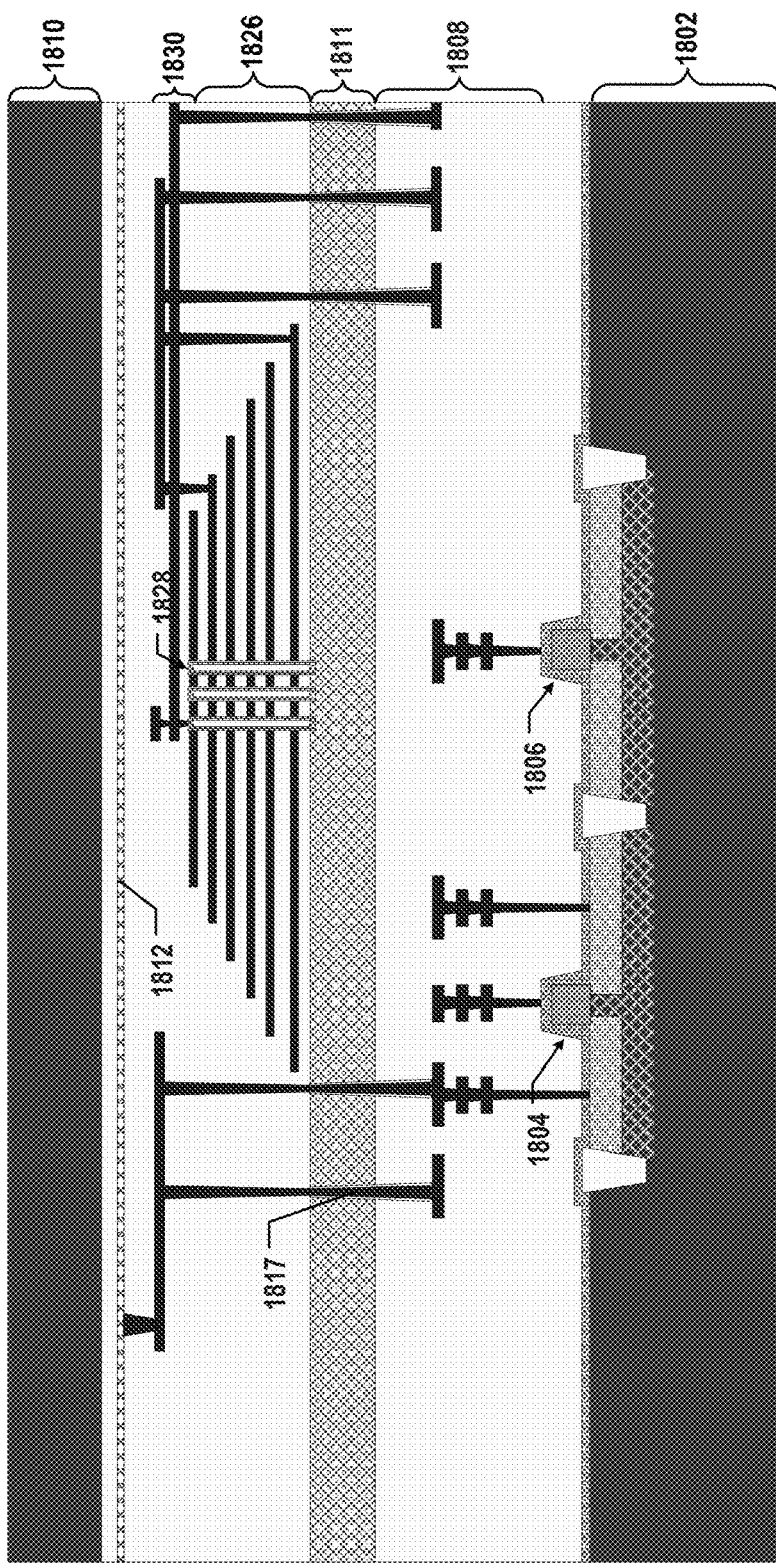

As illustrated in FIG. 18D, a semiconductor layer 1810, such as a single crystalline silicon layer, is formed above interconnect layer 1830 and NAND memory strings 1828. Semiconductor layer 1810 can be attached above interconnect layer 1830 to form a bonding interface 1812 vertically between semiconductor layer 1810 and interconnect layer 1830. In some implementations, to form semiconductor layer 1810, another silicon substrate (not shown in FIG. 18D) and silicon substrate 1802 are bonded in a face-to-face manner (having the components formed on silicon substrate 1802, such as NAND memory strings 1828 and transistors 1804 and 1806, facing toward the other silicon substrate) using transfer bonding, thereby forming bonding interface 1812. The other silicon substrate can then be thinned using any suitable processes to leave semiconductor layer 1810 attached above interconnect layer 1830.

Figure 34A:
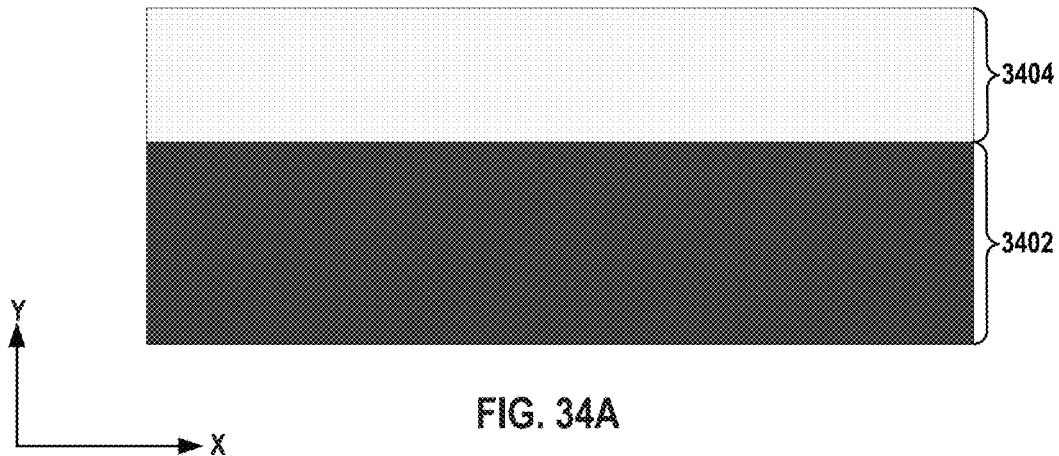
FIGS. 34A-34D illustrate a fabrication process of transfer bonding, according to some aspects of the present disclosure.
Figure 34B:
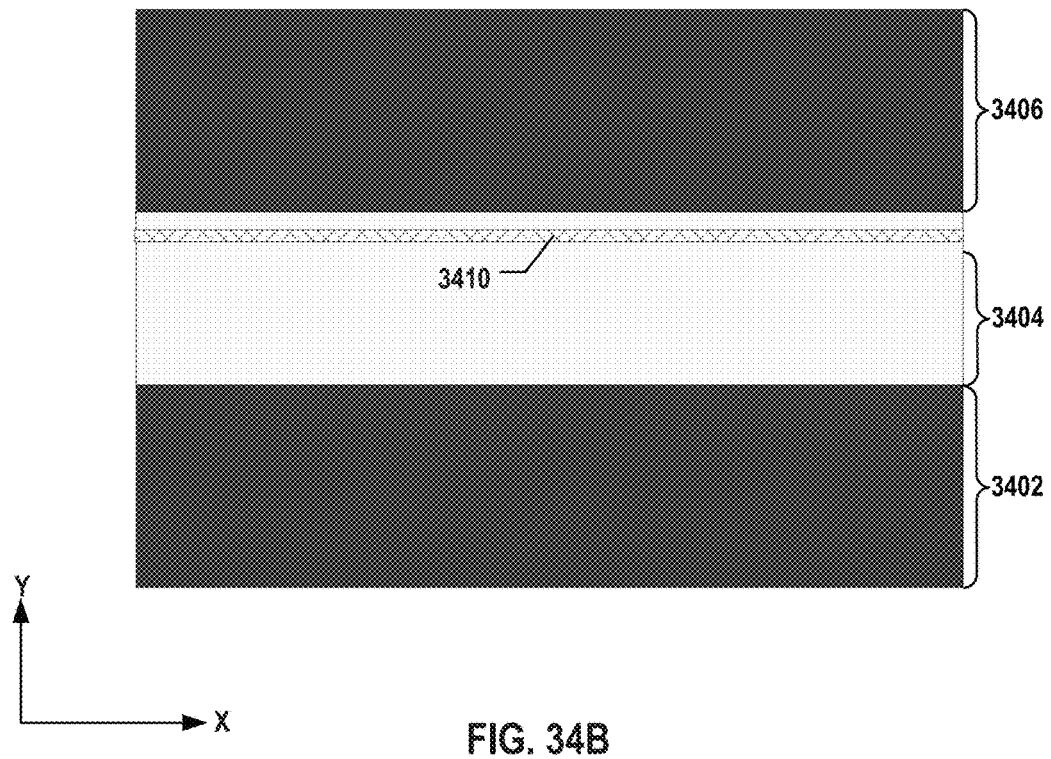

FIGS. 34A-34D illustrate a fabrication process of transfer bonding, according to some aspects of the present disclosure. As illustrated in FIG. 34A, a function layer 3404 can be formed on a base substrate 3402. Function layer 3404 can include device layers, interconnect layers, and/or any suitable layers disclosed herein, such as transistors 1804 and 1806, polysilicon layer 106, memory stack 1826, NAND memory strings 1828, and interconnect layers 1808 and 1830 in FIG. 18C. A transfer substrate 3406, such as a silicon substrate having single crystalline silicon, is provided. In some implementations, transfer substrate 3406 is a single crystalline silicon substrate. As illustrated in FIG. 34B, transfer substrate 3406 and base substrate 3402 (and function layer 3404 formed thereon) can be bonded in a face-to-face manner using any suitable substrate/wafer bonding processes including, for example, anodic bonding and fusion (direct) bonding, thereby forming a bonding interface 3410 between transfer substrate 3406 and base substrate 3402. In one example, fusion bonding may be performed between layers of silicon and silicon, silicon and silicon oxide, or silicon oxide and silicon oxide with pressure and heat. In another example, anodic bonding may be performed between layers of silicon oxide (in an ionic glass) and silicon with voltage, pressure, and heat. It is understood that depending on the bonding process, dielectric layers (e.g., silicon oxide layers) may be formed on one or both sides of bonding interface 3410. For example, silicon oxide layers may be formed on the top surfaces of both transfer substrate 3406 and function layer 3404 to allow $SiO_2$—$SiO_2$ bonding using fusion bonding; or, silicon oxide layer may be formed only on function layer 3404 to allow $SiO_2$—Si bonding using anodic bonding or fusion bonding. In some implementations in which a silicon oxide layer is formed on transfer substrate 3406 (e.g., shown in FIG. 34B), transfer substrate 3406 can be flipped upside, such that the silicon oxide layer on transfer substrate 3406 faces down toward base substrate 3402 before the bonding.

Figure 34C:
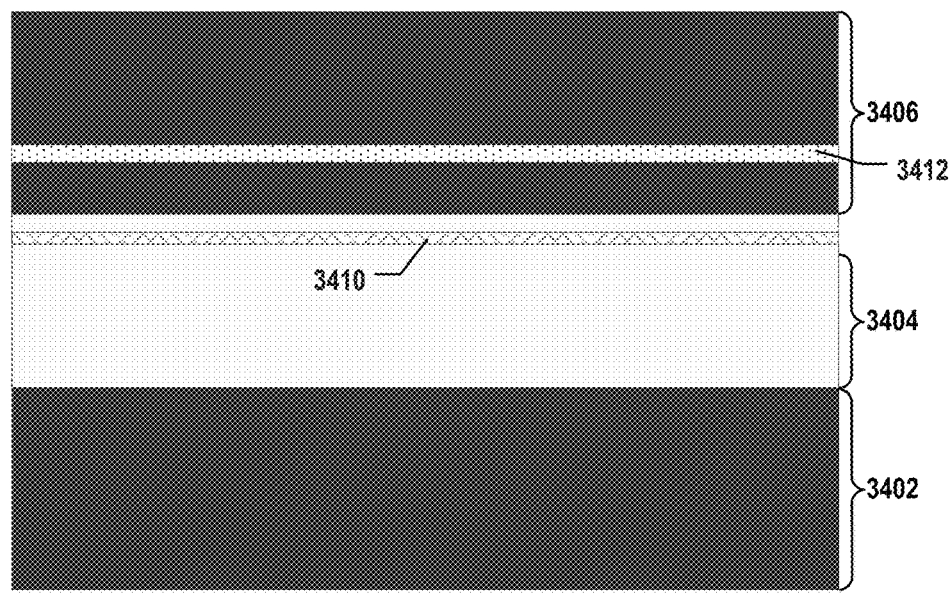
Figure 34D:
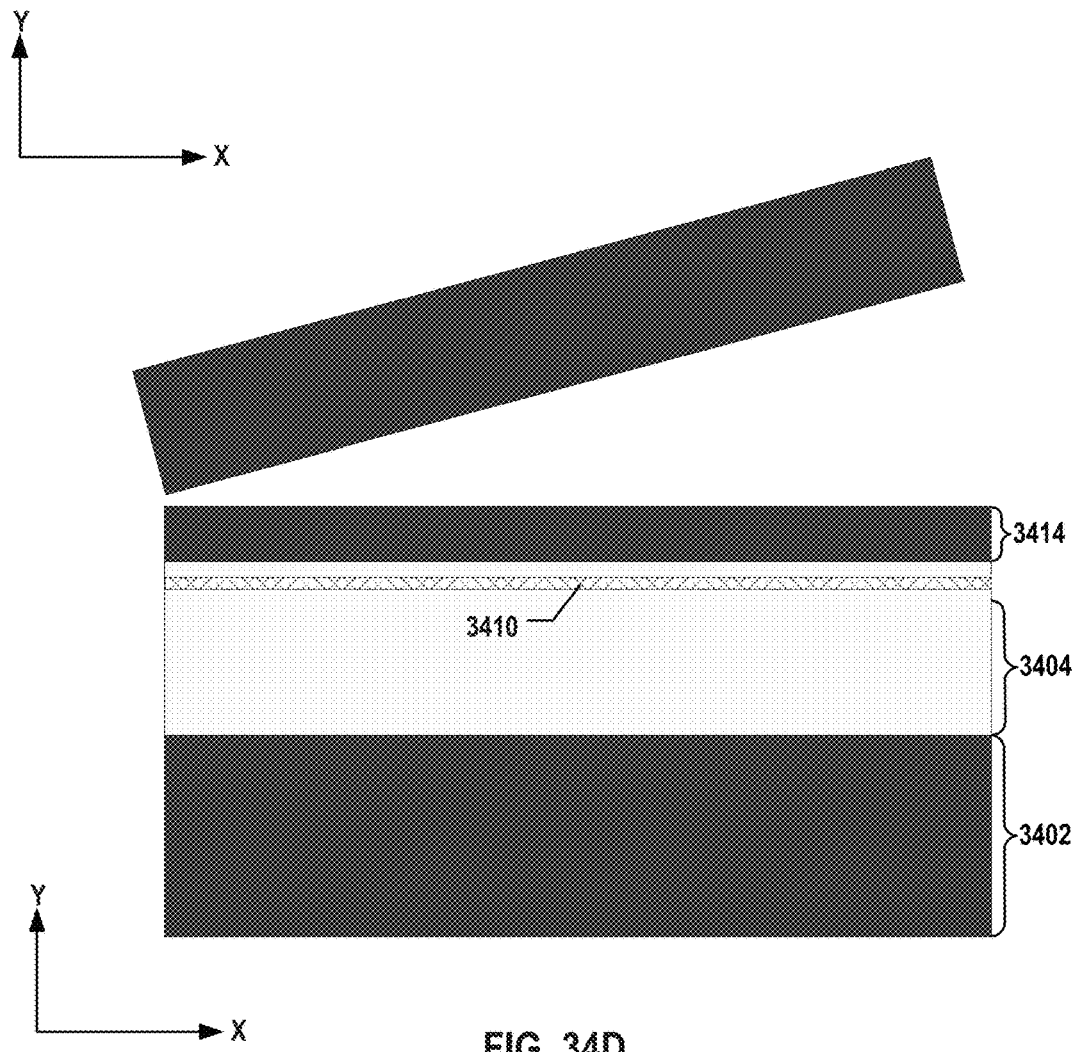

As illustrated in FIG. 34C, a cut layer 3412 can be formed in transfer substrate 3406, for example, using ion implantation. In some implementations, light elements, such as hydrogen ions, are implanted into transfer substrate 3406 to a desired depth, for example, by controlling the energy of the ion impanation process, to form cut layer 3412. As illustrated in FIG. 34D, transfer substrate 3406 can be thinned to leave only a semiconductor layer 3414 vertically between cut layer 3412 and bonding interface 3410. In some implementations, transfer substrate 3406 is split at cut layer 3412 by applying a mechanical force to transfer substrate 3406, i.e., peeling off the remainder of transfer substrate 3406 from semiconductor layer 3414. It is understood that transfer substrate 3406 may be split at cut layer 3412 by any suitable means, not limited to mechanical force alone, such as thermal means, acoustic means, etc., or any combination thereof. As a result, semiconductor layer 3414 can be transferred from transfer substrate 3406 and bonded onto base substrate 3402 (and function layer 3404) using a transfer bonding process. In some implementations, a planarization process, such as chemical mechanical polishing (CMP), is performed on semiconductor layer 3412 to polish and smooth the top surface of semiconductor layer 3412 and adjust the thickness of semiconductor layer 3412. Semiconductor layer 3414 thus can have the same material as transfer substrate 3406, such as single crystalline silicon. The thickness of semiconductor layer 3414 can be determined by the depth of cut layer 3412, for example, by adjusting the implantation energy, and/or by the planarization process. Moreover, the remainder of transfer substrate 3406 can be re-used in the same manner to form semiconductor layers bonded onto other base substrates, thereby reducing the material cost of the transfer bonding process.

Figure 35A:
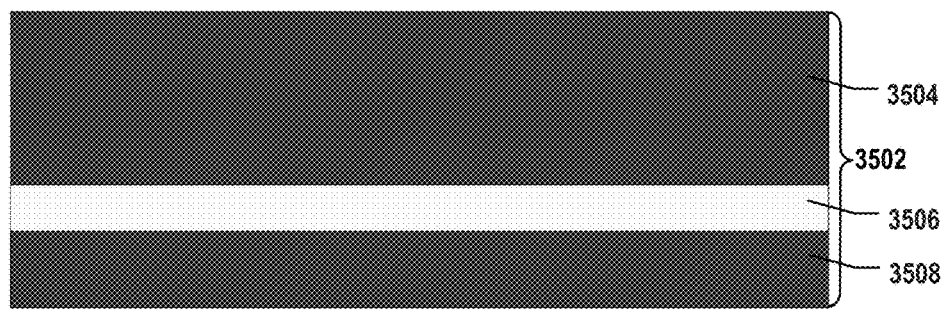
FIGS. 35A-35D illustrate another fabrication process of transfer bonding, according to some aspects of the present disclosure.
Figure 35A:
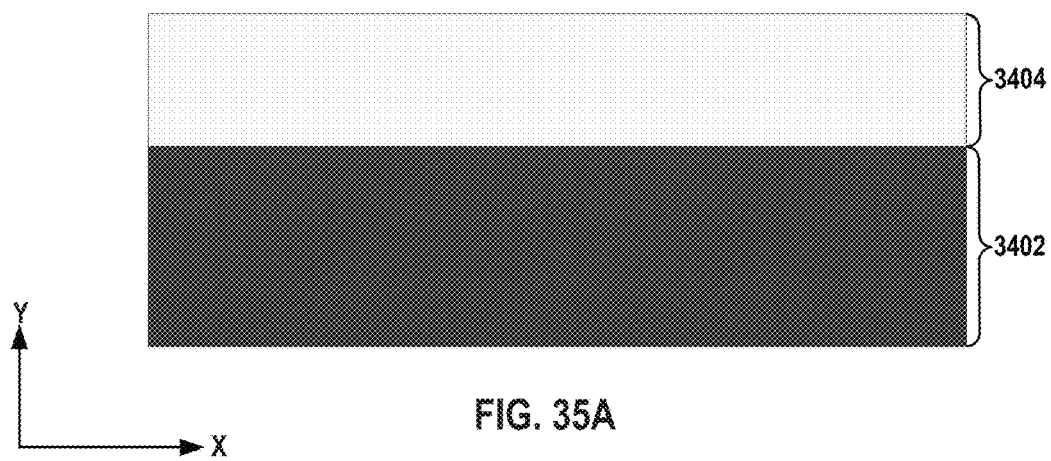
Figure 35B:
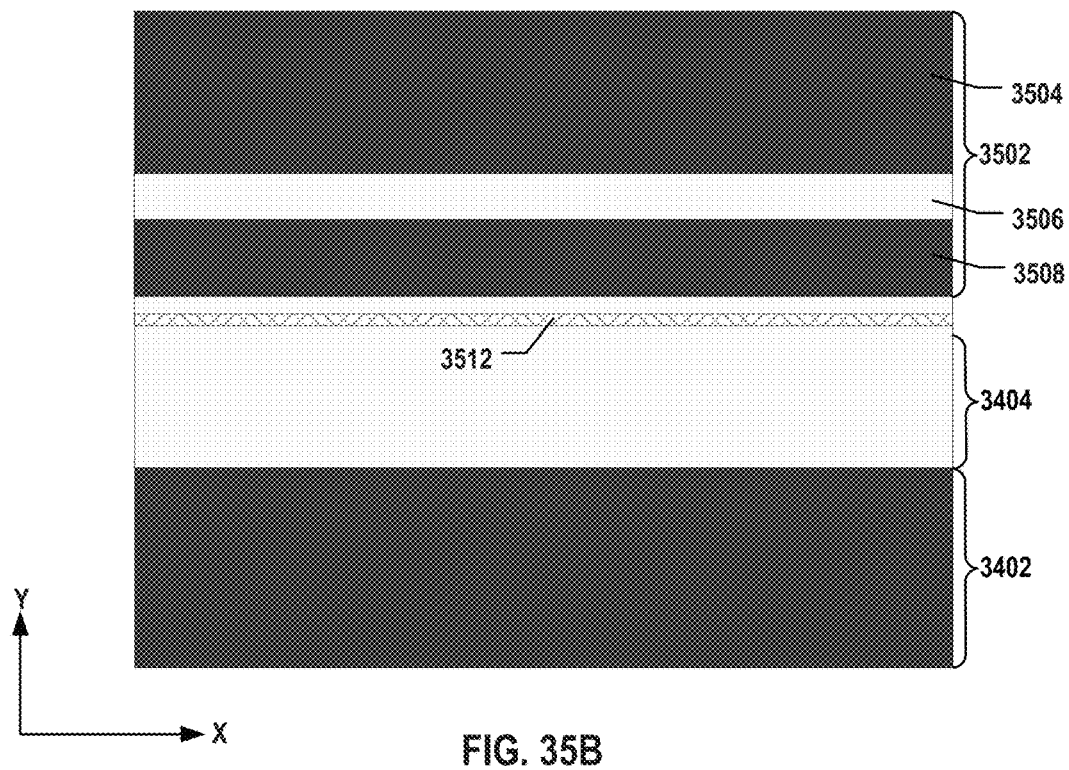

FIGS. 35A-35D illustrate another fabrication process of transfer bonding, according to some aspects of the present disclosure. As illustrated in FIG. 35A, function layer 3404 can be formed on base substrate 3402. Function layer 3404 can include device layers, interconnect layers, and/or any suitable layers disclosed herein, such as transistors 1804 and 1806, polysilicon layer 106, memory stack 1826, NAND memory strings 1828, and interconnect layers 1808 and 1830 in FIG. 18C. An SOI substrate 3502, including a base/handle layer 3504, a buried oxide layer (BOx) 3506, and a device layer 3508, can be flipped upside down facing toward base substrate 3402. As illustrated in FIG. 35B, SOI substrate 3502 and base substrate 3402 (and function layer 3404 formed thereon) can be bonded in a face-to-face manner using any suitable substrate/wafer bonding processes including, for example, anodic bonding and fusion (direct) bonding, thereby forming a bonding interface 3512 between SOI substrate 3502 and base substrate 3402. In one example, fusion bonding may be performed between layers of silicon and silicon, silicon and silicon oxide, or silicon oxide and silicon oxide with pressure and heat. In another example, anodic bonding may be performed between layers of silicon oxide (in an ionic glass) and silicon with voltage, pressure, and heat. It is understood that depending on the bonding process, dielectric layers (e.g., silicon oxide layers) may be formed on one or both sides of bonding interface 3512. For example, silicon oxide layers may be formed on the top surfaces of both SOI substrate 3502 and function layer 3404 to allow $SiO_2$—$SiO_2$ bonding using fusion bonding. Or silicon oxide layer may be formed only on function layer 3404 to allow $SiO_2$—Si bonding using anodic bonding or fusion bonding.

Figure 35C:
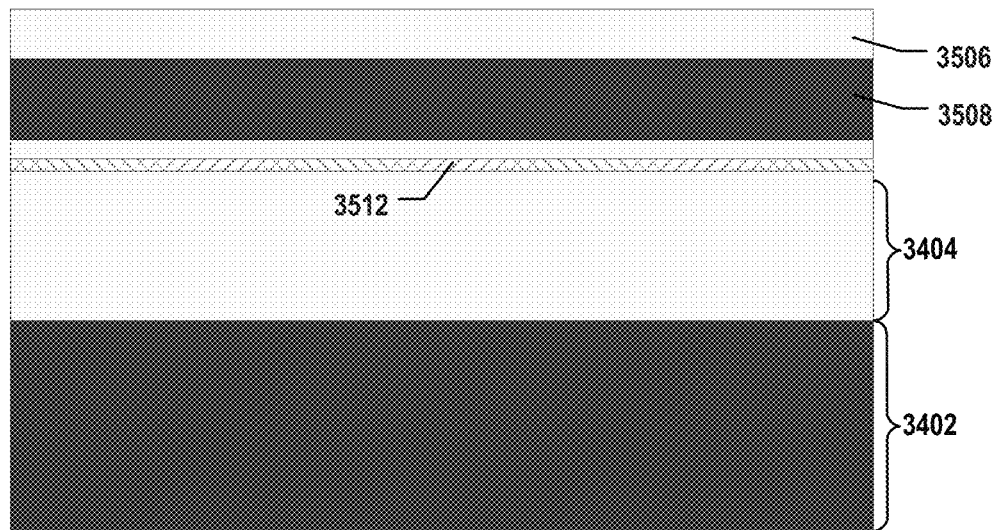
Figure 35D:
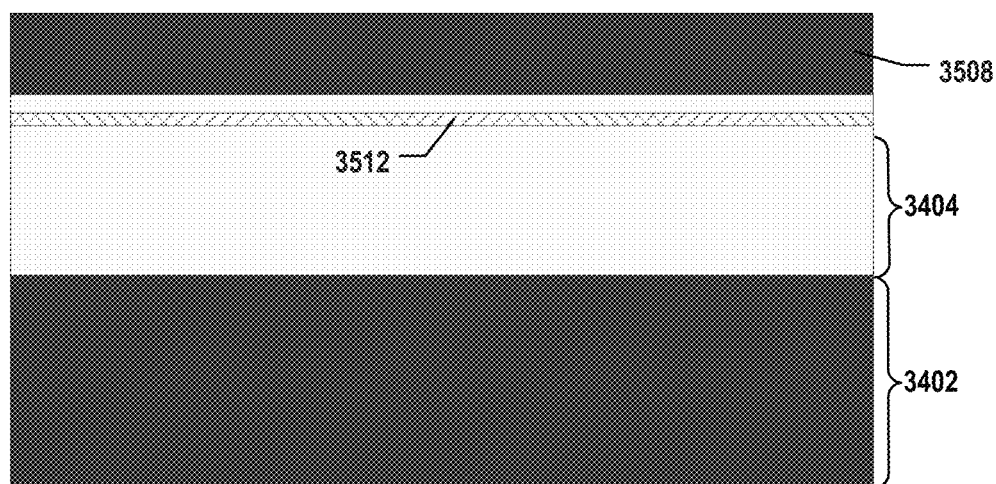

As illustrated in FIGS. 35C and 35D, SOI substrate 3502 (shown in FIG. 35B) can be thinned by sequentially removing base/handle layer 3504 and buried oxide layer 3506, for example, using wet/dry etching and/or CMP processes, to leave only device layer 3508 (as a semiconductor layer) at bonding interface 3512. As a result, device layer 3508 can be transferred from SOI substrate 3502 and bonded onto base substrate 3402 (and function layer 3404) as a semiconductor layer using another transfer bonding process. The transferred semiconductor layer thus can have the same material as device layer 3508, such as single crystalline silicon. The thickness of the semiconductor layer can be the same as the thickness of device layer 3508. It is understood that in some examples, device layer 3508 may be further thinned using wet/dry etching and/or CMP processes, such that the transferred semiconductor layer may be thinner than device layer 3508.

Figure 18E:
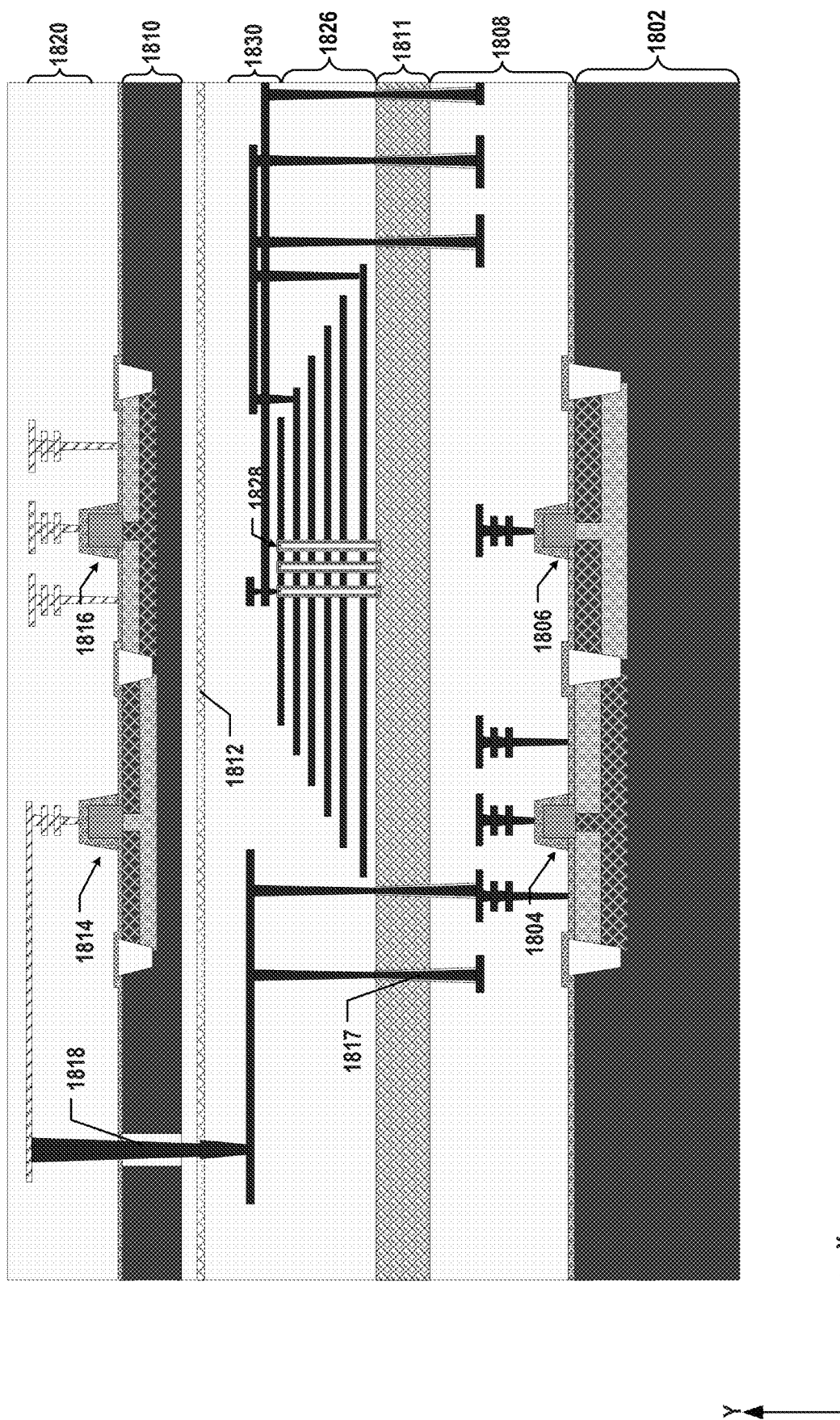

Referring back to FIG. 20, method 2000 proceeds to operation 2008, in which a second transistor is formed on the semiconductor layer. As illustrated in FIG. 18E, a plurality of transistors 1814 and 1816 are formed on semiconductor layer 1810 having single crystalline silicon. Transistors 1814 and 1816 can be formed by a plurality of processes including, but not limited to, photolithography, dry/wet etch, thin film deposition, thermal growth, implantation, CMP, and any other suitable processes. In some implementations, doped regions are formed in semiconductor layer 1810 by ion implantation and/or thermal diffusion, which function, for example, as wells and source/drain regions of transistors 1814 and 1816. In some implementations, isolation regions (e.g., STIs) are also formed in semiconductor layer 1810 by wet/dry etch and thin film deposition. In some implementations, the thickness of gate dielectric of transistor 1814 is different from the thickness of gate dielectric of transistor 1816, for example, by depositing a thicker silicon oxide film in the region of transistor 1814 than the region of transistor 1816, or by etching back part of the silicon oxide film deposited in the region of transistor 1816. It is understood that the details of fabricating transistors 1814 and 1816 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer is formed above the transistor on the second substrate. The interconnect layer can include a plurality of interconnects in one or more ILD layers. As illustrated in FIG. 18E, an interconnect layer 1820 can be formed above transistors 1814 and 1816. Interconnect layer 1820 can include interconnects of MEOL and/or BEOL in a plurality of ILD layers to make electrical connections with transistors 1814 and 1816. In some implementations, interconnect layer 1820 includes multiple ILD layers and interconnects therein formed in multiple processes. For example, the interconnects in interconnect layer 1820 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 17D can be collectively referred to as interconnect layer 1820. Different from interconnect layer 1808, in some implementations, the interconnects in interconnect layer 1820 include Cu, which has a relatively low resistivity among conductive metal materials. It is understood that although Cu has a relatively low thermal budget (incompatible with high-temperature processes), using Cu as the conductive materials of the interconnects in interconnect layer 1820 may become feasible since there are no more high-temperature processes after the fabrication of interconnect layer 1820.

In some implementations, a contact vertically through the semiconductor layer is formed. Contact 1818 can extend vertically through semiconductor layer 1810 from the front side thereof. Contacts 1818 can be coupled to the interconnects in interconnect layer 1820. Contact 1818 can extend further through a dielectric layer (if any) on the backside of semiconductor layer 1810 to be aligned and in contact with the interconnects in interconnect layer 1830 at bonding interface 1812. Thus, contact 1818 couples the interconnects in interconnect layer 1820 to the interconnects in interconnect layer 1830 through semiconductor layer 1810 and across bonding interface 1812. Contacts 1818 can be formed by first patterning contact holes into semiconductor layer 1810 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor.

Figure 18F:
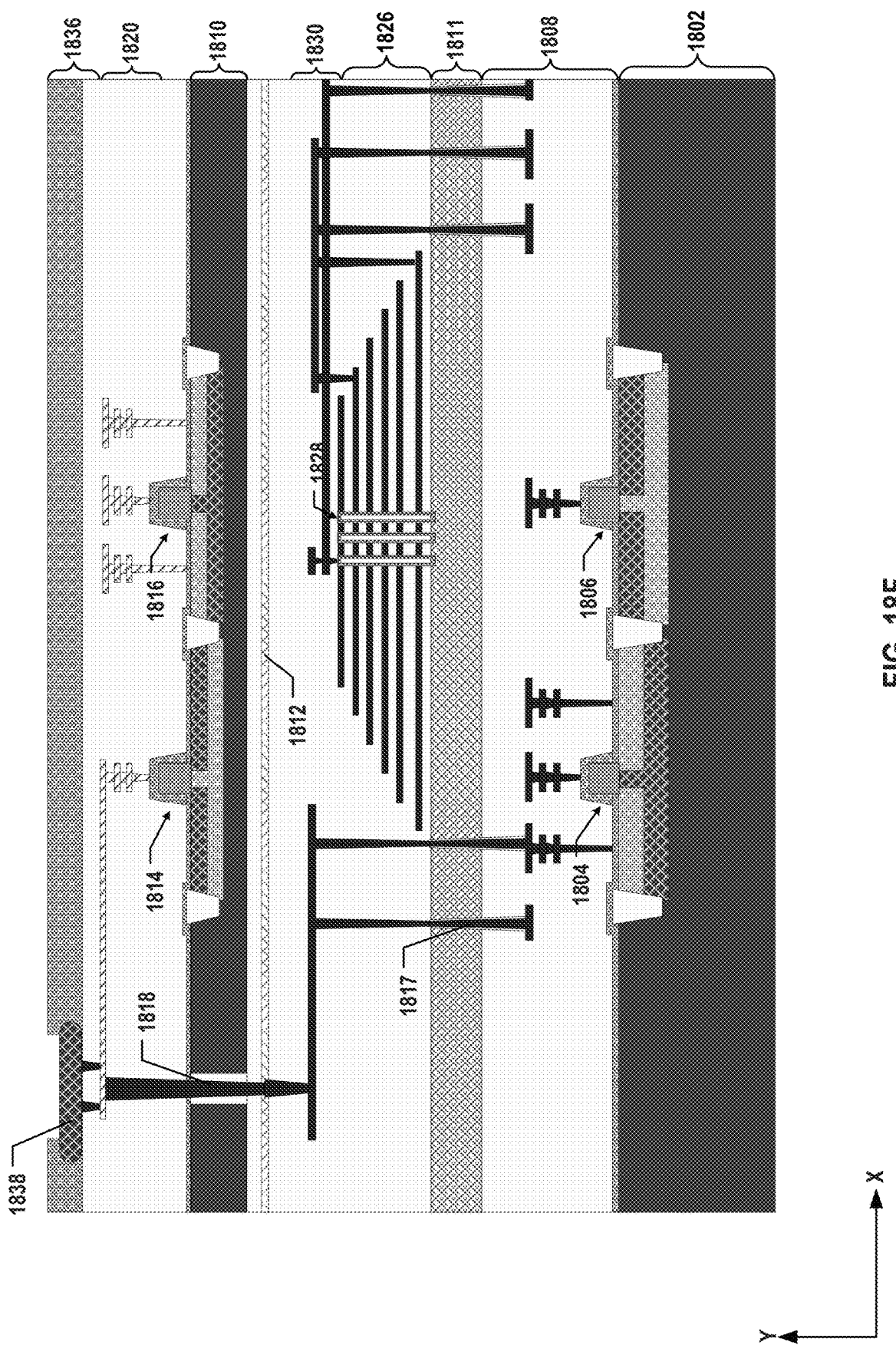

Method 2000 skips optional operation 2012 and proceeds to operation 2014, as illustrated in FIG. 20, in which a pad-out interconnect layer is formed. The pad-out interconnect layer can be formed above the second transistor. As illustrated in FIG. 18F, a pad-out interconnect layer 1836 is formed above interconnect layer 1820 and transistors 1814 and 1816 on semiconductor layer 1810. Pad-out interconnect layer 1836 can include interconnects, such as contact pads 1838, formed in one or more ILD layers. Contact pads 1838 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

In some implementations, to form a pad-out interconnect layer on the first substrate, after operation 2010, method 2000 proceeds to optional operation 2012, as illustrated in FIG. 20, in which the first substrate is thinned. It is understood that although not shown, in some examples, silicon substrate 1802 (shown in FIG. 18E) may be thinned to become a semiconductor layer having single crystalline silicon using processes including, but not limited to, wafer grinding, dry etch, wet etch, CMP, any other suitable processes, or any combination thereof. After the thinning, contacts may be formed extending vertically through the thinned silicon substrate 1802, for example, by wet/dry etching followed by depositing dielectric materials as spacers and conductive materials as conductors. It is understood that in some examples, the contacts may be formed in silicon substrate 1802 before thinning and be exposed from the backside of silicon substrate 1802 (where the thinning occurs) after the thinning.

Method 2000 proceeds to operation 2014, as illustrated in FIG. 20, in which a pad-out interconnect layer is formed. The pad-out interconnect layer can be formed on the thinned first substrate. It is understood that although not shown, in some examples, a pad-out interconnect layer having contact pads may be formed on the thinned silicon substrate 1802.

Figure 21A:
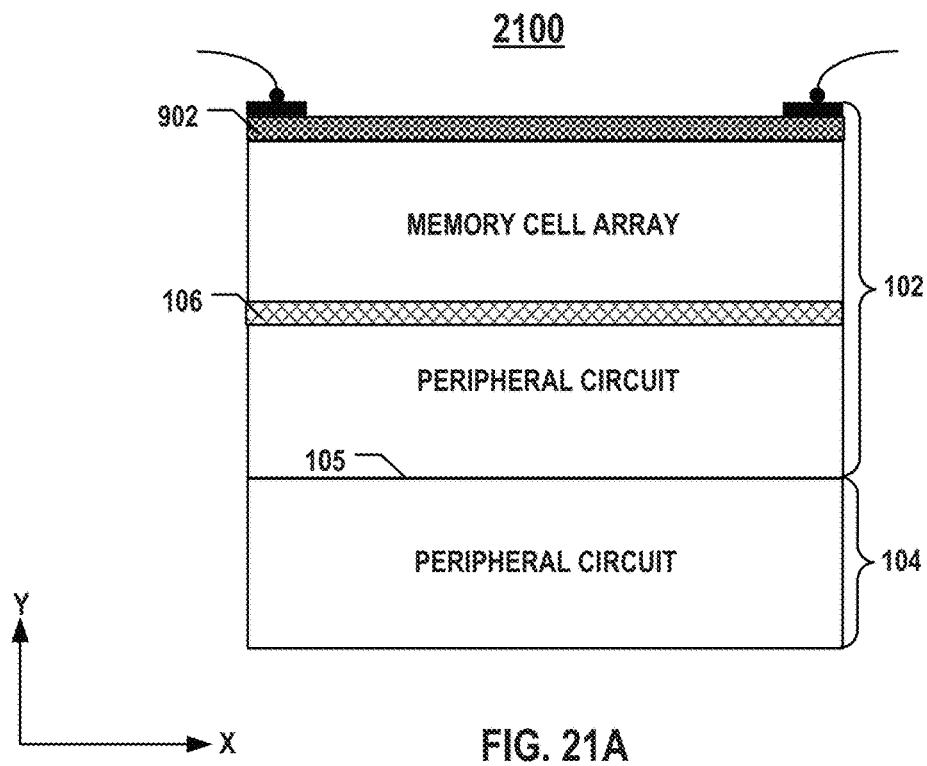
FIGS. 21A and 21B illustrate schematic views of cross-sections of 3D memory devices having two stacked semiconductor structures, according to various aspects of the present disclosure.
Figure 21B:
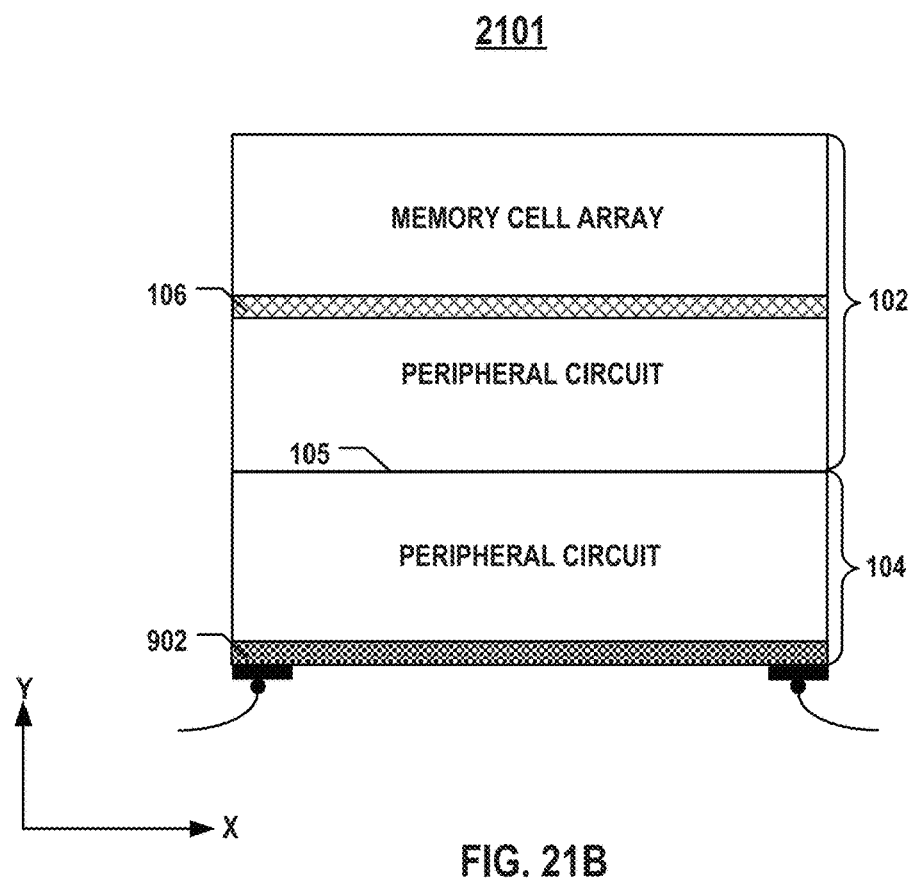

FIGS. 21A and 21B illustrate schematic views of cross-sections of 3D memory devices 2100 and 2101 having two stacked semiconductor structures, according to various aspects of the present disclosure. 3D memory devices 2100 and 2101 may be examples of 3D memory device 101 in FIG. 1B in which the peripheral circuits of first semiconductor structure 102 are disposed vertically between the memory cell array of first semiconductor structure 102 and the peripheral circuits of second semiconductor structure 104. That is, the two separate portions of the peripheral circuits can be disposed adjacently in the vertical direction. As shown in FIGS. 21A and 21B, second semiconductor structure 104 including some of the peripheral circuits is bonded to first semiconductor structure 102 on the side having the peripheral circuits to form bonding interface 105 between second semiconductor structure 104 and the peripheral circuits of first semiconductor structure 102, according to some implementations.

Moreover, as shown in FIGS. 21A and 21B, 3D memory device 2100 or 2101 can further include a pad-out interconnect layer 902 for pad-out purposes, i.e., interconnecting with external devices using contact pads on which bonding wires can be soldered. In one example shown in FIG. 21B, second semiconductor structure 104 including some of the peripheral circuits on one side of 3D memory device 2101 may include pad-out interconnect layer 902, such that 3D memory device 2101 may be pad-out from the peripheral circuit side to reduce the interconnect distance between contact pads and the peripheral circuits, thereby decreasing the parasitic capacitance from the interconnects and improving the electrical performance of 3D memory device 2101.

In another example shown in FIG. 21A, first semiconductor structure 102 including the memory cell array and some of the peripheral circuits on another side of 3D memory device 2100 may include pad-out interconnect layer 902, such that 3D memory device 901 may be pad-out from the memory cell array side.

Figure 22A:
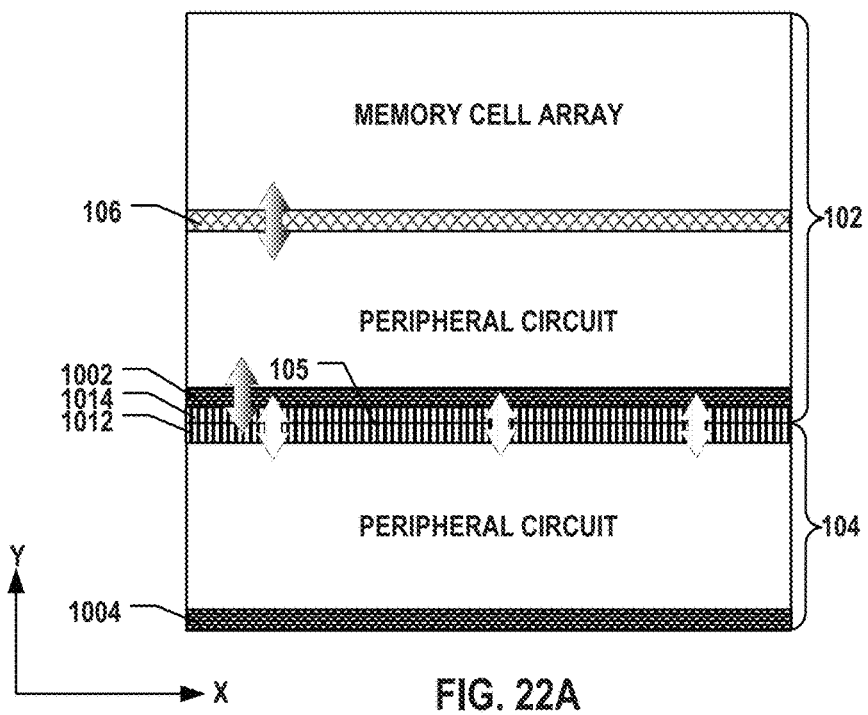
FIGS. 22A and 22B illustrate schematic views of cross-sections of the 3D memory devices in FIGS. 21A and 21B, according to some aspects of the present disclosure.
Figure 22B:
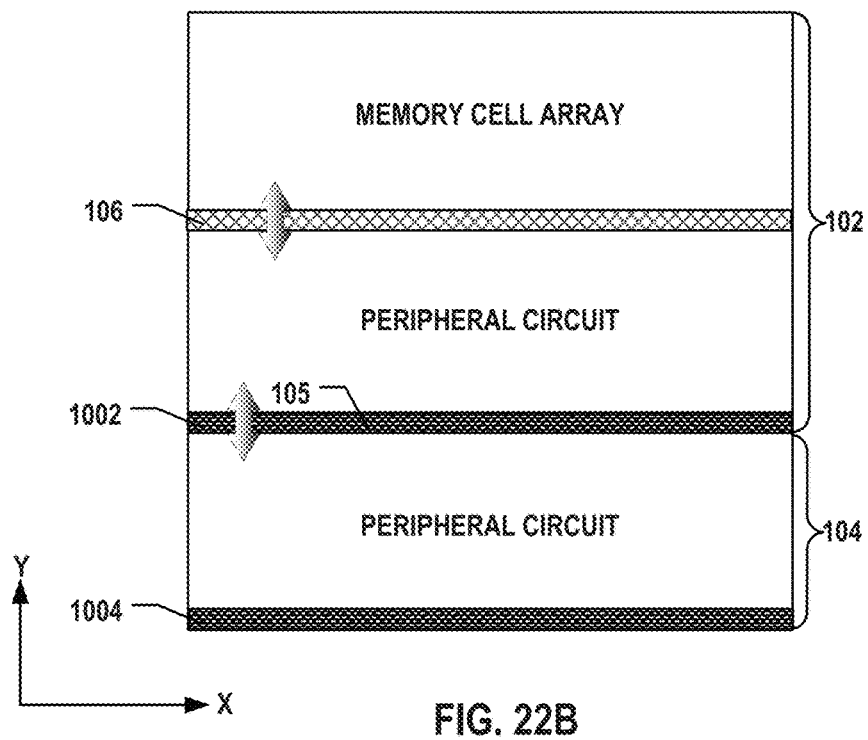

FIGS. 22A and 22B illustrate schematic views of cross-sections of the 3D memory devices in FIGS. 21A and 21B, according to various aspects of the present disclosure. 3D memory devices 2200 and 2201 may be examples of 3D memory devices 2100 and 2101 in FIGS. 21A and 21B. As shown in FIG. 22A, 3D memory device 2200 can include stacked first and second semiconductor structures 102 and 104. In some implementations, first semiconductor structure 102 includes semiconductor layer 1002, a bonding layer 1014, a memory cell array, some of the peripheral circuits vertically between semiconductor layer 1002 and polysilicon layer 106, and polysilicon layer 106 vertically between the memory cell array and the peripheral circuits.

The memory cell array can include an array of NAND memory strings (e.g., NAND memory strings 208 disclosed herein), and the sources of the array of NAND memory strings can be in contact with polysilicon layer 106 (e.g., as shown in FIG. 8). Polysilicon layer 106 can be a deposited polysilicon layer (e.g., either N-type doped, P-type doped, or undoped), which is suitable for "floating gate" type of NAND memory strings or certain designs of channel structures (e.g., channel structure 812 in FIG. 8) in "charge trap" type of NAND memory strings, for example, that are suitable for GIDL erase operations. Through contacts (e.g., ILVs/TSVs) through polysilicon layer 106 can make direct, short-distance (e.g., submicron- or micron-level) electrical connections between the memory cell array and the peripheral circuits in first semiconductor structure 102. Bonding layer 1014 can include conductive bonding contacts (not shown) and dielectrics electrically isolating the bonding contacts, which can be used, for example, for hybrid bonding as described below in detail.

In some implementations, the peripheral circuits in first semiconductor structure 102 are in contact with semiconductor layer 1002, but not polysilicon layer 106. That is, the transistors (e.g., planar transistors 500 and 3D transistors 600) of the peripheral circuits can be in contact with semiconductor layer 1002. Semiconductor layer 1002 can include semiconductor materials, such as single crystalline silicon (e.g., a silicon substrate or a thinned silicon substrate). It is understood that in some examples, different from polysilicon layer 106 in first semiconductor structure 102, semiconductor layer 1002 on which the transistors are formed may include single crystalline silicon, but not polysilicon, due to the superior carrier mobility of single crystalline silicon that is desirable for transistors' performance. The peripheral circuits and bonding layer 1014 can be formed on opposite sides of semiconductor layer 1002, such that semiconductor layer 1002 is disposed vertically between the peripheral circuits and bonding layer 1014. In some implementations, the transistors of the peripheral circuits are formed on the front side of semiconductor layer 1002, and the bonding contacts of bonding layer 1014 are formed on the backside of semiconductor layer 1002.

In some implementations, second semiconductor structure 104 includes a semiconductor layer 1004, a bonding layer 1012, and some of the peripheral circuits of the memory cell array vertically between semiconductor layer 1004 and bonding layer 1012. The transistors (e.g., planar transistors 500 and 3D transistors 600) of the peripheral circuits can be in contact with semiconductor layer 1004.

Similar to semiconductor layer 1002, semiconductor layer 1004 can include semiconductor materials, such as single crystalline silicon (e.g., a silicon substrate or a thinned silicon substrate). It is understood that in some examples, different from polysilicon layer 106 in first semiconductor structure 102, semiconductor layer 1004 on which the transistors are formed may include single crystalline silicon, but not polysilicon, due to the superior carrier mobility of single crystalline silicon that is desirable for transistors' performance.

Similar to bonding layer 1014 in first semiconductor structure 102, bonding layer 1012 can also include conductive bonding contacts (not shown) and dielectrics electrically isolating the bonding contacts. Bonding interface 105 is vertically between and in contact with bonding layers 1012 and 1014, respectively, according to some implementations. That is, bonding layers 1012 and 1014 can be disposed on opposite sides of bonding interface 105, and the bonding contacts of bonding layer 1012 can be in contact with the bonding contacts of bonding layer 1014 at bonding interface 105. As a result, a large number (e.g., millions) of bonding contacts across bonding interface 105, in conjunction with through contacts (e.g., ILVs/TSVs) through semiconductor layer 1002, can make direct, short-distance (e.g., micron-level) electrical connections between adjacent semiconductor structures 102 and 104.

It is understood that in some examples, first and second semiconductor structures 102 and 104 may not include bonding layers 1014 and 1012, respectively, disposed on opposite sides of bonding interface 105 as shown in FIG. 22A. In FIG. 22B, semiconductor layer 1002 in first semiconductor structure 102 of 3D memory device 2201 can be a layer of single crystalline silicon transferred from a silicon substrate or an SOI substrate and attached to the top surface of second semiconductor structure 104 by transfer bonding, and bonding interface 105 between first and second semiconductor structures 102 and 104 can result from transfer bonding, as opposed to hybrid bonding. Through contacts (e.g., ILVs/TSVs) through semiconductor layer 1002 vertically between first and second semiconductor structures 102 and 104 can make direct, short-distance (e.g., submicron-level) electrical connections between adjacent semiconductor structures 102 and 104.

As shown in FIGS. 22A and 22B, since first and second semiconductor structures 102 and 104 are bonded in a back-to-face manner (e.g., semiconductor layers 1002 and 1004 being disposed on the bottom sides of first and second semiconductor structures 102, respectively, in FIGS. 22A and 22B), the transistors of peripheral circuits in first and second semiconductor structures 102 and 104 are disposed facing toward the same direction (e.g., the positive y-direction in FIGS. 12A and 12B), according to some implementations. Moreover, within first semiconductor structure 102, since polysilicon layer 106 is vertically between the memory cell array and the peripheral circuits, and the memory cell array and the peripheral circuits formed on polysilicon layer 106 and semiconductor layer 1002, respectively, the memory cell array and the peripheral circuits face toward the same direction (e.g., in the positive y-direction in FIGS. 22A and 22B). It is understood that pad-out interconnect layer 902 in FIGS. 21A and 21B is omitted from 3D memory devices 2200 and 2201 in FIGS. 22A and 22B for ease of illustration and may be included in 3D memory devices 2200 and 2201 as described above with respect to FIGS. 21A and 21B.

As described above, first and second semiconductor structures 102 and 104 can have peripheral circuits having transistors with different applied voltages. For example, first semiconductor structure 102 may be one example of semiconductor structure 408 including LLV circuits 402 (and LV circuits 404 in some examples) in FIG. 4B, and second semiconductor structure 104 may be one example of semiconductor structure 410 including HV circuits 406 (and LV circuits 404 in some examples) in FIG. 4B, or vice versa. Thus, in some implementations, semiconductor layers 1002 and 1004 in first and second semiconductor structures 102 and 104 have different thicknesses to accommodate the transistors with different applied voltages. In one example, second semiconductor structure 104 may include HV circuits 406 and first semiconductor structure 102 may include LLV circuits 402, and the thickness of semiconductor layer 1002 in first semiconductor structure 102 may be smaller than the thickness of semiconductor layer 1004 in second semiconductor structure 104. Moreover, in some implementations, the gate dielectrics of the transistors in first and second semiconductor structures 102 and 104 have different thicknesses as well to accommodate the different applied voltages. In one example, second semiconductor structure 104 may include HV circuits 406 and first semiconductor structure 102 may include LLV circuits 402, and the thickness of the gate dielectrics of the transistors in second semiconductor structure 104 may be larger (e.g., at least 5-fold) than the thickness of the gate dielectrics of the transistors in first semiconductor structure 102.

Figure 23A:
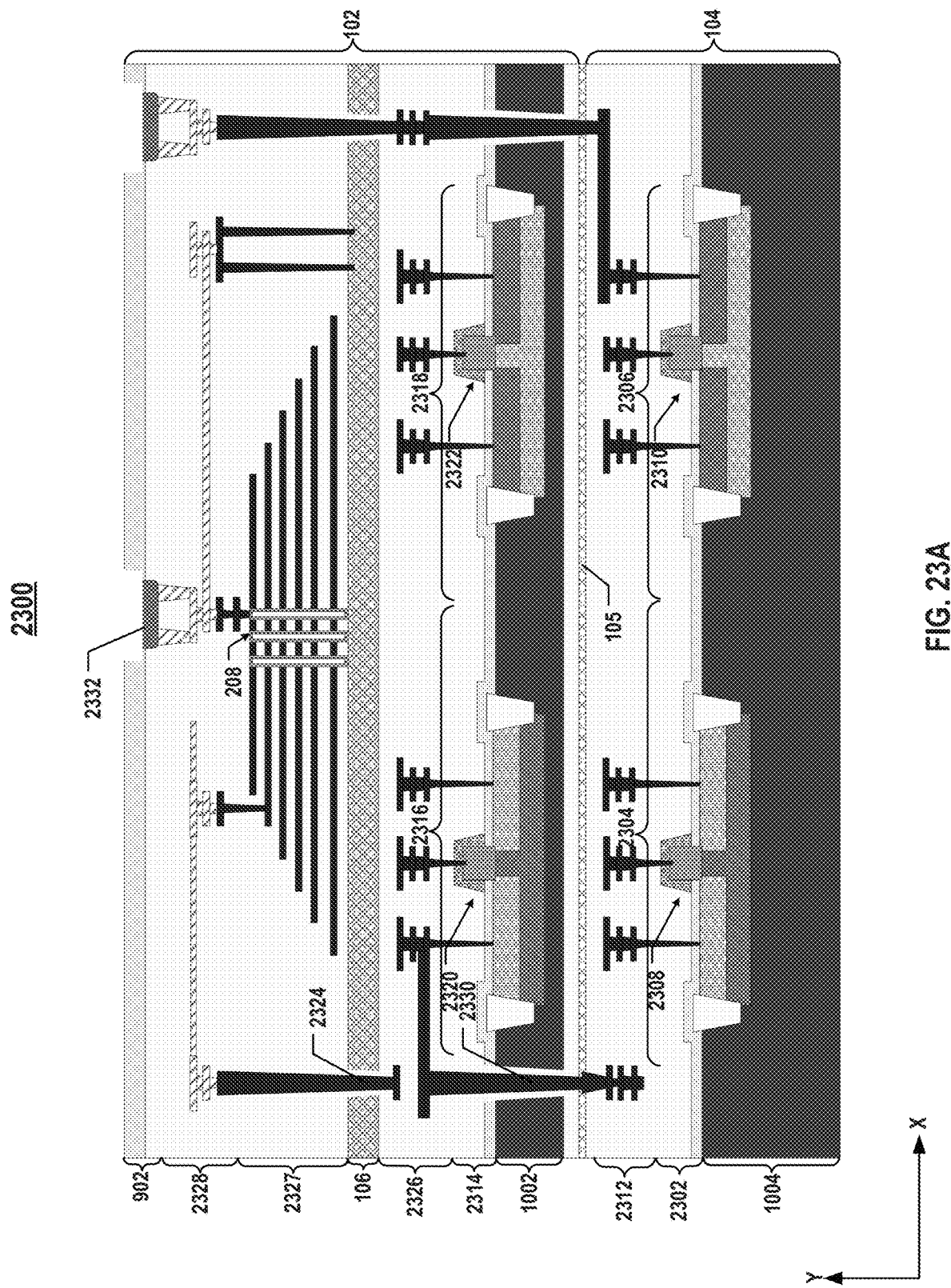
FIGS. 23A and 23B illustrate side views of various examples of the 3D memory devices in FIGS. 22A and 22B, according to various aspects of the present disclosure.
Figure 23B:
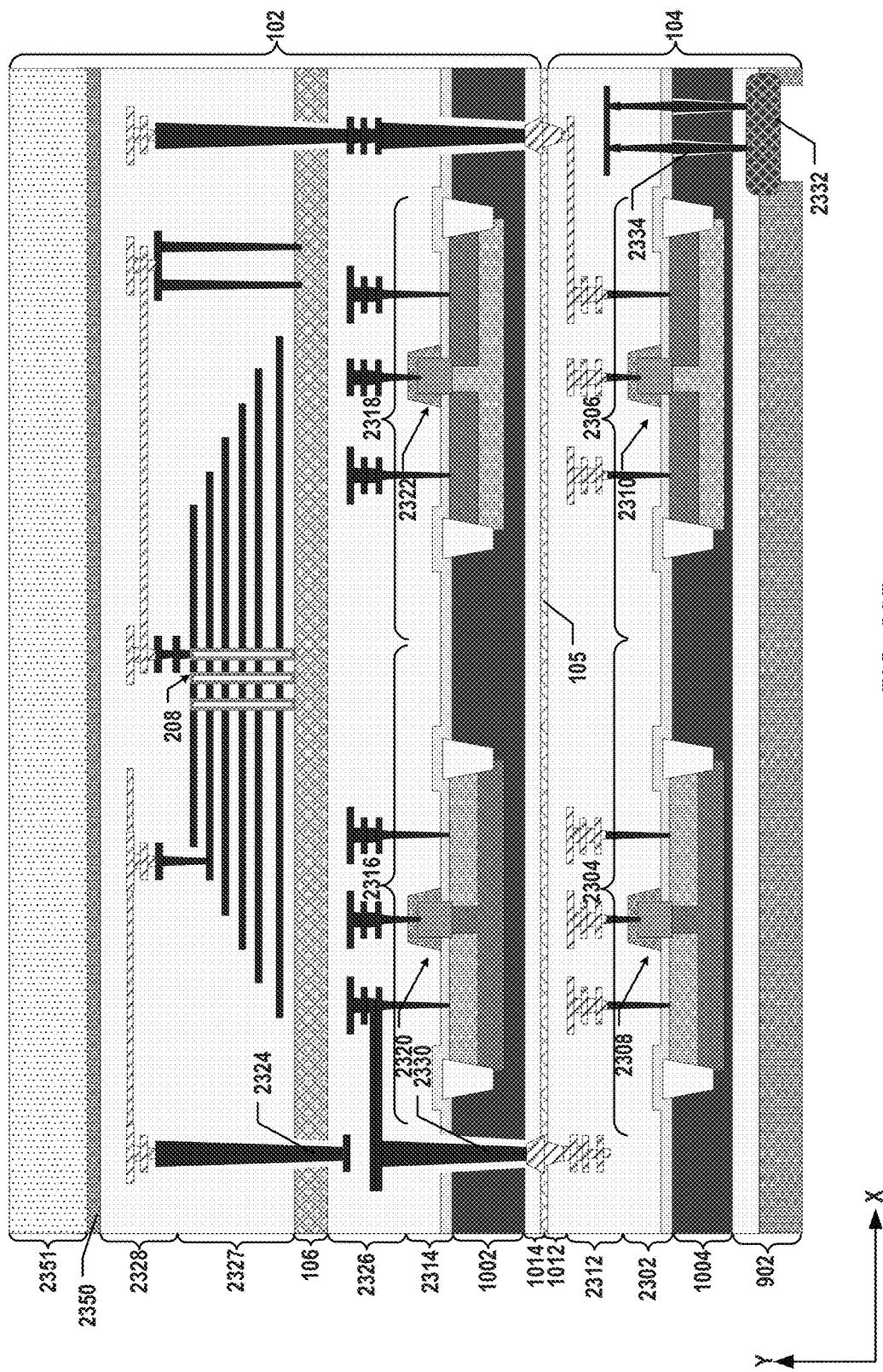

FIGS. 23A and 23B illustrate side views of various examples of 3D memory devices 2200 and 2201 in FIGS. 22A and 22B, according to various aspects of the present disclosure. As shown in FIG. 23A, as one example of 3D memory devices 2200 and 2201 in FIGS. 22A and 22B, 3D memory device 2300 is a bonded chip including first semiconductor structure 102 and second semiconductor structure 104, which are stacked over one another in different planes in the vertical direction (e.g., they-direction in FIG. 23A), according to some implementations. First and second semiconductor structures 102 and 104 are bonded at bonding interface 105 therebetween, according to some implementations.

As shown in FIG. 23A, second semiconductor structure 104 can include semiconductor layer 1004 having semiconductor materials. In some implementations, semiconductor layer 1004 is a silicon substrate having single crystalline silicon. Second semiconductor structure 104 can also include a device layer 2302 above and in contact with semiconductor layer 1004. In some implementations, device layer 2302 includes a first peripheral circuit 2304 and a second peripheral circuit 2306. First peripheral circuit 2304 can include HV circuits 406, such as driving circuits (e.g., string drivers 704 in row decoder/word line driver 308 and drivers in column decoder/bit line driver 306), and second peripheral circuit 2306 can include LV circuits 404, such as page buffer circuits (e.g., page buffer circuits 702 in page buffer 304) and logic circuits (e.g., in control logic 312). In some implementations, first peripheral circuit 2304 includes a plurality of transistors 2308 in contact with semiconductor layer 1004, and second peripheral circuit 2306 includes a plurality of transistors 2310 in contact with semiconductor layer 1004. Transistors 2308 and 2310 can include any transistors disclosed herein, such as planar transistors 500 and 3D transistors 600. As described above in detail with respect to transistors 500 and 600, in some implementations, each transistor 2308 or 2310 includes a gate dielectric, and the thickness of the gate dielectric of transistor 2308 (e.g., in HV circuit 406) is larger than the thickness of the gate dielectric of transistor 2310 (e.g., in LV circuit 404) due to the higher voltage applied to transistor 2308 than transistor 2310. Trench isolations (e.g., STIs) and doped regions (e.g., wells, sources, and drains of transistors 2308 and 2310) can be formed on or in semiconductor layer 1004 as well.

In some implementations, second semiconductor structure 104 further includes an interconnect layer 2312 above device layer 2302 to transfer electrical signals to and from peripheral circuits 2306 and 2304. As shown in FIG. 23A, interconnect layer 2312 can be vertically between bonding interface 105 and device layer 2302 (including transistors 2308 and 2310 of peripheral circuits 2304 and 2306). Interconnect layer 2312 can include a plurality of interconnects, such as MEOL interconnects and BEOL interconnects. The interconnects in interconnect layer 2312 can be coupled to transistors 2308 and 2310 of peripheral circuits 2304 and 2306 in device layer 2302. Interconnect layer 2312 can further include one or more ILD layers in which the lateral lines and vias can form. That is, interconnect layer 2312 can include lateral lines and vias in multiple ILD layers. In some implementations, the devices in device layer 2302 are coupled to one another through the interconnects in interconnect layer 2312. For example, peripheral circuit 2304 may be coupled to peripheral circuit 2306 through interconnect layer 2312. The interconnects in interconnect layer 2312 can include conductive materials including, but not limited to, W, Co, Cu, Al, silicides, or any combination thereof. The ILD layers in interconnect layer 2312 can include dielectric materials including, but not limited to, silicon oxide, silicon nitride, silicon oxynitride, low-k dielectrics, or any combination thereof. In some implementations, the interconnects in interconnect layer 2312 include W, which has a relatively high thermal budget (compatible with high-temperature processes) and good quality (fewer detects, e.g., voids) among conductive metal materials.

As shown in FIG. 23A, first semiconductor structure 102 can be bonded on top of second semiconductor structure 104 in a back-to-face manner at bonding interface 105. First semiconductor structure 102 can further include semiconductor layer 1002 having semiconductor materials. In some implementations, bonding interface 105 is the place at which semiconductor layer 1002 of first semiconductor structure 102 and interconnect layer 2312 of second semiconductor structure 104 are met and bonded. In practice, bonding interface 105 can be a layer with a certain thickness that includes the top surface of interconnect layer 2312 of second semiconductor structure 104 and the bottom surface of semiconductor layer 1002 of first semiconductor structure 102. Bonding interface 105 can result from a transfer bonding process, and semiconductor layer 1002 can be a layer of single crystalline silicon transferred from a silicon substrate or an SOI substrate and attached to the top surface of first semiconductor structure 102 by transfer bonding, as described below in detail with respect to the fabrication process. In some implementations, dielectric layer(s) (e.g., silicon oxide layer) are formed vertically between bonding interface 105 and semiconductor layer 1002 and/or between bonding interface 105 and interconnect layer 2312 to facilitate the transfer bonding of semiconductor layer 1002 onto interconnect layer 2312. Thus, it is understood that bonding interface 105 may include the surfaces of the dielectric layer(s) in some examples.

As shown in FIG. 23A, first semiconductor structure 102 can also include a device layer 2314 above and in contact with semiconductor layer 1002. In some implementations, device layer 2314 includes a third peripheral circuit 2316 and a fourth peripheral circuit 2318 above and in contact with semiconductor layer 1002. In some implementations, semiconductor layer 1002 is disposed vertically between bonding interface 105 and device layer 2314 having peripheral circuits 2316 and 2318. Third peripheral circuit 2316 can include LLV circuits 402, such as I/O circuits (e.g., in interface 316 and data bus 318), and fourth peripheral circuit 2318 can include LV circuits 404, such as page buffer circuits (e.g., page buffer circuits 702 in page buffer 304) and logic circuits (e.g., in control logic 312). In some implementations, third peripheral circuit 2316 includes a plurality of transistors 2320, and fourth peripheral circuit 2318 includes a plurality of transistors 2322 as well. Transistors 2320 and 2322 can include any transistors disclosed herein, such as planar transistors 500 and 3D transistors 600. As described above in detail with respect to transistors 500 and 600, in some implementations, each transistor 2320 or 2322 includes a gate dielectric, and the thickness of the gate dielectric of transistor 2320 (e.g., in LLV circuit 402) is smaller than the thickness of the gate dielectric of transistor 2322 (e.g., in LV circuit 404) due to the lower voltage applied to transistor 2320 than transistor 2322.

Moreover, the different voltages applied to different transistors 2320, 2322, 2308, and 2310 in first and second semiconductor structures 102 and 104 can lead to differences of device dimensions between first and second semiconductor structures 102 and 104. In some implementations, the thickness of the gate dielectric of transistor 2308 (e.g., in HV circuit 406) is larger than the thickness of the gate dielectric of transistor 2320 (e.g., in LLV circuit 402) due to the higher voltage applied to transistor 2308 than transistor 2320. In some implementations, the thickness of the gate dielectric of transistor 2322 (e.g., in LV circuit 404) is the same as the thickness of the gate dielectric of transistor 2310 (e.g., in LV circuit 404) due to the same voltage applied to transistor 2322 and transistor 2310. In some implementations, the thickness of semiconductor layer 1004 in which transistor 2308 (e.g., in HV circuit 406) is formed is larger than the thickness of semiconductor layer 1002 in which transistor 2320 (e.g., in LLV circuit 402) is formed due to the higher voltage applied to transistor 2308 than transistor 2320.

As shown in FIG. 23A, first semiconductor structure 102 can further include an interconnect layer 2326 above and in contact with device layer 2314 to transfer electrical signals to and from transistors 2320 and 2322 of peripheral circuits 2316 and 2318. Interconnect layer 2326 can include a plurality of interconnects, such as MEOL interconnects and BEOL interconnects. Interconnect layer 2326 can further include one or more ILD layers in which the lateral lines and vias can form. The interconnects in interconnect layer 2326 can include conductive materials including, but not limited to, W, Co, Cu, Al, silicides, or any combination thereof. The ILD layers in interconnect layer 2326 can include dielectric materials including, but not limited to, silicon oxide, silicon nitride, silicon oxynitride, low-k dielectrics, or any combination thereof. In some implementations, the interconnects in interconnect layer 2326 include W, which has a relatively high thermal budget (compatible with high-temperature processes) and good quality (fewer detects, e.g., voids) among conductive metal materials.

As shown in FIG. 23A, first semiconductor structure 102 can also include one or more contacts 2330 extending vertically through semiconductor layer 1002. In some implementations, contact 2330 extends further through the dielectric layer (if any) on the backside of semiconductor layer 1002 to be in contact with the interconnects of interconnect layer 2312 at bonding interface 105. Contact 2330 can thus couple the interconnects in interconnect layer 2326 to the interconnects in interconnect layer 2312 to make an electrical connection through semiconductor layer 1004 and across bonding interface 105 between first and second semiconductor structures 102 and 104. Contact 2330 can include conductive materials including, but not limited to, W, Co, Cu, Al, silicides, or any combination thereof. In some implementations, contact 2330 includes W. In some implementations, contact 2330 includes a via surrounded by a dielectric spacer (e.g., having silicon oxide) to electrically separate the via from semiconductor layer 1002. Depending on the thickness of semiconductor layer 1002, contact 2330 can be an ILV having a depth in the submicron-level (e.g., between 10 nm and 1 μm), or a TSV having a depth in the micron- or tens micron-level (e.g., between 1 μm and 100 μm).

As shown in FIG. 23A, first semiconductor structure can further include polysilicon layer 106 above and in contact with interconnect layer 2326. Polysilicon layer 106 is a doped polysilicon layer on interconnect layer 2326, as described below in detail with respect to the fabrication process, according to some implementations. It is understood that in some examples, trench isolations and doped regions (not shown) may be formed in polysilicon layer 106 as well.

As shown in FIG. 23A, first semiconductor structure 102 can also include a memory cell array, such as an array of NAND memory strings 208 above and in contact with polysilicon layer 106. The sources of the NAND memory strings 208 can be in contact with polysilicon layer 106. In some implementations, polysilicon layer 106 is vertically between NAND memory strings 208 and device layer 2314 including transistors 2320 and 2322. In some implementations, each NAND memory string 208 is a "charge trap" type of NAND memory string including any suitable channel structures disclosed herein, such as channel structure 812, described above in detail with respect to FIG. 8. In some implementations, NAND memory string 208 is a "floating gate" type of NAND memory string, and polysilicon layer 106 is the source plate of the floating gate type of NAND memory strings.

Each NAND memory string 208 extends vertically through a plurality of pairs each including a conductive layer and a dielectric layer, according to some implementations. The stacked and interleaved conductive layers and dielectric layers are also referred to herein as a stack structure, e.g., a memory stack 2327. Memory stack 2327 may be an example of memory stack 804 in FIG. 8, and the conductive layer and dielectric layer in memory stack 2327 may be examples of gate conductive layers 806 and dielectric layer 808, respectively, in memory stack 804. The interleaved conductive layers and dielectric layers in memory stack 2327 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 2327.

As shown in FIG. 23A, first semiconductor structure 102 can further include an interconnect layer 2328 above and in contact with NAND memory strings 208 to transfer electrical signals to and from NAND memory strings 208. In some implementations, memory stack 2327 and NAND memory strings 208 are vertically between interconnect layer 2328 and polysilicon layer 106. Interconnect layer 2328 can include a plurality of interconnects, such as MEOL interconnects and BEOL interconnects. In some implementations, the interconnects in interconnect layer 2328 also include local interconnects, such as bit line contacts and word line contacts. Interconnect layer 2328 can further include one or more ILD layers in which the lateral lines and vias can form. The interconnects in interconnect layer 2328 can include conductive materials including, but not limited to, W, Co, Cu, Al, silicides, or any combination thereof. The ILD layers in interconnect layer 2328 can include dielectric materials including, but not limited to, silicon oxide, silicon nitride, silicon oxynitride, low-k dielectrics, or any combination thereof.

As shown in FIG. 23A, first semiconductor structure 102 can further include one or more contacts 2324 extending vertically through polysilicon layer 106. In some implementations, contact 2324 couples the interconnects in interconnect layer 2328 to the interconnects in interconnect layer 2326 to make an electrical connection through polysilicon layer 106 between NAND memory strings 208 and transistors 2320 and 2322. Contact 2324 can include conductive materials including, but not limited to, W, Co, Cu, Al, silicides, or any combination thereof. In some implementations, contact 2324 includes W or Cu. In some implementations, contact 2324 includes a via surrounded by a dielectric spacer (e.g., having silicon oxide) to electrically separate the via from polysilicon layer 106. Depending on the thickness of polysilicon layer 106, contact 2324 can be an ILV having a depth in the submicron-level (e.g., between 10 nm and 1 μm), or a TSV having a depth in the micron- or tens micron-level (e.g., between 1 μm and 100 μm).

As shown in FIG. 23A, first semiconductor structure 102 can further include a pad-out interconnect layer 902 above interconnect layer 2328 and NAND memory strings 208. In some implementations, NAND memory strings 208 are disposed vertically between pad-out interconnect layer 902 and polysilicon layer 106. Pad-out interconnect layer 902 can include interconnects, e.g., contact pads 2332, in one or more ILD layers. In some implementations, the interconnects in pad-out interconnect layer 902 can transfer electrical signals between 3D memory device 2300 and external devices, e.g., for pad-out purposes.

As a result, peripheral circuits 2304, 2306, 2316, and 2318 in second and first semiconductor structures 104 and 102 can be coupled to NAND memory strings 208 in first semiconductor structure 102 through various interconnection structures, including interconnect layers 2312, 2326, and 2328, as well as contacts 2324 and 2330. Moreover, peripheral circuits 2304, 2306, 2316, and 2318 and NAND memory strings 208 in 3D memory device 2300 can be further coupled to external devices through contacts 2330 and pad-out interconnect layer 902.

It is understood that the pad-out of 3D memory devices is not limited to from first semiconductor structure 102 having NAND memory strings 208 and peripheral circuit 2316 as shown in FIG. 23A (corresponding to FIG. 21A) and may be from second semiconductor structure 104 having peripheral circuit 2304 (corresponding to FIG. 21B). For example, as shown in FIG. 23B, a 3D memory device 2301 may include pad-out interconnect layer 902 in second semiconductor structure 104. Pad-out interconnect layer 902 can be in contact with semiconductor layer 1004 of second semiconductor structure 104 on which transistors 2308 of peripheral circuit 2304 are formed. In some implementations, second semiconductor structure 104 further includes one or more contacts 2334 extending vertically through semiconductor layer 1004. In some implementations, contact 2334 couples the interconnects in interconnect layer 2312 in second semiconductor structure 104 to contact pads 2332 in pad-out interconnect layer 902 to make an electrical connection through semiconductor layer 1004. Contact 2334 can include conductive materials including, but not limited to, W, Co, Cu, Al, silicides, or any combination thereof. In some implementations, contact 2334 includes W. In some implementations, contact 2334 includes a via surrounded by a dielectric spacer (e.g., having silicon oxide) to electrically separate the via from semiconductor layer 1004. Depending on the thickness of semiconductor layer 1004, contact 2334 can be an ILV having a thickness in the submicron-level (e.g., between 10 nm and 1 µm), or a TSV having a depth in the micron- or tens micron-level (e.g., between 1 µm and 100 µm).

As shown in FIG. 23B, first semiconductor structure 102 can further include a passivation layer 2350, replacing pad-out interconnect layer 902 in FIG. 23A, to protect and encapsulate 3D memory device 2301 from the side of first semiconductor structure 102 without pad-out interconnect layer 902. Passivation layer 2350 can include dielectric materials, such as silicon nitride and/or silicon oxide. In some implementations, first semiconductor structure 102 in 3D memory device 2301 further includes a handle/carrier substrate 2351 in contact with passivation layer 2350 as the base substrate of 3D memory device 2301 to provide support. It is understood that in some examples, passivation layer 2350 may be omitted or combined with handle substrate 2351 as a single layer for support and protection.

It is also understood that in some examples, first and second semiconductor structures 102 and 104 of 3D memory device 2301 may further include bonding layers 1012 and 1014, respectively, at bonding interface 105 (on opposite sides of bonding interface 105), as shown in FIG. 23B. That is, bonding interface 105 can result from hybrid bonding, as opposed to transfer bonding. Bonding layer 1012 can be disposed between bonding interface 105 and interconnect layer 2312, and bonding layer 1014 can be disposed between bonding interface 105 and semiconductor layer 1002. In some implementations, bonding layer 1014 is formed on the backside of semiconductor layer 1002 (e.g., a thinned silicon substrate) opposite to the front side on which device layer 2314 is formed. In practice, bonding interface 105 can be a layer with a certain thickness that includes the top surface of bonding layer 1012 of second semiconductor structure 104 and the bottom surface of bonding layer 1014 of first semiconductor structure 102.

Bonding layers 1012 and 1014 can include a plurality of bonding contacts and dielectrics electrically isolating the bonding contacts. The bonding contacts can include conductive materials including, but not limited to, W, Co, Cu, Al, silicides, or any combination thereof. In some implementations, the bonding contacts of bonding layers 1012 and 1014 include Cu. The remaining area of bonding layers 1012 and 1014 can be formed with dielectrics including, but not limited to, silicon oxide, silicon nitride, silicon oxynitride, low-k dielectrics, or any combination thereof. The bonding contacts and surrounding dielectrics in bonding layers 1012 and 1014 can be used for hybrid bonding (also known as "metal/dielectric hybrid bonding"), which is a direct bonding technology (e.g., forming bonding between surfaces without using intermediate layers, such as solder or adhesives) and can obtain metal-metal (e.g., Cu-to-Cu) bonding and dielectric-dielectric (e.g., $SiO_2$-to-$SiO_2$) bonding simultaneously.

Figure 26:
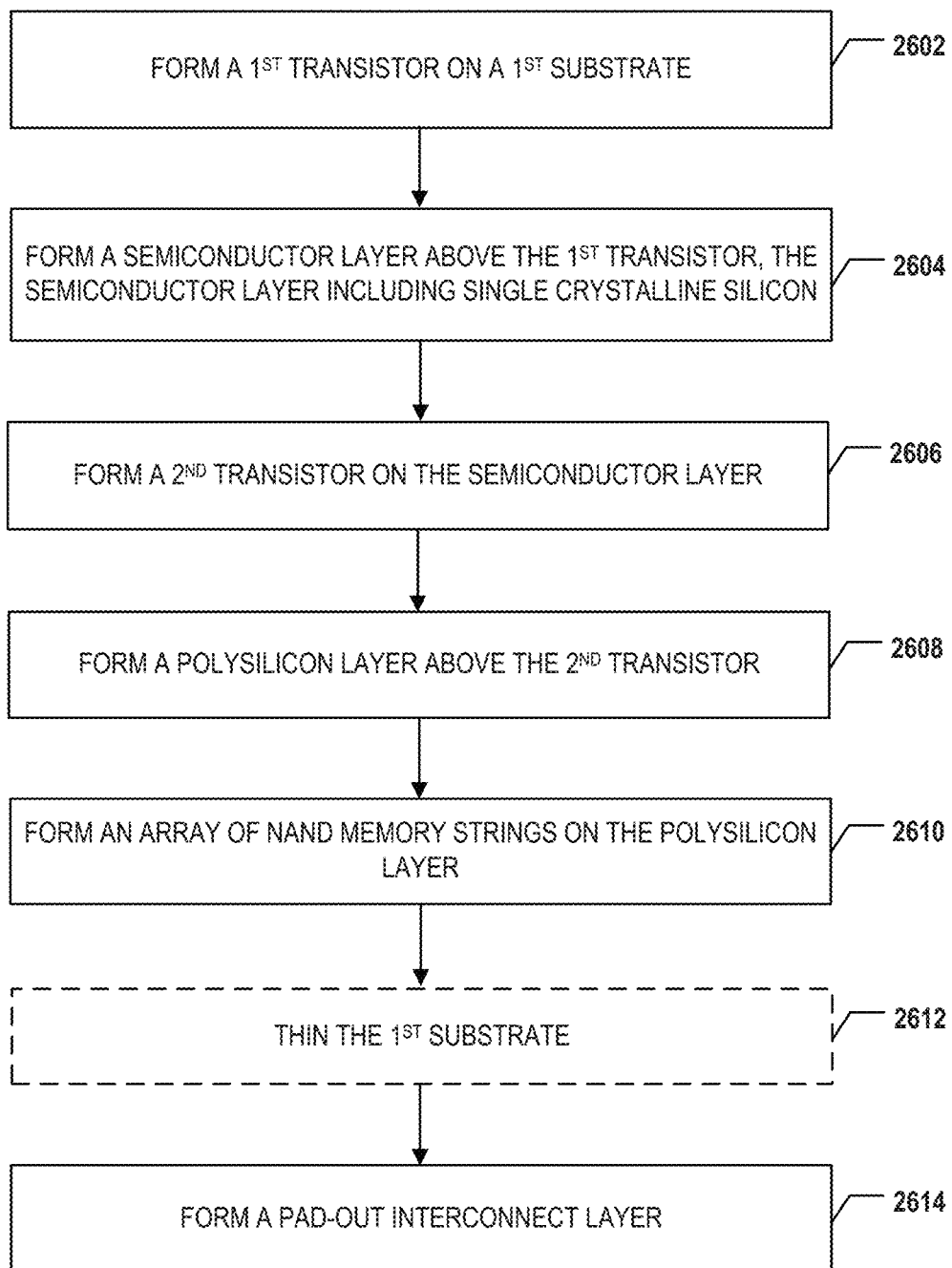
FIG. 26 illustrates a flowchart of a method for forming the 3D memory device in FIGS. 22A and 22B, according to some aspects of the present disclosure.

FIGS. 24A-24F illustrate a fabrication process for forming the 3D memory devices in FIGS. 22A and 22B, according to some aspects of the present disclosure. FIG. 26 illustrates a flowchart of a method 2600 for forming the 3D memory devices in FIGS. 22A and 22B, according to some aspects of the present disclosure. Examples of the 3D memory devices depicted in FIGS. 24A-24F and 26 include 3D memory device 2300 depicted in FIG. 23A. FIGS. 24A-24F and 26 will be described together. It is understood that the operations shown in method 2600 are not exhaustive and that other operations can be performed as well before, after, or between any of the illustrated operations. Further, some of the operations may be performed simultaneously, or in a different order than shown in FIG. 26.

Figure 24A:
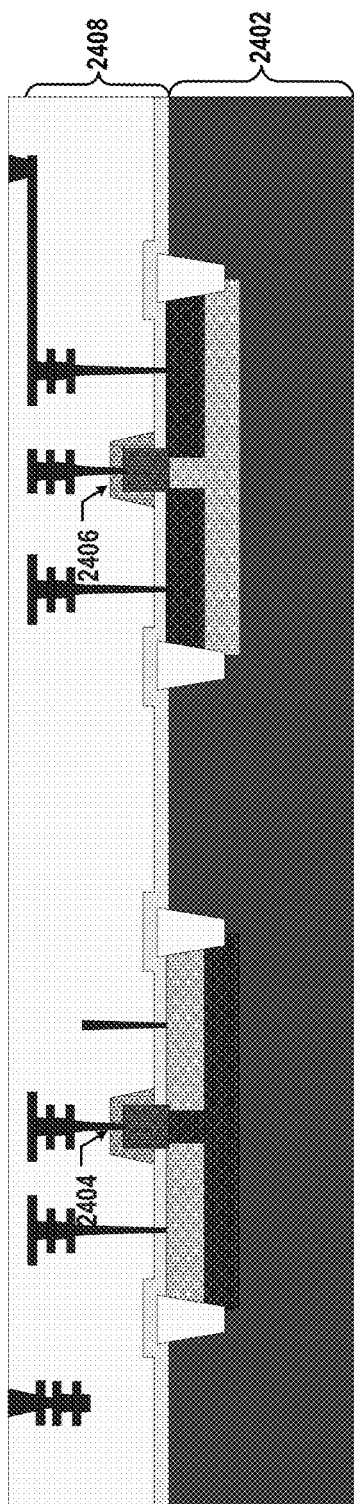
FIGS. 24A-24F illustrate a fabrication process for forming the 3D memory device in FIGS. 22A and 22B, according to some aspects of the present disclosure.

Referring to FIG. 26, method 2600 starts at operation 2602, in which a first transistor is formed on a first substrate. The first substrate can be a silicon substrate having single crystalline silicon. As illustrated in FIG. 24A, a plurality of transistors 2404 and 2406 are formed on a silicon substrate 2402. Transistors 2404 and 2406 can be formed by a plurality of processes including, but not limited to, photolithography, dry/wet etch, thin film deposition, thermal growth, implantation, CMP, and any other suitable processes. In some implementations, doped regions are formed in silicon substrate 2402 by ion implantation and/or thermal diffusion, which function, for example, as wells and source/drain regions of transistors 2404 and 2406. In some implementations, isolation regions (e.g., STIs) are also formed in silicon substrate 2402 by wet/dry etch and thin film deposition. In some implementations, the thickness of gate dielectric of transistor 2404 is different from the thickness of gate dielectric of transistor 2406, for example, by depositing a thicker silicon oxide film in the region of transistor 2404 than the region of transistor 2406, or by etching back part of the silicon oxide film deposited in the region of transistor 2406. It is understood that the details of fabricating transistors 2404 and 2406 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 2408 is formed above the transistor on the first substrate. The interconnect layer can include a plurality of interconnects in one or more ILD layers. As illustrated in FIG. 24A, an interconnect layer 2408 can be formed above transistors 2404 and 2406. Interconnect layer 2408 can include interconnects of MEOL and/or BEOL in a plurality of ILD layers to make electrical connections with transistors 2404 and 2406. In some implementations, interconnect layer 2408 includes multiple ILD layers and interconnects therein formed in multiple processes. For example, the interconnects in interconnect layer 2408 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 24A can be collectively referred to as interconnect layer 2408. In some implementations, the interconnects in interconnect layer 2408 include W, which has a relatively high thermal budget among conductive metal materials to sustain later high-temperature processes.

Method 2600 proceeds to operation 2604, as illustrated in FIG. 26, in which a semiconductor layer is formed above the first transistor. The semiconductor layer can include single crystalline silicon. In some implementations, to form the semiconductor layer, another substrate and the first substrate are bonded in a face-to-face manner, and the other substrate is thinned to leave the semiconductor layer. The bonding can include transfer bonding. The other substrate can be a silicon substrate having single crystalline silicon.

Figure 24B:
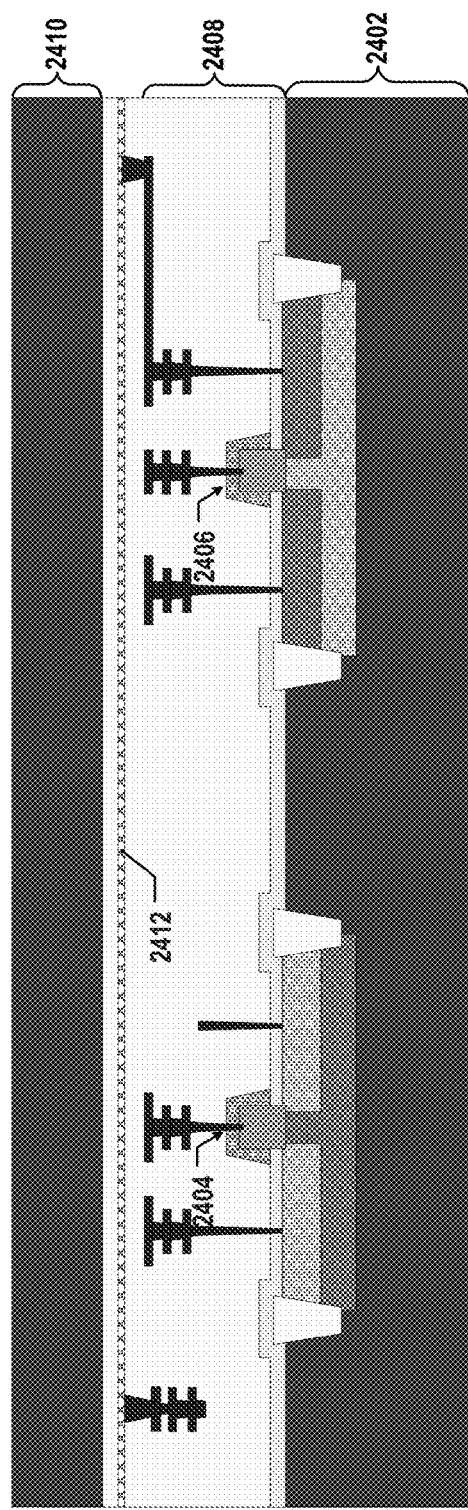

As illustrated in FIG. 24B, a semiconductor layer 2410, such as a single crystalline silicon layer, is formed above interconnect layer 2408 and transistors 2404 and 2406. Semiconductor layer 2410 can be attached above interconnect layer 2408 to form a bonding interface 2412 vertically between semiconductor layer 2410 and interconnect layer 2408. In some implementations, dielectric layer(s) (e.g., silicon oxide layer) are formed between bonding interface 2412 and semiconductor layer 2410 and/or between bonding interface 2412 and interconnect layer 2408 to facilitate the transfer bonding of semiconductor layer 2410. In some implementations, to form semiconductor layer 2410, another silicon substrate (not shown in FIG. 24B) and silicon substrate 2402 are bonded in a face-to-face manner (having the components formed on silicon substrate 2402, such as transistors 2404 and 2406, facing toward the other silicon substrate) using transfer bonding, thereby forming bonding interface 2412. The other silicon substrate can then be thinned using any suitable processes to leave semiconductor layer 2410 attached above interconnect layer 2408. The details of various transfer bonding processes are described above with respect to FIGS. 34A-34D and FIGS. 35A-35D and thus, are not repeated for ease of description.

Figure 24C:
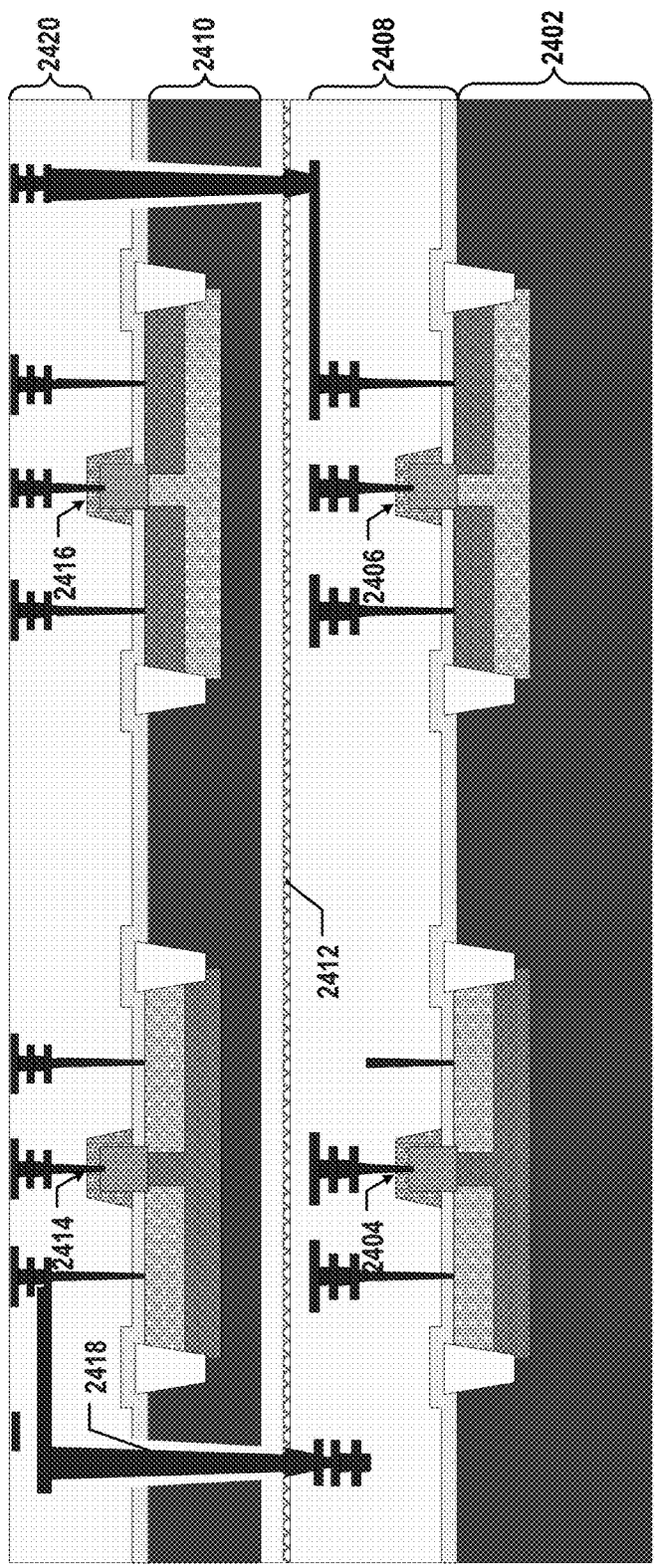

Method 2600 proceeds to operation 2606, in which a second transistor is formed on the semiconductor layer. As illustrated in FIG. 24C, a plurality of transistors 2414 and 2416 are formed on semiconductor layer 2410 having single crystalline silicon. Transistors 2414 and 2416 can be formed by a plurality of processes including, but not limited to, photolithography, dry/wet etch, thin film deposition, thermal growth, implantation, CMP, and any other suitable processes. In some implementations, doped regions are formed in semiconductor layer 2410 by ion implantation and/or thermal diffusion, which function, for example, as wells and source/drain regions of transistors 2414 and 2416. In some implementations, isolation regions (e.g., STIs) are also formed in semiconductor layer 2410 by wet/dry etch and thin film deposition. In some implementations, the thickness of gate dielectric of transistor 2414 is different from the thickness of gate dielectric of transistor 2416, for example, by depositing a thicker silicon oxide film in the region of transistor 2414 than the region of transistor 2416, or by etching back part of the silicon oxide film deposited in the region of transistor 2416. It is understood that the details of fabricating transistors 2414 and 2416 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer is formed above the transistor. The interconnect layer can include a plurality of interconnects in one or more ILD layers. As illustrated in FIG. 24C, an interconnect layer 2420 can be formed above transistors 2414 and 2416. Interconnect layer 2420 can include interconnects of MEOL and/or BEOL in a plurality of ILD layers to make electrical connections with transistors 2414 and 2416. In some implementations, interconnect layer 2420 includes multiple ILD layers and interconnects therein formed in multiple processes. For example, the interconnects in interconnect layer 2420 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 24C can be collectively referred to as interconnect layer 2420. In some implementations, the interconnects in interconnect layer 2420 include W, which has a relatively high thermal budget among conductive metal materials to sustain later high-temperature processes.

In some implementations, a contact through the semiconductor layer is formed. Contact 2418 can extend vertically through semiconductor layer 2410 from the front side thereof. Contacts 2418 can be coupled to the interconnects in interconnect layer 2420. Contact 2418 can extend further through a dielectric layer (if any) on the backside of semiconductor layer 2410 to be aligned and in contact with the interconnects in interconnect layer 2408 at bonding interface 2412. Thus, contact 2418 couples the interconnects in interconnect layer 2408 to the interconnects in interconnect layer 2420 through semiconductor layer 2410 and across bonding interface 2412. Contacts 2418 can be formed by first patterning contact holes into semiconductor layer 2410 using patterning process (e.g., photolithography and dry/wet etch of dielectric materials in the dielectric layer). The contact holes can be filled with a conductor (e.g., W). In some implementations, filling the contact holes includes depositing a spacer (e.g., a silicon oxide layer) before depositing the conductor.

Figure 24D:
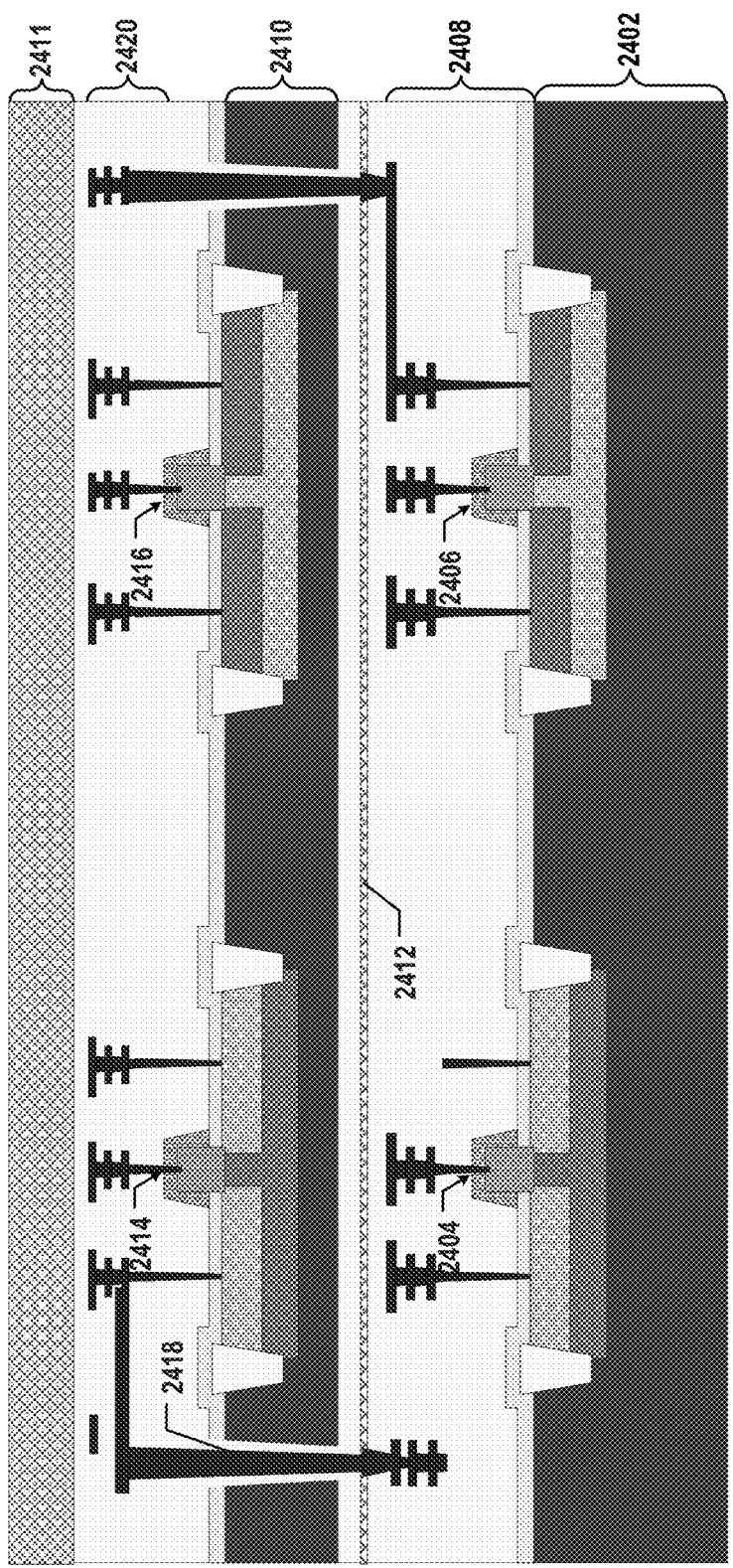

Method 2600 proceeds to operation 2608, as illustrated in FIG. 26, in which a polysilicon layer is formed above the second transistor. As illustrated in FIG. 24D, a polysilicon layer 2411 is formed above interconnect layer 2420 and transistors 2414 and 2416 on semiconductor layer 2410. Polysilicon layer 2411 can be formed by depositing polysilicon on interconnect layer 2420 using one or more thin film deposition processes including, but not limited to, CVD, PVD, ALD, or any combination thereof. In some implementations, polysilicon layer 2411 is doped with P-type or N-type dopant using an in-situ doping process during the deposition process or ion implantation/diffusion process after the deposition process.

Figure 24E:
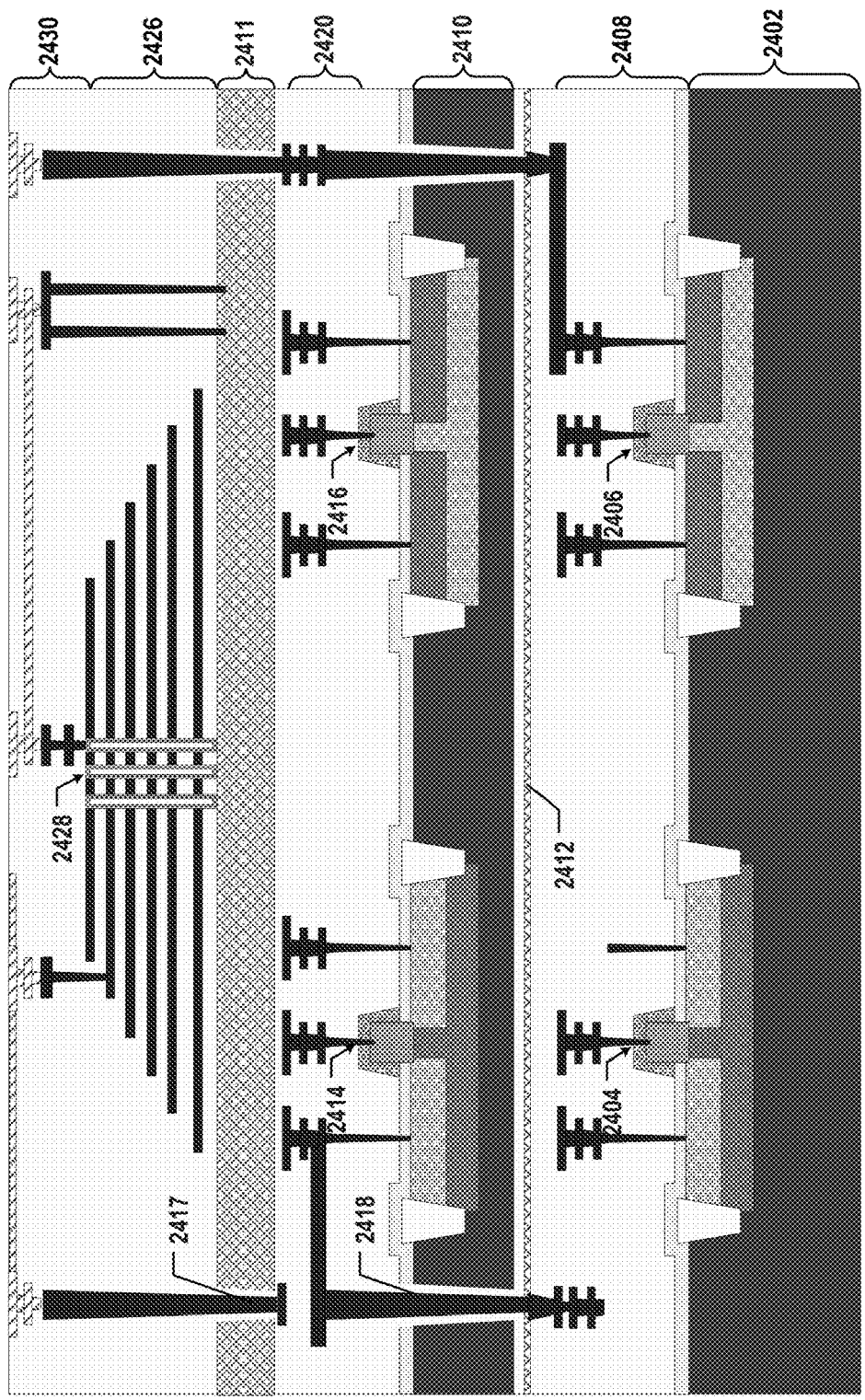

Method 2600 proceeds to operation 2010, as illustrated in FIG. 26, in which an array of NAND memory strings is formed on the polysilicon layer. In some implementations, to form the array of NAND memory strings, a memory stack is formed on the polysilicon layer. As illustrated in FIG. 24E, a stack structure, such as a memory stack 2426 including interleaved conductive layers and dielectric layers, is formed on polysilicon layer 2411. To form memory stack 2426, in some implementations, a dielectric stack (not shown) including interleaved sacrificial layers (not shown) and the dielectric layers is formed on polysilicon layer 2411. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 2426 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 2426 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 2426 and polysilicon layer 2411.

As illustrated in FIG. 24E, NAND memory strings 2428 are formed above polysilicon layer 2411, each of which extends vertically through memory stack 2426 to be in contact with polysilicon layer 2411. In some implementations, fabrication processes to form NAND memory string 2428 include forming a channel hole through memory stack 2426 (or the dielectric stack) and into polysilicon layer 2411 using dry etching/and or wet etching, such as DRIE, followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 2428 may vary depending on the types of channel structures of NAND memory strings 2428 (e.g., channel structure 812 in FIG. 8) and thus, are not elaborated for ease of description.

In some implementations, an interconnect layer is formed above the array of NAND memory strings. The interconnect layer can include a first plurality of interconnects in one or more ILD layers. As illustrated in FIG. 24E, an interconnect layer 2430 is formed above memory stack 2426 and NAND memory strings 2428. Interconnect layer 2430 can include interconnects of MEOL and/or BEOL in a plurality of ILD layers to make electrical connections with NAND memory strings 2428. In some implementations, interconnect layer 2430 includes multiple ILD layers and interconnects therein formed in multiple processes. For example, the interconnects in interconnect layer 2430 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 24E can be collectively referred to as interconnect layer 2430.

In some implementations, a contact through the polysilicon layer is formed. As illustrated in FIG. 24E, one or more contacts 2417 each extending vertically through polysilicon layer 2411 is formed. Contacts 2417 can couple the interconnects in interconnect layers 2430 and 2420. Contacts 2417 can be formed by first patterning contact holes through polysilicon layer 2411 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor.

Figure 24F:
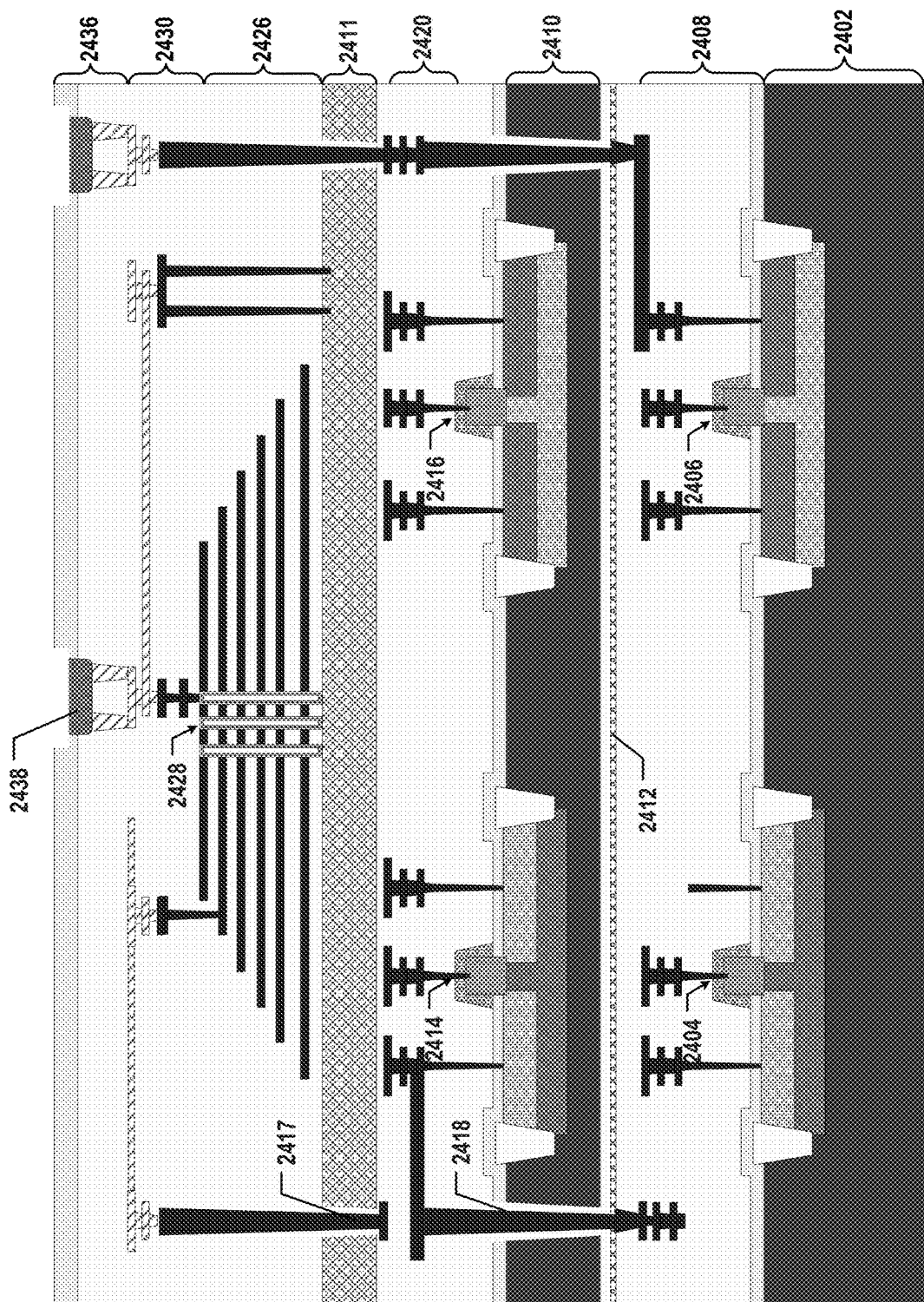

Method 2600 skips optional operation 2612 and proceeds to operation 2614, as illustrated in FIG. 26, in which a pad-out interconnect layer is formed. The pad-out interconnect layer can be formed above the array of NAND memory strings. As illustrated in FIG. 24F, a pad-out interconnect layer 2436 is formed above interconnect layer 2430 and NAND memory strings 2428 on polysilicon layer 2411. Pad-out interconnect layer 2436 can include interconnects, such as contact pads 2438, formed in one or more ILD layers. Contact pads 2438 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

In some implementations, to form a pad-out interconnect layer on the first substrate, after operation 2610, method 2600 proceeds to optional operation 2612, as illustrated in FIG. 26, in which the first substrate is thinned. It is understood that although not shown, in some examples, silicon substrate 2402 (shown in FIG. 24E) may be thinned to become a semiconductor layer having single crystalline silicon using processes including, but not limited to, wafer grinding, dry etch, wet etch, CMP, any other suitable processes, or any combination thereof. After the thinning, contacts may be formed extending vertically through the thinned silicon substrate 2402, for example, by wet/dry etching followed by depositing dielectric materials as spacers and conductive materials as conductors. It is understood that in some examples, the contacts may be formed in silicon substrate 2402 before thinning and be exposed from the backside of silicon substrate 2402 (where the thinning occurs) after the thinning.

Method 2600 proceeds to operation 2614, as illustrated in FIG. 26, in which a pad-out interconnect layer is formed. The pad-out interconnect layer can be formed on the thinned first substrate. It is understood that although not shown, in some examples, a pad-out interconnect layer having contact pads may be formed on the thinned silicon substrate 2402.

Figure 27:
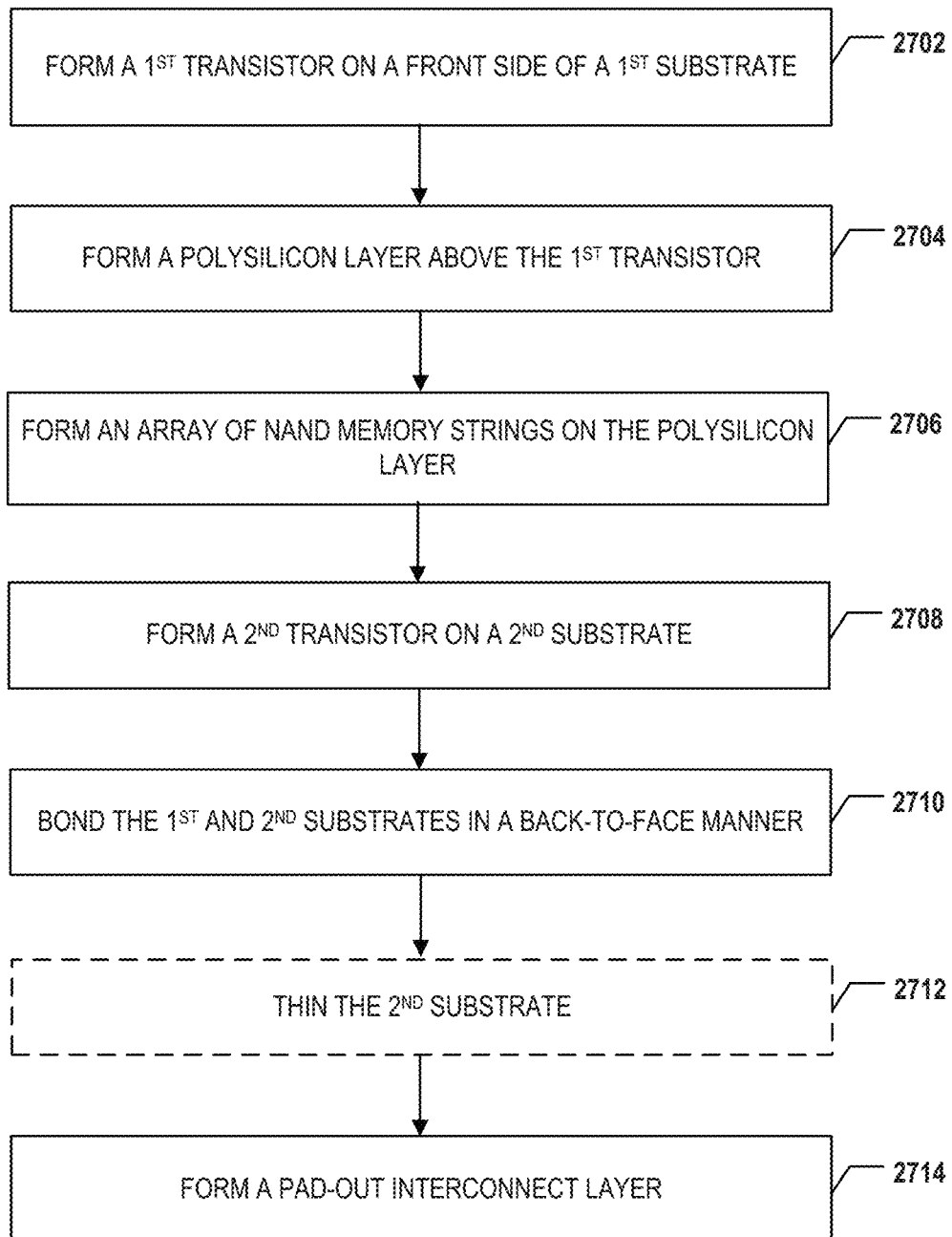
FIG. 27 illustrates a flowchart of another method for forming the 3D memory device in FIGS. 22A and 22B, according to some aspects of the present disclosure.

FIGS. 25A-25G illustrate another fabrication process for forming the 3D memory devices in FIGS. 22A and 22B, according to some aspects of the present disclosure. FIG. 27 illustrates a flowchart of another method 2700 for forming the 3D memory devices in FIGS. 22A and 22B, according to some aspects of the present disclosure. Examples of the 3D memory devices depicted in FIGS. 25A-25G and 27 include 3D memory devices 2301 depicted in FIG. 23B. FIGS. 25A-25G and 27 will be described together. It is understood that the operations shown in method 2700 are not exhaustive and that other operations can be performed as well before, after, or between any of the illustrated operations. Further, some of the operations may be performed simultaneously, or in a different order than shown in FIG. 27.

Figure 25A:
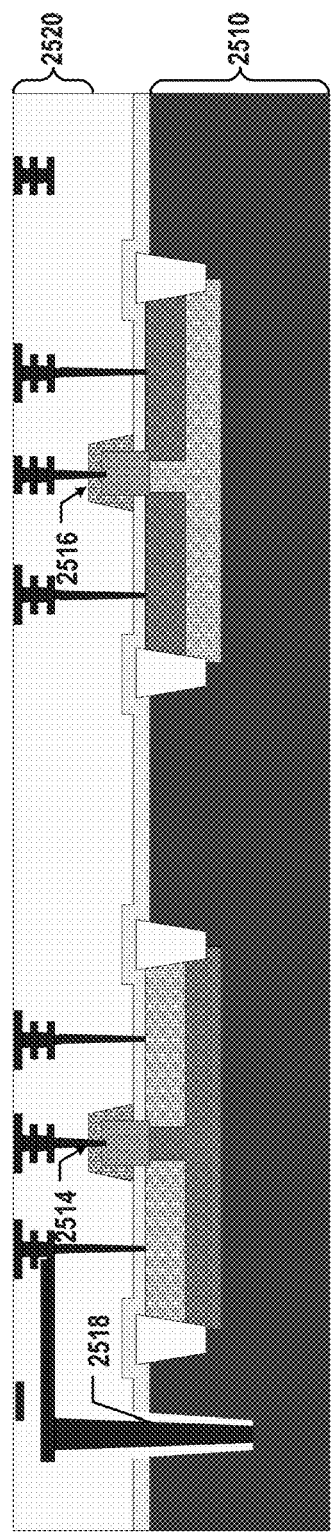
FIGS. 25A-25G illustrate another fabrication process for forming the 3D memory device in FIGS. 22A and 22B, according to some aspects of the present disclosure.

Referring to FIG. 27, method 2700 starts at operation 2702, in which a first transistor is formed on a front side of a first substrate. The first substrate can be a silicon substrate having single crystalline silicon. As illustrated in FIG. 25A, a plurality of transistors 2514 and 2516 are formed on the front side of a silicon substrate 2510. Transistors 2514 and 2516 can be formed by a plurality of processes including, but not limited to, photolithography, dry/wet etch, thin film deposition, thermal growth, implantation, CMP, and any other suitable processes. In some implementations, doped regions are formed in silicon substrate 2510 by ion implantation and/or thermal diffusion, which function, for example, as wells and source/drain regions of transistors 2514 and 2516. In some implementations, isolation regions (e.g., STIs) are also formed in silicon substrate 2510 by wet/dry etch and thin film deposition. In some implementations, the thickness of gate dielectric of transistor 2514 is different from the thickness of gate dielectric of transistor 2516, for example, by depositing a thicker silicon oxide film in the region of transistor 2514 than the region of transistor 2516, or by etching back part of the silicon oxide film deposited in the region of transistor 2516. It is understood that the details of fabricating transistors 2514 and 2516 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 2520 is formed above the transistor on the first substrate. The interconnect layer can include a plurality of interconnects in one or more ILD layers. As illustrated in FIG. 25A, an interconnect layer 2520 can be formed above transistors 2514 and 2516. Interconnect layer 2520 can include interconnects of MEOL and/or BEOL in a plurality of ILD layers to make electrical connections with transistors 2514 and 2516. In some implementations, interconnect layer 2520 includes multiple ILD layers and interconnects therein formed in multiple processes. For example, the interconnects in interconnect layer 2520 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 25A can be collectively referred to as interconnect layer 2520. In some implementations, the interconnects in interconnect layer 2520 include W, which has a relatively high thermal budget among conductive metal materials to sustain later high-temperature processes.

In some implementations, a contact through the thinned first substrate is formed. As shown in FIG. 25A, a contact 2518 extending vertically into silicon substrate 2510 from the front side of silicon substrate 2510 is formed. Contacts 2518 can be coupled to the interconnects in interconnect layer 2520. Contacts 2518 can be formed by first patterning contact holes into silicon substrate 2510 using patterning process (e.g., photolithography and dry/wet etch of dielectric materials in the dielectric layer). The contact holes can be filled with a conductor (e.g., Cu). In some implementations, filling the contact holes includes depositing a spacer (e.g., a silicon oxide layer) before depositing the conductor.

Figure 25B:
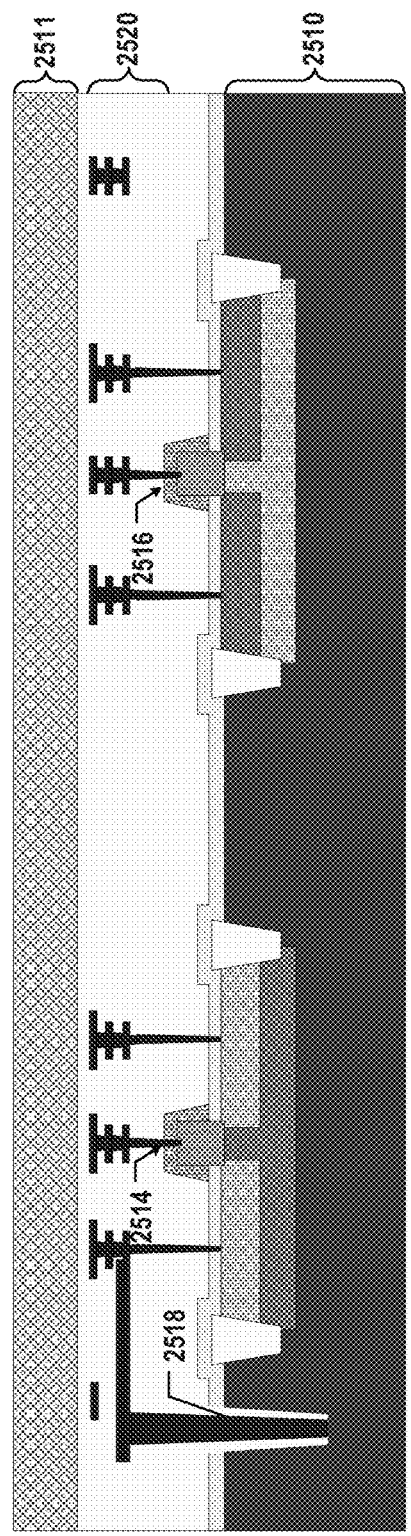

Method 2700 proceeds to operation 2704, as illustrated in FIG. 27, in which a polysilicon layer is formed above the first transistor. As illustrated in FIG. 25B, a polysilicon layer 2511 is formed above interconnect layer 2520 and transistors 2514 and 2516 on first silicon substrate 2510. Polysilicon layer 2511 can be formed by depositing polysilicon on interconnect layer 2520 using one or more thin film deposition processes including, but not limited to, CVD, PVD, ALD, or any combination thereof. In some implementations, polysilicon layer 2511 is doped with P-type or N-type dopant using an in-situ doping process during the deposition process or ion implantation/diffusion process after the deposition process.

Figure 25C:
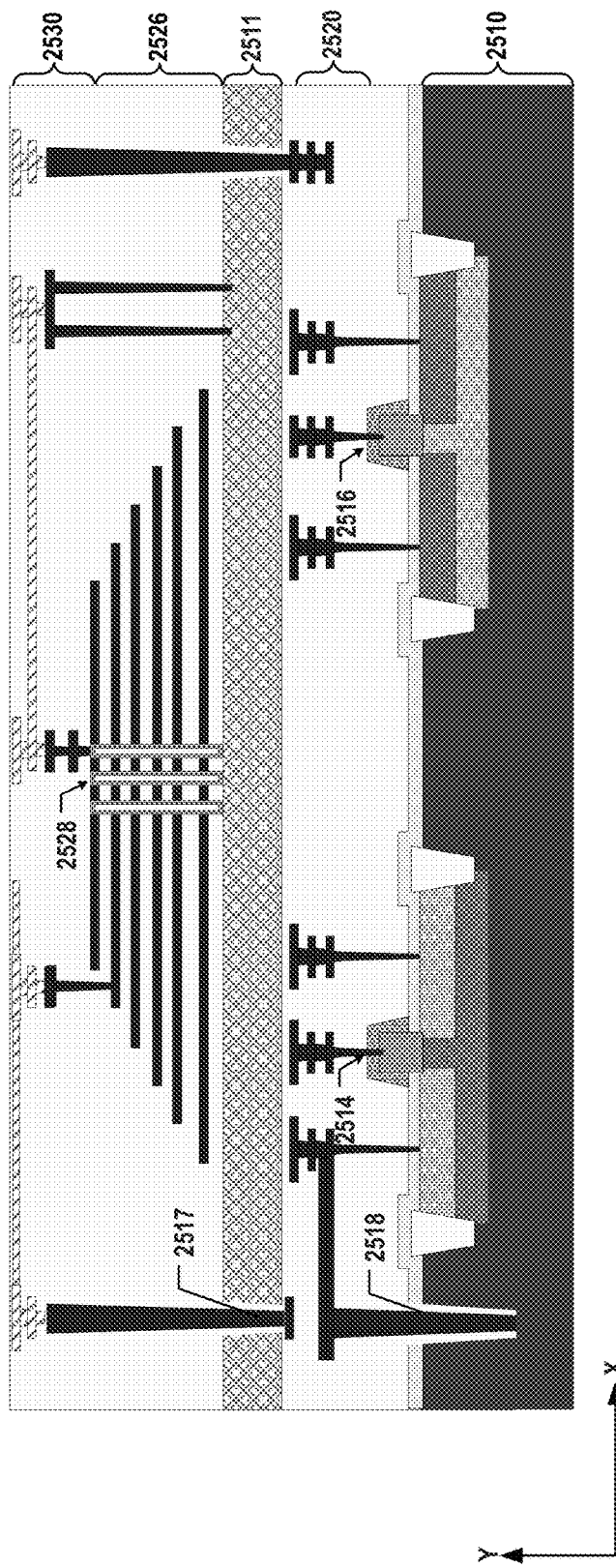

Method 2700 proceeds to operation 2706, as illustrated in FIG. 27, in which an array of NAND memory strings is formed on the polysilicon layer. In some implementations, to form the array of NAND memory strings, a memory stack is formed on the polysilicon layer. As illustrated in FIG. 25C, a stack structure, such as a memory stack 2526 including interleaved conductive layers and dielectric layers, is formed on polysilicon layer 2511. To form memory stack 2526, in some implementations, a dielectric stack (not shown) including interleaved sacrificial layers (not shown) and the dielectric layers is formed on polysilicon layer 2511. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 2526 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 2526 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 2526 and polysilicon layer 2511.

As illustrated in FIG. 25C, NAND memory strings 2528 are formed above polysilicon layer 2511, each of which extends vertically through memory stack 2526 to be in contact with polysilicon layer 2511. In some implementations, fabrication processes to form NAND memory string 2528 include forming a channel hole through memory stack 2526 (or the dielectric stack) and into polysilicon layer 2511 using dry etching/and or wet etching, such as DRIE, followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 2528 may vary depending on the types of channel structures of NAND memory strings 2528 (e.g., channel structure 812 in FIG. 8) and thus, are not elaborated for ease of description.

In some implementations, an interconnect layer is formed above the array of NAND memory strings. The interconnect layer can include a first plurality of interconnects in one or more ILD layers. As illustrated in FIG. 25C, an interconnect layer 2530 is formed above memory stack 2526 and NAND memory strings 2528. Interconnect layer 2530 can include interconnects of MEOL and/or BEOL in a plurality of ILD layers to make electrical connections with NAND memory strings 2528. In some implementations, interconnect layer 2530 includes multiple ILD layers and interconnects therein formed in multiple processes. For example, the interconnects in interconnect layer 2530 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 25C can be collectively referred to as interconnect layer 2530.

In some implementations, a contact through the polysilicon layer is formed. As illustrated in FIG. 25C, one or more contacts 2517 each extending vertically through polysilicon layer 2511 is formed. Contacts 2517 can couple the interconnects in interconnect layers 2530 and 2520. Contacts 2517 can be formed by first patterning contact holes through polysilicon layer 2511 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor.

Figure 25D:
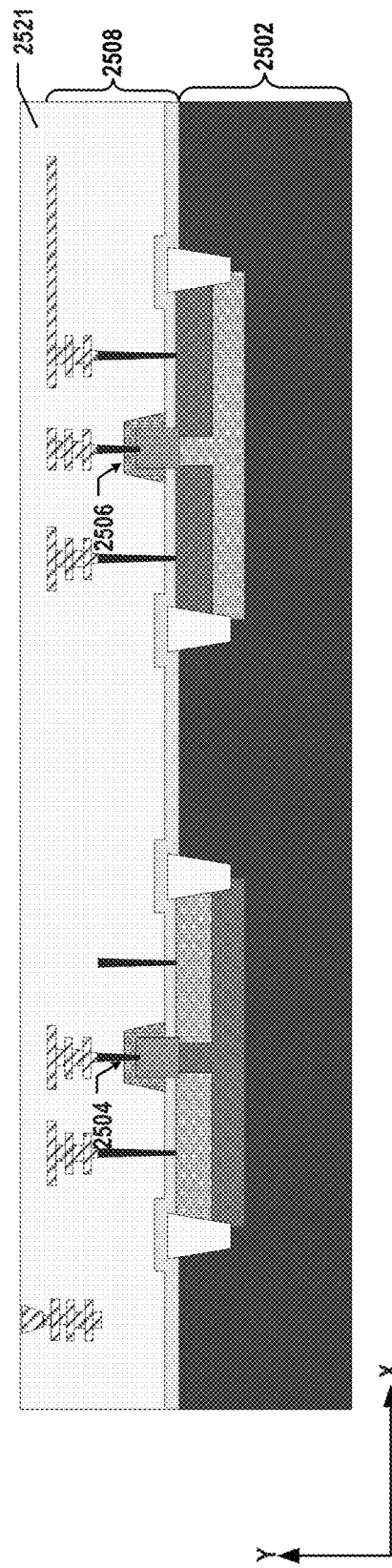
Figure 25E:
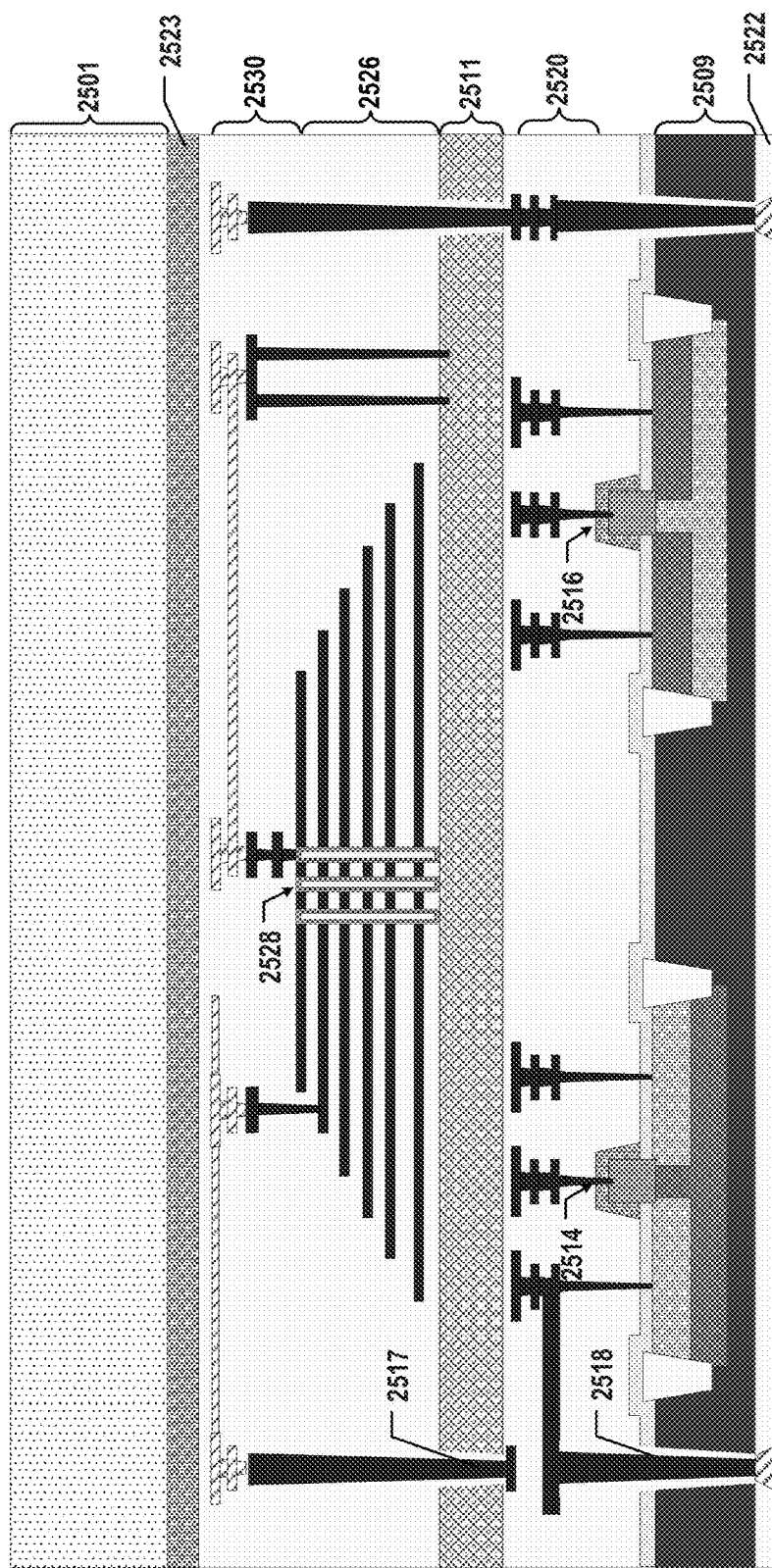

In some implementations, the first substrate is thinned. As illustrated in FIG. 25E, silicon substrate 2510 (shown in FIG. 25C) is thinned to become a semiconductor layer 2509 having single crystalline silicon. Silicon substrate 2510 can be thinned by processes including, but not limited to, wafer grinding, dry etch, wet etch, CMP, any other suitable processes, or any combination thereof. The thickness of semiconductor layer 2509 can be controlled to expose contact 2518 from the backside of thinned silicon substrate 2510, for example, by controlling the duration of the CMP process. It is understood that in some examples, contacts 2518 may be formed through semiconductor layer 2509 from the backside thereof after the thinning, as opposed to in silicon substrate 2510 before the thinning. In some implementations, before the thinning, a passivation layer 2523 is formed on interconnect layer 2530 by depositing a dielectric material, such as silicon nitride, on interconnect layer 2530 using one or more thin film deposition processes including, but not limited to, CVD, PVD, ALD, or any combination thereof. A handle substrate 2501 can then be attached to passivation layer 2523, for example, using adhesive bonding, prior to the thinning to allow the subsequent backside processes on silicon substrate 2510, such as thinning, contact formation, and bonding.

In some implementations, a first bonding layer is formed on the backside of the thinned first substrate. The first bonding layer can include a plurality of first bonding contacts. As illustrated in FIG. 25E, a bonding layer 2522 is formed on the backside of semiconductor layer 2509 (i.e., thinned silicon substrate 2510). Bonding layer 2522 can include a plurality of bonding contacts surrounded by dielectrics. In some implementations, a dielectric layer is deposited on the backside of semiconductor layer 2509 (opposite to the front side on which transistors 2514 and 2516 are formed) by one or more thin film deposition processes including, but not limited to, CVD, PVD, ALD, or any combination thereof. The bonding contacts can then be formed through the dielectric layer and in contact with contacts 2518 on the backside of thinned silicon substrate 2510 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 2700 proceeds to operation 2708, as illustrated in FIG. 27, in which a second transistor is formed on a second substrate. The second substrate can be a silicon substrate having single crystalline silicon. As illustrated in FIG. 25D, a plurality of transistors 2504 and 2506 are formed on a silicon substrate 2502 having single crystalline silicon. Transistors 2504 and 2506 can be formed by a plurality of processes including, but not limited to, photolithography, dry/wet etch, thin film deposition, thermal growth, implantation, CMP, and any other suitable processes. In some implementations, doped regions are formed in silicon substrate 2502 by ion implantation and/or thermal diffusion, which function, for example, as wells and source/drain regions of transistors 2504 and 2506. In some implementations, isolation regions (e.g., STIs) are also formed in silicon substrate 2502 by wet/dry etch and thin film deposition. In some implementations, the thickness of gate dielectric of transistor 2504 is different from the thickness of gate dielectric of transistor 2506, for example, by depositing a thicker silicon oxide film in the region of transistor 2504 than the region of transistor 2506, or by etching back part of the silicon oxide film deposited in the region of transistor 2506. It is understood that the details of fabricating transistors 2504 and 2506 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer is formed above the transistor on the second substrate. The interconnect layer can include a plurality of interconnects in one or more ILD layers. As illustrated in FIG. 25D, an interconnect layer 2508 can be formed above transistors 2504 and 2506. Interconnect layer 2508 can include interconnects of MEOL and/or BEOL in a plurality of ILD layers to make electrical connections with transistors 2504 and 2506. In some implementations, interconnect layer 2508 includes multiple ILD layers and interconnects therein formed in multiple processes. For example, the interconnects in interconnect layer 2508 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 25D can be collectively referred to as interconnect layer 2520. Different from interconnect layer 2520, in some implementations, the interconnects in interconnect layer 2508 include Cu, which has a relatively low resistivity among conductive metal materials. It is understood that although Cu has a relatively low thermal budget (incompatible with high-temperature processes), using Cu as the conductive materials of the interconnects in interconnect layer 2508 may become feasible since there are no more high-temperature processes after the fabrication of interconnect layer 2508.

In some implementations, a second bonding layer is formed above interconnect layer. The second bonding layer can include a plurality of second bonding contacts. As illustrated in FIG. 25D, a bonding layer 2521 is formed above interconnect layer 2508. Bonding layer 2521 can include a plurality of bonding contacts surrounded by dielectrics. In some implementations, a dielectric layer is deposited on the top surface of interconnect layer 2508 by one or more thin film deposition processes including, but not limited to, CVD, PVD, ALD, or any combination thereof. The bonding contacts can then be formed through the dielectric layer and in contact with the interconnects in interconnect layer 2508 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 2700 proceeds to operation 2710, as illustrated in FIG. 27, in which the first substrate and the second substrate are bonded in a back-to-face manner. The first bonding contact in the first bonding layer can be in contact with the second bonding contact in the second bonding layer at a bonding interface after bonding the first and second substrates. The bonding can include hybrid bonding.

Figure 25F:
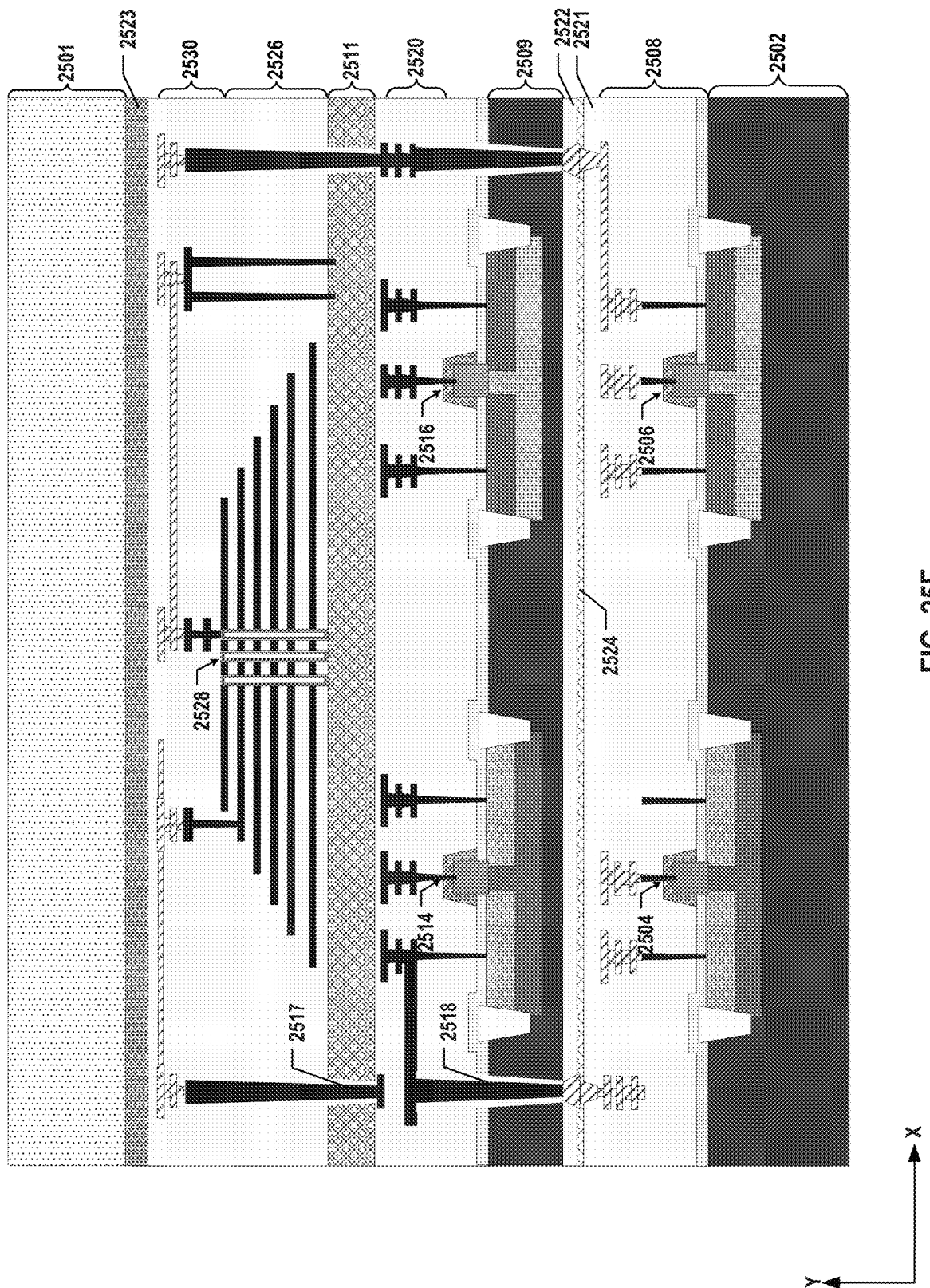
Figure 25G:
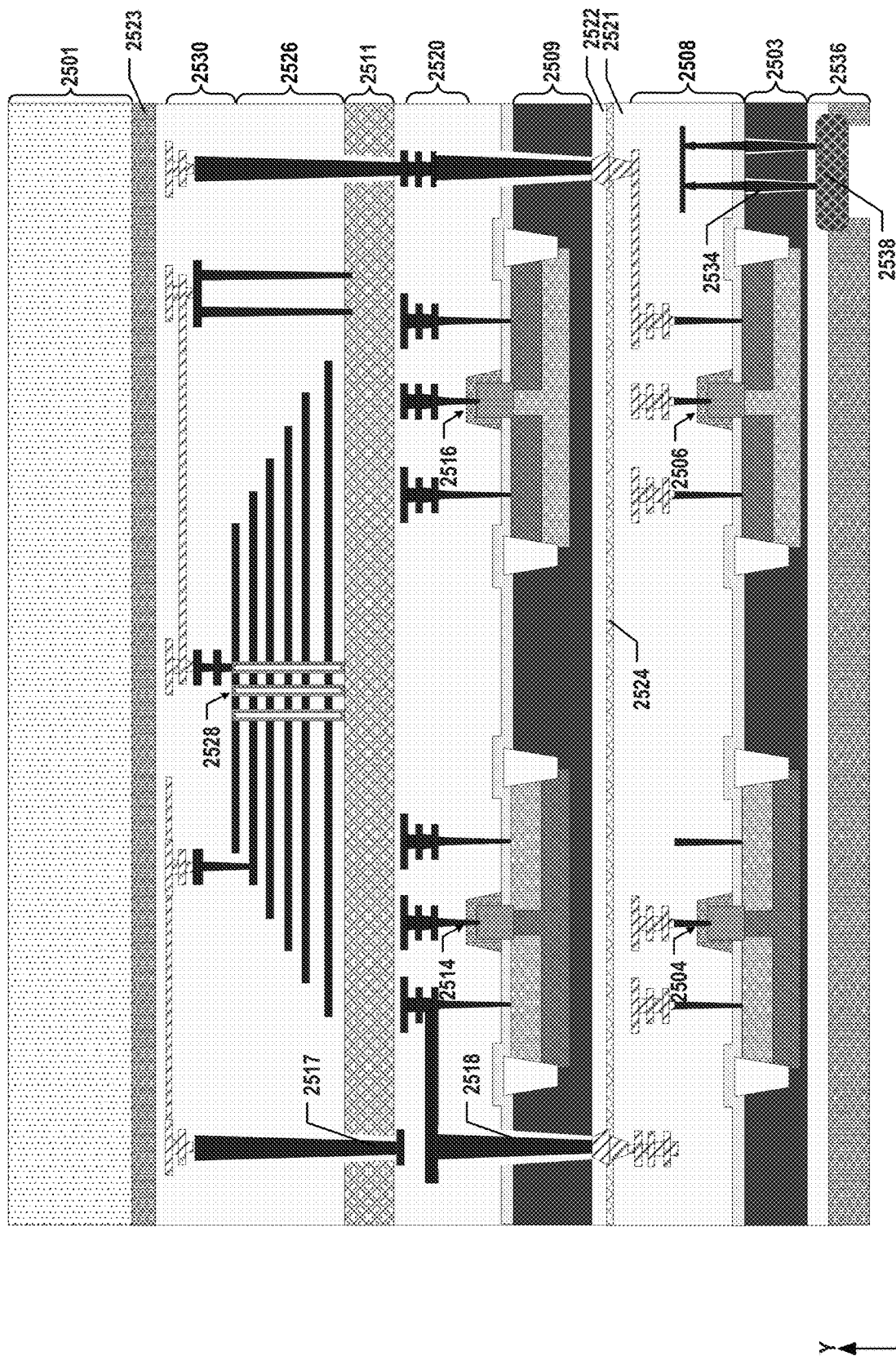

As illustrated in FIG. 25F, thinned silicon substrate 2510 (i.e., semiconductor layer 2509) and components formed thereon (e.g., transistors 2514 and 2516 and NAND memory strings 2528) and silicon substrate 2502 and components formed thereon (e.g., transistors 2504 and 2506) are bonded in a manner that bonding layer 2521 facing up on the front side of silicon substrate 2502 is bonded with bonding layer 2522 facing down on the backside of thinned silicon substrate 2510 (i.e., a face-to-face manner), thereby forming a bonding interface 2524. That is, thinned silicon substrate 2510 and components formed thereon can be bonded with silicon substrate 2502 and components formed thereon in a back-to-face manner, such that the bonding contacts in bonding layer 2521 are in contact with the bonding contacts in bonding layer 2522 at bonding interface 2524. In some implementations, a treatment process, e.g., plasma treatment, wet treatment and/or thermal treatment, is applied to bonding surfaces prior to bonding. As a result of the bonding, e.g., hybrid bonding, the bonding contacts on opposite sides of bonding interface 2524 can be inter-mixed. After the bonding, the bonding contacts in bonding layer 2521 and the bonding contacts in bonding layer 2522 are aligned and in contact with one another, such that memory stack 2526 and NAND memory strings 2528 formed therethrough as well as transistors 2514 and 2516 can be coupled to transistors 2504 and 2506 through the bonded bonding contacts across bonding interface 2524, according to some implementations.

Method 2700 proceeds to optional operation 2712, as illustrated in FIG. 27, in which the second substrate is thinned. As illustrated in FIG. 25F, silicon substrate 2502 (shown in FIG. 25E) is thinned to become a semiconductor layer 2503 having single crystalline silicon. Silicon substrate 2502 can be thinned by processes including, but not limited to, wafer grinding, dry etch, wet etch, CMP, any other suitable processes, or any combination thereof.

Method 2700 proceeds to operation 2714, as illustrated in FIG. 27, in which a pad-out interconnect layer is formed. The pad-out interconnect layer can be formed on the thinned second substrate. As illustrated in FIG. 25F, a pad-out interconnect layer 2536 is formed on semiconductor layer 2503 (the thinned silicon substrate 2502). Pad-out interconnect layer 2536 can include interconnects, such as contact pads 2538, formed in one or more ILD layers. Contact pads 2538 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations, after the bonding and thinning, contacts 2534 are formed, extending vertically through semiconductor layer 2503, for example, by wet/dry etching followed by depositing dielectric materials as spacers and conductive materials as conductors. Contacts 2534 can couple contact pads 2538 in pad-out interconnect layer 2536 to the interconnects in interconnect layer 2508. It is understood that in some examples, contacts 2534 may be formed in silicon substrate 2502 before thinning (the formation of semiconductor layer 2503, e.g., shown in FIG. 25F) and be exposed from the backside of silicon substrate 2502 (where the thinning occurs) after the thinning.

In some implementations, after operation 2710, optional operation 2712 is skipped, and method 2700 proceeds to operation 2714, as illustrated in FIG. 27, in which a pad-out interconnect layer is formed. The pad-out interconnect layer can be formed above the array of NAND memory strings. Although not shown in FIG. 25F, it is understood that in some examples, a pad-out interconnect layer having contact pads may be formed above interconnect layer 2530 and NAND memory strings 2528 after removing handle substrate 2501 and passivation layer 2523.

Figure 28A:
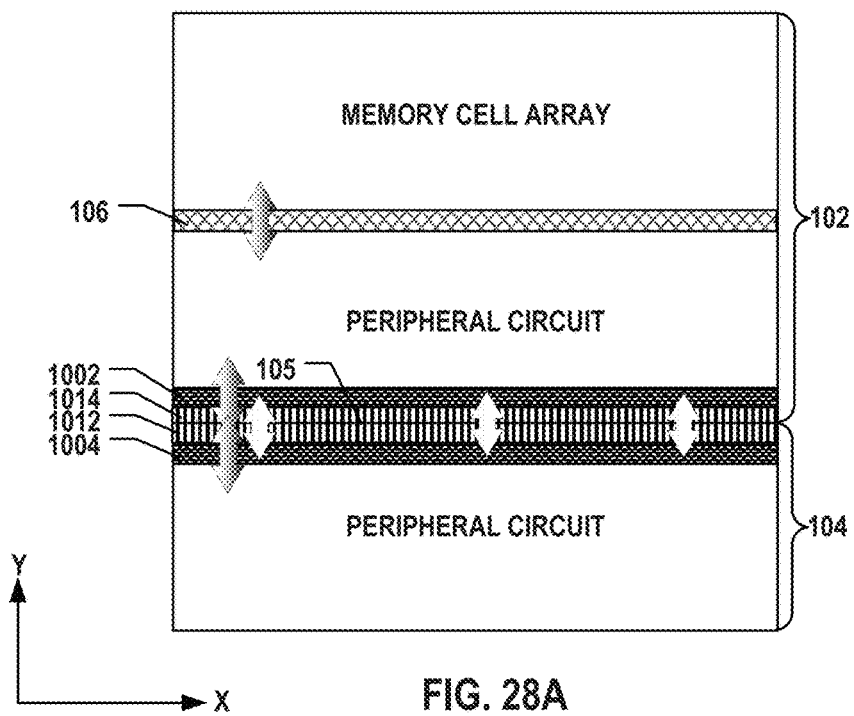
FIGS. 28A and 28B illustrate schematic views of cross-sections of the 3D memory devices in FIGS. 21A and 21B, according to some aspects of the present disclosure.
Figure 28B:
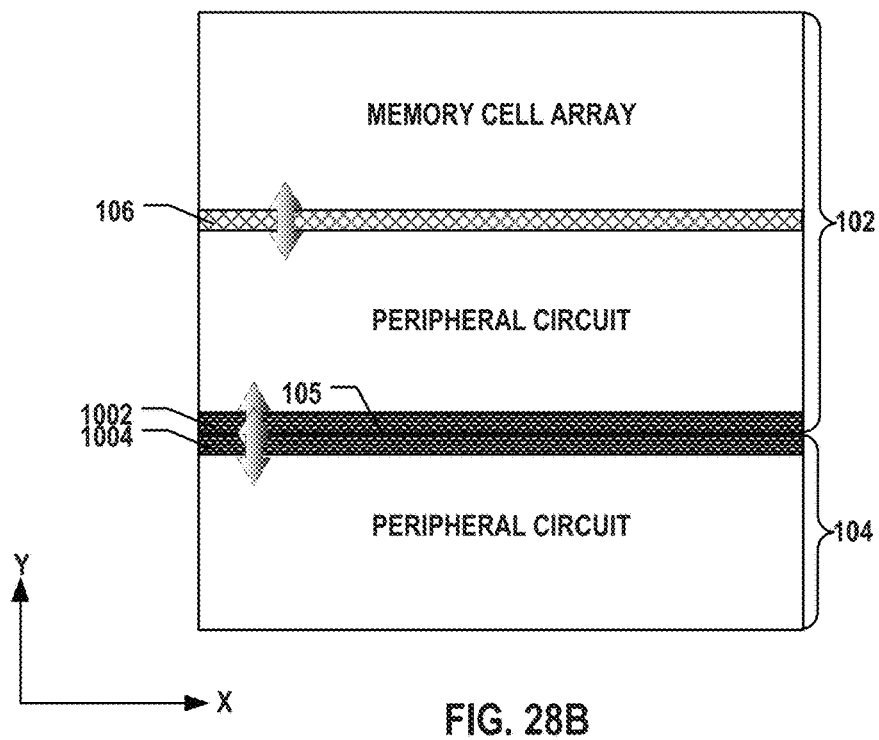

FIGS. 28A and 28B illustrate schematic views of cross-sections of the 3D memory devices in FIGS. 21A and 21B, according to various aspects of the present disclosure. 3D memory devices 2800 and 2801 may be examples of 3D memory devices 2100 and 2101 in FIGS. 21A and 21B. As shown in FIG. 28A, 3D memory device 2800 can include stacked first and second semiconductor structures 102 and 104. In some implementations, first semiconductor structure 102 includes semiconductor layer 1002, a bonding layer 1014, a memory cell array, some of the peripheral circuits vertically between semiconductor layer 1002 and polysilicon layer 106, and polysilicon layer 106 vertically between the memory cell array and the peripheral circuits.

The memory cell array can include an array of NAND memory strings (e.g., NAND memory strings 208 disclosed herein), and the sources of the array of NAND memory strings can be in contact with polysilicon layer 106 (e.g., as shown in FIG. 8). Polysilicon layer 106 can be a deposited polysilicon layer (e.g., either N-type doped, P-type doped, or undoped), which is suitable for "floating gate" type of NAND memory strings or certain designs of channel structures (e.g., channel structure 812 in FIG. 8) in "charge trap" type of NAND memory strings, for example, that are suitable for GIDL erase operations. Through contacts (e.g., ILVs/TSVs) through polysilicon layer 106 can make direct, short-distance (e.g., submicron- or micron-level) electrical connections between the memory cell array and the peripheral circuits in first semiconductor structure 102. Bonding layer 1014 can include conductive bonding contacts (not shown) and dielectrics electrically isolating the bonding contacts, which can be used, for example, for hybrid bonding as described below in detail.

In some implementations, the peripheral circuits in first semiconductor structure 102 are in contact with semiconductor layer 1002, but not polysilicon layer 106. That is, the transistors (e.g., planar transistors 500 and 3D transistors 600) of the peripheral circuits can be in contact with semiconductor layer 1002. Semiconductor layer 1002 can include semiconductor materials, such as single crystalline silicon (e.g., a silicon substrate or a thinned silicon substrate). It is understood that in some examples, different from polysilicon layer 106 in first semiconductor structure 102, semiconductor layer 1002 on which the transistors are formed may include single crystalline silicon, but not polysilicon, due to the superior carrier mobility of single crystalline silicon that is desirable for transistors' performance. The peripheral circuits and bonding layer 1014 can be formed on opposite sides of semiconductor layer 1002, such that semiconductor layer 1002 is disposed vertically between the peripheral circuits and bonding layer 1014. In some implementations, the transistors of the peripheral circuits are formed on the front side of semiconductor layer 1002, and the bonding contacts of bonding layer 1014 are formed on the backside of semiconductor layer 1002.

In some implementations, second semiconductor structure 104 includes bonding layer 1012, some of the peripheral circuits of the memory cell array, and semiconductor layer 1004 vertically between the peripheral circuits and bonding layer 1012. The transistors (e.g., planar transistors 500 and 3D transistors 600) of the peripheral circuits can be in contact with the front side of semiconductor layer 1004. Similar to semiconductor layer 1002, semiconductor layer 1004 can include semiconductor materials, such as single crystalline silicon (e.g., a silicon substrate or a thinned silicon substrate). It is understood that in some examples, different from polysilicon layer 106 in first semiconductor structure 102, semiconductor layer 1004 on which the transistors are formed may include single crystalline silicon, but not polysilicon, due to the superior carrier mobility of single crystalline silicon that is desirable for transistors' performance. The peripheral circuits and bonding layer 1012 can be formed on opposite sides of semiconductor layer 1004, such that semiconductor layer 1004 is disposed vertically between the peripheral circuits and bonding layer 1012. In some implementations, the transistors of the peripheral circuits are formed on the front side of semiconductor layer 1004, and the bonding contacts of bonding layer 1012 are formed on the backside of semiconductor layer 1004.

Similar to bonding layer 1014 in first semiconductor structure 102, bonding layer 1012 can also include conductive bonding contacts (not shown) and dielectrics electrically isolating the bonding contacts. Bonding interface 105 is vertically between and in contact with bonding layers 1012 and 1014, respectively, according to some implementations. That is, bonding layers 1012 and 1014 can be disposed on opposite sides of bonding interface 105, and the bonding contacts of bonding layer 1012 can be in contact with the bonding contacts of bonding layer 1014 at bonding interface 105. As a result, a large number (e.g., millions) of bonding contacts across bonding interface 105, in conjunction with through contacts (e.g., ILVs/TSVs) through semiconductor layers 1002 and 1004, can make direct, short-distance (e.g., micron-level) electrical connections between adjacent semiconductor structures 102 and 104.

It is understood that in some examples, first and second semiconductor structures 102 and 104 may not include bonding layers 1014 and 1012, respectively, disposed on opposite sides of bonding interface 105 as shown in FIG. 28A. In FIG. 28B, semiconductor layer 1004 in second semiconductor structure 104 of 3D memory device 2801 can be a layer of single crystalline silicon transferred from a silicon substrate or an SOI substrate and attached to the bottom surface of first semiconductor structure 102 by transfer bonding, and bonding interface 105 between first and second semiconductor structures 102 and 104 can result from transfer bonding, as opposed to hybrid bonding. Through contacts (e.g., ILVs/TSVs) through semiconductor layers 1002 and 1004 vertically between first and second semiconductor structures 102 and 104 can make direct, short-distance (e.g., submicron-level) electrical connections between adjacent semiconductor structures 102 and 104.

As shown in FIGS. 28A and 28B, since first and second semiconductor structures 102 and 104 are bonded in a back-to-back manner (e.g., semiconductor layers 1002 being disposed on the bottom side of first semiconductor structure 102, while semiconductor layers 1004 being disposed on the top side of second semiconductor structure 104 in FIGS. 28A and 28B), the transistors of peripheral circuits in first and second semiconductor structures 102 and 104 are disposed facing away from each other, according to some implementations. Moreover, within first semiconductor structure 102, since polysilicon layer 106 is vertically between the memory cell array and the peripheral circuits, and the memory cell array and the peripheral circuits formed on polysilicon layer 106 and semiconductor layer 1002, respectively, the memory cell array and the peripheral circuits face toward the same direction (e.g., in the positive y-direction in FIGS. 28A and 28B). It is understood that pad-out interconnect layer 902 in FIGS. 21A and 21B is omitted from 3D memory devices 2800 and 2801 in FIGS. 28A and 28B for ease of illustration and may be included in 3D memory devices 2800 and 2801 as described above with respect to FIGS. 21A and 21B.

As described above, first and second semiconductor structures 102 and 104 can have peripheral circuits having transistors with different applied voltages. For example, second semiconductor structure 104 may be one example of semiconductor structure 408 including LLV circuits 402 (and LV circuits 404 in some examples) in FIG. 4B, and first semiconductor structure 102 may be one example of semiconductor structure 410 including HV circuits 406 (and LV circuits 404 in some examples) in FIG. 4B, or vice versa. Thus, in some implementations, semiconductor layers 1002 and 1004 in first and second semiconductor structures 102 and 104 have different thicknesses to accommodate the transistors with different applied voltages. In one example, first semiconductor structure 102 may include HV circuits 406 and second semiconductor structure 104 may include LLV circuits 402, and the thickness of semiconductor layer 1002 in first semiconductor structure 102 may be larger than the thickness of semiconductor layer 1004 in second semiconductor structure 104. Moreover, in some implementations, the gate dielectrics of the transistors in first and second semiconductor structures 102 and 104 have different thicknesses as well to accommodate the different applied voltages. In one example, first semiconductor structure 102 may include HV circuits 406 and second semiconductor structure 104 may include LLV circuits 402, and the thickness of the gate dielectrics of the transistors in first semiconductor structure 102 may be larger (e.g., at least 5-fold) than the thickness of the gate dielectrics of the transistors in second semiconductor structure 104.

Figure 29A:
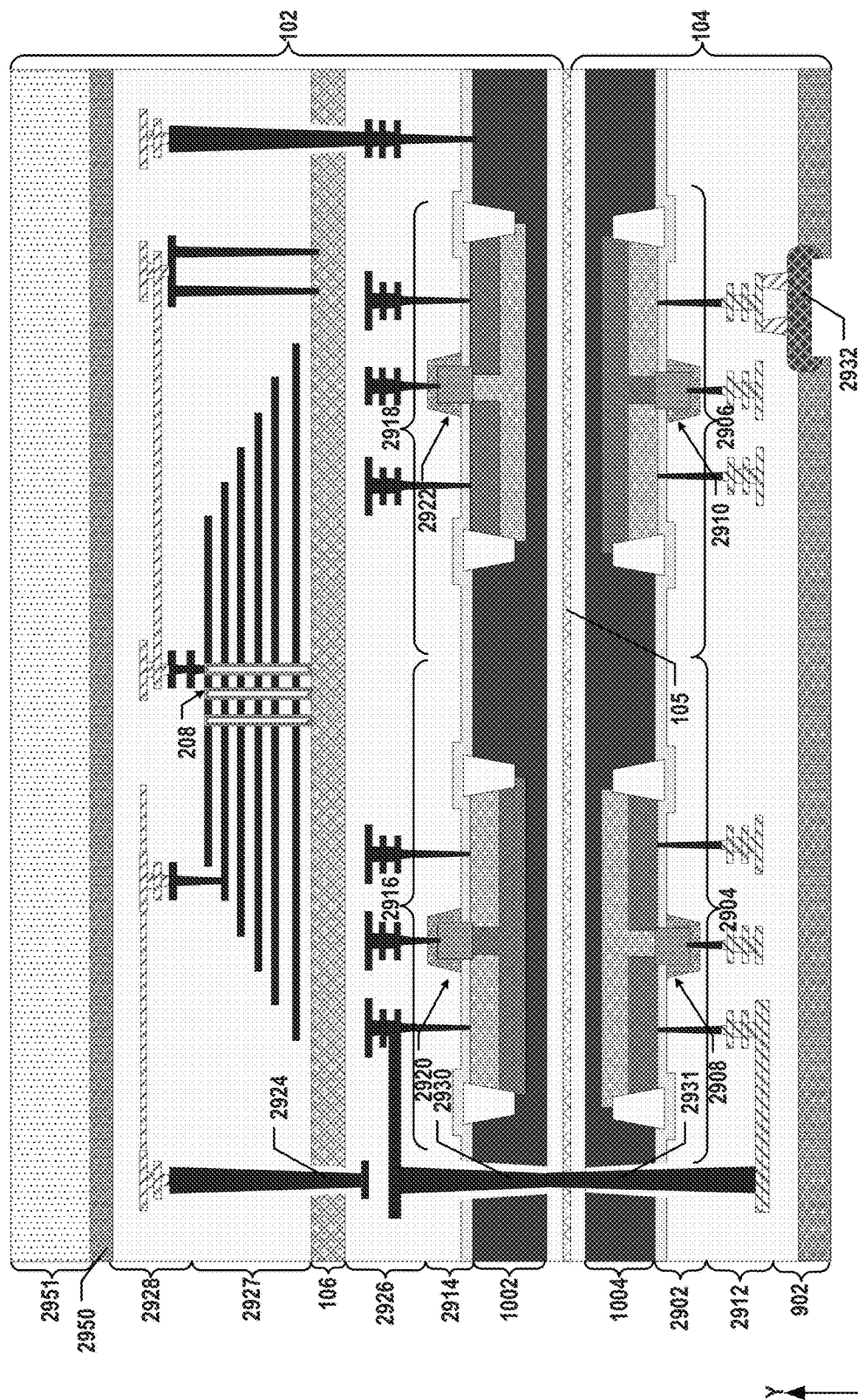
FIGS. 29A and 29B illustrate side views of various examples of the 3D memory devices in FIGS. 28A and 28B, according to various aspects of the present disclosure.
Figure 29B:
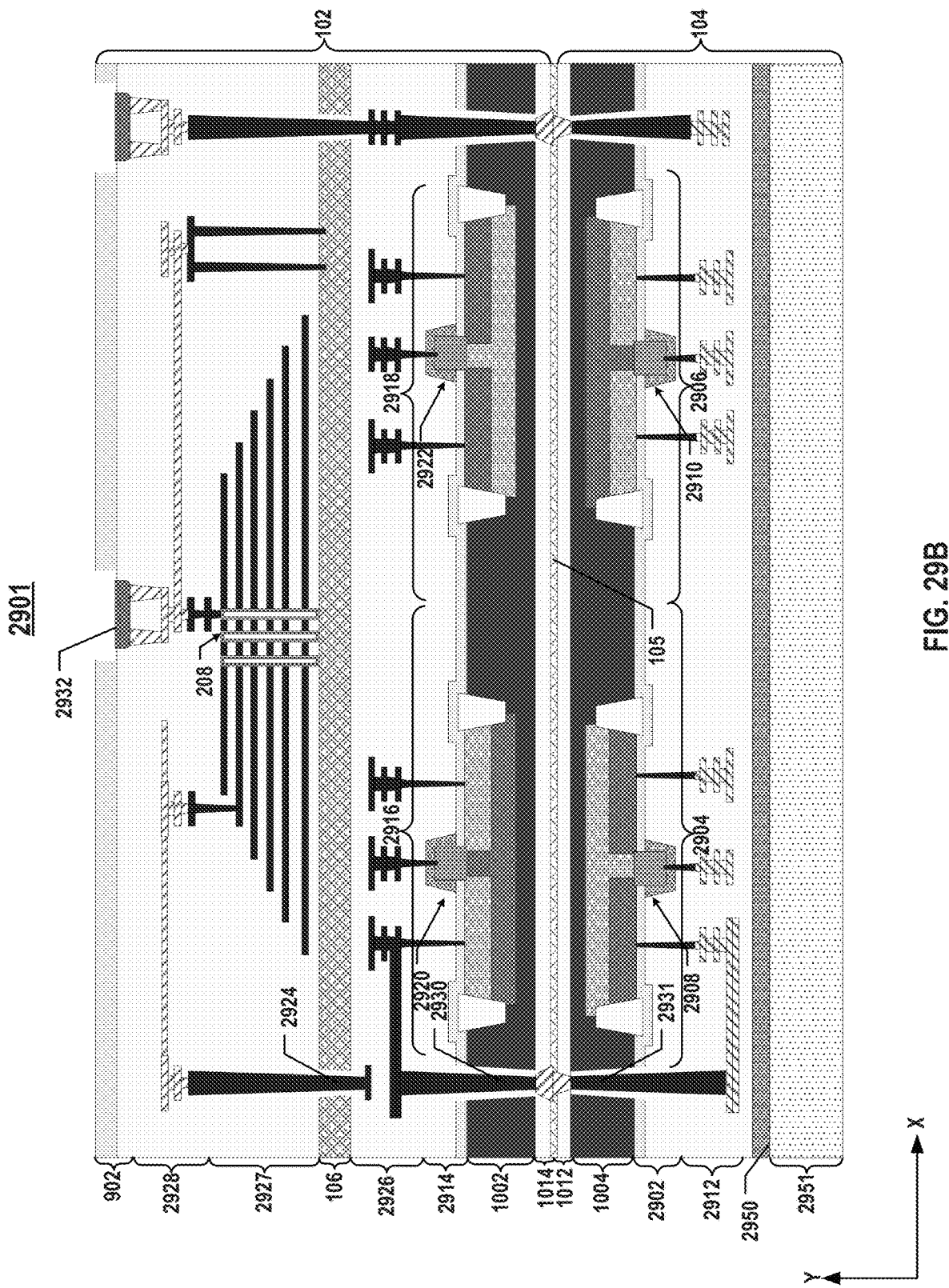

FIGS. 29A and 29B illustrate side views of various examples of 3D memory devices 2800 and 2801 in FIGS. 28A and 28B, according to various aspects of the present disclosure. As shown in FIG. 29A, as one example of 3D memory devices 2800 and 2801 in FIGS. 28A and 28B, 3D memory device 2900 is a bonded chip including first semiconductor structure 102 and second semiconductor structure 104, which are stacked over one another in different planes in the vertical direction (e.g., the y-direction in FIG. 29A), according to some implementations. First and second semiconductor structures 102 and 104 are bonded at bonding interface 105 therebetween, according to some implementations.

As shown in FIG. 29A, second semiconductor structure 104 can include semiconductor layer 1004 having semiconductor materials. In some implementations, semiconductor layer 1004 is a silicon substrate having single crystalline silicon. Second semiconductor structure 104 can also include a device layer 2902 above and in contact with semiconductor layer 1004. In some implementations, device layer 2902 includes a first peripheral circuit 2904 and a second peripheral circuit 2906. First peripheral circuit 2904 can include LLV circuits 402, such as I/O circuits (e.g., in interface 316 and data bus 318), and second peripheral circuit 2906 can include LV circuits 404, such as page buffer circuits (e.g., page buffer circuits 702 in page buffer 304) and logic circuits (e.g., in control logic 312). In some implementations, first peripheral circuit 2904 includes a plurality of transistors 2908 in contact with semiconductor layer 1004, and second peripheral circuit 2906 includes a plurality of transistors 2910 in contact with semiconductor layer 1004. Transistors 2908 and 2910 can include any transistors disclosed herein, such as planar transistors 500 and 3D transistors 600. As described above in detail with respect to transistors 500 and 600, in some implementations, each transistor 2908 or 2910 includes a gate dielectric, and the thickness of the gate dielectric of transistor 2908 (e.g., in LLV circuit 402) is smaller than the thickness of the gate dielectric of transistor 2910 (e.g., in LV circuit 404) due to the lower voltage applied to transistor 2908 than transistor 2910. Trench isolations (e.g., STIs) and doped regions (e.g., wells, sources, and drains of transistors 2908 and 2910) can be formed on or in semiconductor layer 1004 as well.

In some implementations, second semiconductor structure 104 further includes an interconnect layer 2912 above device layer 2902 to transfer electrical signals to and from peripheral circuits 2906 and 2904. As shown in FIG. 29A, device layer 2902 (including transistors 2908 and 2910 of peripheral circuits 2904 and 2906) can be vertically between bonding interface 105 and interconnect layer 2912. Interconnect layer 2912 can include a plurality of interconnects, such as MEOL interconnects and BEOL interconnects. The interconnects in interconnect layer 2912 can be coupled to transistors 2908 and 2910 of peripheral circuits 2904 and 2906 in device layer 2902. Interconnect layer 2912 can further include one or more ILD layers in which the lateral lines and vias can form. That is, interconnect layer 2912 can include lateral lines and vias in multiple ILD layers. In some implementations, the devices in device layer 2902 are coupled to one another through the interconnects in interconnect layer 2912. For example, peripheral circuit 2904 may be coupled to peripheral circuit 2906 through interconnect layer 2912. The interconnects in interconnect layer 2912 can include conductive materials including, but not limited to, W, Co, Cu, Al, silicides, or any combination thereof. The ILD layers in interconnect layer 2912 can include dielectric materials including, but not limited to, silicon oxide, silicon nitride, silicon oxynitride, low-k dielectrics, or any combination thereof.

In some implementations, the interconnects in interconnect layer 2912 include Cu, which has a relatively low resistivity (better electrical performance) among conductive metal materials. As described below with respect to the fabrication process, although Cu has a relatively low thermal budget (incompatible with high-temperature processes), since the fabrication of interconnect layer 2912 can occur after the high-temperature processes in forming device layer 2902 and NAND memory strings 208 in first semiconductor structure 102, the interconnects of interconnect layer 1126 having Cu can become feasible.

As shown in FIG. 29A, second semiconductor structure 104 can further include one or more contacts 2931 extending vertically through semiconductor layer 1004. In some implementations, contact 2931 extends further through the dielectric layer (if any) on the backside of semiconductor layer 1004 to bonding interface 105. Contact 2931 can be coupled to the interconnects in interconnect layer 2912. Contact 2931 can include conductive materials including, but not limited to, W, Co, Cu, Al, silicides, or any combination thereof. In some implementations, contact 2931 includes W or Cu. In some implementations, contact 2931 includes a via surrounded by a dielectric spacer (e.g., having silicon oxide) to electrically separate the via from semiconductor layer 1004. Depending on the thickness of semiconductor layer 1004, contact 2931 can be an ILV having a depth in the submicron-level (e.g., between 10 nm and 1 μm), or a TSV having a depth in the micron- or tens micron-level (e.g., between 1 μm and 100 μm).

As shown in FIG. 29A, first semiconductor structure 102 can be bonded on top of second semiconductor structure 104 in a back-to-back manner at bonding interface 105. First semiconductor structure 102 can further include semiconductor layer 1002 having semiconductor materials. In some implementations, bonding interface 105 is the place at which semiconductor layer 1002 of first semiconductor structure 102 and semiconductor layer 1004 of second semiconductor structure 104 are met and bonded. In practice, bonding interface 105 can be a layer with a certain thickness that includes the top surface of semiconductor layer 1004 of second semiconductor structure 104 and the bottom surface of semiconductor layer 1002 of first semiconductor structure 102. Bonding interface 105 can result from a transfer bonding process, and semiconductor layer 1004 can be a layer of single crystalline silicon transferred from a silicon substrate or an SOI substrate and attached to the bottom surface of first semiconductor structure 102 by transfer bonding, as described below in detail with respect to the fabrication process. In some implementations, dielectric layer(s) (e.g., silicon oxide layer) are formed vertically between bonding interface 105 and semiconductor layer 1002 and/or between bonding interface 105 and semiconductor layer 1004 to facilitate the transfer bonding of semiconductor layer 1004 onto semiconductor layer 1002. Thus, it is understood that bonding interface 105 may include the surfaces of the dielectric layer(s) in some examples.

As shown in FIG. 29A, first semiconductor structure 102 can also include a device layer 2914 below and in contact with semiconductor layer 1002. In some implementations, device layer 2914 includes a third peripheral circuit 2916 and a fourth peripheral circuit 2918 below and in contact with semiconductor layer 1002. In some implementations, semiconductor layer 1002 is disposed vertically between bonding interface 105 and device layer 2914 having peripheral circuits 2916 and 2918. Third peripheral circuit 2916 can include HV circuits 406, such as driving circuits (e.g., string drivers 704 in row decoder/word line driver 308 and drivers in column decoder/bit line driver 306), and fourth peripheral circuit 2918 can include LV circuits 404, such as page buffer circuits (e.g., page buffer circuits 702 in page buffer 304) and logic circuits (e.g., in control logic 312). In some implementations, third peripheral circuit 2916 includes a plurality of transistors 2920, and fourth peripheral circuit 2918 includes a plurality of transistors 2922 as well. Transistors 2920 and 2922 can include any transistors disclosed herein, such as planar transistors 500 and 3D transistors 600. As described above in detail with respect to transistors 500 and 600, in some implementations, each transistor 2920 or 2922 includes a gate dielectric, and the thickness of the gate dielectric of transistor 2920 (e.g., in HV circuit 406) is larger than the thickness of the gate dielectric of transistor 2922 (e.g., in LV circuit 404) due to the higher voltage applied to transistor 2920 than transistor 2922.

Moreover, the different voltages applied to different transistors 2920, 2922, 2908, and 2910 in first and second semiconductor structures 102 and 104 can lead to differences of device dimensions between first and second semiconductor structures 102 and 104. In some implementations, the thickness of the gate dielectric of transistor 2908 (e.g., in LLV circuit 402) is smaller than the thickness of the gate dielectric of transistor 2920 (e.g., in HV circuit 406) due to the lower voltage applied to transistor 2908 than transistor 2920. In some implementations, the thickness of the gate dielectric of transistor 2922 (e.g., in LV circuit 404) is the same as the thickness of the gate dielectric of transistor 2910 (e.g., in LV circuit 404) due to the same voltage applied to transistor 2922 and transistor 2910. In some implementations, the thickness of semiconductor layer 1002 in which transistor 2920 (e.g., in HV circuit 406) is formed is larger than the thickness of semiconductor layer 1004 in which transistor 2908 (e.g., in LLV circuit 402) is formed due to the higher voltage applied to transistor 2920 than transistor 2908.

As shown in FIG. 29A, first semiconductor structure 102 can further include an interconnect layer 2926 below and in contact with device layer 2914 to transfer electrical signals to and from transistors 2920 and 2922 of peripheral circuits 2916 and 2918. Interconnect layer 2926 can include a plurality of interconnects, such as MEOL interconnects and BEOL interconnects. Interconnect layer 2926 can further include one or more ILD layers in which the lateral lines and vias can form. The interconnects in interconnect layer 2926 can include conductive materials including, but not limited to, W, Co, Cu, Al, silicides, or any combination thereof. The ILD layers in interconnect layer 2926 can include dielectric materials including, but not limited to, silicon oxide, silicon nitride, silicon oxynitride, low-k dielectrics, or any combination thereof. In some implementations, the interconnects in interconnect layer 2926 include W, which has a relatively high thermal budget (compatible with high-temperature processes) and good quality (fewer detects, e.g., voids) among conductive metal materials.

As shown in FIG. 29A, first semiconductor structure 102 can also include one or more contacts 2930 extending vertically through semiconductor layer 1002. In some implementations, contact 2930 extends further through the dielectric layer (if any) on the backside of semiconductor layer 1002 to be in contact with contact 2931 at bonding interface 105. Contact 2930 can be coupled to the interconnects in interconnect layer 2926. Contacts 2930 and 2931 can thus couple the interconnects in interconnect layer 2926 to the interconnects in interconnect layer 2912 to make an electrical connection through semiconductor layers 1002 and 1004 and across bonding interface 105 between first and second semiconductor structures 102 and 104. Contact 2930 can include conductive materials including, but not limited to, W, Co, Cu, Al, silicides, or any combination thereof. In some implementations, contact 2930 includes W. In some implementations, contact 2930 includes a via surrounded by a dielectric spacer (e.g., having silicon oxide) to electrically separate the via from semiconductor layer 1002. Depending on the thickness of semiconductor layer 1002, contact 2930 can be an ILV having a depth in the submicron-level (e.g., between 10 nm and 1 μm), or a TSV having a depth in the micron- or tens micron-level (e.g., between 1 μm and 100 μm).

As shown in FIG. 23A, first semiconductor structure can further include polysilicon layer 106 below and in contact with interconnect layer 2926. Polysilicon layer 106 is a doped polysilicon layer on interconnect layer 2926, as described below in detail with respect to the fabrication process, according to some implementations. It is understood that in some examples, trench isolations and doped regions (not shown) may be formed in polysilicon layer 106 as well.

As shown in FIG. 29A, first semiconductor structure 102 can also include a memory cell array, such as an array of NAND memory strings 208 below and in contact with polysilicon layer 106. The sources of the NAND memory strings 208 can be in contact with polysilicon layer 106. In some implementations, polysilicon layer 106 is vertically between NAND memory strings 208 and device layer 2914 including transistors 2920 and 2922. In some implementations, each NAND memory string 208 is a "charge trap" type of NAND memory string including any suitable channel structures disclosed herein, such as channel structure 812, described above in detail with respect to FIG. 8. In some implementations, NAND memory string 208 is a "floating gate" type of NAND memory string, and polysilicon layer 106 is the source plate of the floating gate type of NAND memory strings.

Each NAND memory string 208 extends vertically through a plurality of pairs each including a conductive layer and a dielectric layer, according to some implementations. The stacked and interleaved conductive layers and dielectric layers are also referred to herein as a stack structure, e.g., a memory stack 2927. Memory stack 2927 be an example of memory stack 804 in FIG. 8, and the conductive layer and dielectric layer in memory stack 2927 may be examples of gate conductive layers 806 and dielectric layer 808, respectively, in memory stack 804. The interleaved conductive layers and dielectric layers in memory stack 2927 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 2927.

As shown in FIG. 29A, first semiconductor structure 102 can further include an interconnect layer 2928 below and in contact with NAND memory strings 208 to transfer electrical signals to and from NAND memory strings 208. In some implementations, memory stack 2927 and NAND memory strings 208 are vertically between interconnect layer 2928 and polysilicon layer 106. Interconnect layer 2928 can include a plurality of interconnects, such as MEOL interconnects and BEOL interconnects. In some implementations, the interconnects in interconnect layer 2928 also include local interconnects, such as bit line contacts and word line contacts. Interconnect layer 2928 can further include one or more ILD layers in which the lateral lines and vias can form. The interconnects in interconnect layer 2928 can include conductive materials including, but not limited to, W, Co, Cu, Al, silicides, or any combination thereof. The ILD layers in interconnect layer 2928 can include dielectric materials including, but not limited to, silicon oxide, silicon nitride, silicon oxynitride, low-k dielectrics, or any combination thereof.

As shown in FIG. 29A, first semiconductor structure 102 can further include one or more contacts 2924 extending vertically through polysilicon layer 106. In some implementations, contact 2924 couples the interconnects in interconnect layer 2928 to the interconnects in interconnect layer 2926 to make an electrical connection through polysilicon layer 106 between NAND memory strings 208 and transistors 2920 and 2922. Contact 2924 can include conductive materials including, but not limited to, W, Co, Cu, Al, silicides, or any combination thereof. In some implementations, contact 2924 includes W or Cu. In some implementations, contact 2924 includes a via surrounded by a dielectric spacer (e.g., having silicon oxide) to electrically separate the via from polysilicon layer 106. Depending on the thickness of polysilicon layer 106, contact 2924 can be an ILV having a depth in the submicron-level (e.g., between 10 nm and 1 μm), or a TSV having a depth in the micron- or tens micron-level (e.g., between 1 μm and 100 μm).

As shown in FIG. 29A, second semiconductor structure 104 can further include a pad-out interconnect layer 902 above interconnect layer 2912 and transistors 2908 and 2910. In some implementations, transistors 2908 and 2910 are disposed vertically between pad-out interconnect layer 902 and semiconductor layer 1004. Pad-out interconnect layer 902 can include interconnects, e.g., contact pads 2932, in one or more ILD layers. In some implementations, the interconnects in pad-out interconnect layer 902 can transfer electrical signals between 3D memory device 2900 and external devices, e.g., for pad-out purposes.

As a result, peripheral circuits 2904, 2906, 2916, and 2918 in second and first semiconductor structures 104 and 102 can be coupled to NAND memory strings 208 in first semiconductor structure 102 through various interconnection structures, including interconnect layers 2912, 2926, and 2928, as well as contacts 2924, 2930, and 2931. Moreover, peripheral circuits 2904, 2906, 2916, and 2918 and NAND memory strings 208 in 3D memory device 2900 can be further coupled to external devices through contacts 2930 and pad-out interconnect layer 902.

As shown in FIG. 29A, first semiconductor structure 102 can further include a passivation layer 2950 to protect and encapsulate 3D memory device 2900 from the side of first semiconductor structure 102 without pad-out interconnect layer 902. Passivation layer 2950 can include dielectric materials, such as silicon nitride and/or silicon oxide. In some implementations, first semiconductor structure 102 in 3D memory device 2900 further includes a handle/carrier substrate 2951 in contact with passivation layer 2950 as the base substrate of 3D memory device 2900 to provide support. It is understood that in some examples, passivation layer 2950 may be omitted or combined with handle substrate 2951 as a single layer for support and protection.

It is understood that the pad-out of 3D memory devices is not limited to from second semiconductor structure 104 having peripheral circuit 2904 as shown in FIG. 29A (corresponding to FIG. 21B) and may be from first semiconductor structure 102 having NAND memory strings 208 and peripheral circuit 2916 (corresponding to FIG. 21A). For example, as shown in FIG. 29B, a 3D memory device 2901 may include pad-out interconnect layer 902 in first semiconductor structure 102. Pad-out interconnect layer 902 can be above interconnect layer 2928 and NAND memory strings 208. As shown in FIG. 29B, second semiconductor structure 104 can further include passivation layer 2950, replacing pad-out interconnect layer 902, to protect and encapsulate 3D memory device 2901 from the side of second semiconductor structure 104 without pad-out interconnect layer 902. In some implementations, second semiconductor structure 104 in 3D memory device 2901 further includes handle/carrier substrate 2951 in contact with passivation layer 2950 as the base substrate of 3D memory device 2901 to provide support. It is understood that in some examples, passivation layer 2950 may be omitted or combined with handle substrate 2951 as a single layer for support and protection.

It is also understood that in some examples, first and second semiconductor structures 102 and 104 of 3D memory device 2901 may further include bonding layers 1012 and 1014, respectively, at bonding interface 105 (on opposite sides of bonding interface 105), as shown in FIG. 29B. That is, bonding interface 105 can result from hybrid bonding, as opposed to transfer bonding. Bonding layer 1012 can be disposed between bonding interface 105 and semiconductor layer 1004, and bonding layer 1014 can be disposed between bonding interface 105 and semiconductor layer 1002. In some implementations, bonding layer 1014 is formed on the backside of semiconductor layer 1002 (e.g., a thinned silicon substrate) opposite to the front side on which device layer 2914 is formed. Similarly, bonding layer 1012 is formed on the backside of semiconductor layer 1004 (e.g., a thinned silicon substrate) opposite to the front side on which device layer 2902 is formed, according to some implementations. In practice, bonding interface 105 can be a layer with a certain thickness that includes the top surface of bonding layer 1012 of second semiconductor structure 104 and the bottom surface of bonding layer 1014 of first semiconductor structure 102.

Bonding layers 1012 and 1014 can include a plurality of bonding contacts and dielectrics electrically isolating the bonding contacts. The bonding contacts can include conductive materials including, but not limited to, W, Co, Cu, Al, silicides, or any combination thereof. In some implementations, the bonding contacts of bonding layers 1012 and 1014 include Cu. The remaining area of bonding layers 1012 and 1014 can be formed with dielectrics including, but not limited to, silicon oxide, silicon nitride, silicon oxynitride, low-k dielectrics, or any combination thereof. The bonding contacts and surrounding dielectrics in bonding layers 1012 and 1014 can be used for hybrid bonding (also known as "metal/dielectric hybrid bonding"), which is a direct bonding technology (e.g., forming bonding between surfaces without using intermediate layers, such as solder or adhesives) and can obtain metal-metal (e.g., Cu-to-Cu) bonding and dielectric-dielectric (e.g., $SiO_2$-to-$SiO_2$) bonding simultaneously.

Figure 32:
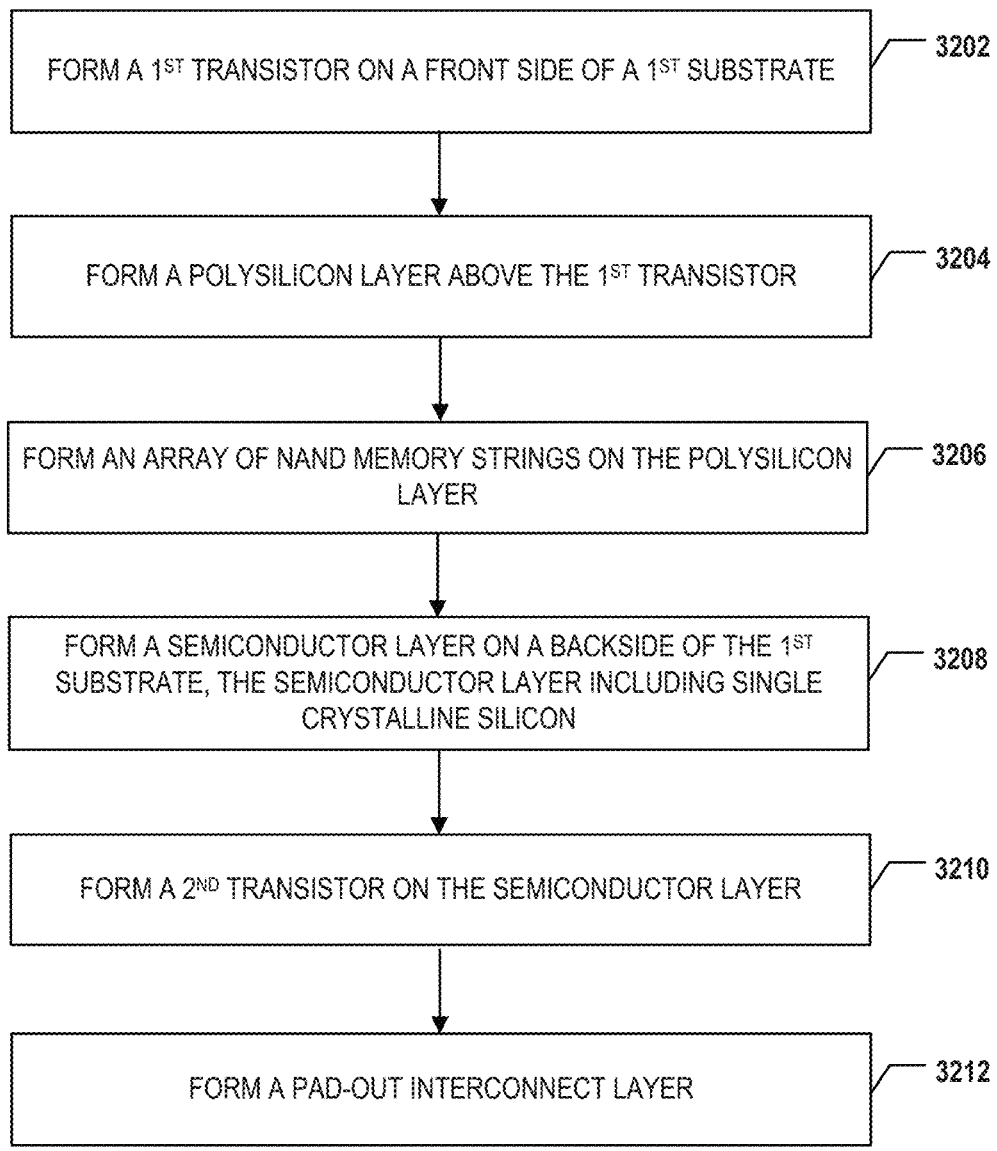
FIG. 32 illustrates a flowchart of a method for forming the 3D memory device in FIGS. 28A and 28B, according to some aspects of the present disclosure.

FIGS. 30A-30G illustrate a fabrication process for forming the 3D memory devices in FIGS. 29A and 29B, according to some aspects of the present disclosure. FIG. 32 illustrates a flowchart of a method 3200 for forming the 3D memory devices in FIGS. 29A and 29B, according to some aspects of the present disclosure. Examples of the 3D memory devices depicted in FIGS. 30A-30G and 32 include 3D memory device 2900 depicted in FIG. 29A. FIGS. 30A-30G and 32 will be described together. It is understood that the operations shown in method 3200 are not exhaustive and that other operations can be performed as well before, after, or between any of the illustrated operations. Further, some of the operations may be performed simultaneously, or in a different order than shown in FIG. 32.

Referring to FIG. 32, method 3200 starts at operation 3202, in which a first transistor is formed on a front side of a first substrate. The first substrate can be a silicon substrate having single crystalline silicon. As illustrated in FIG. 30A, a plurality of transistors 3014 and 3016 are formed on the front side of a silicon substrate 3010. Transistors 3014 and 3016 can be formed by a plurality of processes including, but not limited to, photolithography, dry/wet etch, thin film deposition, thermal growth, implantation, CMP, and any other suitable processes. In some implementations, doped regions are formed in silicon substrate 3010 by ion implantation and/or thermal diffusion, which function, for example, as wells and source/drain regions of transistors 3014 and 3016. In some implementations, isolation regions (e.g., STIs) are also formed in silicon substrate 3010 by wet/dry etch and thin film deposition. In some implementations, the thickness of gate dielectric of transistor 3014 is different from the thickness of gate dielectric of transistor 3016, for example, by depositing a thicker silicon oxide film in the region of transistor 3014 than the region of transistor 3016, or by etching back part of the silicon oxide film deposited in the region of transistor 3016. It is understood that the details of fabricating transistors 3014 and 3016 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 3020 is formed above the transistor on the first substrate. The interconnect layer can include a plurality of interconnects in one or more ILD layers. As illustrated in FIG. 30A, an interconnect layer 3020 can be formed above transistors 3014 and 3016. Interconnect layer 3020 can include interconnects of MEOL and/or BEOL in a plurality of ILD layers to make electrical connections with transistors 3014 and 3016. In some implementations, interconnect layer 3020 includes multiple ILD layers and interconnects therein formed in multiple processes. For example, the interconnects in interconnect layer 3020 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 30A can be collectively referred to as interconnect layer 3020. In some implementations, the interconnects in interconnect layer 3020 include W, which has a relatively high thermal budget among conductive metal materials to sustain later high-temperature processes.

In some implementations, a contact through the thinned first substrate is formed. As shown in FIG. 30A, a contact 3018 extending vertically into silicon substrate 3010 from the front side of silicon substrate 3010 is formed. Contacts 3018 can be coupled to the interconnects in interconnect layer 3020. Contacts 3018 can be formed by first patterning contact holes into silicon substrate 3010 using patterning process (e.g., photolithography and dry/wet etch of dielectric materials in the dielectric layer). The contact holes can be filled with a conductor (e.g., Cu). In some implementations, filling the contact holes includes depositing a spacer (e.g., a silicon oxide layer) before depositing the conductor.

Method 3200 proceeds to operation 3204, as illustrated in FIG. 32, in which a polysilicon layer is formed above the first transistor. As illustrated in FIG. 30B, a polysilicon layer 3011 is formed above interconnect layer 3020 and transistors 3014 and 3016 on first silicon substrate 3010. Polysilicon layer 3011 can be formed by depositing polysilicon on interconnect layer 3020 using one or more thin film deposition processes including, but not limited to, CVD, PVD, ALD, or any combination thereof. In some implementations, polysilicon layer 3011 is doped with P-type or N-type dopant using an in-situ doping process during the deposition process or ion implantation/diffusion process after the deposition process.

Figure 30C:
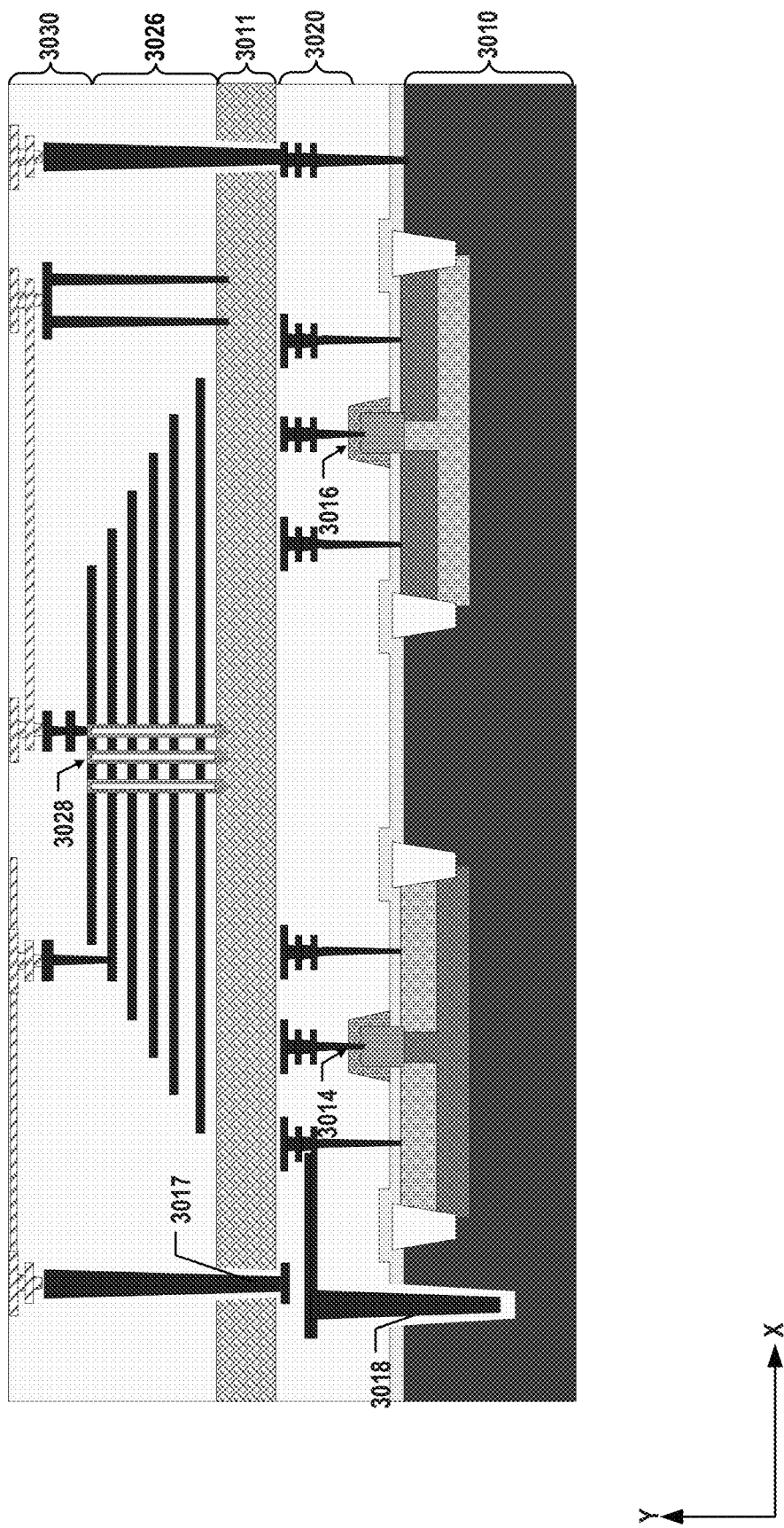

Method 3200 proceeds to operation 3206, as illustrated in FIG. 32, in which an array of NAND memory strings is formed on the polysilicon layer. In some implementations, to form the array of NAND memory strings, a memory stack is formed on the polysilicon layer. As illustrated in FIG. 30C, a stack structure, such as a memory stack 3026 including interleaved conductive layers and dielectric layers, is formed on polysilicon layer 3011. To form memory stack 3026, in some implementations, a dielectric stack (not shown) including interleaved sacrificial layers (not shown) and the dielectric layers is formed on polysilicon layer 3011. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 3026 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 3026 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 3026 and polysilicon layer 3011.

As illustrated in FIG. 30C, NAND memory strings 3028 are formed above polysilicon layer 3011, each of which extends vertically through memory stack 3026 to be in contact with polysilicon layer 3011. In some implementations, fabrication processes to form NAND memory string 3028 include forming a channel hole through memory stack 3026 (or the dielectric stack) and into polysilicon layer 3011 using dry etching/and or wet etching, such as DRIE, followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 3028 may vary depending on the types of channel structures of NAND memory strings 3028 (e.g., channel structure 812 in FIG. 8) and thus, are not elaborated for ease of description.

In some implementations, an interconnect layer is formed above the array of NAND memory strings. The interconnect layer can include a first plurality of interconnects in one or more ILD layers. As illustrated in FIG. 30C, an interconnect layer 3030 is formed above memory stack 3026 and NAND memory strings 3028. Interconnect layer 3030 can include interconnects of MEOL and/or BEOL in a plurality of ILD layers to make electrical connections with NAND memory strings 3028. In some implementations, interconnect layer 3030 includes multiple ILD layers and interconnects therein formed in multiple processes. For example, the interconnects in interconnect layer 3030 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 30C can be collectively referred to as interconnect layer 3030.

In some implementations, a contact through the polysilicon layer is formed. As illustrated in FIG. 30C, one or more contacts 3017 each extending vertically through polysilicon layer 3011 is formed. Contacts 3017 can couple the interconnects in interconnect layers 3030 and 3020. Contacts 3017 can be formed by first patterning contact holes through polysilicon layer 3011 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor.

Figure 30D:
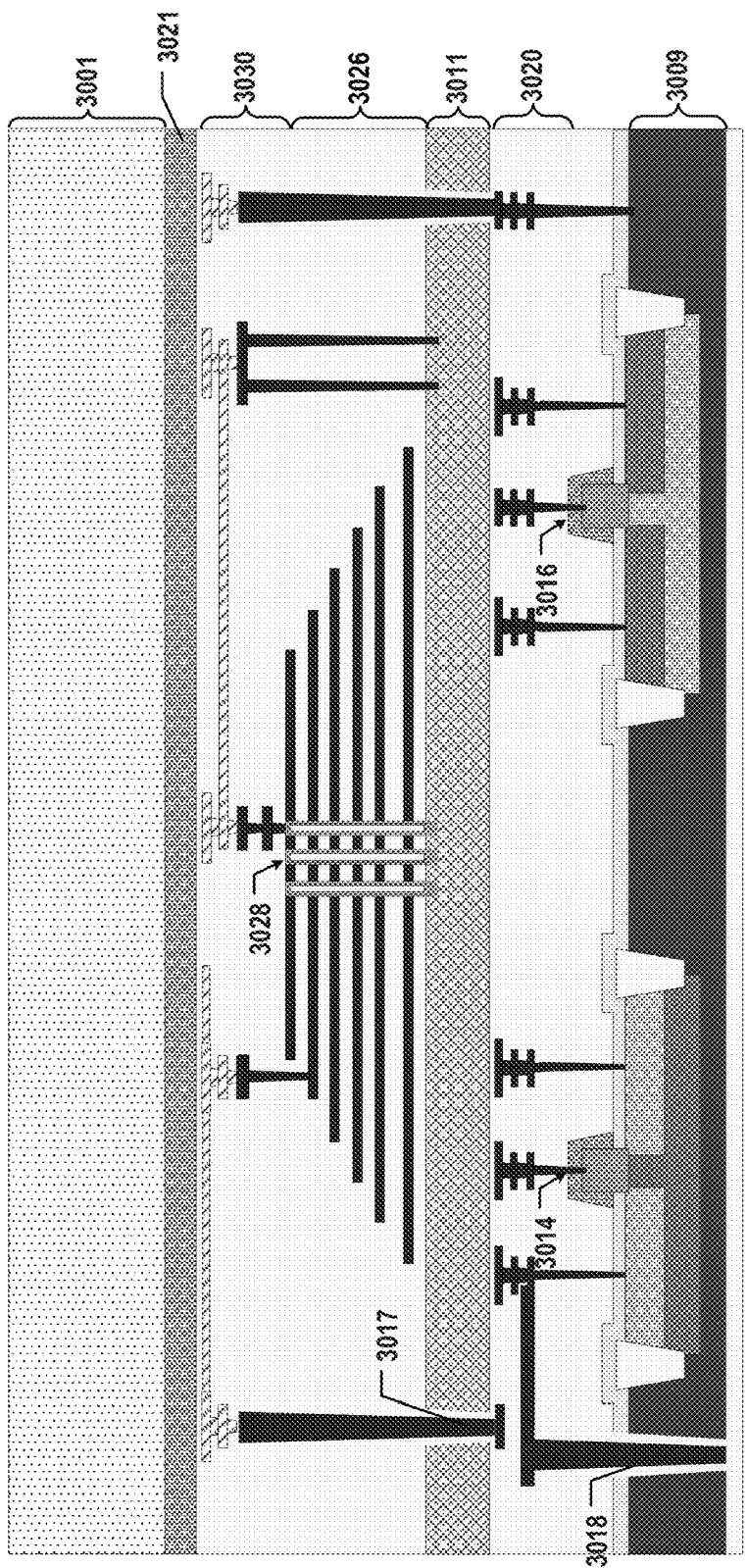

In some implementations, the first substrate is thinned. As illustrated in FIG. 30D, silicon substrate 3010 (shown in FIG. 30C) is thinned to become a semiconductor layer 3009 having single crystalline silicon. Silicon substrate 3010 can be thinned by processes including, but not limited to, wafer grinding, dry etch, wet etch, CMP, any other suitable processes, or any combination thereof. The thickness of semiconductor layer 3009 can be controlled to expose contact 3018 from the backside of thinned silicon substrate 3010, for example, by controlling the duration of the CMP process. It is understood that in some examples, contacts 3018 may be formed through semiconductor layer 3009 from the backside thereof after the thinning, as opposed to in silicon substrate 3010 before the thinning. In some implementations, before the thinning, a passivation layer 3021 is formed on interconnect layer 3030 by depositing a dielectric material, such as silicon nitride, on interconnect layer 3030 using one or more thin film deposition processes including, but not limited to, CVD, PVD, ALD, or any combination thereof. A handle substrate 3001 can then be attached to passivation layer 3021, for example, using adhesive bonding, prior to the thinning to allow the subsequent backside processes on silicon substrate 3010, such as thinning, contact formation, and bonding.

Method 3200 proceeds to operation 3208, as illustrated in FIG. 32, in which a semiconductor layer is formed on a backside of the first substrate. The semiconductor layer can include single crystalline silicon. In some implementations, to form the semiconductor layer, another substrate and the first substrate are bonded in a face-to-back manner, and the other substrate is thinned to leave the semiconductor layer. The bonding can include transfer bonding. The other substrate can be a silicon substrate having single crystalline silicon.

Figure 30E:
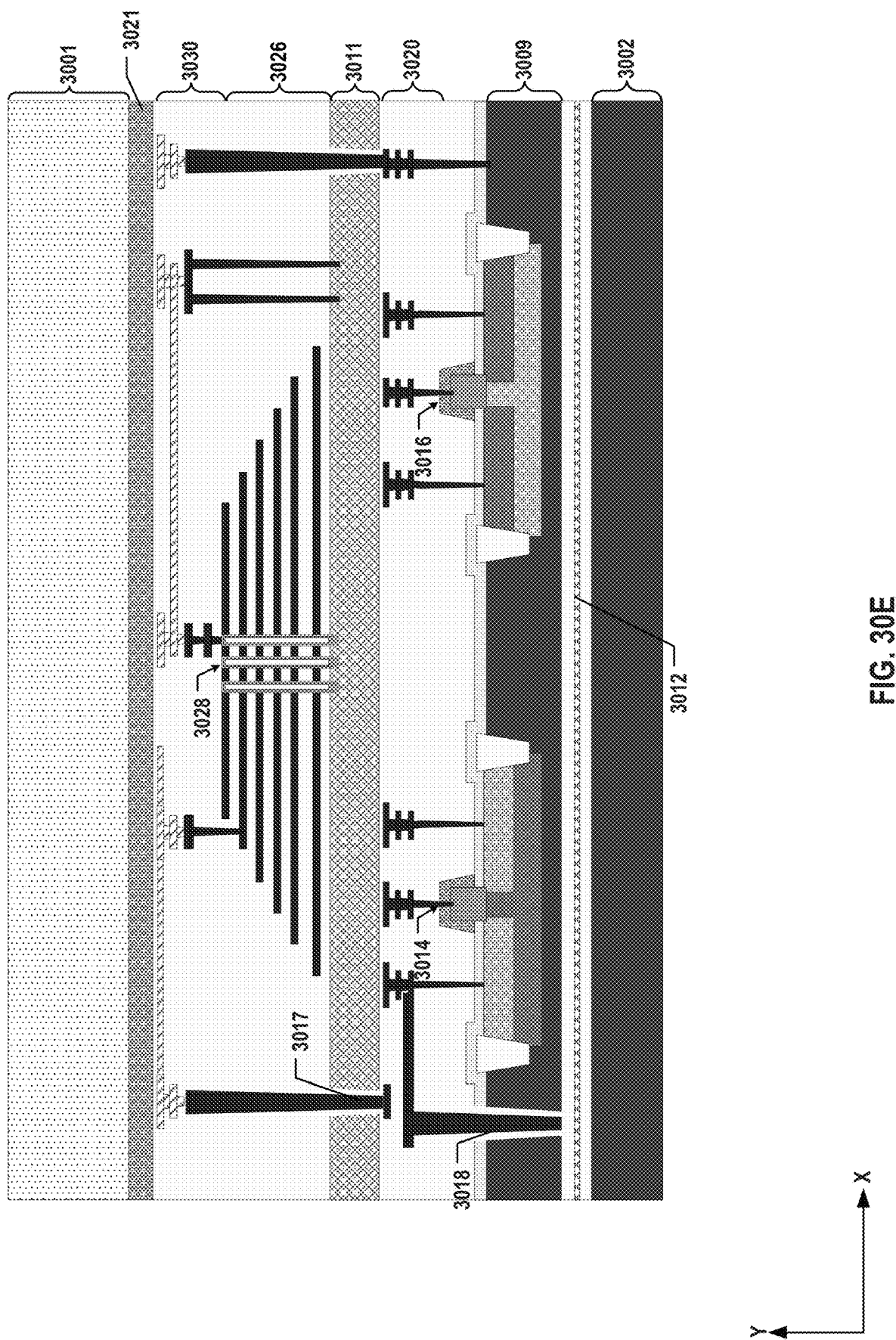

As illustrated in FIG. 30E, a semiconductor layer 3002, such as a single crystalline silicon layer, is formed on the backside of semiconductor layer 3009 (i.e., thinned silicon substrate 3010). Semiconductor layer 3002 can be attached to the backside of semiconductor layer 3009 to form a bonding interface 3012 vertically between semiconductor layer 3009 and semiconductor layer 3002. In some implementations, to form semiconductor layer 3002, another silicon substrate (not shown in FIG. 30E) and thinned silicon substrate 3010 are bonded in a face-to-back manner (having the components formed on thinned silicon substrate 3010, such as transistors 3014 and 3016 and NAND memory strings 3028, facing away from the other silicon substrate) using transfer bonding, thereby forming bonding interface 3012. The other silicon substrate can then be thinned using any suitable processes to leave semiconductor layer 3002 attached to the backside of thinned silicon substrate 3010. The details of various transfer bonding processes are described above with respect to FIGS. 34A-34D and FIGS. 35A-35D and thus, are not repeated for ease of description.

Figure 30F:
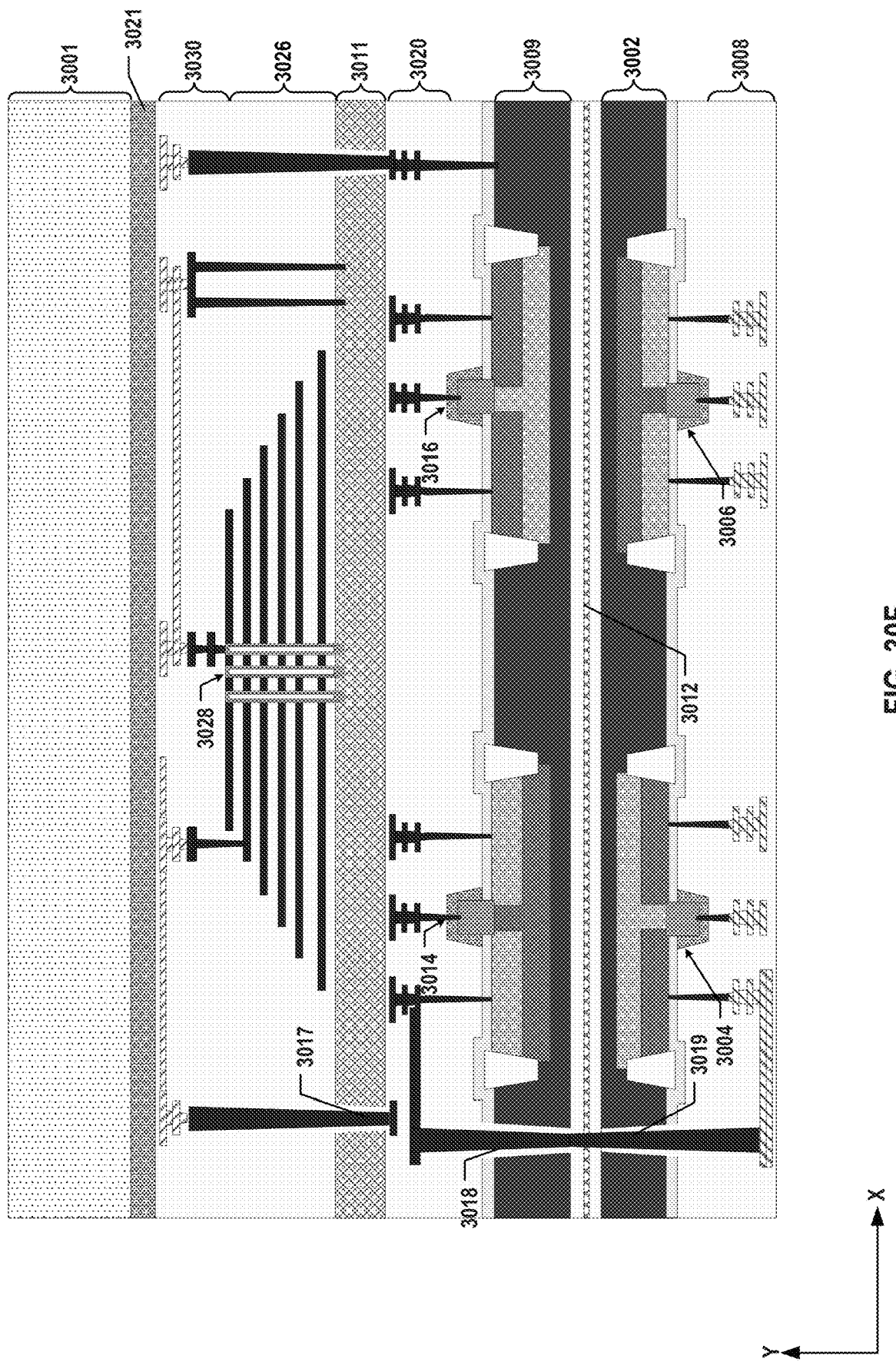

Method 3200 proceeds to operation 3210, in which a second transistor is formed on the semiconductor layer. As illustrated in FIG. 30F, a plurality of transistors 3004 and 3006 are formed on semiconductor layer 3002 having single crystalline silicon. Transistors 3004 and 3006 can be formed by a plurality of processes including, but not limited to, photolithography, dry/wet etch, thin film deposition, thermal growth, implantation, CMP, and any other suitable processes. In some implementations, doped regions are formed in semiconductor layer 3002 by ion implantation and/or thermal diffusion, which function, for example, as wells and source/drain regions of transistors 3004 and 3006. In some implementations, isolation regions (e.g., STIs) are also formed in semiconductor layer 3002 by wet/dry etch and thin film deposition. In some implementations, the thickness of gate dielectric of transistor 3004 is different from the thickness of gate dielectric of transistor 3006, for example, by depositing a thicker silicon oxide film in the region of transistor 3004 than the region of transistor 3006, or by etching back part of the silicon oxide film deposited in the region of transistor 3006. It is understood that the details of fabricating transistors 3004 and 3006 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer is formed above the transistor. The interconnect layer can include a plurality of interconnects in one or more ILD layers. As illustrated in FIG. 30F, an interconnect layer 3008 can be formed above transistors 3004 and 3006. Interconnect layer 3008 can include interconnects of MEOL and/or BEOL in a plurality of ILD layers to make electrical connections with transistors 3004 and 3006. In some implementations, interconnect layer 3008 includes multiple ILD layers and interconnects therein formed in multiple processes. For example, the interconnects in interconnect layer 3008 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 24C can be collectively referred to as interconnect layer 3008. Different from interconnect layer 3020, in some implementations, the interconnects in interconnect layer 3008 include Cu, which has a relatively low resistivity among conductive metal materials. It is understood that although Cu has a relatively low thermal budget (incompatible with high-temperature processes), using Cu as the conductive materials of the interconnects in interconnect layer 3008 may become feasible since there are no more high-temperature processes after the fabrication of interconnect layer 3008.

In some implementations, a contact through the semiconductor layer is formed. Contact 3019 can extend vertically through semiconductor layer 3002 from the front side thereof. Contacts 3019 can be coupled to the interconnects in interconnect layer 3008. Contact 3019 can extend further through a dielectric layer (if any) on the backside of semiconductor layer 3002 to be aligned and in contact with the contact 3018 at bonding interface 3012. Thus, contacts 3018 and 3018 can couple the interconnects in interconnect layer 3020 to the interconnects in interconnect layer 3008 through semiconductor layers 3009 and 3002 and across bonding interface 3012. Contacts 3019 can be formed by first patterning contact holes into semiconductor layer 3002 using patterning process (e.g., photolithography and dry/wet etch of dielectric materials in the dielectric layer). The contact holes can be filled with a conductor (e.g., W). In some implementations, filling the contact holes includes depositing a spacer (e.g., a silicon oxide layer) before depositing the conductor.

Figure 30G:
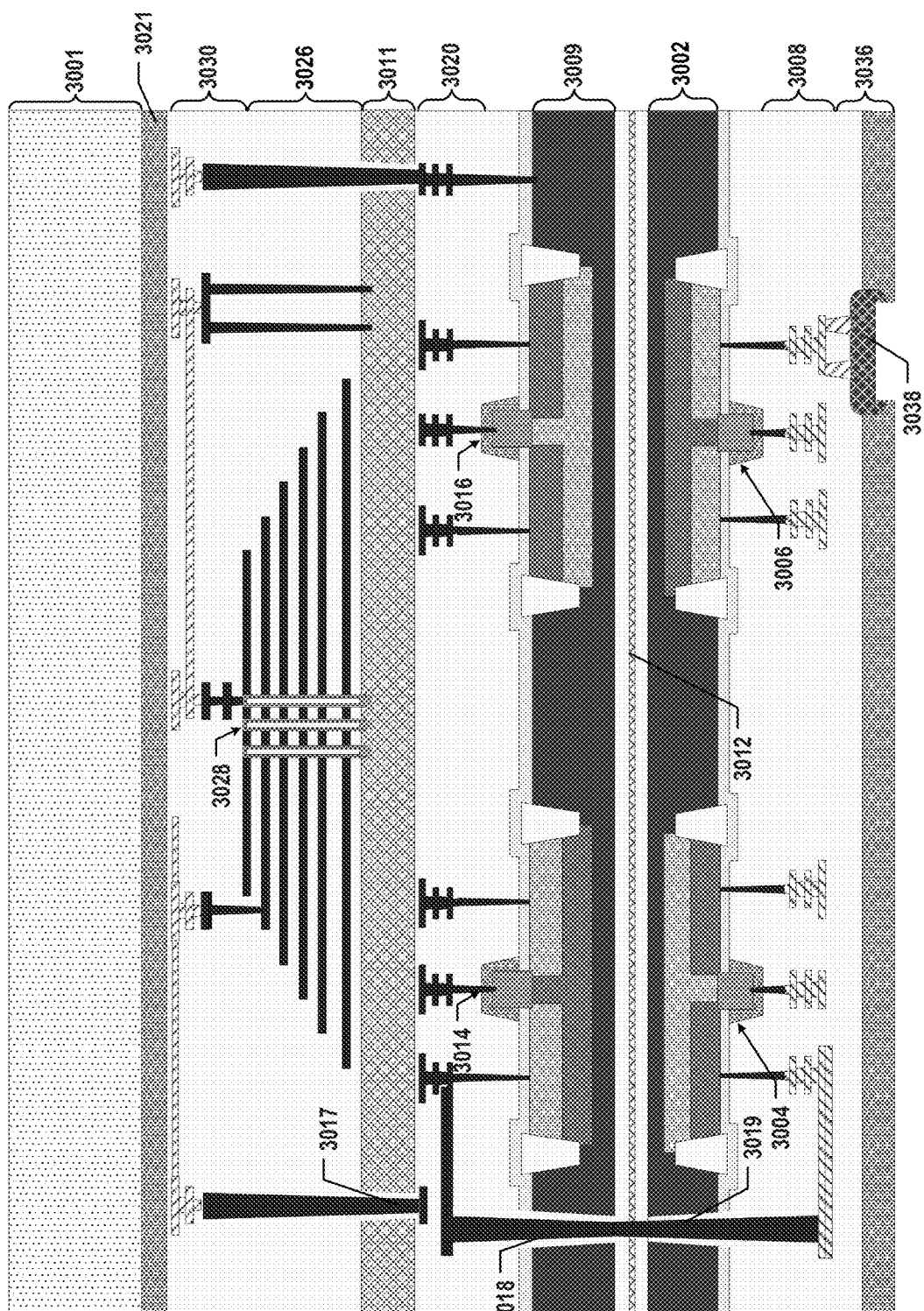

Method 3200 proceeds to operation 3212, as illustrated in FIG. 32, in which a pad-out interconnect layer is formed. The pad-out interconnect layer can be formed above the second transistor or the array of NAND memory strings. As illustrated in FIG. 30G, a pad-out interconnect layer 3036 is formed above interconnect layer 3008 and transistor 3004 on semiconductor layer 3002. Pad-out interconnect layer 3036 can include interconnects, such as contact pads 3038, formed in one or more ILD layers. Contact pads 3038 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. It is understood that although not shown, in some examples, passivation layer 3021 and handle substrate 3001 may be removed to expose interconnect layer 3030, and pad-out interconnect layer 3036 may be formed above interconnect layer 3030 and NAND memory strings 3028 on polysilicon layer 3011.

Figure 33:
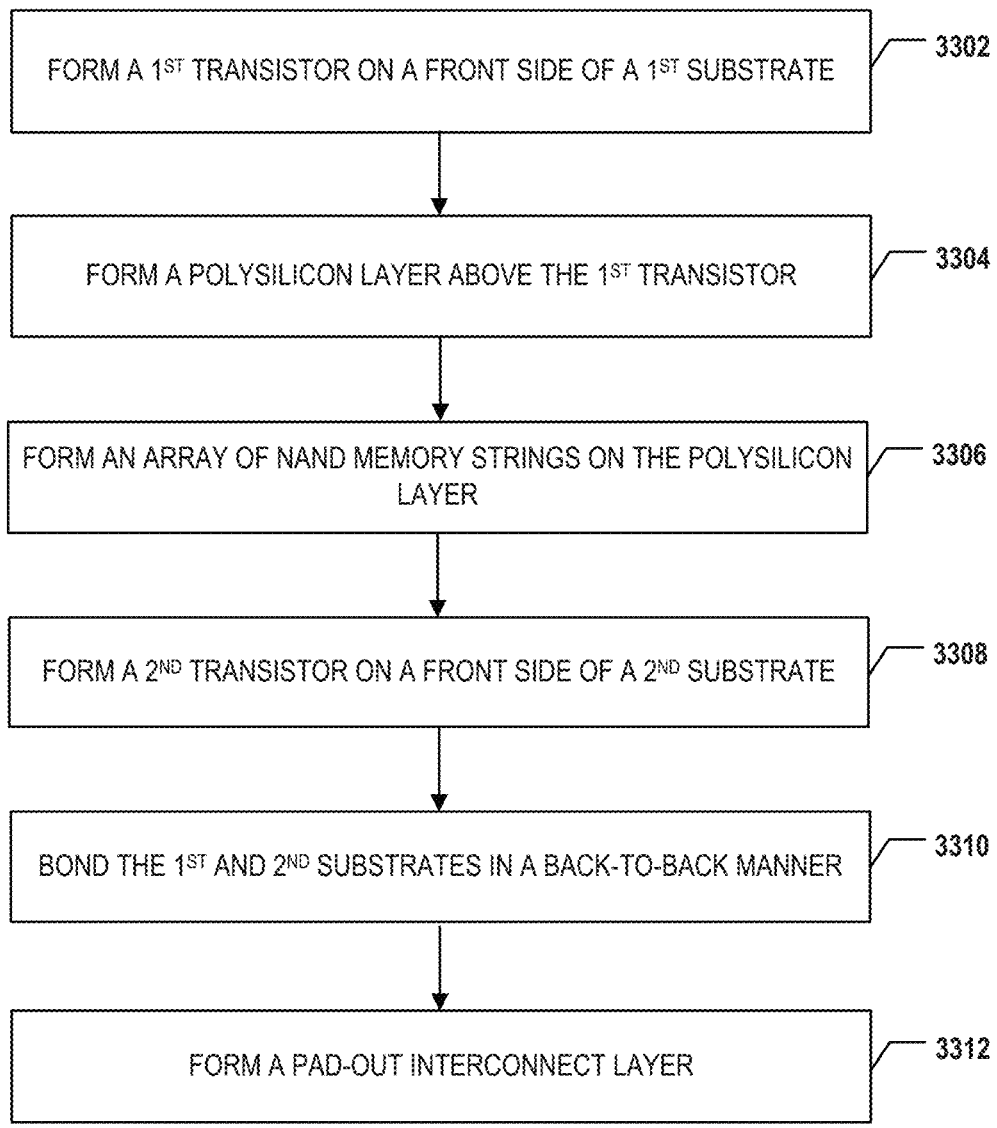
FIG. 33 illustrates a flowchart of another method for forming the 3D memory device in FIGS. 28A and 28B, according to some aspects of the present disclosure.

FIGS. 31A-31H illustrate another fabrication process for forming the 3D memory devices in FIGS. 29A and 29B, according to some aspects of the present disclosure. FIG. 33 illustrates a flowchart of another method 3300 for forming the 3D memory devices in FIGS. 29A and 29B, according to some aspects of the present disclosure. Examples of the 3D memory devices depicted in FIGS. 31A-31H and 33 include 3D memory devices 2901 depicted in FIG. 29B. FIGS. 31A-31H and 33 will be described together. It is understood that the operations shown in method 3300 are not exhaustive and that other operations can be performed as well before, after, or between any of the illustrated operations. Further, some of the operations may be performed simultaneously, or in a different order than shown in FIG. 33.

Figure 31A:
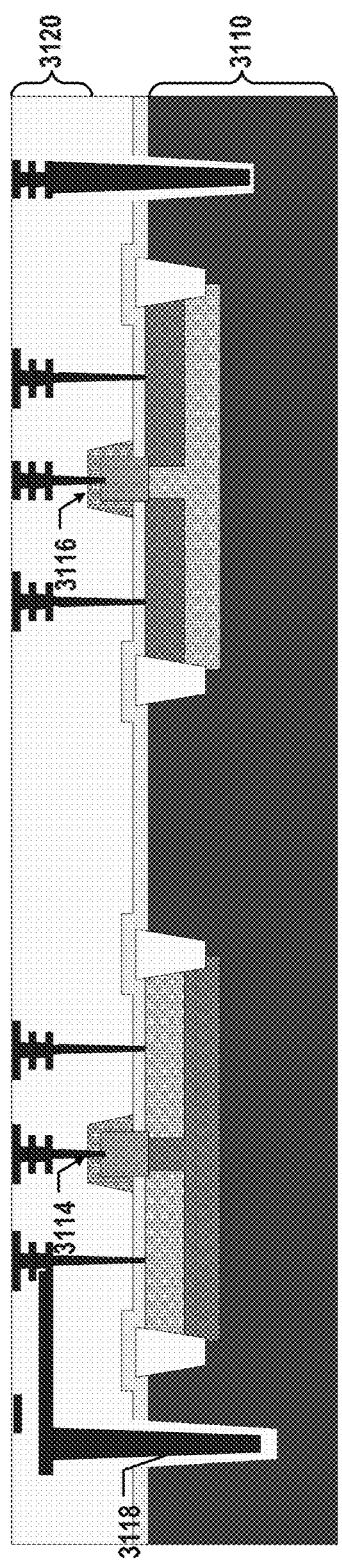
FIGS. 31A-31H illustrate another fabrication process for forming the 3D memory device in FIGS. 28A and 28B, according to some aspects of the present disclosure.

Referring to FIG. 33, method 3300 starts at operation 3302, in which a first transistor is formed on a front side of a first substrate. The first substrate can be a silicon substrate having single crystalline silicon. As illustrated in FIG. 31A, a plurality of transistors 3114 and 3116 are formed on the front side of a silicon substrate 3110. Transistors 3114 and 3116 can be formed by a plurality of processes including, but not limited to, photolithography, dry/wet etch, thin film deposition, thermal growth, implantation, CMP, and any other suitable processes. In some implementations, doped regions are formed in silicon substrate 3110 by ion implantation and/or thermal diffusion, which function, for example, as wells and source/drain regions of transistors 3114 and 3116. In some implementations, isolation regions (e.g., STIs) are also formed in silicon substrate 3110 by wet/dry etch and thin film deposition. In some implementations, the thickness of gate dielectric of transistor 3114 is different from the thickness of gate dielectric of transistor 3116, for example, by depositing a thicker silicon oxide film in the region of transistor 3114 than the region of transistor 3116, or by etching back part of the silicon oxide film deposited in the region of transistor 3116. It is understood that the details of fabricating transistors 3114 and 3116 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 3120 is formed above the transistor on the first substrate. The interconnect layer can include a plurality of interconnects in one or more ILD layers. As illustrated in FIG. 31A, an interconnect layer 3120 can be formed above transistors 3114 and 3116. Interconnect layer 3120 can include interconnects of MEOL and/or BEOL in a plurality of ILD layers to make electrical connections with transistors 3114 and 3116. In some implementations, interconnect layer 3120 includes multiple ILD layers and interconnects therein formed in multiple processes. For example, the interconnects in interconnect layer 3120 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 31A can be collectively referred to as interconnect layer 3120. In some implementations, the interconnects in interconnect layer 3120 include W, which has a relatively high thermal budget among conductive metal materials to sustain later high-temperature processes.

In some implementations, a contact through the thinned first substrate is formed. As shown in FIG. 31A, a contact 3118 extending vertically into silicon substrate 3110 from the front side of silicon substrate 3110 is formed. Contacts 3118 can be coupled to the interconnects in interconnect layer 3120. Contacts 3118 can be formed by first patterning contact holes into silicon substrate 3110 using patterning process (e.g., photolithography and dry/wet etch of dielectric materials in the dielectric layer). The contact holes can be filled with a conductor (e.g., Cu). In some implementations, filling the contact holes includes depositing a spacer (e.g., a silicon oxide layer) before depositing the conductor.

Figure 31B:
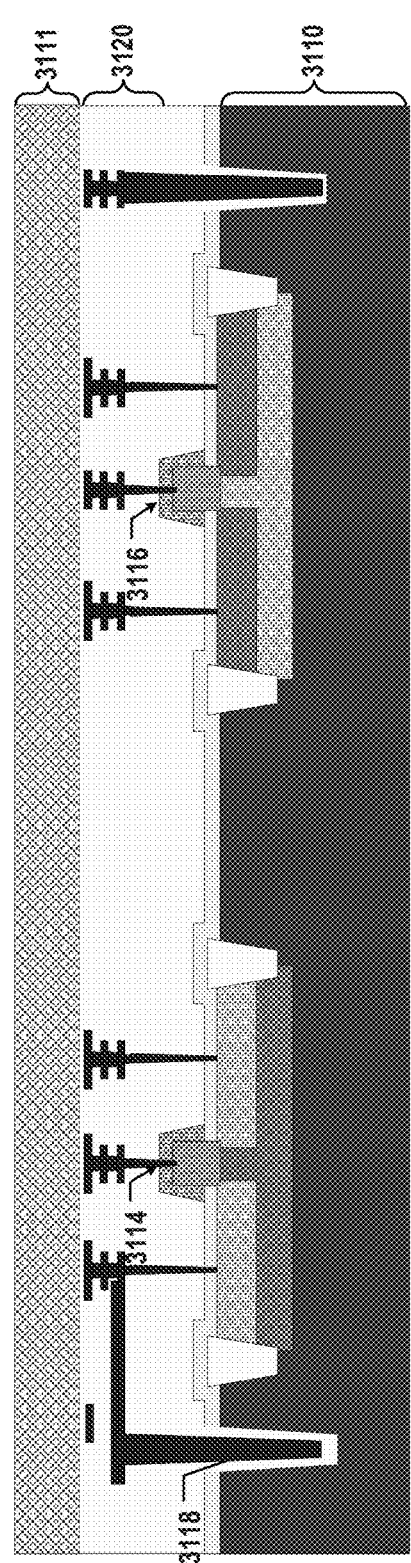

Method 3300 proceeds to operation 3304, as illustrated in FIG. 33, in which a polysilicon layer is formed above the first transistor. As illustrated in FIG. 31B, a polysilicon layer 3111 is formed above interconnect layer 3120 and transistors 3114 and 3116 on first silicon substrate 3110. Polysilicon layer 3111 can be formed by depositing polysilicon on interconnect layer 3120 using one or more thin film deposition processes including, but not limited to, CVD, PVD, ALD, or any combination thereof. In some implementations, polysilicon layer 3111 is doped with P-type or N-type dopant using an in-situ doping process during the deposition process or ion implantation/diffusion process after the deposition process.

Figure 31C:
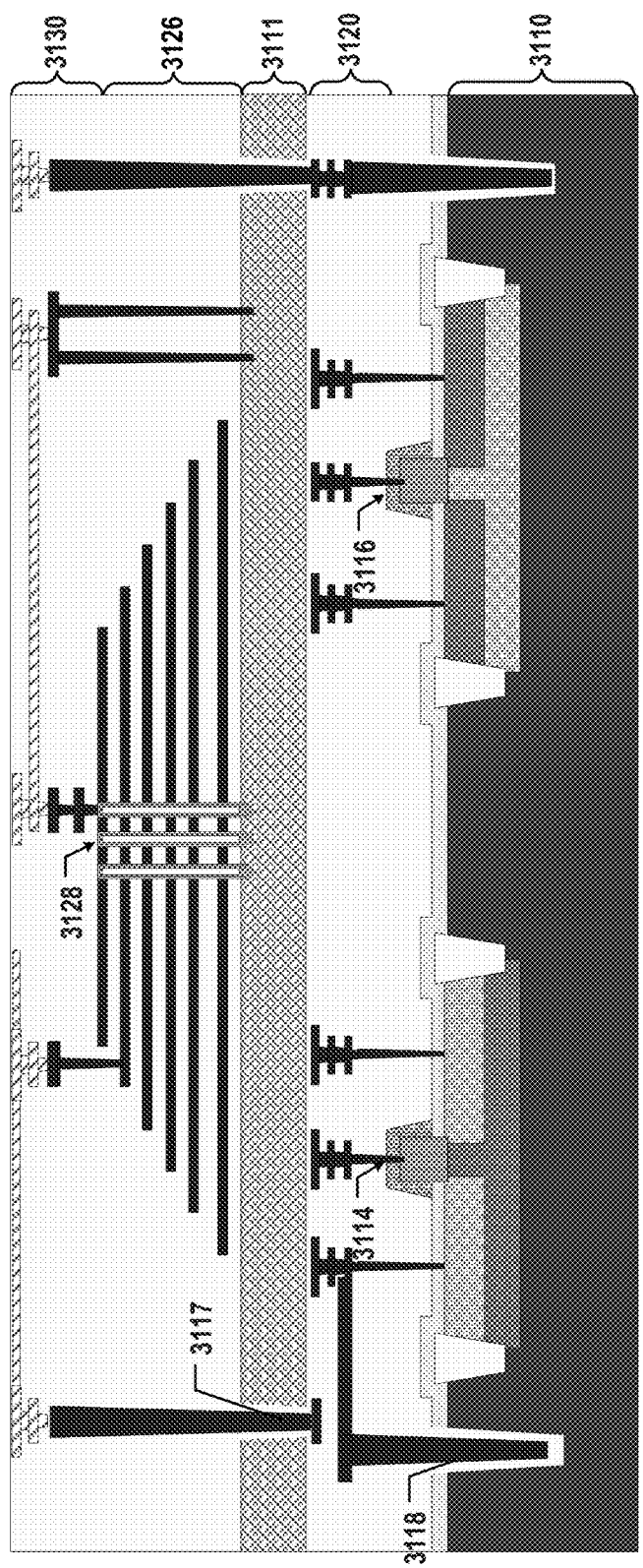

Method 3300 proceeds to operation 3306, as illustrated in FIG. 33, in which an array of NAND memory strings is formed on the polysilicon layer. In some implementations, to form the array of NAND memory strings, a memory stack is formed on the polysilicon layer. As illustrated in FIG. 31C, a stack structure, such as a memory stack 3126 including interleaved conductive layers and dielectric layers, is formed on polysilicon layer 3111. To form memory stack 3126, in some implementations, a dielectric stack (not shown) including interleaved sacrificial layers (not shown) and the dielectric layers is formed on polysilicon layer 3111. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 3126 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 3126 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 3126 and polysilicon layer 3111.

As illustrated in FIG. 31C, NAND memory strings 3128 are formed above polysilicon layer 3111, each of which extends vertically through memory stack 3126 to be in contact with polysilicon layer 3111. In some implementations, fabrication processes to form NAND memory string 3128 include forming a channel hole through memory stack 3126 (or the dielectric stack) and into polysilicon layer 3111 using dry etching/and or wet etching, such as DRIE, followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 3128 may vary depending on the types of channel structures of NAND memory strings 3128 (e.g., channel structure 812 in FIG. 8) and thus, are not elaborated for ease of description.

In some implementations, an interconnect layer is formed above the array of NAND memory strings. The interconnect layer can include a first plurality of interconnects in one or more ILD layers. As illustrated in FIG. 31C, an interconnect layer 3130 is formed above memory stack 3126 and NAND memory strings 3128. Interconnect layer 3130 can include interconnects of MEOL and/or BEOL in a plurality of ILD layers to make electrical connections with NAND memory strings 3128. In some implementations, interconnect layer 3130 includes multiple ILD layers and interconnects therein formed in multiple processes. For example, the interconnects in interconnect layer 3130 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 31C can be collectively referred to as interconnect layer 3130.

In some implementations, a contact through the polysilicon layer is formed. As illustrated in FIG. 31C, one or more contacts 3117 each extending vertically through polysilicon layer 3111 is formed. Contacts 3117 can couple the interconnects in interconnect layers 3130 and 3120. Contacts 3117 can be formed by first patterning contact holes through polysilicon layer 3111 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor.

Figure 31D:
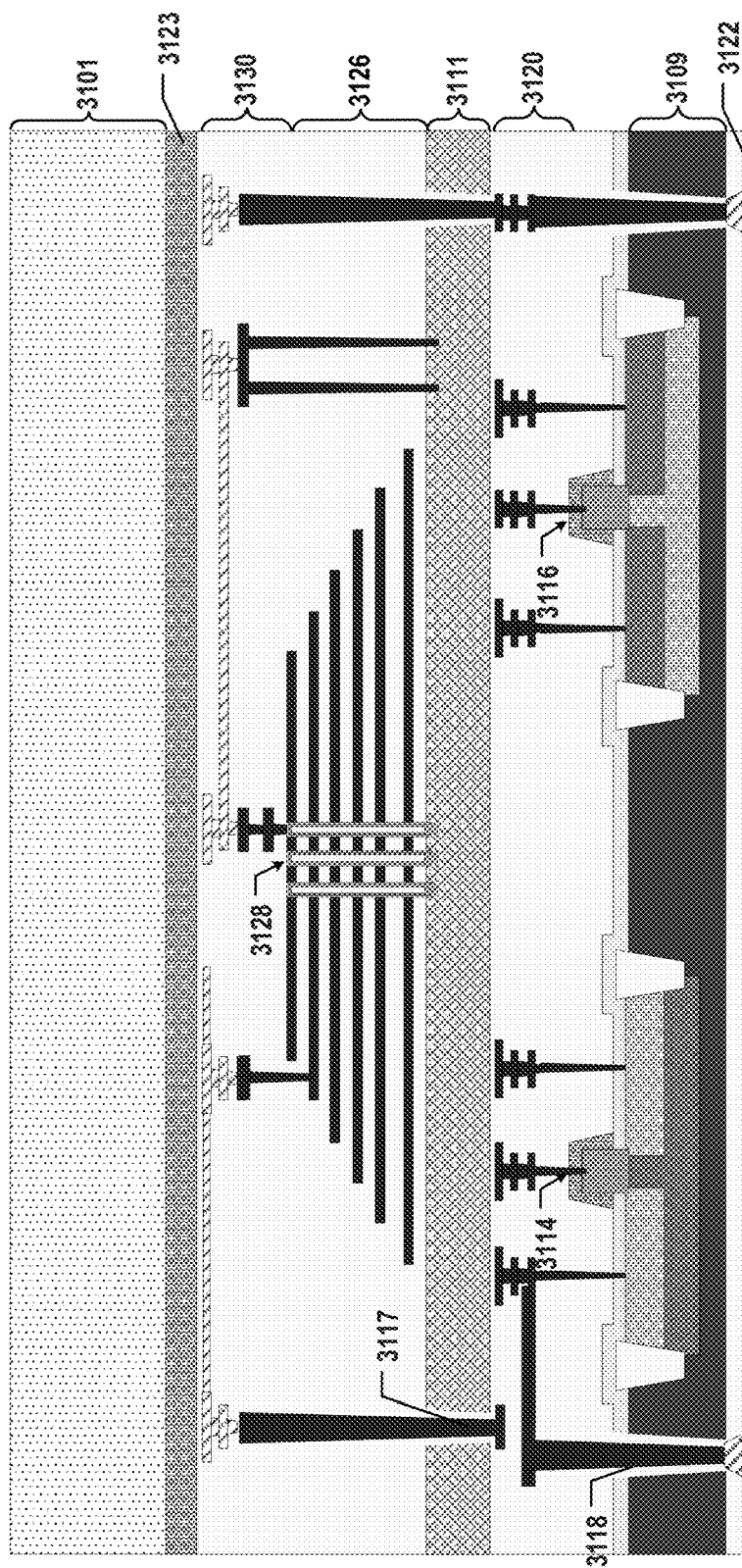

In some implementations, the first substrate is thinned. As illustrated in FIG. 31D, silicon substrate 3110 (shown in FIG. 31C) is thinned to become a semiconductor layer 3109 having single crystalline silicon. Silicon substrate 3110 can be thinned by processes including, but not limited to, wafer grinding, dry etch, wet etch, CMP, any other suitable processes, or any combination thereof. The thickness of semiconductor layer 3109 can be controlled to expose contact 3118 from the backside of thinned silicon substrate 3110, for example, by controlling the duration of the CMP process. It is understood that in some examples, contacts 3118 may be formed through semiconductor layer 3109 from the backside thereof after the thinning, as opposed to in silicon substrate 3110 before the thinning. In some implementations, before the thinning, a passivation layer 3123 is formed on interconnect layer 3130 by depositing a dielectric material, such as silicon nitride, on interconnect layer 3130 using one or more thin film deposition processes including, but not limited to, CVD, PVD, ALD, or any combination thereof. A handle substrate 3101 can then be attached to passivation layer 3123, for example, using adhesive bonding, prior to the thinning to allow the subsequent backside processes on silicon substrate 3110, such as thinning, contact formation, and bonding.

In some implementations, a first bonding layer is formed on the backside of the thinned first substrate. The first bonding layer can include a plurality of first bonding contacts. As illustrated in FIG. 31D, a bonding layer 3122 is formed on the backside of semiconductor layer 3109 (i.e., thinned silicon substrate 3110). Bonding layer 3122 can include a plurality of bonding contacts surrounded by dielectrics. In some implementations, a dielectric layer is deposited on the backside of semiconductor layer 3109 (opposite to the front side on which transistors 3114 and 3116 are formed) by one or more thin film deposition processes including, but not limited to, CVD, PVD, ALD, or any combination thereof. The bonding contacts can then be formed through the dielectric layer and in contact with contacts 3118 on the backside of thinned silicon substrate 3110 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Figure 31E:
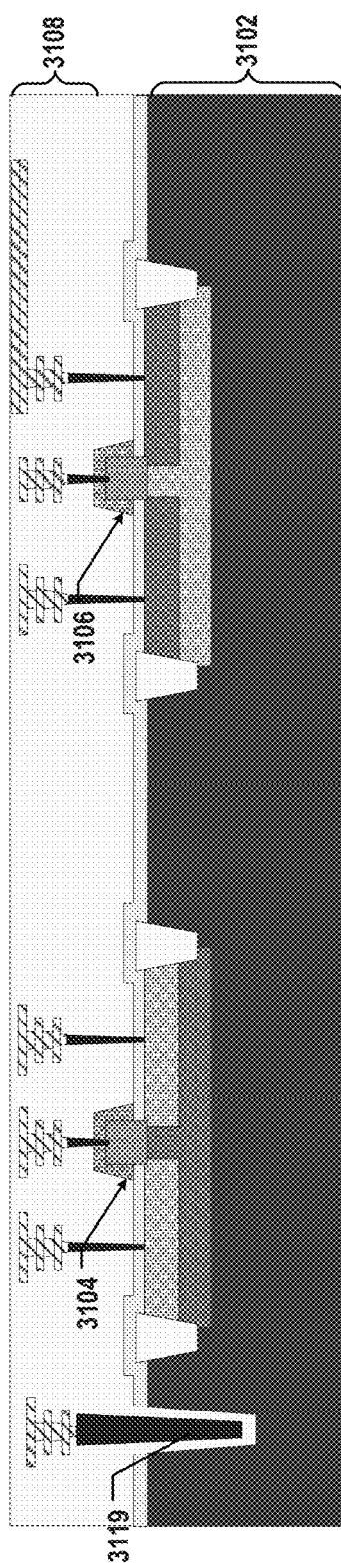

Method 3300 proceeds to operation 3308, as illustrated in FIG. 33, in which a second transistor is formed on a front side of a second substrate. The second substrate can be a silicon substrate having single crystalline silicon. As illustrated in FIG. 31E, a plurality of transistors 3104 and 3106 are formed on a silicon substrate 3102 having single crystalline silicon. Transistors 3104 and 3106 can be formed by a plurality of processes including, but not limited to, photolithography, dry/wet etch, thin film deposition, thermal growth, implantation, CMP, and any other suitable processes. In some implementations, doped regions are formed in silicon substrate 3102 by ion implantation and/or thermal diffusion, which function, for example, as wells and source/drain regions of transistors 3104 and 3106. In some implementations, isolation regions (e.g., STIs) are also formed in silicon substrate 3102 by wet/dry etch and thin film deposition. In some implementations, the thickness of gate dielectric of transistor 3104 is different from the thickness of gate dielectric of transistor 3106, for example, by depositing a thicker silicon oxide film in the region of transistor 3104 than the region of transistor 3106, or by etching back part of the silicon oxide film deposited in the region of transistor 3106. It is understood that the details of fabricating transistors 3104 and 3106 may vary depending on the types of the transistors (e.g., planar transistors 500 or 3D transistors 600 in FIGS. 5A, 5B, 6A, and 6B) and thus, are not elaborated for ease of description.

Figure 31F:
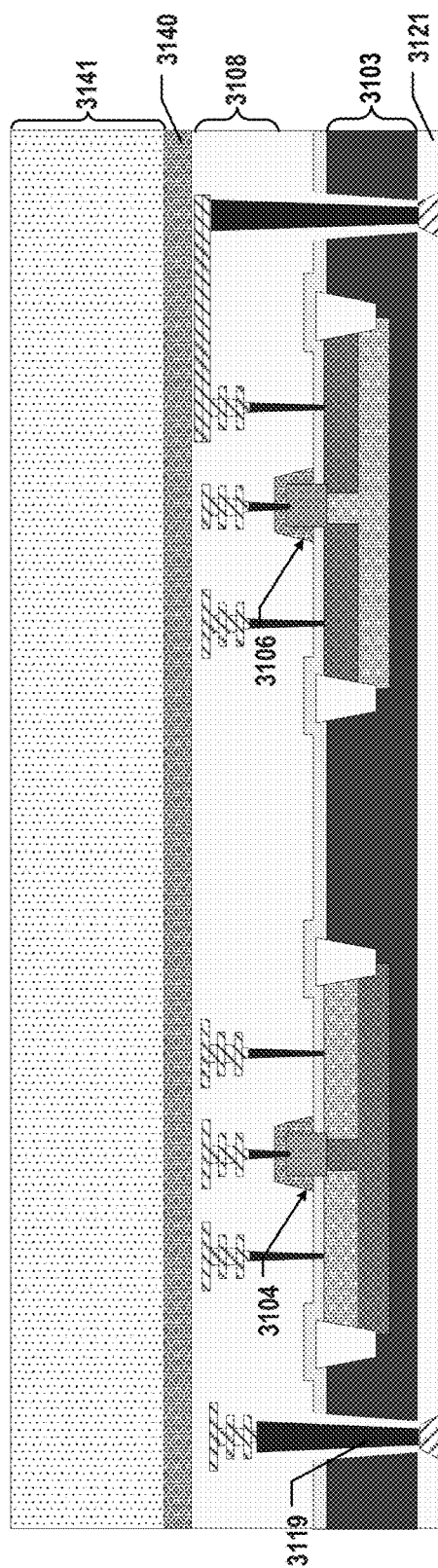

In some implementations, an interconnect layer is formed above the transistor on the second substrate. The interconnect layer can include a plurality of interconnects in one or more ILD layers. As illustrated in FIG. 31F, an interconnect layer 3108 can be formed above transistors 3104 and 3106. Interconnect layer 3108 can include interconnects of MEOL and/or BEOL in a plurality of ILD layers to make electrical connections with transistors 3104 and 3106. In some implementations, interconnect layer 3108 includes multiple ILD layers and interconnects therein formed in multiple processes. For example, the interconnects in interconnect layer 3108 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 31F can be collectively referred to as interconnect layer 3108. Different from interconnect layer 3120, in some implementations, the interconnects in interconnect layer 3108 include Cu, which has a relatively low resistivity among conductive metal materials. It is understood that although Cu has a relatively low thermal budget (incompatible with high-temperature processes), using Cu as the conductive materials of the interconnects in interconnect layer 3108 may become feasible since there are no more high-temperature processes after the fabrication of interconnect layer 3108.

In some implementations, a contact through the thinned second substrate is formed. As shown in FIG. 31E, a contact 3119 extending vertically into silicon substrate 3102 from the front side of silicon substrate 3102 is formed. Contacts 3119 can be coupled to the interconnects in interconnect layer 3108. Contacts 3119 can be formed by first patterning contact holes into silicon substrate 3102 using patterning process (e.g., photolithography and dry/wet etch of dielectric materials in the dielectric layer). The contact holes can be filled with a conductor (e.g., Cu). In some implementations, filling the contact holes includes depositing a spacer (e.g., a silicon oxide layer) before depositing the conductor.

In some implementations, the second substrate is thinned. As illustrated in FIG. 31F, silicon substrate 3102 (shown in FIG. 31E) is thinned to become a semiconductor layer 3103 having single crystalline silicon. Silicon substrate 3102 can be thinned by processes including, but not limited to, wafer grinding, dry etch, wet etch, CMP, any other suitable processes, or any combination thereof. The thickness of semiconductor layer 3103 can be controlled to expose contact 3119 from the backside of thinned silicon substrate 3102, for example, by controlling the duration of the CMP process. It is understood that in some examples, contacts 3119 may be formed through semiconductor layer 3103 from the backside thereof after the thinning, as opposed to in silicon substrate 3102 before the thinning. In some implementations, before the thinning, a passivation layer 3140 is formed on interconnect layer 3108 by depositing a dielectric material, such as silicon nitride, on interconnect layer 3108 using one or more thin film deposition processes including, but not limited to, CVD, PVD, ALD, or any combination thereof. A handle substrate 3141 can then be attached to passivation layer 3140, for example, using adhesive bonding, prior to the thinning to allow the subsequent backside processes on silicon substrate 3102, such as thinning, contact formation, and bonding.

In some implementations, a second bonding layer is formed on the backside of the thinned second substrate. The second bonding layer can include a plurality of second bonding contacts. As illustrated in FIG. 31F, a bonding layer 3121 is formed on the backside of semiconductor layer 3103 (i.e., thinned silicon substrate 3102). Bonding layer 3121 can include a plurality of bonding contacts surrounded by dielectrics. In some implementations, a dielectric layer is deposited on the backside of semiconductor layer 3103 (opposite to the front side on which transistors 3104 and 3106 are formed) by one or more thin film deposition processes including, but not limited to, CVD, PVD, ALD, or any combination thereof. The bonding contacts can then be formed through the dielectric layer and in contact with contacts 3119 on the backside of thinned silicon substrate 3102 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 3300 proceeds to operation 3310, as illustrated in FIG. 33, in which the first substrate and the second substrate are bonded in a back-to-back manner. The first bonding contact in the first bonding layer can be in contact with the second bonding contact in the second bonding layer at a bonding interface after bonding the first and second substrates. The bonding can include hybrid bonding.

Figure 31G:
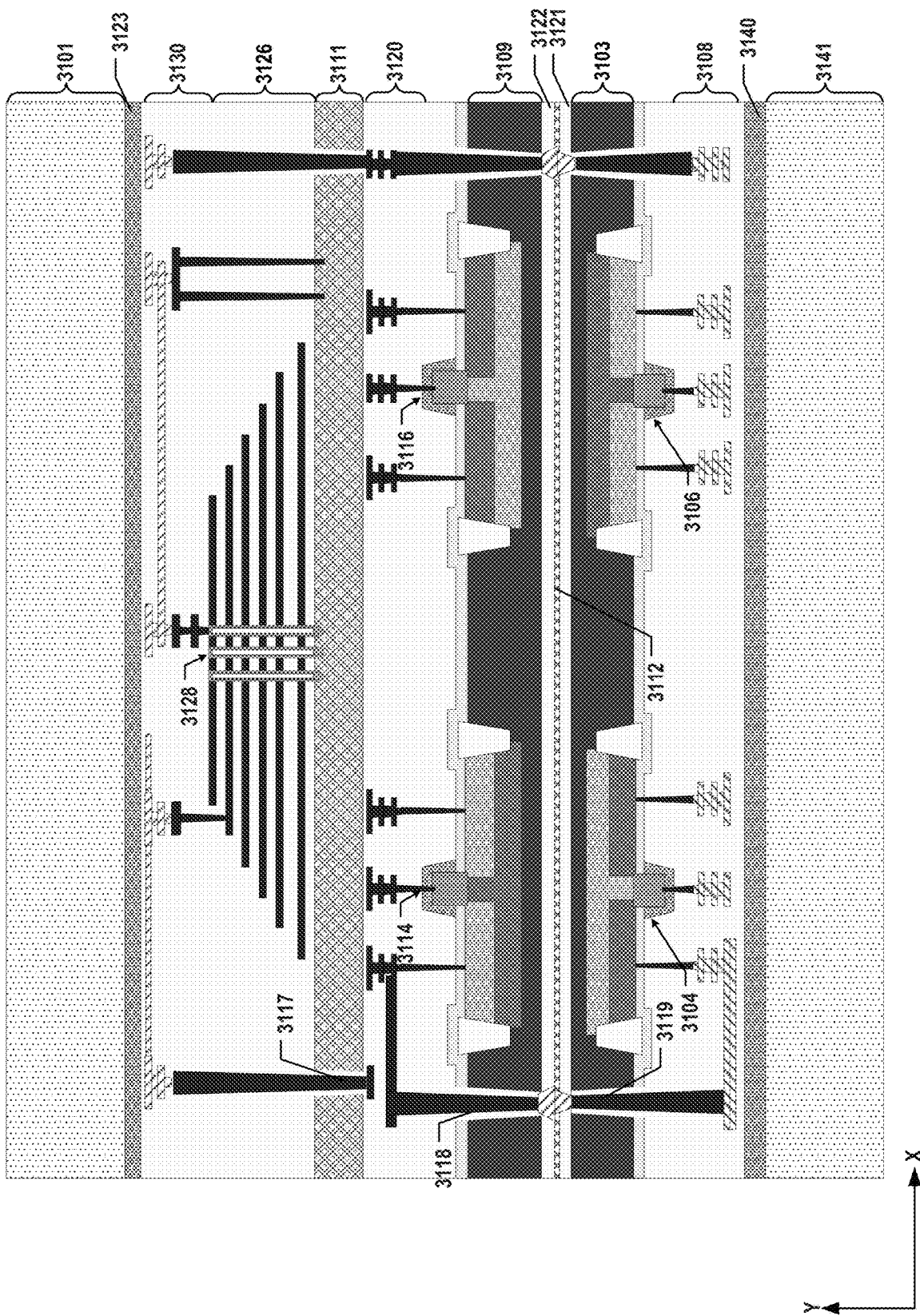

As illustrated in FIG. 31G, thinned silicon substrate 3110 (i.e., semiconductor layer 3109) and components formed thereon (e.g., transistors 3114 and 3116 and NAND memory strings 3128) and thinned silicon substrate 3102 (i.e., semiconductor layer 3103) and components formed thereon (e.g., transistors 3104 and 3106) are bonded in a manner that bonding layer 3121 facing up on the backside of thinned silicon substrate 3102 is bonded with bonding layer 3122 facing down on the backside of thinned silicon substrate 3110 (i.e., a back-to-back manner), thereby forming a bonding interface 3112. That is, thinned silicon substrate 3110 and components formed thereon can be bonded with thinned silicon substrate 3102 and components formed thereon in a back-to-back manner, such that the bonding contacts in bonding layer 3121 are in contact with the bonding contacts in bonding layer 3122 at bonding interface 3112. In some implementations, a treatment process, e.g., plasma treatment, wet treatment and/or thermal treatment, is applied to bonding surfaces prior to bonding. As a result of the bonding, e.g., hybrid bonding, the bonding contacts on opposite sides of bonding interface 3112 can be inter-mixed. After the bonding, the bonding contacts in bonding layer 3121 and the bonding contacts in bonding layer 3122 are aligned and in contact with one another, such that memory stack 3126 and NAND memory strings 3128 formed therethrough as well as transistors 3114 and 3116 can be coupled to transistors 3104 and 3106 through the bonded bonding contacts across bonding interface 3112, according to some implementations.

Figure 31H:
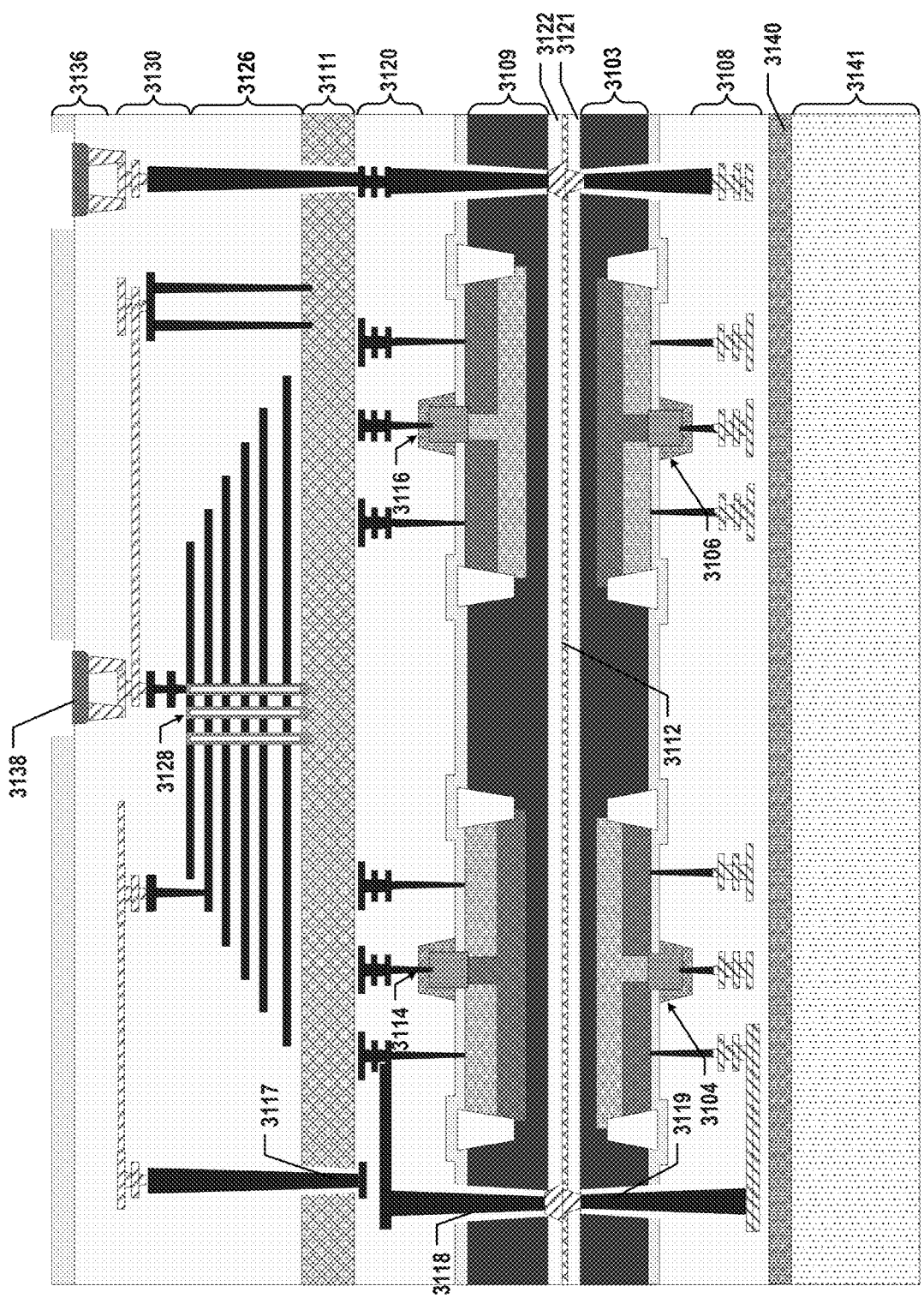

Method 3300 proceeds to operation 3312, as illustrated in FIG. 33, in which a pad-out interconnect layer is formed. The pad-out interconnect layer can be formed above the second transistor or the array of NAND memory strings. As illustrated in FIG. 31H, passivation layer 3123 and handle substrate 3101 (shown in FIG. 13G) are removed to expose interconnect layer 3130, and a pad-out interconnect layer 3136 is formed above interconnect layer 3130 and NAND memory strings 3128 on polysilicon layer 3111. Pad-out interconnect layer 3136 can include interconnects, such as contact pads 3138, formed in one or more ILD layers. Contact pads 3138 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. It is understood that although not shown, in some examples, passivation layer 3140 and handle substrate 3141 may be removed to expose interconnect layer 3108, and pad-out interconnect layer 3136 may be formed above interconnect layer 3108 and transistors 3104 and 3106 on semiconductor layer 3103.

Figure 36:
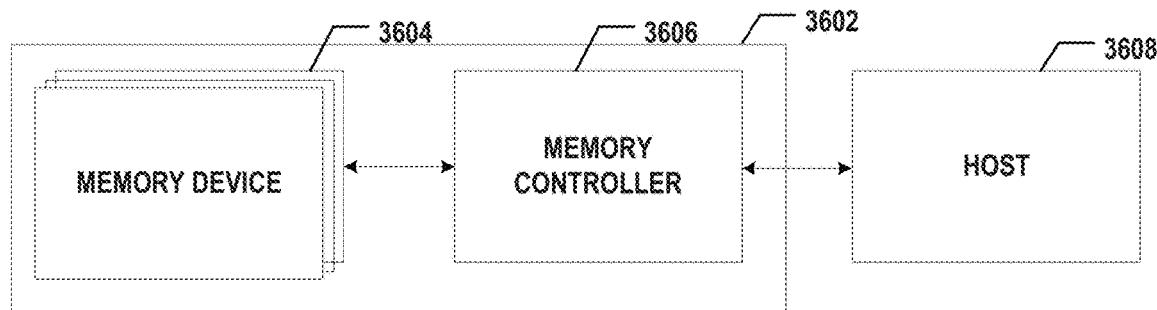
FIG. 36 illustrates a block diagram of an exemplary system having a memory device, according to some aspects of the present disclosure.

FIG. 36 illustrates a block diagram of a system 3600 having a memory device, according to some aspects of the present disclosure. System 3600 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 36, system 3600 can include a host 3608 and a memory system 3602 having one or more memory devices 3604 and a memory controller 3606. Host 3608 can be a processor of an electronic device, such as a central processing unit (CPU), or a system-on-chip (SoC), such as an application processor (AP). Host 3608 can be configured to send or receive the data to or from memory devices 3604.

Memory device 3604 can be any memory devices disclosed herein, such as 3D memory devices 100 and 101. In some implementations, each memory device 3604 includes an array of memory cells, a first peripheral circuit of the array of memory cells, and a second peripheral circuit of the array of memory cells, which are stacked over one another in different planes, as described above in detail.

Memory controller 3606 is coupled to memory device 3604 and host 3608 and is configured to control memory device 3604, according to some implementations. Memory controller 3606 can manage the data stored in memory device 3604 and communicate with host 3608. In some implementations, memory controller 3606 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 3606 is designed for operating in a high duty-cycle environment SSDs or embedded multi-media-cards (eMMCs) used as data storage for mobile devices, such as smartphones, tablets, laptop computers, etc., and enterprise storage arrays. Memory controller 3606 can be configured to control operations of memory device 3604, such as read, erase, and program operations. In some implementations, memory controller 3606 is configured to control the array of memory cells through the first peripheral circuit and the second peripheral circuit. Memory controller 3606 can also be configured to manage various functions with respect to the data stored or to be stored in memory device 3604 including, but not limited to bad-block management, garbage collection, logical-to-physical address conversion, wear leveling, etc. In some implementations, memory controller 3606 is further configured to process error correction codes (ECCs) with respect to the data read from or written to memory device 3604. Any other suitable functions may be performed by memory controller 3606 as well, for example, formatting memory device 3604. Memory controller 3606 can communicate with an external device (e.g., host 3608) according to a particular communication protocol. For example, memory controller 3606 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 37A:
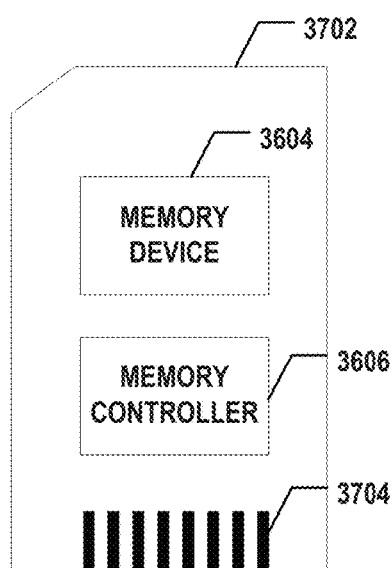
FIG. 37A illustrates a diagram of an exemplary memory card having a memory device, according to some aspects of the present disclosure.
Figure 37B:
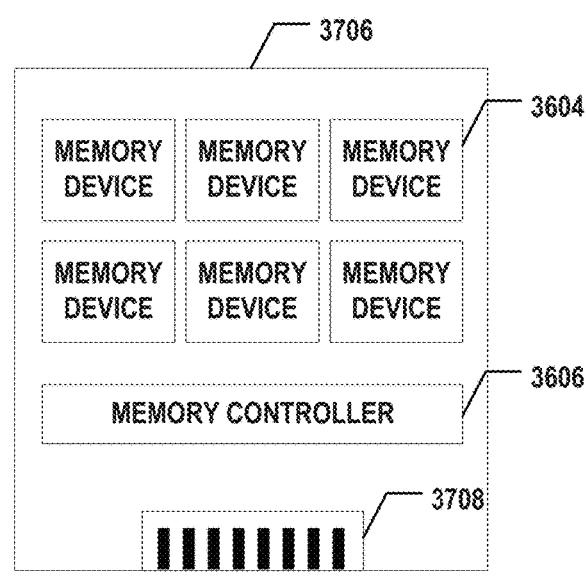
FIG. 37B illustrates a diagram of an exemplary solid-state drive (SSD) having a memory device, according to some aspects of the present disclosure.

Memory controller 3606 and one or more memory devices 3604 can be integrated into various types of storage devices, for example, be included in the same package, such as a universal Flash storage (UFS) package or an eMMC package. That is, memory system 3602 can be implemented and packaged into different types of end electronic products. In one example as shown in FIG. 37A, memory controller 3606 and a single memory device 3604 may be integrated into a memory card 3702. Memory card 3702 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 3702 can further include a memory card connector 3704 coupling memory card 3702 with a host (e.g., host 3608 in FIG. 36). In another example as shown in FIG. 37B, memory controller 3606 and multiple memory devices 3604 may be integrated into an SSD 3706. SSD 3706 can further include an SSD connector 3708 coupling SSD 3706 with a host (e.g., host 3608 in FIG. 36). In some implementations, the storage capacity and/or the operation speed of SSD 3706 is greater than those of memory card 3702.

According to one aspect of the present disclosure, a 3D memory device includes a first semiconductor structure, a second semiconductor structure, and a bonding interface between the first semiconductor structure and the second semiconductor structure. The first semiconductor structure includes an array of NAND memory strings, a first peripheral circuit of the array of NAND memory strings including a first transistor, a polysilicon layer between the array of NAND memory strings and the first peripheral circuit, and a first semiconductor layer in contact with the first transistor. The polysilicon layer is in contact with sources of the array of NAND memory strings. The second semiconductor structure includes a second peripheral circuit of the array of NAND memory strings including a second transistor, and a second semiconductor layer in contact with the second transistor. The second peripheral circuit is between the bonding interface and the second semiconductor layer. The first semiconductor layer is between the polysilicon layer and the second semiconductor layer.

In some implementations, the first peripheral circuit is between the first semiconductor layer and the polysilicon layer.

In some implementations, each of the first and second semiconductor layers includes single crystalline silicon.

In some implementations, a thickness of the second semiconductor layer is greater than a thickness of the first semiconductor layer.

In some implementations, the first transistor includes a first gate dielectric, the second transistor includes a second gate dielectric, and a thickness of the second gate dielectric is greater than a thickness of the first gate dielectric.

In some implementations, a difference between the thicknesses of the first and second gate dielectrics is at least 5-fold.

In some implementations, the first semiconductor structure further includes a third peripheral circuit of the array of NAND memory strings, and the third peripheral circuit includes a third transistor including a third gate dielectric. In some implementations, the second semiconductor structure further includes a fourth peripheral circuit of the array of NAND memory strings, and the fourth peripheral circuit including a fourth transistor including a fourth gate dielectric.

In some implementations, the third and fourth gate dielectrics have a same thickness.

In some implementations, the thickness of the third and fourth gate dielectrics is between the thicknesses of the first and second gate dielectrics.

In some implementations, the third and fourth peripheral circuits include at least one of a page buffer circuit or a logic circuit.

In some implementations, the first semiconductor structure further includes a first interconnect layer between the polysilicon layer and the first peripheral circuit, and the first interconnect layer includes a first interconnect coupled to the first transistor. In some implementations, the second semiconductor structure further includes a second interconnect layer between the bonding interface and the second peripheral circuit, and the second interconnect layer includes a second interconnect coupled to the second transistor.

In some implementations, the first interconnect includes tungsten.

In some implementations, the first semiconductor structure further includes a third interconnect layer such that the array of NAND memory strings is between the third interconnect layer and the polysilicon layer, a first contact through the polysilicon layer and coupling the third interconnect to the first interconnect, and a second contact through the first semiconductor layer and coupling the first interconnect to the second interconnect.

In some implementations, the first semiconductor structure further includes a first pad-out interconnect layer above the array of NAND memory strings, or the second semiconductor structure further includes a second pad-out interconnect layer in contact with the second semiconductor layer.

In some implementations, the first peripheral circuit includes a driving circuit, and the second peripheral circuit includes an I/O circuit.

In some implementations, the 3D memory device further includes a first voltage source coupled to the first peripheral circuit and configured to provide a first voltage to the first peripheral circuit, and a second voltage source coupled to the second peripheral circuit and configured to provide a second voltage to the second peripheral circuit. In some implementations, the second voltage is greater than the first voltage.

In some implementations, the first semiconductor structure further includes a first bonding layer including a first bonding contact such that the first semiconductor layer is between the first bonding layer and the first peripheral circuit. In some implementations, the second semiconductor structure further includes a second bonding layer including a second bonding contact such that the second peripheral circuit is between the second bonding layer and the second semiconductor layer. In some implementations, the first bonding contact is in contact with the second bonding contact at the bonding interface.

In some implementations, the first transistor is formed on the first semiconductor layer, and the second transistor is formed on the second semiconductor layer.

According to another aspect of the present disclosure, a system includes a memory device configured to store data. The memory device includes a first semiconductor structure, a second semiconductor structure, and a bonding interface between the first semiconductor structure and the second semiconductor structure. The first semiconductor structure includes an array of NAND memory strings, a first peripheral circuit of the array of NAND memory strings including a first transistor, a polysilicon layer between the array of NAND memory strings and the first peripheral circuit, and a first semiconductor layer in contact with the first transistor. The polysilicon layer is in contact with sources of the array of NAND memory strings. The second semiconductor structure includes a second peripheral circuit of the array of NAND memory strings including a second transistor, and a second semiconductor layer in contact with the second transistor. The second peripheral circuit is between the bonding interface and the second semiconductor layer. The first semiconductor layer is between the polysilicon layer and the second semiconductor layer. The system also includes a memory controller coupled to the memory device and configured to control the array of memory cells through the first peripheral circuit and the second peripheral circuit.

According to still another aspect of the present disclosure, a method for forming a 3D memory device is disclosed. A first transistor is formed on a front side of a first substrate. A polysilicon layer is formed above the first transistor on the first substrate. An array of NAND memory strings is formed on the polysilicon layer. A second transistor is formed on a second substrate. The first substrate and the second substrate are bonded in a back-to-face manner.

In some implementations, a pad-out interconnect layer is formed above the array of NAND memory strings after bonding the first and second substrates.

In some implementations, the second substrate is thinned after bonding the first and second substrates, and a pad-out interconnect layer is formed on the thinned second substrate.

In some implementations, bonding the first and second substrates includes hybrid bonding.

In some implementations, a first bonding layer including a first bonding contact is formed on a backside of the first substrate, a second bonding layer including a second bonding contact is formed above the second transistor, and the first bonding contact is in contact with the second bonding contact at a bonding interface after bonding the first and second substrates.

In some implementations, a first contact is formed through the polysilicon layer.

In some implementations, the first substrate is thinned before bonding the first and second substrates, and a second contact is formed through the thinned first substrate.

In some implementations, to form the first transistor, a first gate dielectric is formed, to form the second transistor, a second gate dielectric is formed, and a thickness of the second gate dielectric is greater than a thickness of the first gate dielectric.

According to yet another aspect of the present disclosure, a method for forming a 3D memory device is disclosed. A first transistor is formed on a first substrate. A semiconductor layer is formed on above the first transistor. The semiconductor layer includes single crystalline silicon. A second transistor is formed on the semiconductor layer. A polysilicon layer is formed above the second transistor. An array of NAND memory strings is formed on the polysilicon layer.

In some implementations, a pad-out interconnect layer is formed above the array of NAND memory strings.

In some implementations, the first substrate is thinned after forming the array of NAND memory strings, and a pad-out interconnect layer is formed on the thinned first substrate.

In some implementations, a first contact is formed through the semiconductor layer before forming the polysilicon layer.

In some implementations, a second contact is formed through the polysilicon layer.

In some implementations, to form the semiconductor layer, a second substrate and the first substrate are bonded, and the second substrate is thinned to leave the semiconductor layer.

In some implementations, bonding the second and first substrates includes transfers bonding.

In some implementations, to form the first transistor, a first gate dielectric is formed, to form the second transistor, a second gate dielectric is formed, and a thickness of the first gate dielectric is greater than a thickness of the second gate dielectric.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
    a first semiconductor structure, comprising:
        an array of NAND memory strings;
        a first peripheral circuit of the array of NAND memory strings, the first peripheral circuit comprising a first transistor;
        a polysilicon layer between the array of NAND memory strings and the first peripheral circuit, the polysilicon layer being in contact with sources of the array of NAND memory strings; and
        a first semiconductor layer in contact with the first transistor;
    a second semiconductor structure, comprising:
        a second peripheral circuit of the array of NAND memory strings, the second peripheral circuit comprising a second transistor; and
        a second semiconductor layer in contact with the second transistor; and
    a bonding interface between the first semiconductor structure and the second semiconductor structure,
    wherein the second peripheral circuit is between the bonding interface and the second semiconductor layer; and
    the first semiconductor layer is between the polysilicon layer and the second semiconductor layer.

2. The 3D memory device of claim 1, wherein the first peripheral circuit is between the first semiconductor layer and the polysilicon layer.

3. The 3D memory device of claim 1, wherein each of the first and second semiconductor layers comprises single crystalline silicon.

4. The 3D memory device of claim 1, wherein a thickness of the second semiconductor layer is greater than a thickness of the first semiconductor layer.

5. The 3D memory device of claim 1, wherein
    the first transistor comprises a first gate dielectric;
    the second transistor comprises a second gate dielectric; and
    a thickness of the second gate dielectric is greater than a thickness of the first gate dielectric.

6. The 3D memory device of claim 5, wherein a difference between the thickness of the first gate dielectric and the thickness of the second gate dielectric is at least 5-fold.

7. The 3D memory device of claim 5, wherein
    the first semiconductor structure further comprises a third peripheral circuit of the array of NAND memory strings, the third peripheral circuit comprising a third transistor that comprises a third gate dielectric; and
    the second semiconductor structure further comprises a fourth peripheral circuit of the array of NAND memory strings, the fourth peripheral circuit comprising a fourth transistor that comprises a fourth gate dielectric.

8. The 3D memory device of claim 7, wherein the third and fourth gate dielectrics have a same thickness.

9. The 3D memory device of claim 8, wherein the thicknesses of the third and fourth gate dielectrics is between the thicknesses of the first and second gate dielectrics.

10. The 3D memory device of claim 7, wherein the third and fourth peripheral circuits comprise at least one of a page buffer circuit or a logic circuit.

11. The 3D memory device of claim 1, wherein
    the first semiconductor structure further comprises a first interconnect layer between the polysilicon layer and the first peripheral circuit, the first interconnect layer comprising a first interconnect coupled to the first transistor; and
    the second semiconductor structure further comprises a second interconnect layer between the bonding interface and the second peripheral circuit, the second interconnect layer comprising a second interconnect coupled to the second transistor.

12. The 3D memory device of claim 11, wherein the first interconnect comprises tungsten.

13. The 3D memory device of claim 11, wherein the first semiconductor structure further comprises:
    a third interconnect layer, the array of NAND memory strings being arranged between the third interconnect layer and the polysilicon layer, and the third interconnect layer comprising a third interconnect coupled to the array of NAND memory strings;
    a first contact extending through the polysilicon layer and coupling the third interconnect to the first interconnect; and
    a second contact extending through the first semiconductor layer and coupling the first interconnect to the second interconnect.

14. The 3D memory device of claim 1, wherein
    the first semiconductor structure further comprises a first pad-out interconnect layer above the array of NAND memory strings; or
    the second semiconductor structure further comprises a second pad-out interconnect layer in contact with the second semiconductor layer.

15. The 3D memory device of claim 1, wherein the second peripheral circuit comprises a driving circuit, and the first peripheral circuit comprises an input/output (I/O) circuit.

16. The 3D memory device of claim 1, further comprising:
    a first voltage source coupled to the first peripheral circuit and configured to provide a first voltage to the first peripheral circuit; and
    a second voltage source coupled to the second peripheral circuit and configured to provide a second voltage to the second peripheral circuit,
    wherein the second voltage is greater than the first voltage.

17. The 3D memory device of claim 1, wherein
    the first semiconductor structure further comprises a first bonding layer, the first semiconductor layer being arranged between the first bonding layer and the first peripheral circuit, and the first bonding layer comprising a first bonding contact;

the second semiconductor structure further comprises a second bonding layer, the second peripheral circuit being arranged between the second bonding layer and the second semiconductor layer, the second bonding layer comprising a second bonding contact; and the first bonding contact is in contact with the second bonding contact at the bonding interface.

18. The 3D memory device of claim 1, wherein the first transistor is formed on the first semiconductor layer, and the second transistor is formed on the second semiconductor layer.

19. The 3D memory device of claim 1, wherein the first semiconductor structure further comprises a third peripheral circuit of the array of NAND memory strings, a first voltage provided to the first peripheral circuit being higher than a third voltage provided to the third peripheral circuit.

20. The 3D memory device of claim 1, wherein the second semiconductor structure further comprises a fourth peripheral circuit of the array of NAND memory strings, a second voltage provided to the second peripheral circuit being higher than a fourth voltage provided to the fourth peripheral circuit.

* * * * *